US010988495B2

(12) United States Patent
Lee et al.

(10) Patent No.: US 10,988,495 B2
(45) Date of Patent: Apr. 27, 2021

(54) ORGANOMETALLIC COMPOUND, ORGANIC-LIGHT EMITTING DEVICE INCLUDING THE SAME, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Jungin Lee, Seoul (KR); Jiwhan Kim, Seoul (KR); Bumwoo Park, Hwaseong-si (KR); Sunyoung Lee, Seoul (KR); Hyeonho Choi, Seoul (KR); Kyuyoung Hwang, Anyang-si (KR); Yoonhyun Kwak, Seoul (KR); Ohyun Kwon, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 360 days.

(21) Appl. No.: 15/962,022

(22) Filed: Apr. 25, 2018

(65) Prior Publication Data

US 2018/0305386 A1 Oct. 25, 2018

(30) Foreign Application Priority Data

Apr. 25, 2017 (KR) ........................ 10-2017-0053242

(51) Int. Cl.

| | |
|---|---|
| ***C07F 15/00*** | (2006.01) |
| ***C09K 11/06*** | (2006.01) |
| ***H01L 51/50*** | (2006.01) |
| ***H01L 51/00*** | (2006.01) |

(52) U.S. Cl.

CPC .......... *C07F 15/0086* (2013.01); *C09K 11/06* (2013.01); *H01L 51/0087* (2013.01); *H01L 51/5024* (2013.01); *H01L 51/5056* (2013.01); *H01L 51/5072* (2013.01); *C09K 2211/1033* (2013.01); *C09K 2211/1044* (2013.01); *C09K 2211/185* (2013.01); *H01L 51/0003* (2013.01); *H01L 51/0081* (2013.01); *H01L 51/5016* (2013.01)

(58) Field of Classification Search

CPC ........................... C07F 15/086; H01L 51/0087

See application file for complete search history.

(56) References Cited

U.S. PATENT DOCUMENTS

| | | | |
|---|---|---|---|
| 10,566,566 B2 * | 2/2020 | Jeon | .................... H01L 51/5203 |
| 2011/0028730 A1 | 2/2011 | Könemann et al. | |
| 2013/0168656 A1 | 7/2013 | Tsai et al. | |
| 2015/0274762 A1 | 10/2015 | Li et al. | |
| 2015/0349279 A1 | 12/2015 | Li et al. | |
| 2018/0013078 A1 | 1/2018 | Lee et al. | |
| 2018/0090707 A1 * | 3/2018 | Jeon | .................... H01L 51/0072 |

FOREIGN PATENT DOCUMENTS

| | | |
|---|---|---|
| JP | 2010-135689 A | 6/2010 |
| WO | 2003-084960 A1 | 10/2003 |
| WO | 2014-109814 A2 | 7/2014 |

OTHER PUBLICATIONS

Extended Eropean Search Report issued by the European Patent Office dated Jul. 2, 2018 in the examination of the European Patent Application No. 18168937.3-1109.

Chihiro Maeda et al. "Synthesis and Characterization of Novel Fused Porphyrinoids Based on Cyclic Carbazole[2]indolones", Organic Letters 2012, 14 (8), pp. 2122-2125.

Shoichi Nakamura et al. "Synthesis and oxidation of cyclic tetraindole", Chem. Sci., 2012, 3 (2), pp. 524-527.

* cited by examiner

*Primary Examiner* — Peter F Godenschwager

(74) *Attorney, Agent, or Firm* — Cantor Colburn LLP

(57) ABSTRACT

An organometallic compound represented by Formula 1:

Formula 1

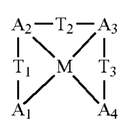

wherein in Formula 1, $A_1$ to $A_4$, M, and $T_1$ to $T_3$ are the same as described in the specification.

20 Claims, 1 Drawing Sheet

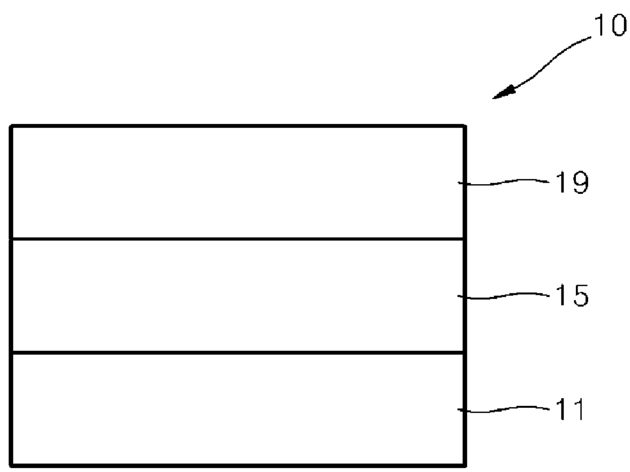
10
19
15
11

ORGANOMETALLIC COMPOUND, ORGANIC-LIGHT EMITTING DEVICE INCLUDING THE SAME, AND DIAGNOSTIC COMPOSITION INCLUDING THE ORGANOMETALLIC COMPOUND

CROSS-REFERENCE TO RELATED APPLICATION

This application claims priority to Korean Patent Application No. 10-2017-0053242, filed on Apr. 25, 2017, in the Korean Intellectual Property Office, and all the benefits accruing therefrom under 35 U.S.C. § 119, the content of which is incorporated herein in its entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices, which have better characteristics in terms of a viewing angle, a response time, a brightness, a driving voltage, and a response speed, and which produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

Various types of organic light emitting devices are known. However, there still remains a need in OLEDs having low driving voltage, high efficiency, high brightness, and long lifespan.

SUMMARY

Aspects of the present disclosure provide an organometallic compound, an organic light-emitting device including the same, and a diagnostic composition including the organometallic compound.

Additional aspects will be set forth in part in the description which follows and, in part, will be apparent from the description, or may be learned by practice of the presented embodiments.

An aspect provides an organometallic compound represented by Formula 1:

Formula 1

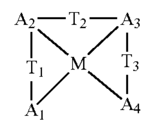

Formula A1-1

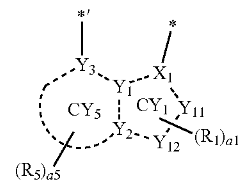

Formula A1-2

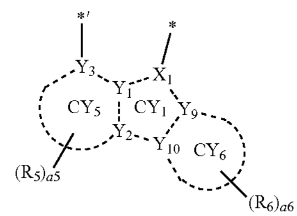

Formula A2-1

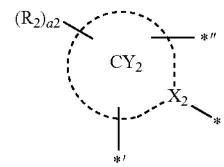

Formula A2-2

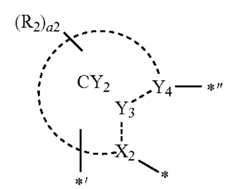

Formula A2-3

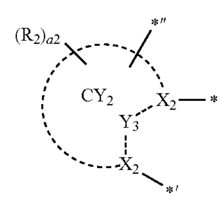

Formula A3-1

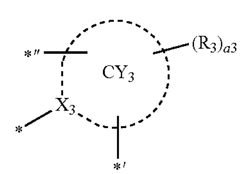

Formula A3-2

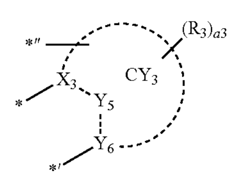

-continued

Formula A3-3

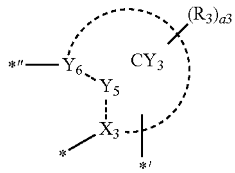

Formula A4-1

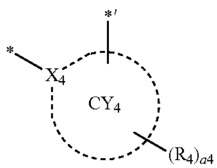

Formula A4-2

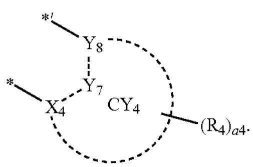

wherein

M in Formula 1 may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), in Formula 1, two bonds selected from a bond between $A_1$ and M, a bond between $A_2$ and M, a bond between $A_3$ and M, and a bond between $A_4$ and M may each be a covalent bond, and the others thereof may each be a coordinate bond, $A_1$ in Formula 1 may be represented by Formula A1-1 or A1-2, and in Formulae A1-1 and A1-2, * indicates a binding site to M in Formula 1, and *' indicates a binding site to $T_1$ in Formula 1, $A_2$ in Formula 1 may be represented by one of Formula A2-1 to A2-3, and in Formulae A2-1 to A2-3, * indicates a binding site to M in Formula 1, *' indicates a binding site to $T_1$ in Formula 1, and *" indicates a binding site to $T_2$ in Formula 1, and in Formula A2-1, the two atoms to which *' and *" are linked are adjacent to $X_2$, $A_3$ in Formula 1 may be represented by one of Formulae A3-1 to A3-3, and in Formulae A3-1 to A3-3, * indicates a binding site to M in Formula 1, *" indicates a binding site to $T_2$ in Formula 1, and *' indicates a binding site to $T_3$ in Formula 1, and in Formula A3-1, the two atoms to which *' and *" are linked are adjacent to $X_3$, $A_4$ in Formula 1 may be a first atom linked to M or a non-cyclic moiety including the first atom linked to M, or may be represented by Formula A4-1 or A4-2, and in Formulae A4-1 and A4-2, * indicates a binding site to M in Formula 1, and *' indicates a binding site to $T_3$ in Formula 1, and in Formula A4-1, the atom to which *' is linked is adjacent to $X_4$, the first atom may be B, N, P, C, Si, O, or S, in Formulae A1-1, A1-2, A2-1 to A2-3, A3-1 to A3-3, A4-1, and A4-2, $X_1$ to $X_4$ and $Y_1$ to $Y_{10}$ may each independently be C or N, and $Y_{11}$ and $Y_{12}$ may each independently be O, S, N, C, or Si, ring $CY_1$ in Formulae A1-1 and A1-2 may be a 5-membered ring, rings $CY_2$ to $CY_6$ in Formulae A1-1, A1-2, A2-1 to A2-3, A3-1 to A3-3, A4-1, and A4-2 may each independently be a $C_5$-$C_{30}$ carbocyclic group or a $C_1$-$C_{30}$ heterocyclic group, $T_1$ to $T_3$ in Formula 1 may each independently be selected from a single bond, a double bond, *—N($R_7$)—*', *—B($R_7$)—*', *—P($R_7$)—*', *—C($R_7$)($R_8$)—*', *—Si($R_7$)($R_8$)—*', *—Ge($R_7$)($R_8$)—*', *—S—*', *—Se—*', *—O—*', *—C(=O)—*', *—S(=O)—*', *—S(=O)$_2$—*', *—C($R_7$)=, *=C($R_7$)—*', *—C($R_7$)=C($R_8$)—*', *—C(=S)—*', and *—C≡C—*', $R_7$ and $R_8$ may optionally be linked via a single bond, a double bond, or a first linking group to form a substituted or unsubstituted $C_5$-$C_{30}$ carbocyclic group or a substituted or unsubstituted $C_1$-$C_{30}$ heterocyclic group, $R_1$ to $R_8$ may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), a1 in Formula A1-1 may be an integer from 0 to 4, a2 to a6 in Formulae A1-1, A1-2, A2-1 to A2-3, A3-1 to A3-3, A4-1, and A4-2 may each independently be an integer from 0 to 20, two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_5$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_6$ may optionally be linked to form a substituted or unsubstituted $C_5$-$C_{30}$ carbocyclic group or a substituted or unsubstituted $C_1$-$C_{30}$ heterocyclic group, two or more neighboring groups selected from $R_2$ to $R_5$ may optionally be linked to form a substituted or unsubstituted $C_5$-$C_{30}$ carbocyclic group, or a substituted or unsubstituted $C_1$-$C_{30}$ heterocyclic group, $A_1$ and $A_4$ in Formula 1 are not linked to each other, i) when $A_1$ in Formula 1 is represented by Formula A1-1, the organometallic compound represented by Formula 1 may satisfy "Condition 1", and ii) when $A_1$ in Formula 1 is represented by Formula A1-2, the organometallic compound represented by Formula 1 may satisfy at least one of "Condition 1" to "Condition 3":

"Condition 1"

$A_2$ in Formula 1 is represented by Formula A2-2 or A2-3,

"Condition 2"

$A_3$ in Formula 1 is represented by Formula A3-2 or A3-3, and

"Condition 3"

$A_4$ in Formula 1 is represented by Formula A4-2, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, and $—P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, and $—P(=O)(Q_{28})(Q_{29})$; and $—N(Q_{31})(Q_{32})$, $—Si(Q_{33})(Q_{34})(Q_{35})$, $—B(Q_{36})(Q_{37})$, and $—P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

Another aspect of the present disclosure provides an organic light-emitting device including:

a first electrode, a second electrode, and an organic layer disposed between the first electrode and the second electrode, wherein the organic layer includes an emission layer and at least one of the organometallic compound.

The organometallic compounds may act as a dopant in the emission layer.

Another aspect of the present disclosure provides a diagnostic composition including at least one organometallic compound represented by Formula 1.

BRIEF DESCRIPTION OF THE DRAWING

These and/or other aspects will become apparent and more readily appreciated from the following description of the embodiments, taken in conjunction with the FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section.

Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An organometallic compound according to an embodiment is represented by Formula 1 below:

Formula 1

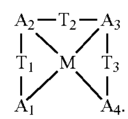

M in Formula 1 may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

For example, M may be Pt or Pd.

In an embodiment, M may be Pt, but embodiments of the present disclosure are not limited thereto.

In Formula 1, two bonds selected from a bond between $A_1$ and M, a bond between $A_2$ and M, a bond between $A_3$ and M, and a bond between $A_4$ and M may each be a covalent bond, and the others thereof may each be a coordinate bond. Accordingly, the organometallic compound represented by Formula 1 is electrically neutral. Therefore, the organometallic compound represented by Formula 1 clearly distinguishes from a virtual organometallic compound being represented by i) Formula 1, in which one bond selected from a bond between $A_1$ and M, a bond between $A_2$ and M, a bond between $A_3$ and M, and a bond between $A_4$ and M may be a covalent bond, and the others thereof may each be a coordinate bond, or ii) Formula 1, in which three bonds selected from a bond between $A_1$ and M, a bond between $A_2$ and M, a bond between $A_3$ and M, and a bond between $A_4$ and M may each be a covalent bond, and the other thereof may be a coordinate bond, and thus not being electrically neutral.

In an embodiment, a bond between $A_1$ and M and a bond between $A_3$ and M may each be a covalent bond, and a bond between $A_2$ and M and a bond between $A_4$ and M may each be a coordinate bond, or a bond between $A_1$ and M and a bond between $A_4$ and M may each be a covalent bond, and a bond between $A_2$ and M and a bond between $A_3$ and M may each be a coordinate bond, but embodiments of the present disclosure are not limited thereto.

$A_1$ in Formula 1 may be represented by Formula A1-1 or A1-2, and in Formulae A1-1 and A1-2, * indicates a binding site to M in Formula 1, and *' indicates a binding site to $T_1$ in Formula 1, $A_2$ in Formula 1 may be represented by one of Formula A2-1 to A2-3, and in Formulae A2-1 to A2-3, * indicates a binding site to M in Formula 1, *' indicates a binding site to $T_1$ in Formula 1, and *" indicates a binding site to $T_2$ in Formula 1, and in Formula A2-1, the two atoms to which *' and *" are linked are adjacent to $X_2$, $A_3$ in Formula 1 may be represented by one of Formulae A3-1 to A3-3, and in Formulae A3-1 to A3-3, * indicates a binding site to M in Formula 1, *" indicates a binding site to $T_2$ in Formula 1, and *' indicates a binding site to $T_3$ in Formula 1, and in Formula A3-1, the two atoms to which *' and *" are linked are adjacent to $X_3$, and $A_4$ in Formula 1 may be a first atom linked to M or a non-cyclic moiety including the first atom linked to M, or may be represented by Formula A4-1 or A4-2, and in Formulae A4-1 and A4-2, * indicates a binding site to M in Formula 1, and *' indicates a binding site to $T_3$ in Formula 1, and in Formula A4-1, the atom to which *' is linked is adjacent to $X_4$:

Formula A1-1

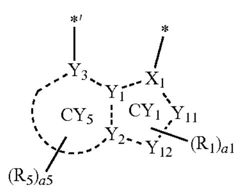

Formula A1-2

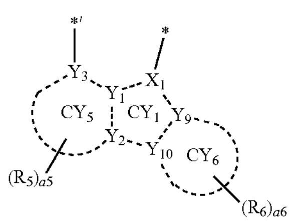

Formula A2-1

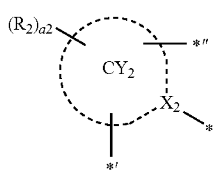

Formula A2-2

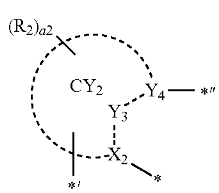

Formula A2-3

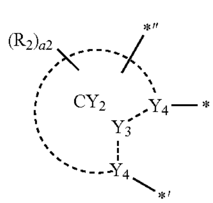

-continued

Formula A3-1

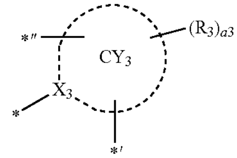

Formula A3-2

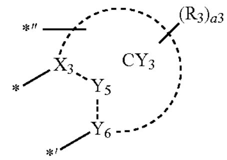

Formula A3-3

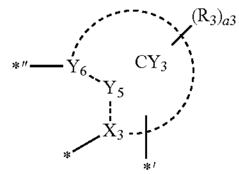

Formula A4-1

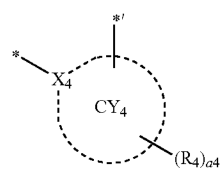

Formula A4-2

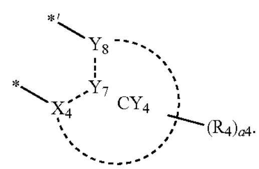

The first atom may be B, N, P, C, Si, O, or S.

For example, the first atom may be N, P, C, Si, or O, but embodiments of the present disclosure are not limited thereto.

In an embodiment, the first atom may be O.

The non-cyclic moiety including the first atom linked to M may be *—C($R_{41}$)—*, *—Si($R_{41}$)—*', *—B($R_{41}$)—*', *—N($R_{41}$)—*', *—P($R_{41}$)—*', *—C($R_{41}$)($R_{42}$)—*', *—Si($R_{41}$)($R_{42}$)—*', *—C($R_{41}$)—C(═O)—*', *—Si($R_{41}$)—C(═O)—*', *—B($R_{41}$)—C(═O)—*', *—N($R_{41}$)—C(═O)—*', *—P($R_{41}$)—C(═O)—*', *—C($R_{41}$)($R_{42}$)—C(═O)—*', or *—Si($R_{41}$)($R_{42}$)—C(═O)—*' (wherein $R_{41}$ and $R_{42}$ are the same as described in connection with $R_4$, * indicates a binding site to M in Formula 1, and *' indicates a binding site to $T_3$ in Formula 1).

In Formulae A1-1, A1-2, A2-1 to A2-3, A3-1 to A3-3, A4-1, and A4-2, $X_1$ to $X_4$ and $Y_1$ to $Y_{10}$ may each independently be C or N, and $Y_{11}$ and $Y_{12}$ may each independently be O, S, N, C, or Si.

Ring $CY_1$ in Formulae A1-1 and A1-2 may be a 5-membered ring.

Rings $CY_2$ to $CY_6$ in Formulae A1-1, A1-2, A2-1 to A2-3, A3-1 to A3-3, A4-1, and A4-2 may each independently be a $C_5$-$C_{30}$ carbocyclic group or a $C_1$-$C_{30}$ heterocyclic group.

In an embodiment, ring CY may be selected from a pyrrole group, a furan group, a thiophene group, a silole group, a pyrazole group, an imidazole group, a triazole group, a tetrazole group, an oxazole group, an isoxazole group, a thiazole group, an isothiazole group, an oxadiazole group, a thiadiazole group, an oxatriazole group, and a thiatriazole group.

In one or more embodiments, rings $CY_2$ to $CY_6$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, and a 5,6,7,8-tetrahydroquinoline group.

In one or more embodiments, at least one of rings $CY_2$ to $CY_4$ may be a condensed ring with at least one 5-membered ring and at least one 6-membered ring, the 5-membered ring may be selected from a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, and the 6-membered ring may be selected from a cyclohexane group, a cyclohexene group, a benzene group, a pyridine group, a pyrimidine group, a pyrazine group, and a pyridazine group, but embodiments of the present disclosure are not limited thereto.

In one or more embodiments, when $A_2$ is the condensed ring (for example, a moiety represented by Formula A2-2), the 5-membered ring of the condensed ring may be linked to $T_1$ in Formula 1.

In one or more embodiments, when $A_2$ is the condensed ring (for example, a moiety represented by Formula A2-2), the 5-membered ring of the condensed ring may be linked to $T_2$ in Formula 1.

In one or more embodiments, when $A_3$ is the condensed ring (for example, a moiety represented by Formula A3-2 or A3-3), the 5-membered ring of the condensed ring may be linked to $T_2$ in Formula 1.

In one or more embodiments, when $A_3$ is the condensed ring (for example, a moiety represented by Formula A3-2 or A3-3), the 5-membered ring of the condensed ring may be linked to $T_3$ in Formula 1.

In one or more embodiments, when $A_4$ is the condensed ring (for example, a moiety represented by Formula A4-2), the 5-membered ring of the condensed ring may be linked to $T_3$ in Formula 1.

In one or more embodiments, at least one of rings $CY_2$ to $CY_4$ may be a condensed ring with at least two 6-membered rings, and the 6-membered ring may be selected from a cyclohexane group, a cyclohexene group, a benzene group, a pyridine group, a pyrimidine group, a pyrazine group, and a pyridazine group, but embodiments of the present disclosure are not limited thereto.

$T_1$ to $T_3$ in Formula 1 may each independently be selected from a single bond, a double bond, $*—N(R_7)—*'$, $*—B(R_7)—*'$, $*—P(R_7)—*'$, $*—C(R_7)(R_8)—*'$, $*—Si(R_7)(R_8)—*'$, $*—Ge(R_7)(R_8)—*'$, $*—S—*'$, $*—Se—*'$, $*—O—*'$, $*—C(=O)—*'$, $*—S(=O)—*'$, $*—S(=O)_2—*'$, $*—C(R_7)=*'$, $*=C(R_7)—*'$, $*—C(R_7)=C(R_8)—*'$, $*—C(=S)—*'$, and $*—C≡C—*'$. $R_7$ and $R_8$ are the same as described herein, and $R_7$ and $R_8$ may optionally be linked via a single bond, a double bond, or a first linking group to form a substituted or unsubstituted $C_5$-$C_{30}$ carbocyclic group or a substituted or unsubstituted $C_1$-$C_{30}$ heterocyclic group.

The first linking group may be selected from $*—N(R_9)—*'$, $*—B(R_9)—*'$, $*—P(R_9)—*'$, $*—C(R_9)(R_{10})—*'$, $*—Si(R_9)(R_{10})—*'$, $*—Ge(R_9)(R_{10})—*'$, $*—S—*'$, $*—Se—*'$, $*—O—*'$, $*—C(=O)—*'$, $*—S(=O)—*'$, $*—S(=O)_2—*'$, $*—C(R_9)=*'$, $*=C(R_9)—*'$, $*—C(R_9)=C(R_{10})—*'$, $*—C(=S)—*'$, and $*—C≡C—*'$, $R_9$ and $R_{10}$ are the same as described in connection with $R_7$, and * and *' each indicate a binding site to a neighboring atom.

In an embodiment, $T_1$ and $T_2$ may each be a single bond, but embodiments of the present disclosure are not limited thereto.

In one or more embodiments, $T_1$ to $T_3$ may each be a single bond, but embodiments of the present disclosure are not limited thereto.

$R_1$ to $R_8$ may each independently be selected from hydrogen, deuterium, —F, —Cl, —Br, —I, $—SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, $—B(Q_6)(Q_7)$, and $—P(=O)(Q_8)(Q_9)$.

For example, $R_1$ to $R_8$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, $—CD_3$, $—CD_2H$, $—CDH_2$, $—CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —$Si(Q_{33})(Q_{34})(Q_{35})$; and —$N(Q_1)(Q_2)$, —$Si(Q_3)(Q_4)(Q_5)$, —$B(Q_6)(Q_7)$, and —$P(=O)(Q_8)(Q_9)$, and $Q_1$ to $Q_9$ and $Q_{33}$ to $Q_{35}$ may each independently be selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CH_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

In an embodiment, $R_1$ to $R_8$ may each independently be selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-19, groups represented by Formulae 10-1 to 10-161, —$N(Q_1)(Q_2)$, —$Si(Q_3)(Q_4)(Q_5)$, —$B(Q_6)(Q_7)$, and —$P(=O)(Q_8)(Q_9)$ (wherein $Q_1$ to $Q_9$ are the same as described herein):

Formula 9-1

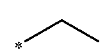

Formula 9-2

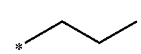

Formula 9-3

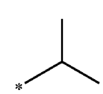

Formula 9-4

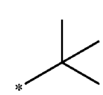

Formula 9-5

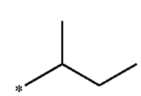

Formula 9-6
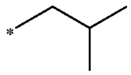
Formula 9-7
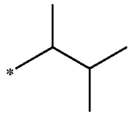
Formula 9-8
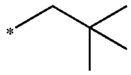
Formula 9-9
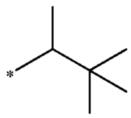
Formula 9-10
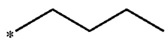
Formula 9-11
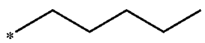
Formula 9-12
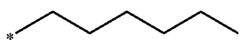
Formula 9-13
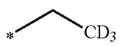
Formula 9-14
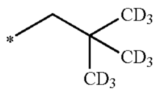
Formula 9-15
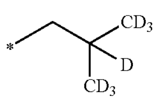
Formula 9-16
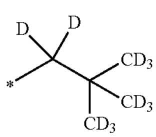
Formula 9-17
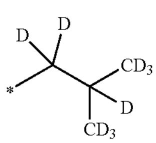
Formula 9-18
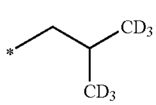
Formula 9-19
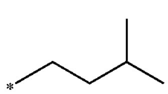
Formula 10-1
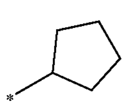
Formula 10-2
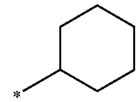
Formula 10-3
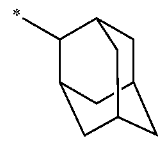
Formula 10-4
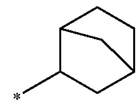
Formula 10-5
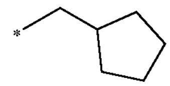
Formula 10-6
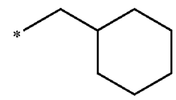
Formula 10-7
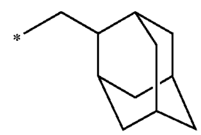
Formula 10-8
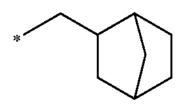
Formula 10-9
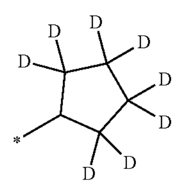
Formula 10-10
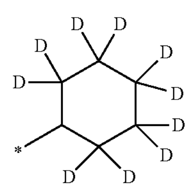
Formula 10-11
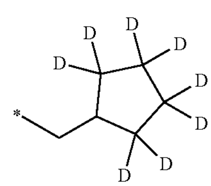
Formula 10-12
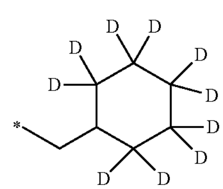

-continued
Formula 10-13
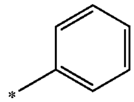
Formula 10-14
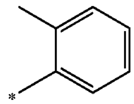
Formula 10-15
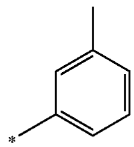
Formula 10-16
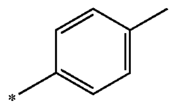
Formula 10-17
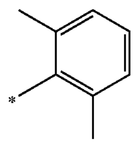
Formula 10-18
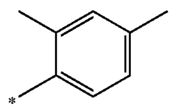
Formula 10-19
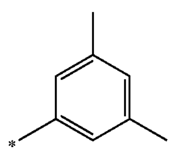
Formula 10-20
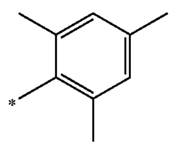
Formula 10-21
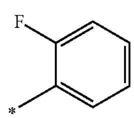
Formula 10-22
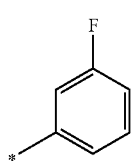
Formula 10-23
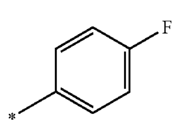
-continued
Formula 10-24
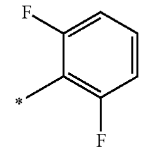
Formula 10-25
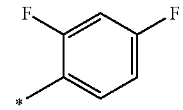
Formula 10-26
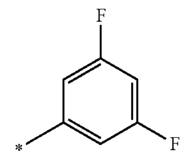
Formula 10-27
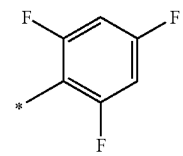
Formula 10-28
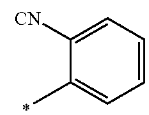
Formula 10-29
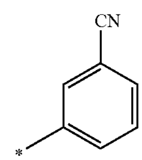
Formula 10-30
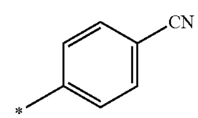
Formula 10-31
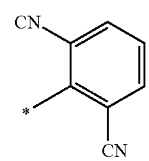
Formula 10-32
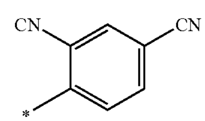
Formula 10-33
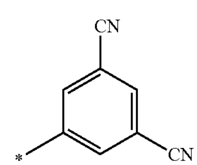

-continued
Formula 10-34
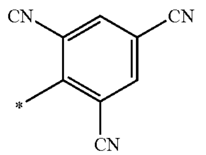
Formula 10-35
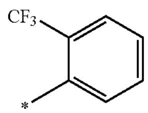
Formula 10-36
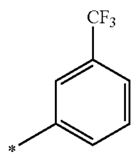
Formula 10-37
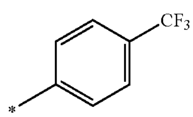
Formula 10-38
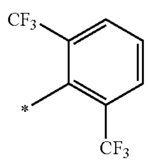
Formula 10-39
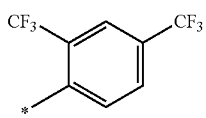
Formula 10-40
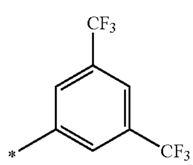
Formula 10-41
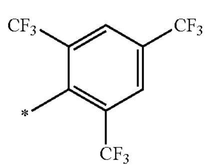
Formula 10-42
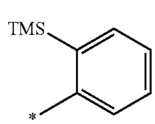
Formula 10-43
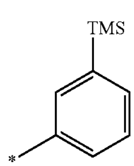
-continued
Formula 10-44
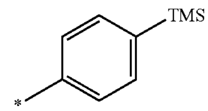
Formula 10-45
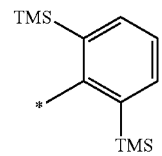
Formula 10-46
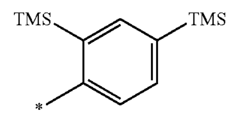
Formula 10-47
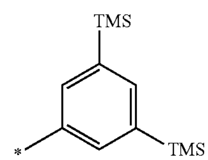
Formula 10-48
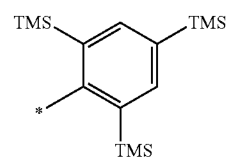
Formula 10-49
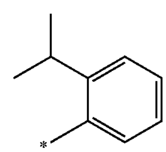
Formula 10-50
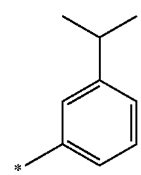
Formula 10-51
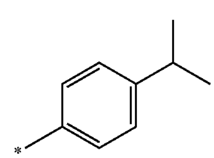
Formula 10-52
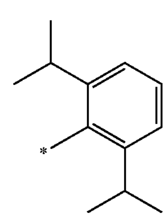

-continued
Formula 10-53
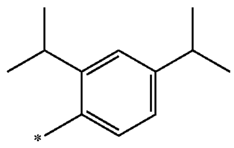
Formula 10-54
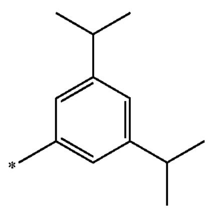
Formula 10-55
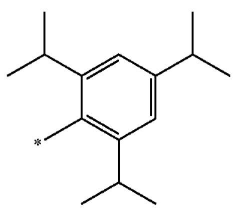
Formula 10-56
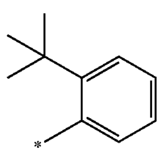
Formula 10-57
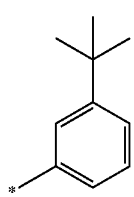
Formula 10-58
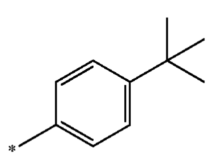
Formula 10-59
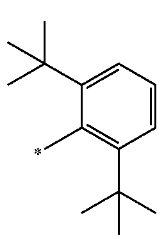
Formula 10-60
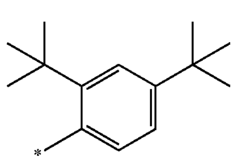
-continued
Formula 10-61
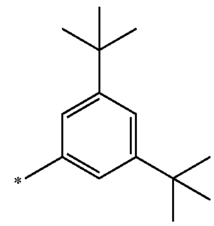
Formula 10-62
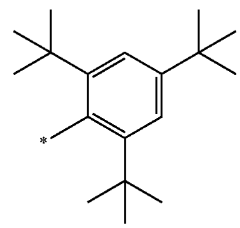
Formula 10-63
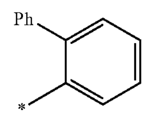
Formula 10-64
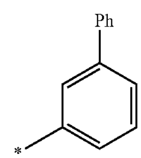
Formula 10-65
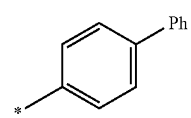
Formula 10-66
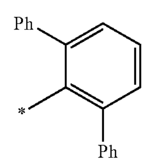
Formula 10-67
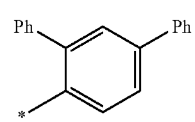
Formula 10-68
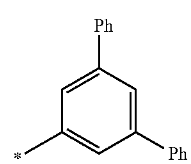
Formula 10-69
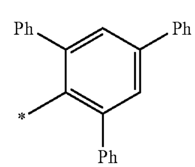

-continued
Formula 10-70
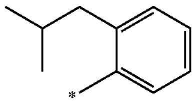
Formula 10-71
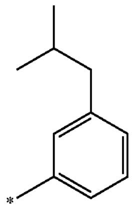
Formula 10-72
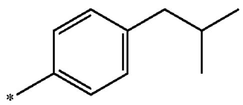
Formula 10-73
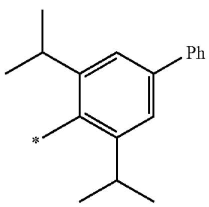
Formula 10-74
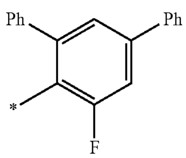
Formula 10-75
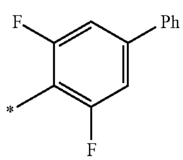
Formula 10-76
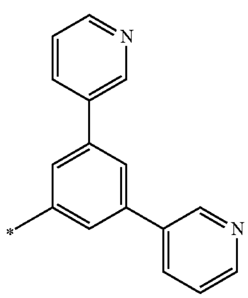
Formula 10-77
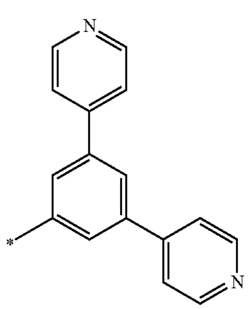
-continued
Formula 10-78
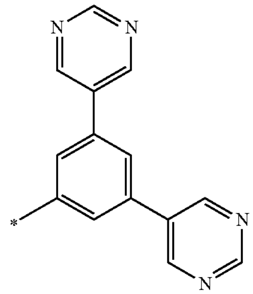
Formula 10-79
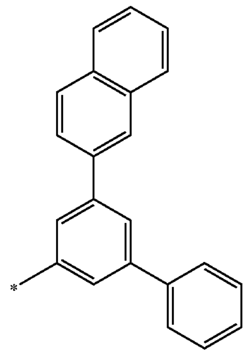
Formula 10-80
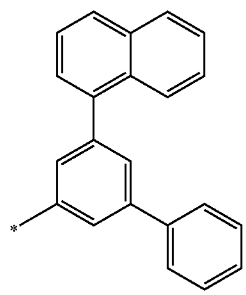
Formula 10-81
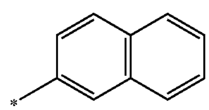
Formula 10-82
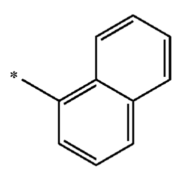
Formula 10-83
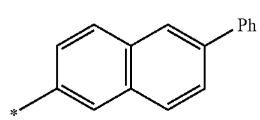
Formula 10-84
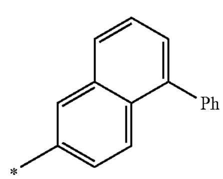

Formula 10-85
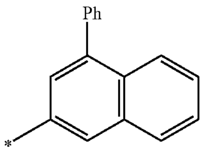
Formula 10-86
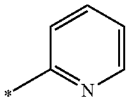
Formula 10-87
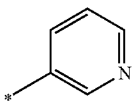
Formula 10-88
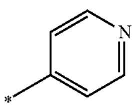
Formula 10-89
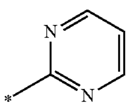
Formula 10-90
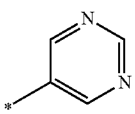
Formula 10-91
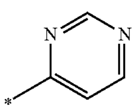
Formula 10-92
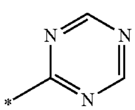
Formula 10-93
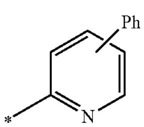
Formula 10-94
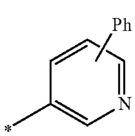
Formula 10-95
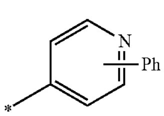
Formula 10-96
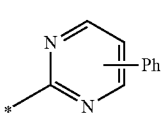
Formula 10-97
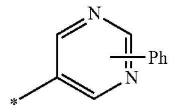
Formula 10-98
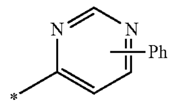
Formula 10-99
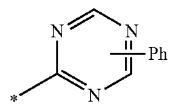
Formula 10-100
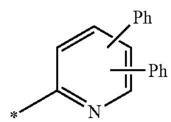
Formula 10-101
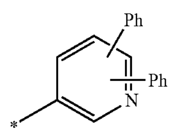
Formula 10-102
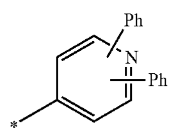
Formula 10-103
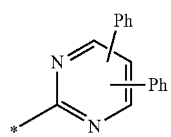
Formula 10-104
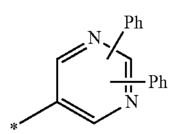
Formula 10-105
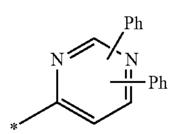
Formula 10-106
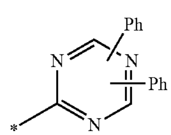
Formula 10-107
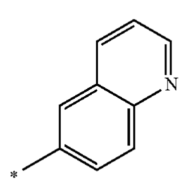

Formula 10-108
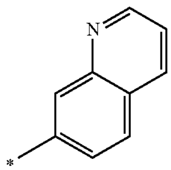
Formula 10-109
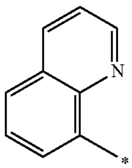
Formula 10-110
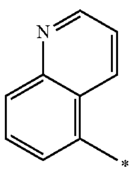
Formula 10-111
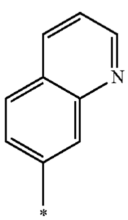
Formula 10-112
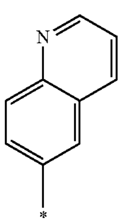
Formula 10-113
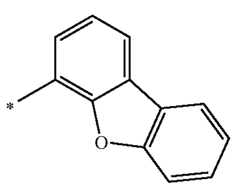
Formula 10-114
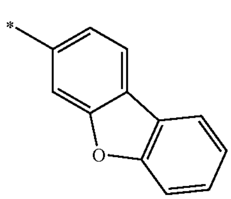
Formula 10-115
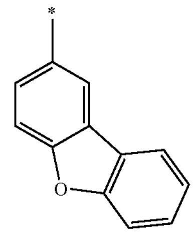
Formula 10-116
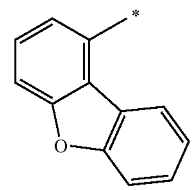
Formula 10-117
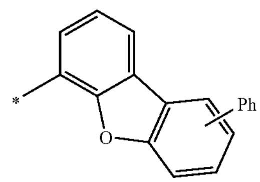
Formula 10-118
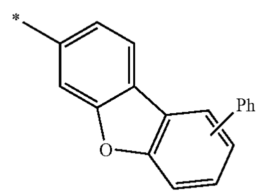
Formula 10-119
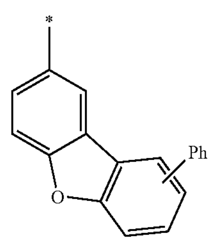
Formula 10-120
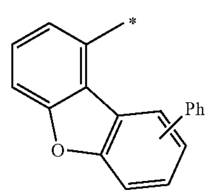
Formula 10-121
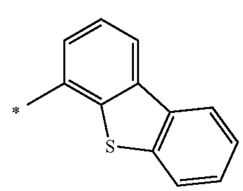

-continued
Formula 10-122
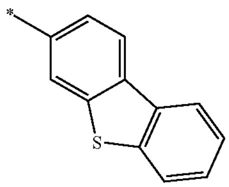
Formula 10-123
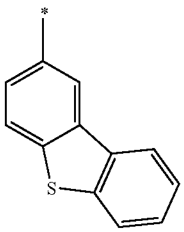
Formula 10-124
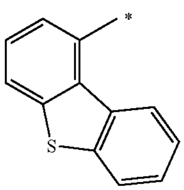
Formula 10-125
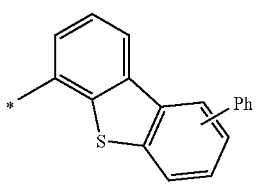
Formula 10-126
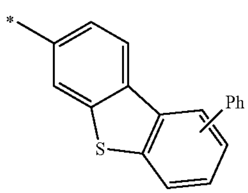
Formula 10-127
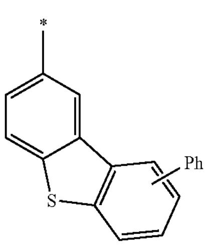
Formula 10-128
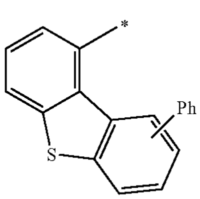
-continued
Formula 10-129
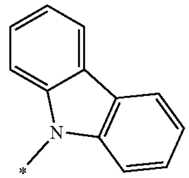
Formula 10-130
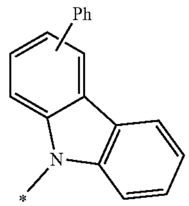
Formula 10-131
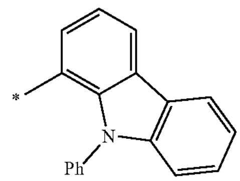
Formula 10-132
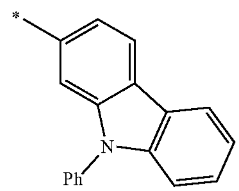
Formula 10-133
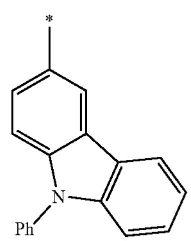
Formula 10-134
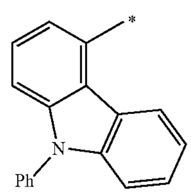
Formula 10-135
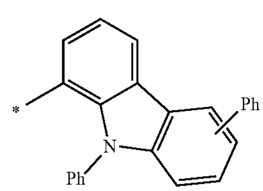
Formula 10-136
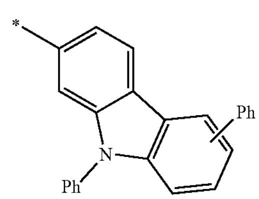

-continued
Formula 10-137
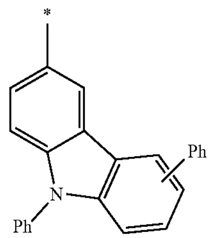
Formula 10-138
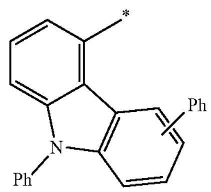
Formula 10-139
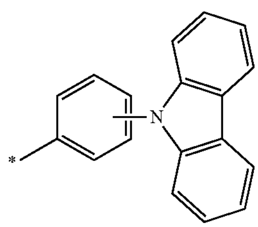
Formula 10-140
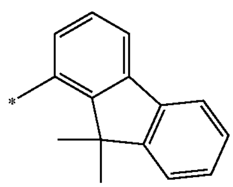
Formula 10-141
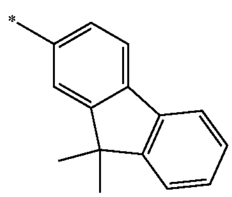
Formula 10-142
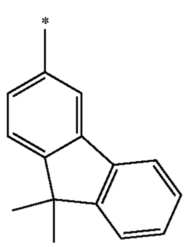
Formula 10-143
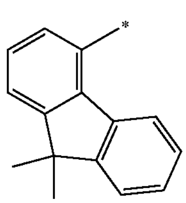
-continued
Formula 10-144
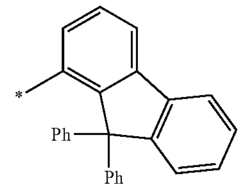
Formula 10-145
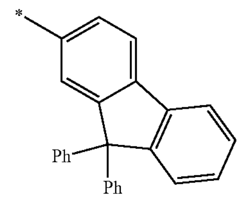
Formula 10-146
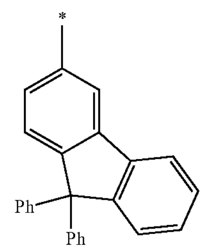
Formula 10-147
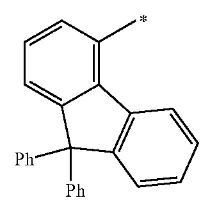
Formula 10-148
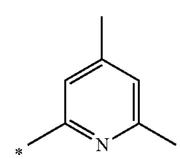
Formula 10-149
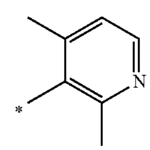
Formula 10-150
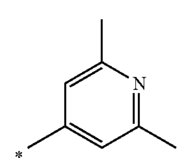
Formula 10-151
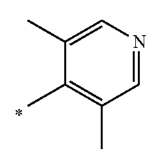

-continued

Formula 10-152

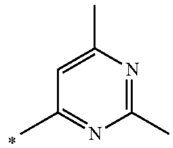

Formula 10-153

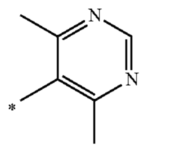

Formula 10-154

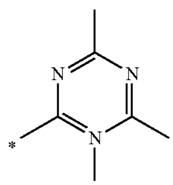

Formula 10-155

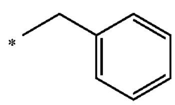

Formula 10-156

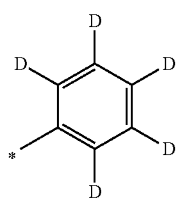

Formula 10-157

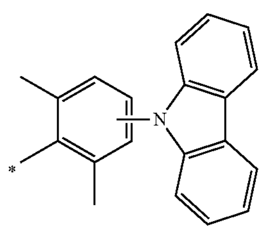

Formula 10-158

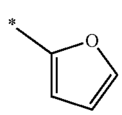

Formula 10-159

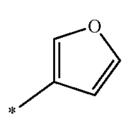

Formula 10-160

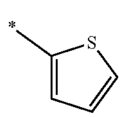

Formula 10-161

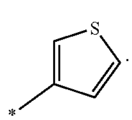

In Formulae 9-1 to 9-19 and 10-1 to 10-161, "Ph" indicates a phenyl group, "TMS" indicates a trimethylsilyl group, and "*" indicates a binding site to a neighboring atom.

a1 in Formula A1-1 indicates the number of groups $R_1$ and may be an integer from 0 to 4. a2, a3, a4, a5, and a6 in Formulae A1-1, A1-2, A2-1 to A2-3, A3-1 to A3-3, A4-1, and A4-2 respectively indicate the number of groups $R_2$, the number of groups $R_3$, the number of groups $R_4$, the number of groups $R_5$, and the number of groups $R_6$ and may each independently be an integer from 0 to 20 (for example, an integer from 0 to 4). When a1 is two or more, a plurality of groups $R_1$ may be identical to or different from each other, when a2 is two or more, a plurality of groups $R_2$ may be identical to or different from each other, when a3 is two or more, a plurality of groups $R_3$ may be identical to or different from each other, when a4 is two or more, a plurality of groups $R_4$ may be identical to or different from each other, when a5 is two or more, a plurality of groups $R_5$ may be identical to or different from each other, and when a6 is two or more, a plurality of groups $R_6$ may be identical to or different from each other.

In an embodiment, $A_1$ in Formula 1 may be represented by one of Formulae A1-1(1) to A1-1(24) and A1-2(1) to A1-2(8):

Formula A1-1(1)

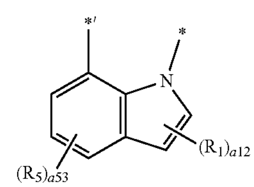

Formula A1-1(2)

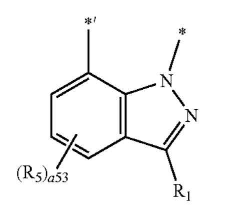

Formula A1-1(3)

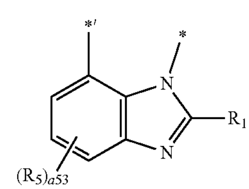

Formula A1-1(4)

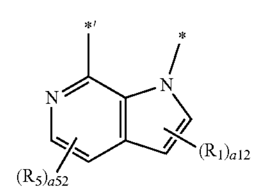

Formula A1-1(5)

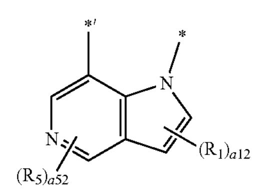

-continued
Formula A1-1(6)
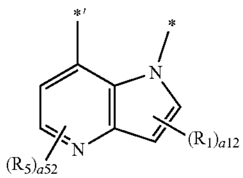
Formula A1-1(7)
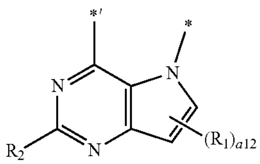
Formula A1-1(8)
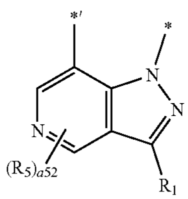
Formula A1-1(9)
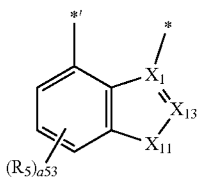
Formula A1-1(10)
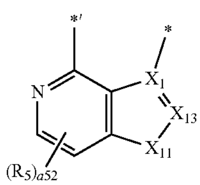
Formula A1-1(11)
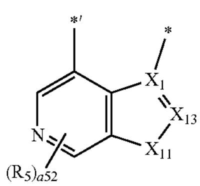
Formula A1-1(12)
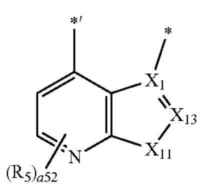
Formula A1-1(13)
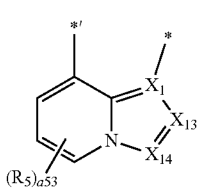
-continued
Formula A1-1(14)
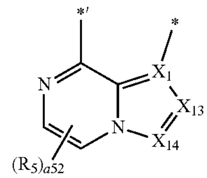
Formula A1-1(15)
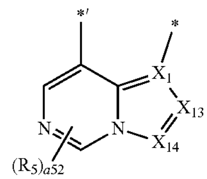
Formula A1-1(16)
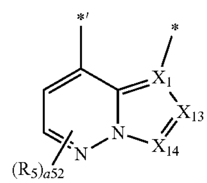
Formula A1-1(17)
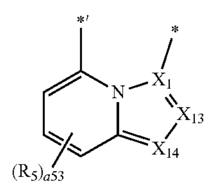
Formula A1-1(18)
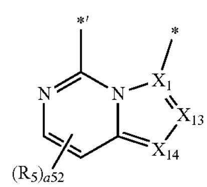
Formula A1-1(19)
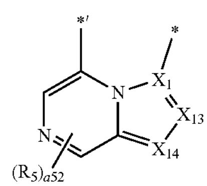
Formula A1-1(20)
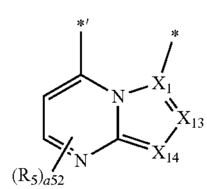
Formula A1-1(21)
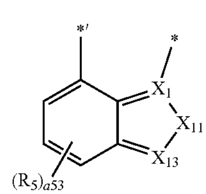

-continued

Formula A1-1(22)

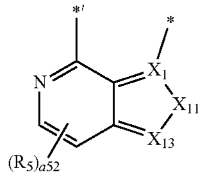

Formula A1-1(23)

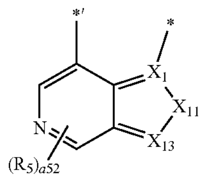

Formula A1-1(24)

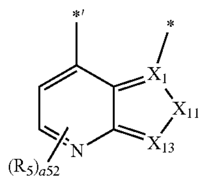

Formula A1-2(1)

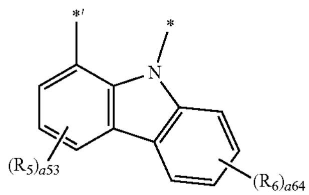

Formula A1-2(2)

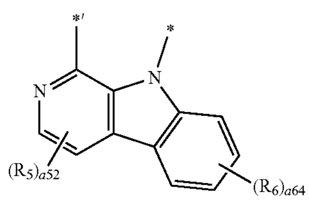

Formula A1-2(3)

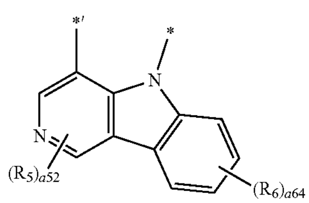

Formula A1-2(4)

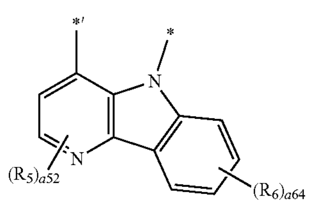

Formula A1-2(5)

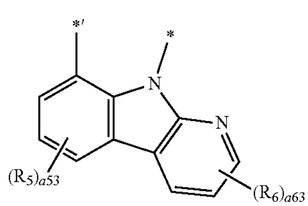

-continued

Formula A1-2(6)

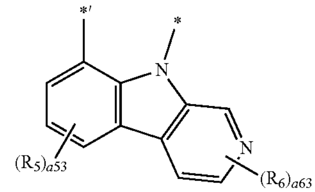

Formula A1-2(7)

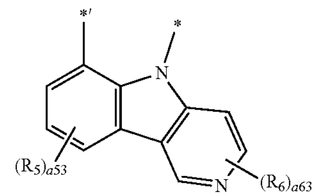

Formula A1-2(8)

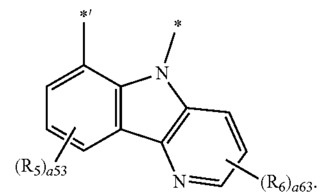

In Formulae A1-1(1) to A1-1(24) and A1-2(1) to A1-2(8), $X_1$, $R_1$, $R_5$, $R_6$, *, and *' are the same as described herein, $X_{11}$ may be O, S, N($R_{11}$), C($R_{11}$)($R_{12}$), or Si($R_{11}$)($R_{12}$), $X_{13}$ may be N or C($R_{13}$), $X_{14}$ may be N or C($R_{14}$), $R_{11}$ to $R_{14}$ are the same as described in connection with $R_1$, a64 may be an integer from 0 to 4, a53 and a63 may each independently be an integer from 0 to 3, and a12 and a52 may each independently be an integer from 0 to 2.

In one or more embodiments, $A_2$ in Formula 1 may be represented by one of Formulae A2-1(1) to A2-1(17), A2-2(1) to A2-2(58), and A2-3(1) to A2-3(58):

Formula A2-1(1)

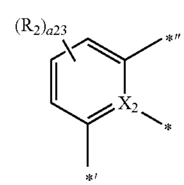

Formula A2-1(2)

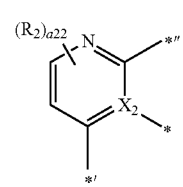

-continued
Formula A2-1(3)
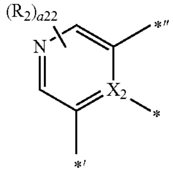
Formula A2-1(4)
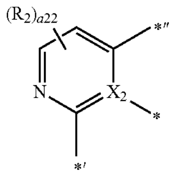
Formula A2-1(5)
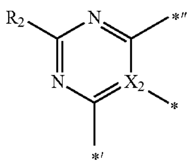
Formula A2-1(6)
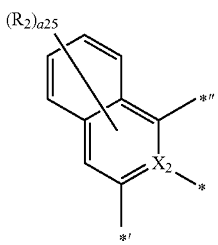
Formula A2-1(7)
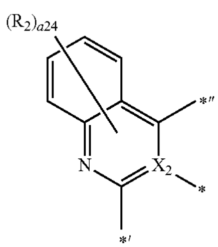
Formula A2-1(8)
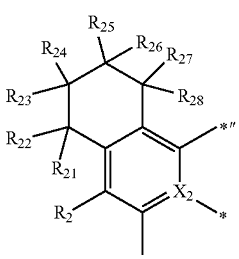
Formula A2-1(9)
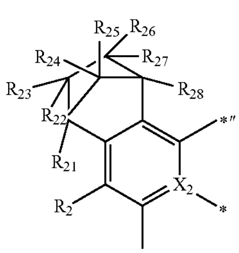
-continued
Formula A2-1(10)
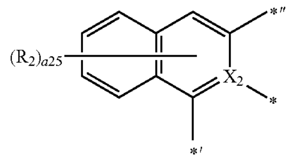
Formula A2-1(11)
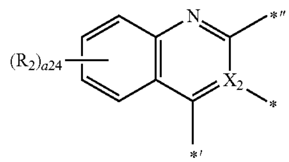
Formula A2-1(12)
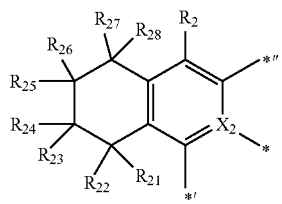
Formula A2-1(13)
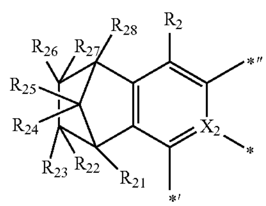
Formula A2-1(14)
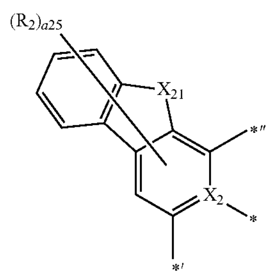
Formula A2-1(15)
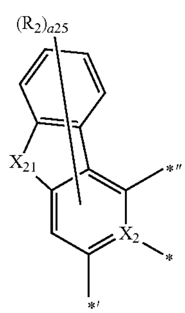
Formula A2-1(16)
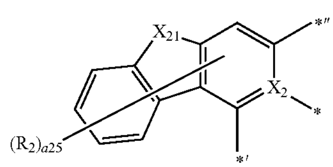

Formula A2-1(17)
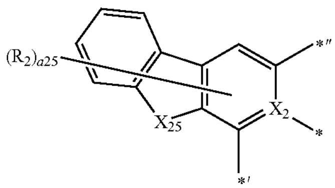
Formula A2-2(1)
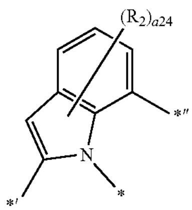
Formula A2-2(2)
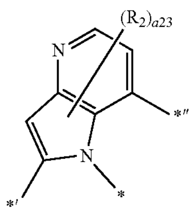
Formula A2-2(3)
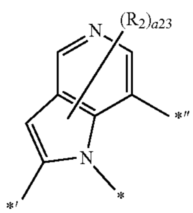
Formula A2-2(4)
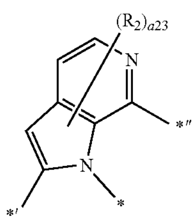
Formula A2-2(5)
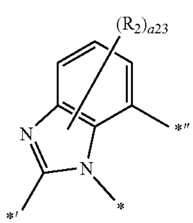
Formula A2-2(6)
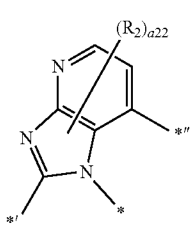
Formula A2-2(7)
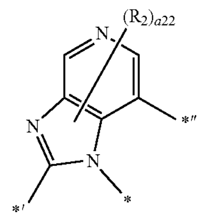
Formula A2-2(8)
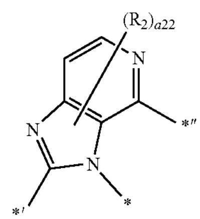
Formula A2-2(9)
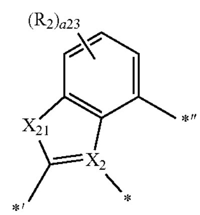
Formula A2-2(10)
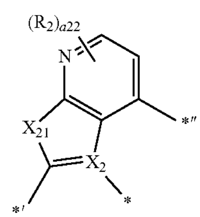
Formula A2-2(11)
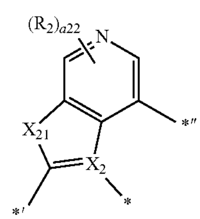
Formula A2-2(12)
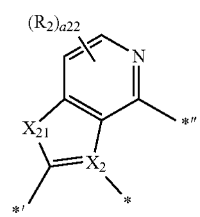
Formula A2-2(13)
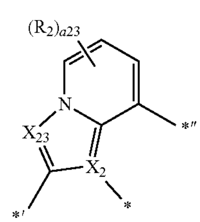

-continued
Formula A2-2(14)
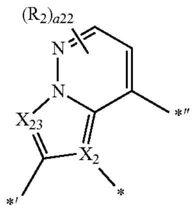
Formula A2-2(15)
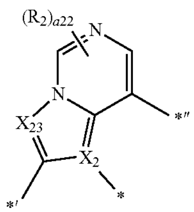
Formula A2-2(16)
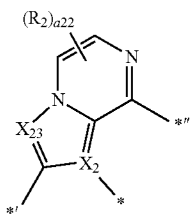
Formula A2-2(17)
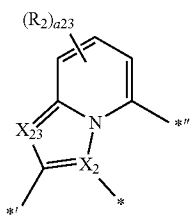
Formula A2-2(18)
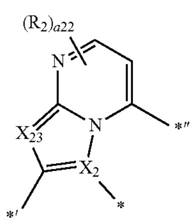
Formula A2-2(19)
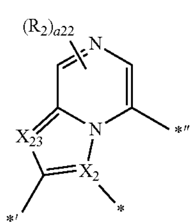
Formula A2-2(20)
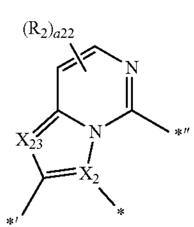
-continued
Formula A2-2(21)
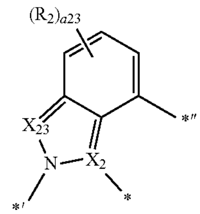
Formula A2-2(22)
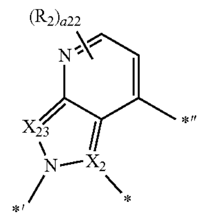
Formula A2-2(23)
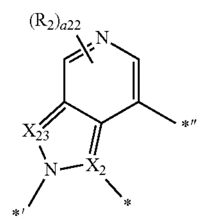
Formula A2-2(24)
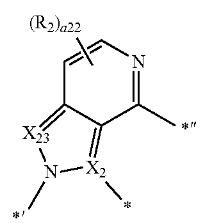
Formula A2-2(25)
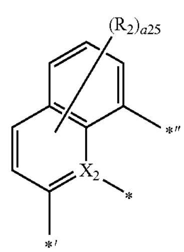
Formula A2-2(26)
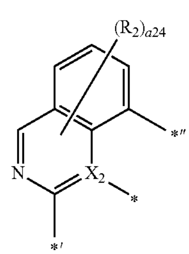

-continued
Formula A2-2(27)
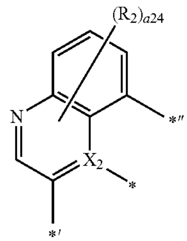
Formula A2-2(28)
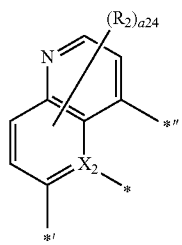
Formula A2-2(29)
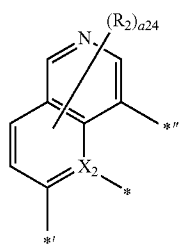
Formula A2-2(30)
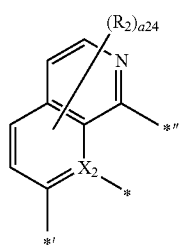
Formula A2-2(31)
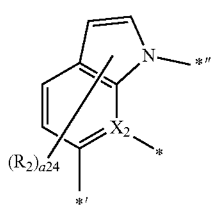
Formula A2-2(32)
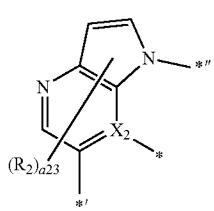
-continued
Formula A2-2(33)
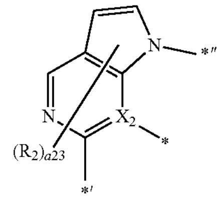
Formula A2-2(34)
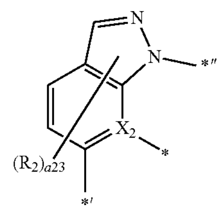
Formula A2-2(35)
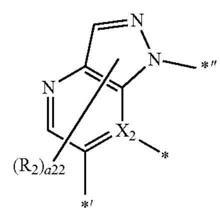
Formula A2-2(36)
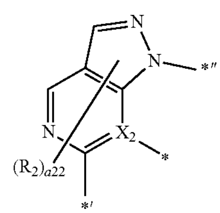
Formula A2-2(37)
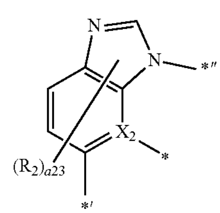
Formula A2-2(38)
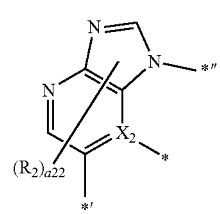
Formula A2-2(39)
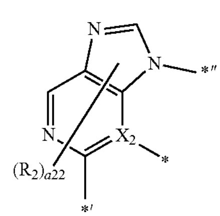

-continued
Formula A2-2(40)
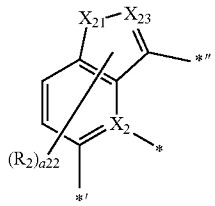
Formula A2-2(41)
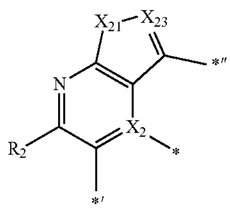
Formula A2-2(42)
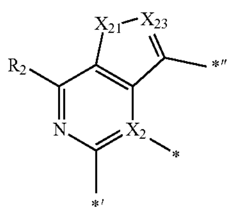
Formula A2-2(43)
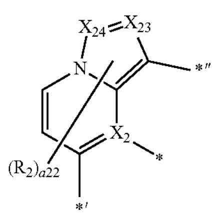
Formula A2-2(44)
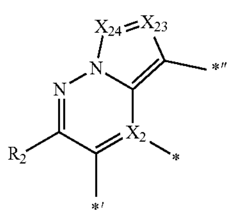
Formula A2-2(45)
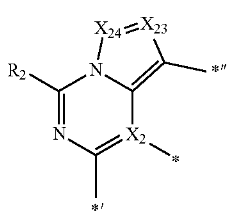
Formula A2-2(46)
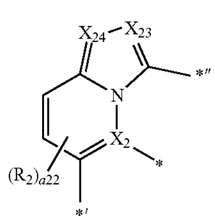
-continued
Formula A2-2(47)
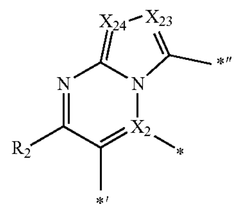
Formula A2-2(48)
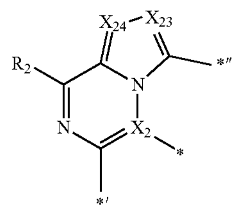
Formula A2-2(49)
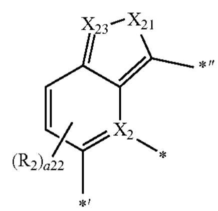
Formula A2-2(50)
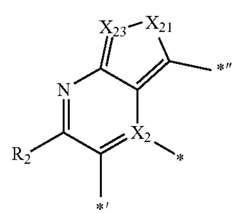
Formula A2-2(51)
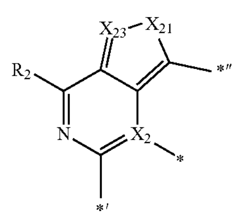
Formula A2-2(52)
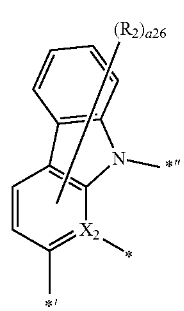

-continued
Formula A2-2(53)
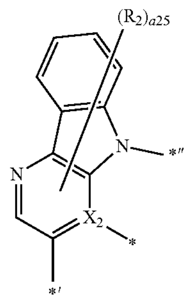
Formula A2-2(54)
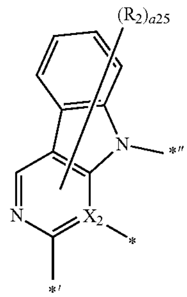
Formula A2-2(55)
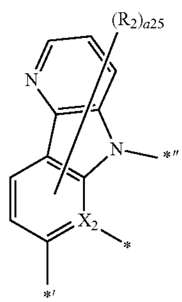
Formula A2-2(56)
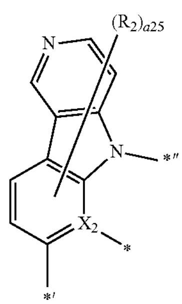
Formula A2-2(57)
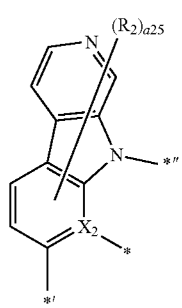
-continued
Formula A2-2(58)
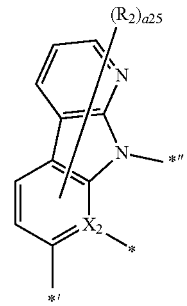
Formula A2-3(1)
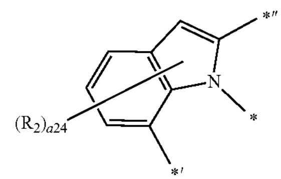
Formula A2-3(2)
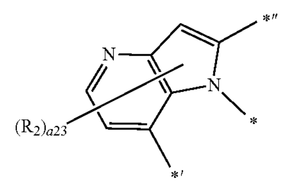
Formula A2-3(3)
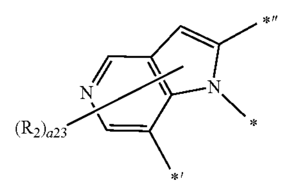
Formula A2-3(4)
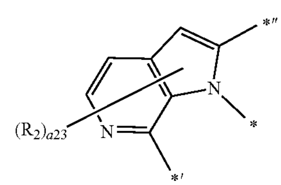
Formula A2-3(5)
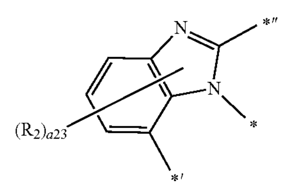
Formula A2-3(6)
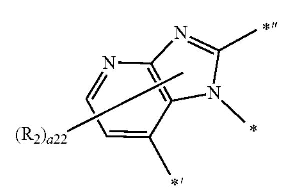

Formula A2-3(7)
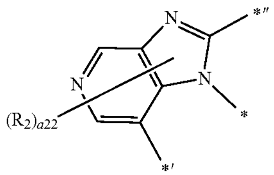
Formula A2-3(8)
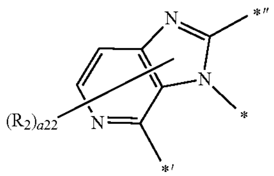
Formula A2-3(9)
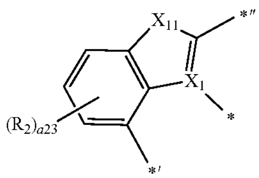
Formula A2-3(10)
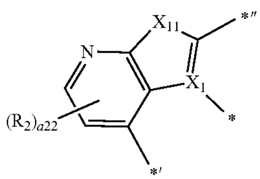
Formula A2-3(11)
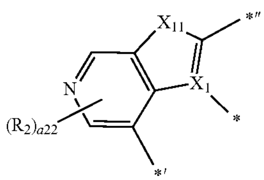
Formula A2-3(12)
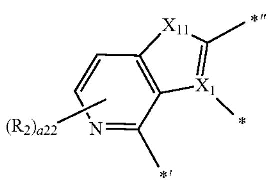
Formula A2-3(13)
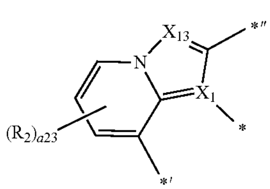
Formula A2-3(14)
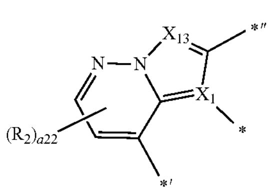
Formula A2-3(15)
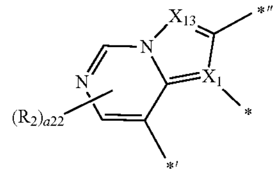
Formula A2-3(16)
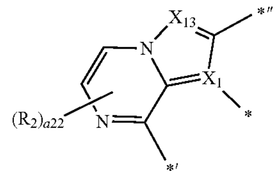
Formula A2-3(17)
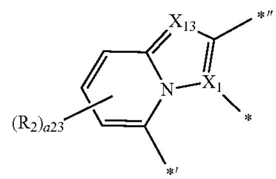
Formula A2-3(18)
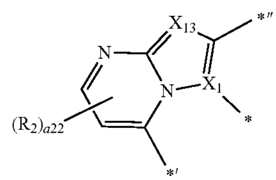
Formula A2-3(19)
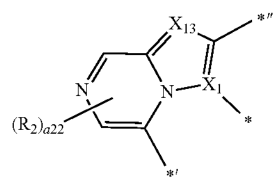
Formula A2-3(20)
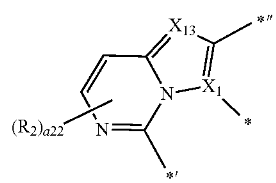
Formula A2-3(21)
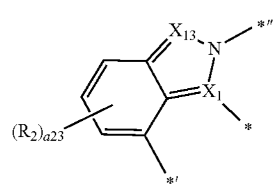
Formula A2-3(22)
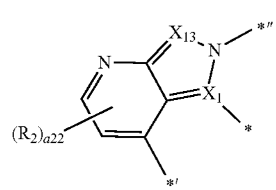

-continued
Formula A2-3(23)
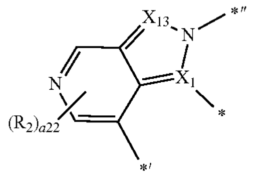
Formula A2-3(24)
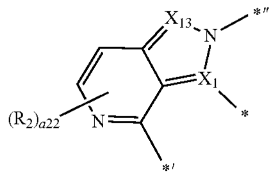
Formula A2-3(25)
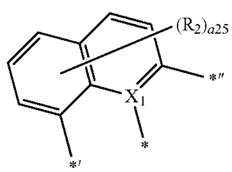
Formula A2-3(26)
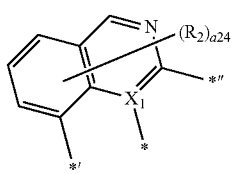
Formula A2-3(27)
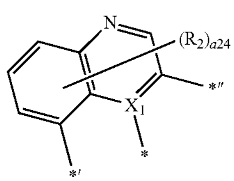
Formula A2-3(28)
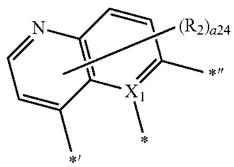
Formula A2-3(29)
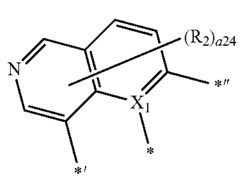
Formula A2-3(30)
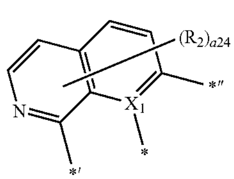
-continued
Formula A2-3(31)
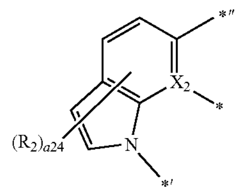
Formula A2-3(32)
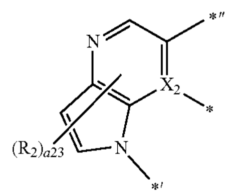
Formula A2-3(33)
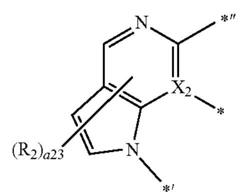
Formula A2-3(34)
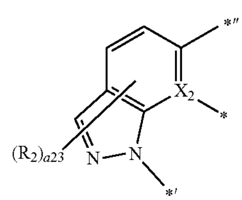
Formula A2-3(35)
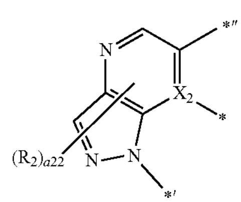
Formula A2-3(36)
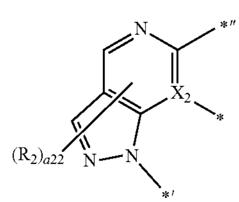
Formula A2-3(37)
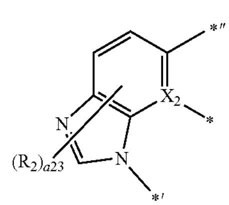

Formula A2-3(38)
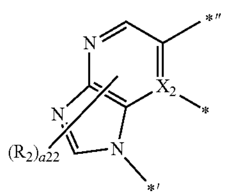
Formula A2-3(39)
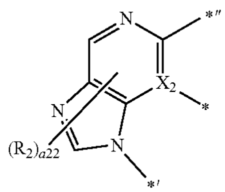
Formula A2-3(40)
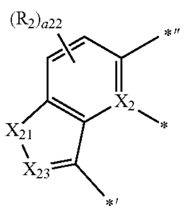
Formula A2-3(41)
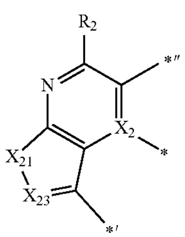
Formula A2-3(42)
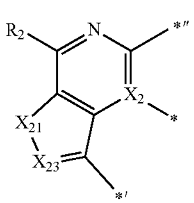
Formula A2-3(43)
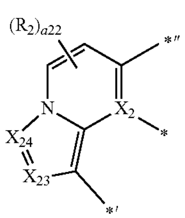
Formula A2-3(44)
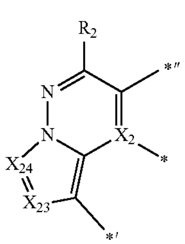
Formula A2-3(45)
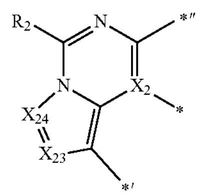
Formula A2-3(46)
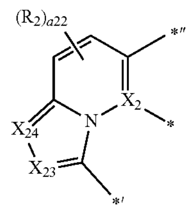
Formula A2-3(47)
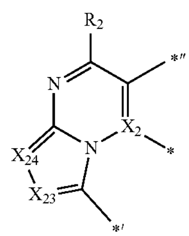
Formula A2-3(48)
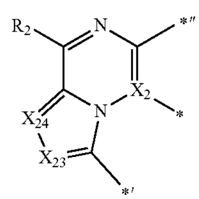
Formula A2-3(49)
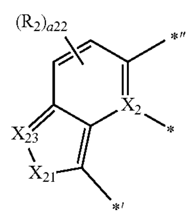
Formula A2-3(50)
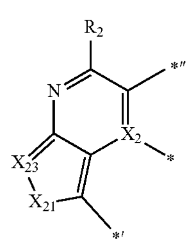
Formula A2-3(51)
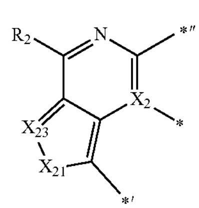

-continued

Formula A2-3(52)

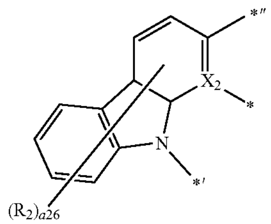

Formula A2-3(53)

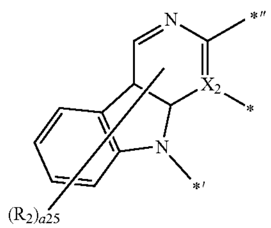

Formula A2-3(54)

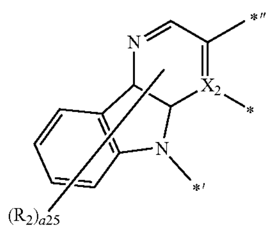

Formula A2-3(55)

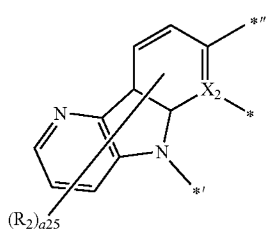

Formula A2-3(56)

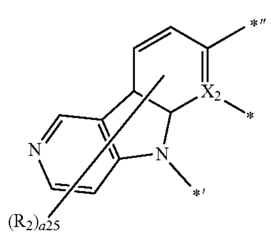

Formula A2-3(57)

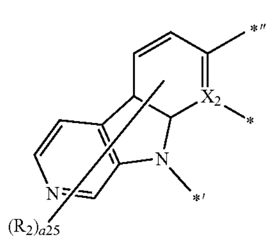

-continued

Formula A2-3(58)

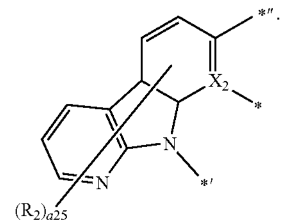

In Formulae A2-1 (1) to A2-1(17), A2-2(1) to A2-2(58), and A2-3(1) to A2-3(58), $X_2$ and $R_2$ are the same as described herein, $X_{21}$ may be O, S, $N(R_{21})$, $C(R_{21})(R_{22})$, or $Si(R_{21})(R_{22})$, $X_{23}$ may be N or $C(R_{23})$, $X_{24}$ may be N or $C(R_{24})$, $R_{21}$ to $R_{28}$ are the same as described in connection with $R_2$, a26 may be an integer from 0 to 6, a25 may be an integer from 0 to 5, a24 may be an integer from 0 to 4, a23 may be an integer from 0 to 3, a22 may be an integer from 0 to 2, and

*, *', and *" are the same as described in connection with *, *', and *" in Formula A2-1.

In one or more embodiments, $A_3$ in Formula 1 may be represented by one of Formulae A3-1(1) to A3-1(21), A3-2 (1) to A3-2(58), and A3-3(1) to A3-3(58):

Formula A3-1(1)

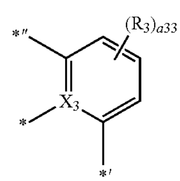

Formula A3-1(2)

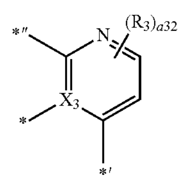

Formula A3-1(3)

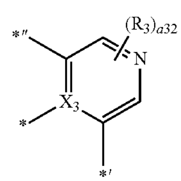

Formula A3-1(4)

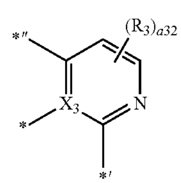

-continued
Formula A3-1(5)
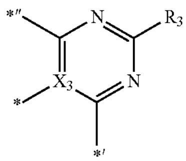
Formula A3-1(6)
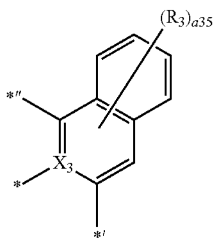
Formula A3-1(7)
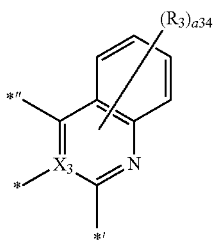
Formula A3-1(8)
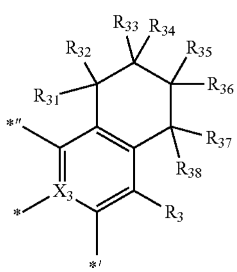
Formula A3-1(9)
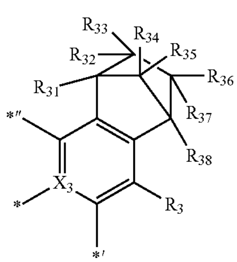
Formula A3-1(10)
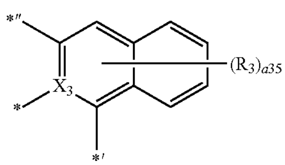
Formula A3-1(11)
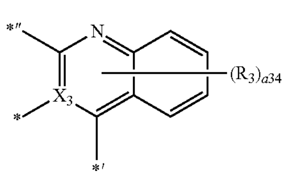
-continued
Formula A3-1(12)
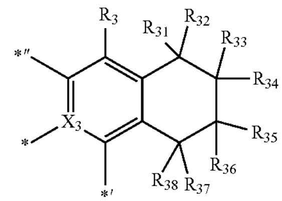
Formula A3-1(13)
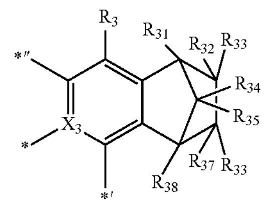
Formula A3-1(14)
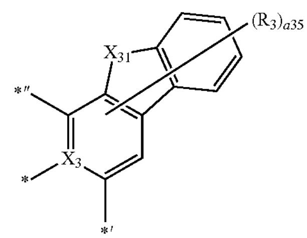
Formula A3-1(15)
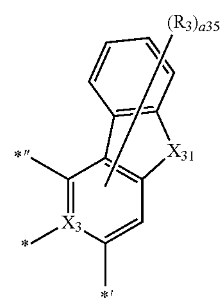
Formula A3-1(16)
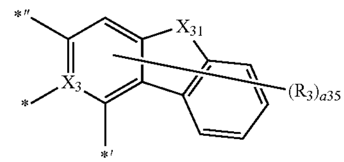
Formula A3-1(17)
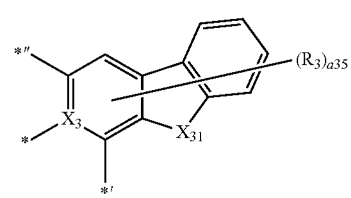
Formula A3-1(18)
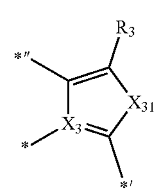

-continued
Formula A3-1(19)
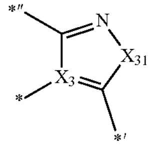
Formula A3-1(20)
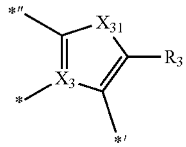
Formula A3-1(21)
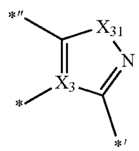
Formula A3-2(1)
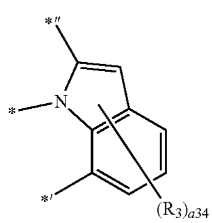
Formula A3-2(2)
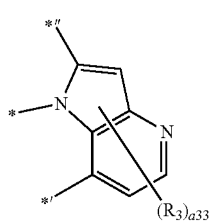
Formula A3-2(3)
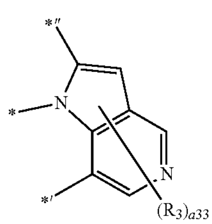
Formula A3-2(4)
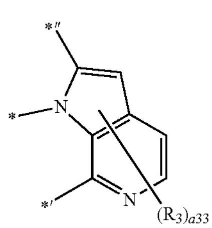
-continued
Formula A3-2(5)
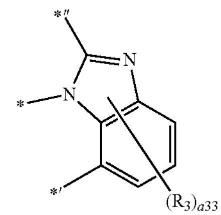
Formula A3-2(6)
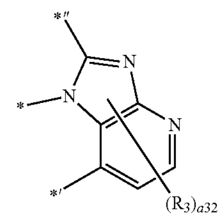
Formula A3-2(7)
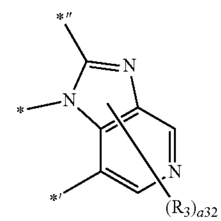
Formula A3-2(8)
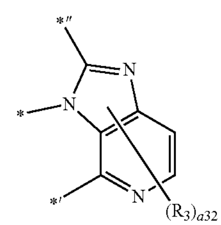
Formula A3-2(9)
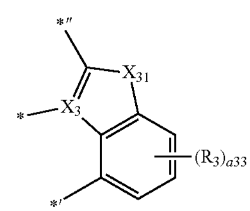
Formula A3-2(10)
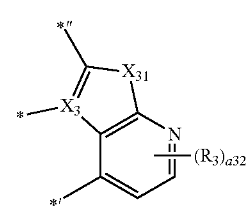
Formula A3-2(11)
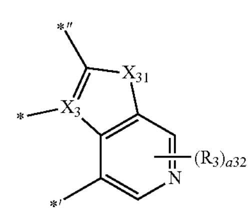

-continued
Formula A3-2(12)
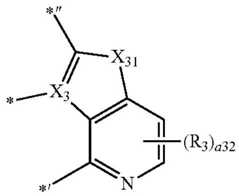
Formula A3-2(13)
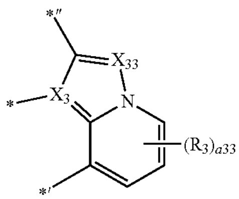
Formula A3-2(14)
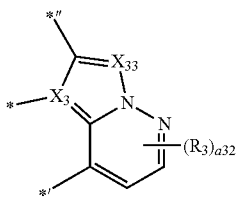
Formula A3-2(15)
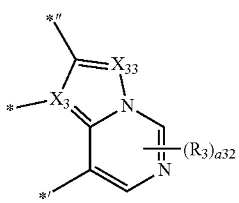
Formula A3-2(16)
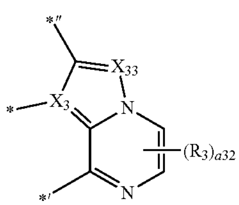
Formula A3-2(17)
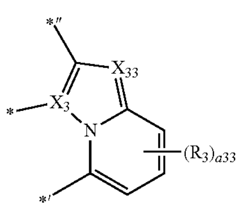
Formula A3-2(18)
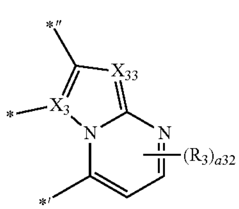
-continued
Formula A3-2(19)
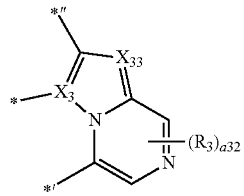
Formula A3-2(20)
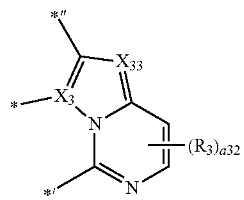
Formula A3-2(21)
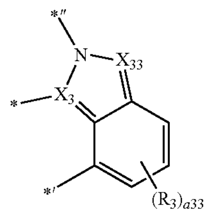
Formula A3-2(22)
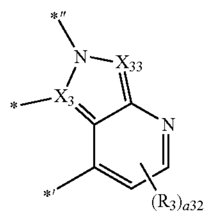
Formula A3-2(23)
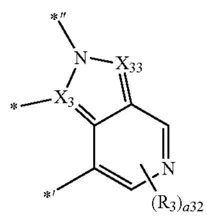
Formula A3-2(24)
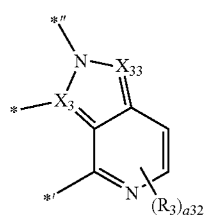
Formula A3-2(25)
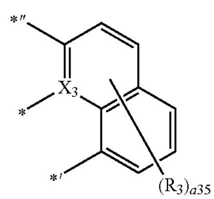

-continued
Formula A3-2(26)
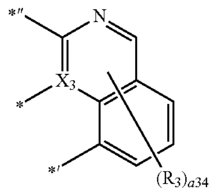
Formula A3-2(27)
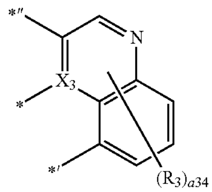
Formula A3-2(28)
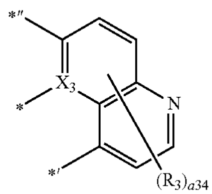
Formula A3-2(29)
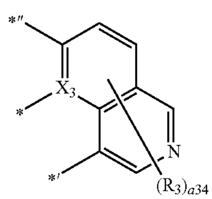
Formula A3-2(30)
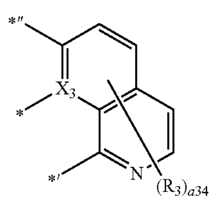
Formula A3-2(31)
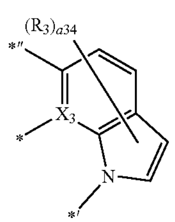
Formula A3-2(32)
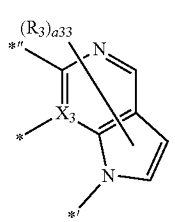
-continued
Formula A3-2(33)
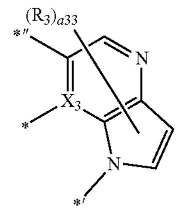
Formula A3-2(34)
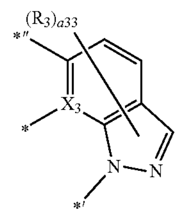
Formula A3-2(35)
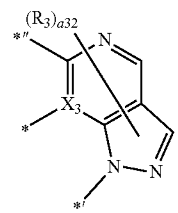
Formula A3-2(36)
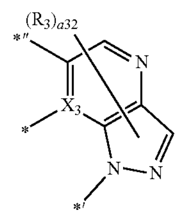
Formula A3-2(37)
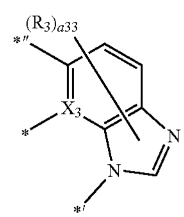
Formula A3-2(38)
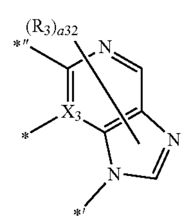
Formula A3-2(39)
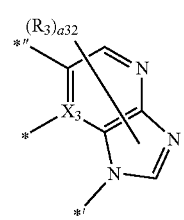

-continued
Formula A3-2(40)
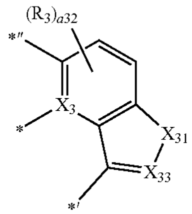
Formula A3-2(41)
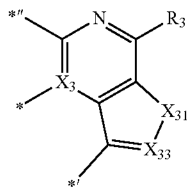
Formula A3-2(42)
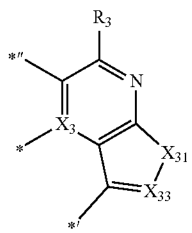
Formula A3-2(43)
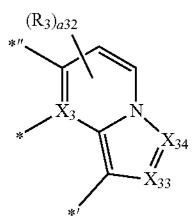
Formula A3-2(44)
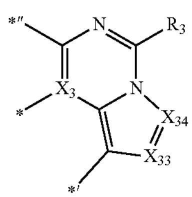
Formula A3-2(45)
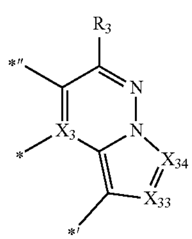
Formula A3-2(46)
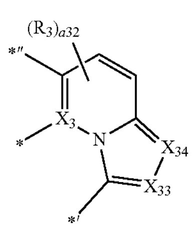
-continued
Formula A3-2(47)
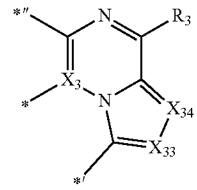
Formula A3-2(48)
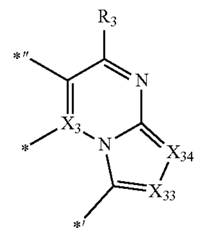
Formula A3-2(49)
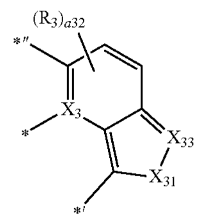
Formula A3-2(50)
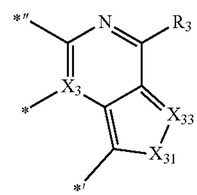
Formula A3-2(51)
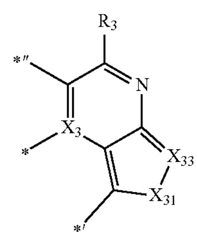
Formula A3-2(52)
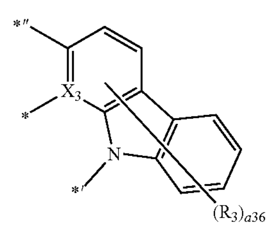
Formula A3-2(53)
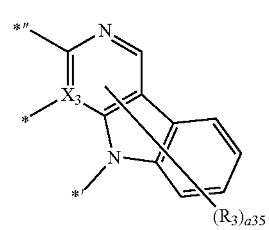

-continued
Formula A3-2(54)
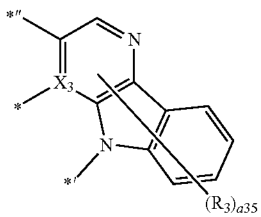
Formula A3-2(55)
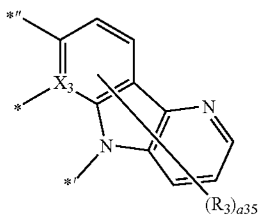
Formula A3-2(56)
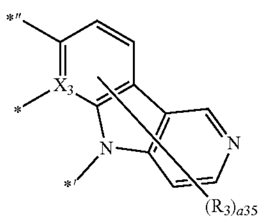
Formula A3-2(57)
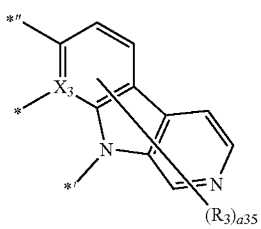
Formula A3-2(58)
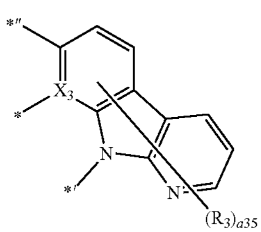
Formula A3-3(1)
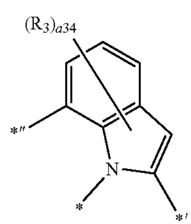
Formula A3-3(2)
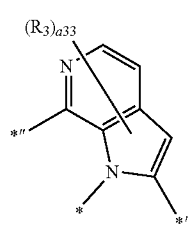
-continued
Formula A3-3(3)
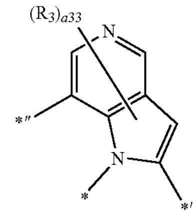
Formula A3-3(4)
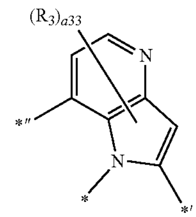
Formula A3-3(5)
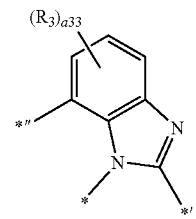
Formula A3-3(6)
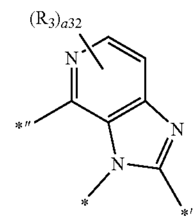
Formula A3-3(7)
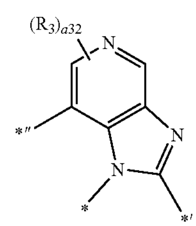
Formula A3-3(8)
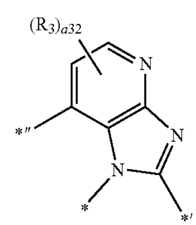
Formula A3-3(9)
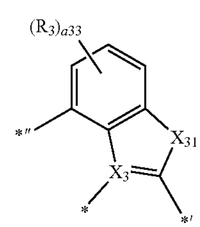

-continued
Formula A3-3(10)
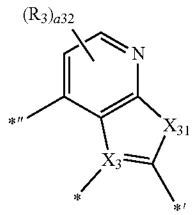
Formula A3-3(11)
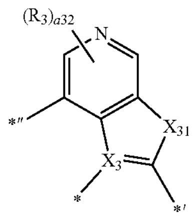
Formula A3-3(12)
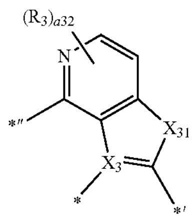
Formula A3-3(13)
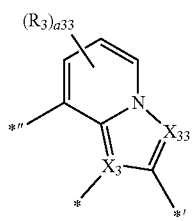
Formula A3-3(14)
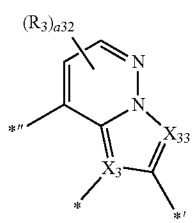
Formula A3-3(15)
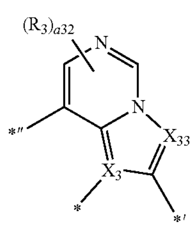
Formula A3-3(16)
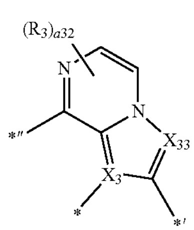
-continued
Formula A3-3(17)
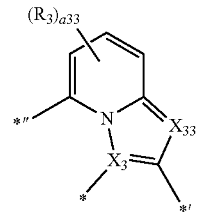
Formula A3-3(18)
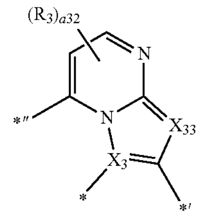
Formula A3-3(19)
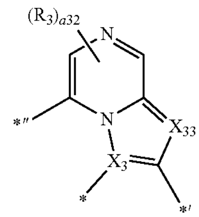
Formula A3-3(20)
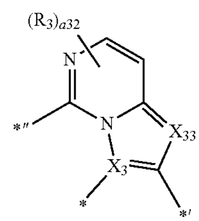
Formula A3-3(21)
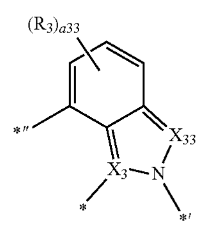
Formula A3-3(22)
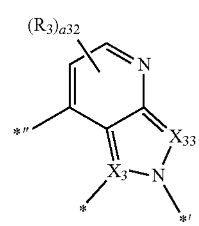
Formula A3-3(23)
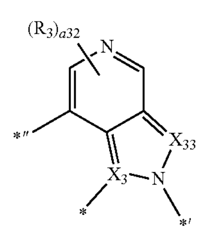

Formula A3-3(24)
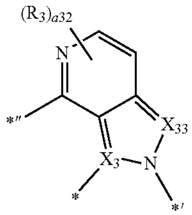
Formula A3-3(25)
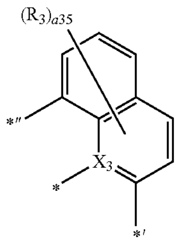
Formula A3-3(26)
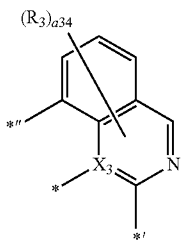
Formula A3-3(27)
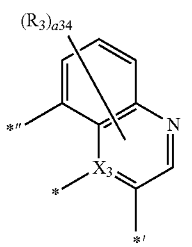
Formula A3-3(28)
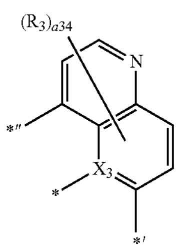
Formula A3-3(29)
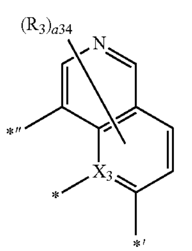
Formula A3-3(30)
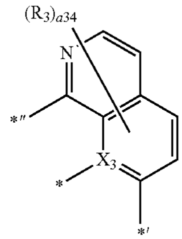
Formula A3-3(31)
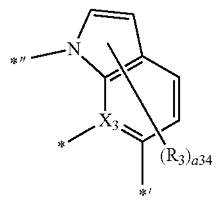
Formula A3-3(32)
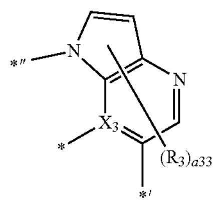
Formula A3-3(33)
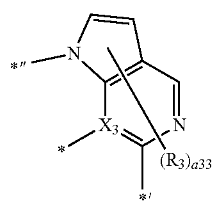
Formula A3-3(34)
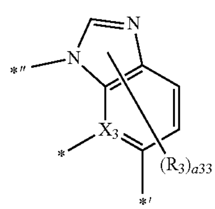
Formula A3-3(35)
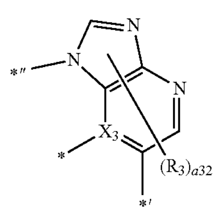
Formula A3-3(36)
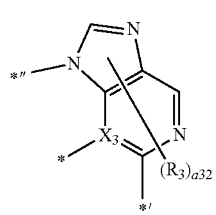

-continued
Formula A3-3(37)
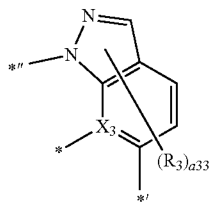
Formula A3-3(38)
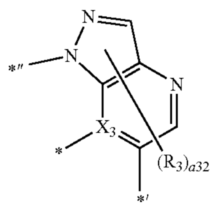
Formula A3-3(39)
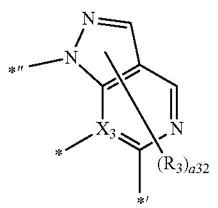
Formula A3-3(40)
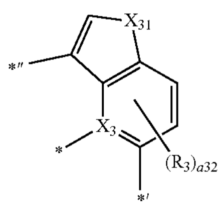
Formula A3-3(41)
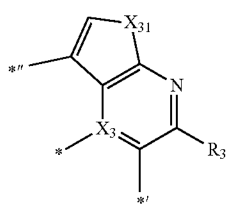
Formula A3-3(42)
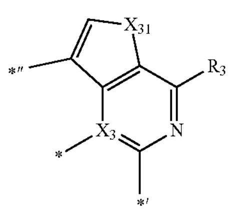
Formula A3-3(43)
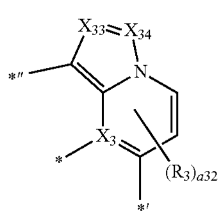
-continued
Formula A3-3(44)
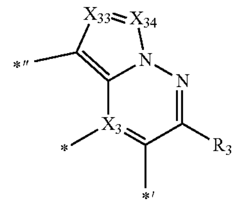
Formula A3-3(45)
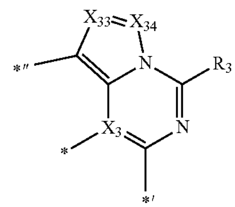
Formula A3-3(46)
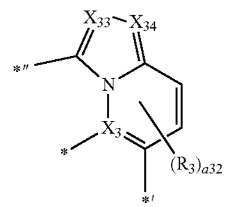
Formula A3-3(47)
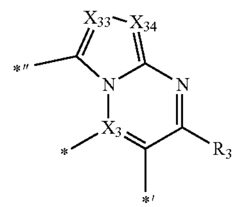
Formula A3-3(48)
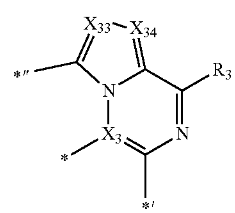
Formula A3-3(49)
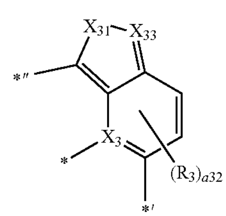
Formula A3-3(50)
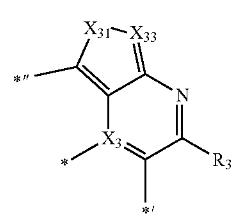

-continued

Formula A3-3(51)

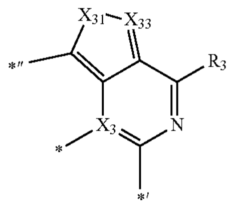

Formula A3-3(52)

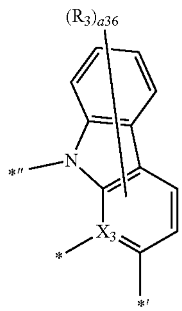

Formula A3-3(53)

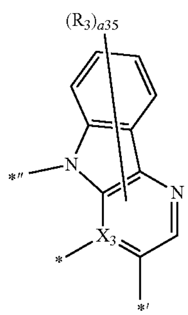

Formula A3-3(54)

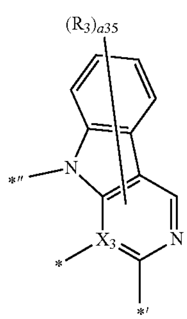

Formula A3-3(55)

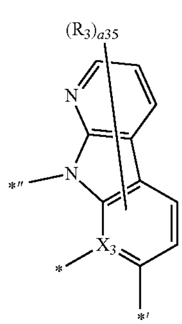

-continued

Formula A3-3(56)

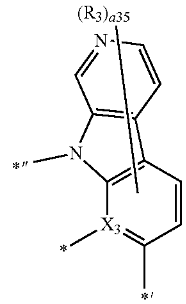

Formula A3-3(57)

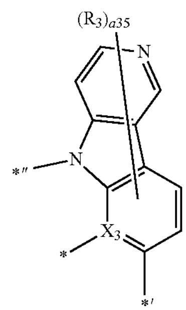

Formula A3-3(58)

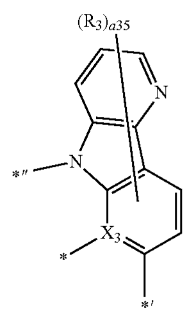

In Formulae A3-1 (1) to A3-1(21), A3-2(1) to A3-2(58), and A3-3(1) to A3-3(58), $X_3$ and $R_3$ are the same as described herein, $X_{31}$ may be O, S, $N(R_{31})$, $C(R_{31})(R_{32})$, or $Si(R_{31})(R_{32})$, $X_{33}$ may be N or $C(R_{33})$, $X_{34}$ may be N or $C(R_{34})$, $R_{31}$ to $R_{38}$ may be the same as described in connection with $R_3$, a36 may be an integer from 0 to 6, a35 may be an integer from 0 to 5, a34 may be an integer from 0 to 4, a33 may be an integer from 0 to 3, a32 may be an integer from 0 to 2, and

*, *' and *" are the same as described in connection with *, *', and *" in Formula A3-1.

In one or more embodiments, $A_4$ in Formula 1 may be represented by one of Formulae A4-1 (1) to A3-1(44) and A4-2(1) to A4-2(71):

-continued
Formula A4-1(1)
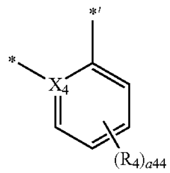
Formula A4-1(2)
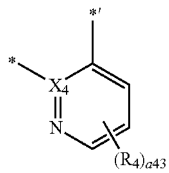
Formula A4-1(3)
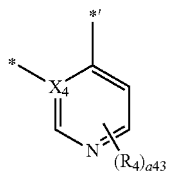
Formula A4-1(4)
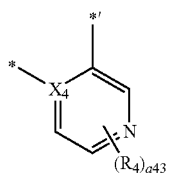
Formula A4-1(5)
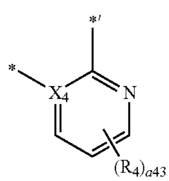
Formula A4-1(6)
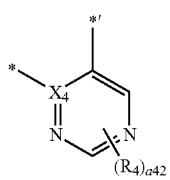
Formula A4-1(7)
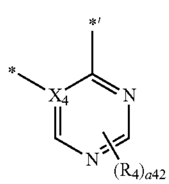
Formula A4-1(8)
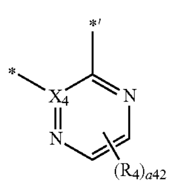
Formula A4-1(9)
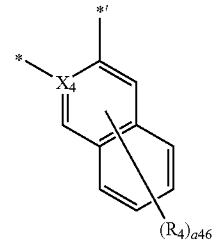
Formula A4-1(10)
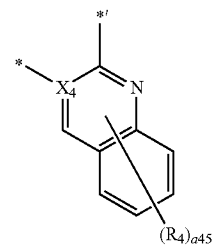
Formula A4-1(11)
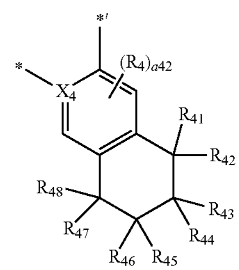
Formula A4-1(12)
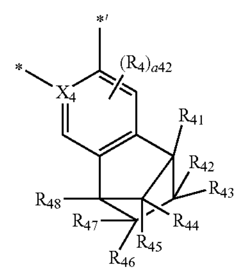
Formula A4-1(13)
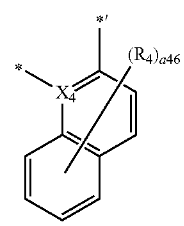
Formula A4-1(14)
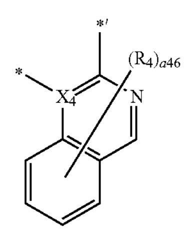

-continued
Formula A4-1(15)
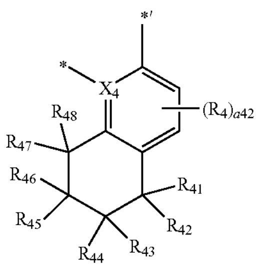
Formula A4-1(16)
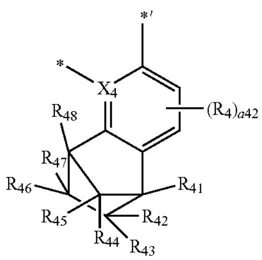
Formula A4-1(17)
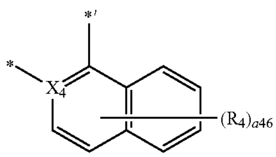
Formula A4-1(18)
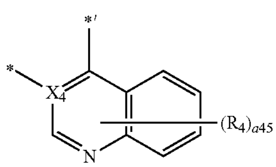
Formula A4-1(19)
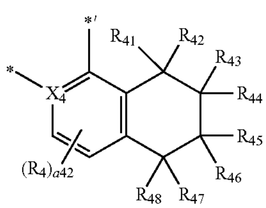
Formula A4-1(20)
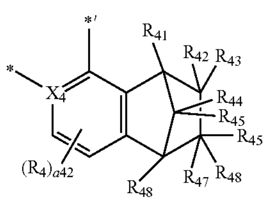
Formula A4-1(21)
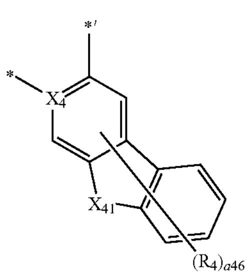
-continued
Formula A4-1(22)
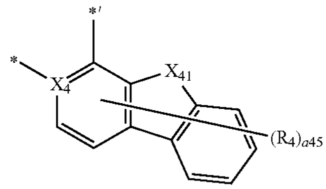
Formula A4-1(23)
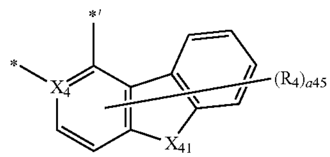
Formula A4-1(24)
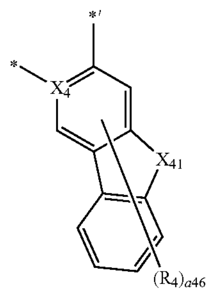
Formula A4-1(25)
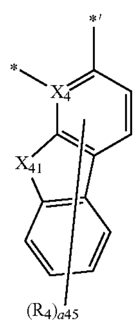
Formula A4-1(26)
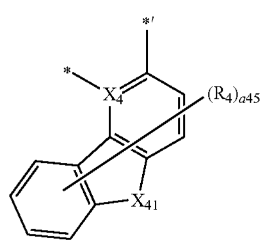
Formula A4-1(27)
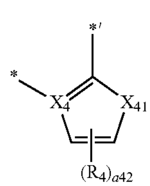
Formula A4-1(28)
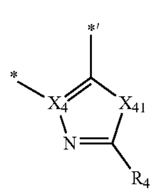

-continued
Formula A4-1(29)
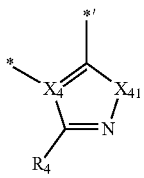
Formula A4-1(30)
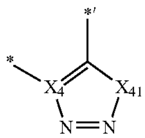
Formula A4-1(31)
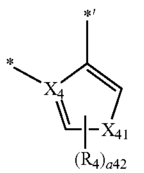
Formula A4-1(32)
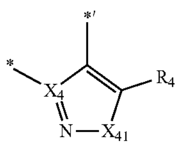
Formula A4-1(33)
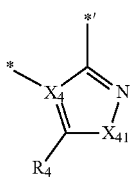
Formula A4-1(34)
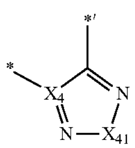
Formula A4-1(35)
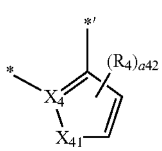
Formula A4-1(36)
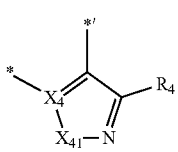
Formula A4-1(37)
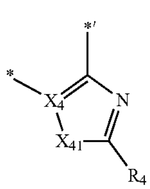
-continued
Formula A4-1(38)
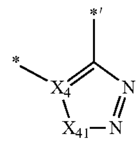
Formula A4-1(39)
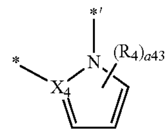
Formula A4-1(40)
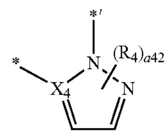
Formula A4-1(41)
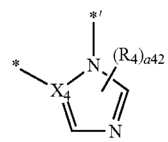
Formula A4-1(42)
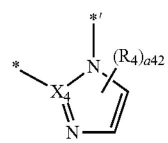
Formula A4-1(43)
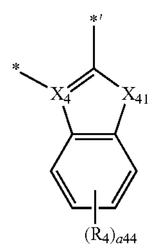
Formula A4-1(44)
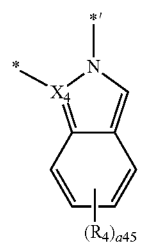
Formula A4-2(1)
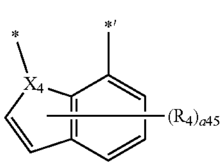
Formula A4-2(2)
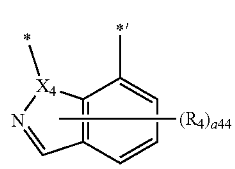

Formula A4-2(3)
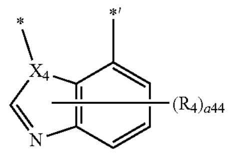
Formula A4-2(4)
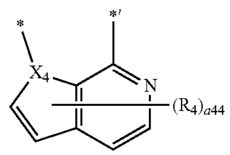
Formula A4-2(5)
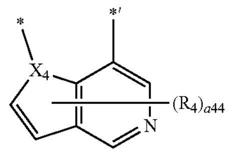
Formula A4-2(6)
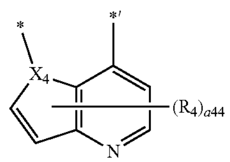
Formula A4-2(7)
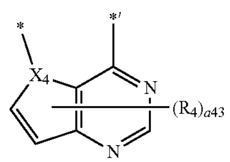
Formula A4-2(8)
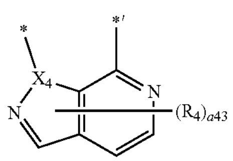
Formula A4-2(9)
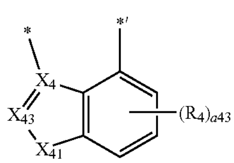
Formula A4-2(10)
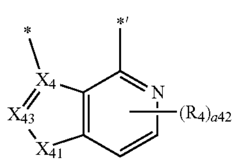
Formula A4-2(11)
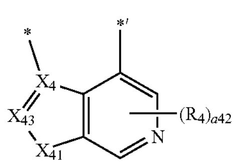
Formula A4-2(12)
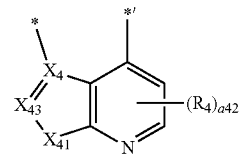
Formula A4-2(13)
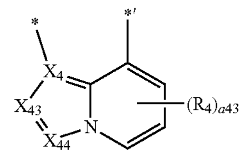
Formula A4-2(14)
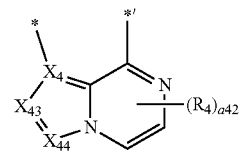
Formula A4-2(15)
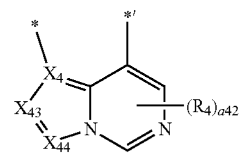
Formula A4-2(16)
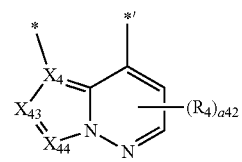
Formula A4-2(17)
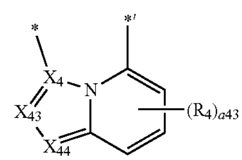
Formula A4-2(18)
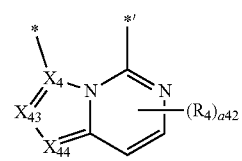
Formula A4-2(19)
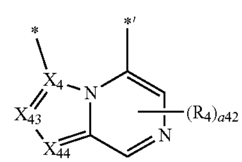
Formula A4-2(20)
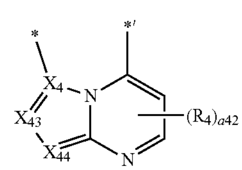

-continued
Formula A4-2(21)
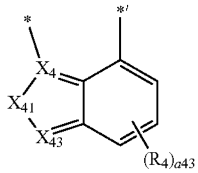
Formula A4-2(22)
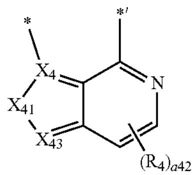
Formula A4-2(23)
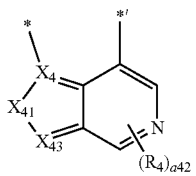
Formula A4-2(24)
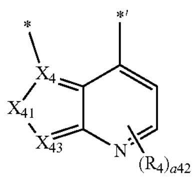
Formula A4-2(25)
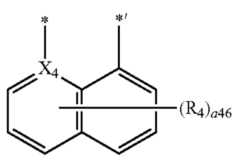
Formula A4-2(26)
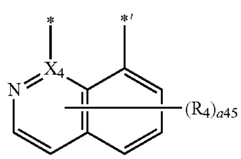
Formula A4-2(27)
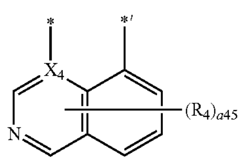
Formula A4-2(28)
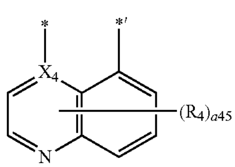
Formula A4-2(29)
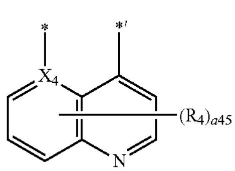
-continued
Formula A4-2(30)
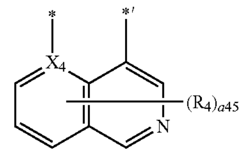
Formula A4-2(31)
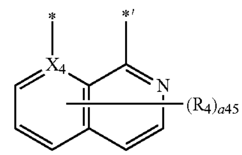
Formula A4-2(32)
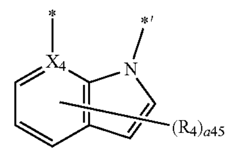
Formula A4-2(33)
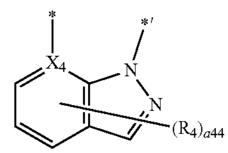
Formula A4-2(34)
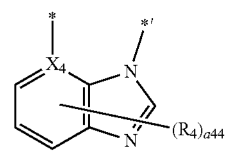
Formula A4-2(35)
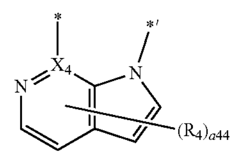
Formula A4-2(36)
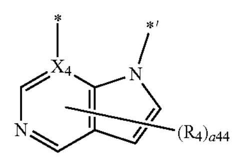
Formula A4-2(37)
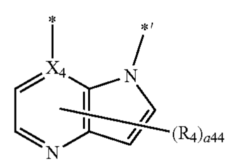
Formula A4-2(38)
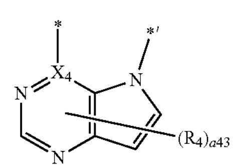
Formula A4-2(39)
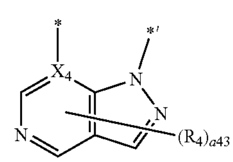

Formula A4-2(40)
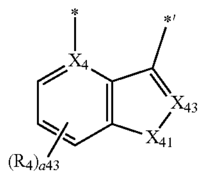
Formula A4-2(41)
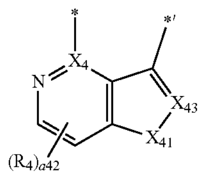
Formula A4-2(42)
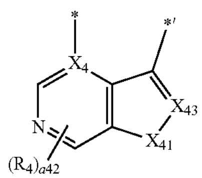
Formula A4-2(43)
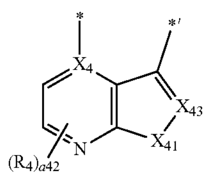
Formula A4-2(44)
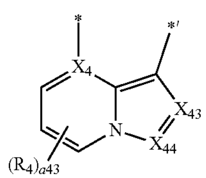
Formula A4-2(45)
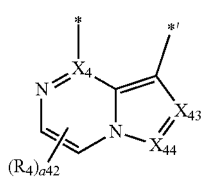
Formula A4-2(46)
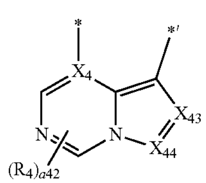
Formula A4-2(47)
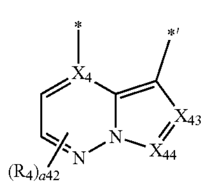
Formula A4-2(48)
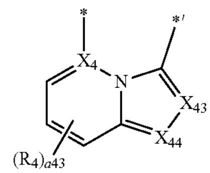
Formula A4-2(49)
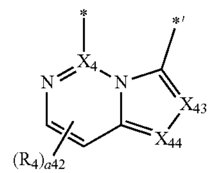
Formula A4-2(50)
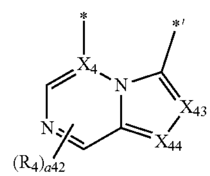
Formula A4-2(51)
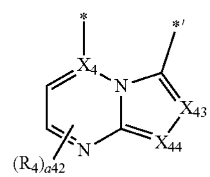
Formula A4-2(52)
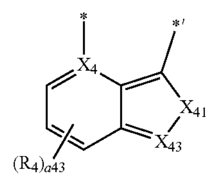
Formula A4-2(53)
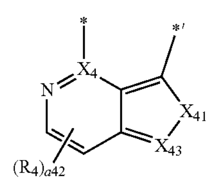
Formula A4-2(54)
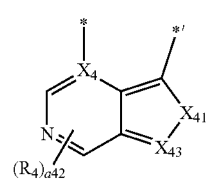
Formula A4-2(55)
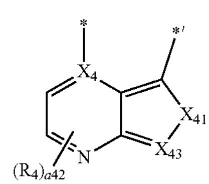

-continued
Formula A4-2(56)
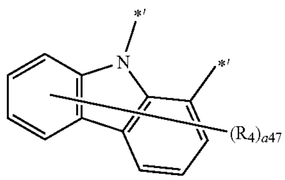
Formula A4-2(57)
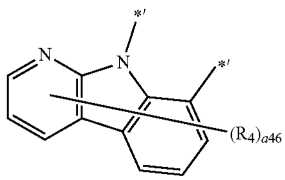
Formula A4-2(58)
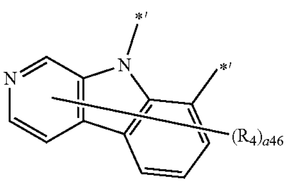
Formula A4-2(59)
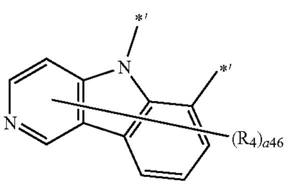
Formula A4-2(60)
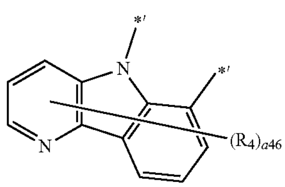
Formula A4-2(61)
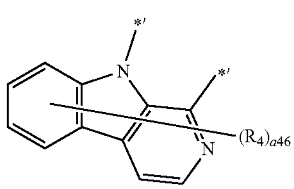
Formula A4-2(62)
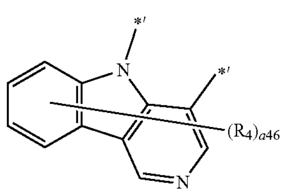
Formula A4-2(63)
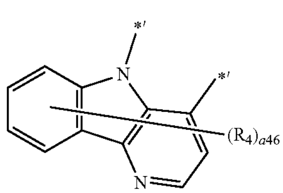
-continued
Formula A4-2(64)
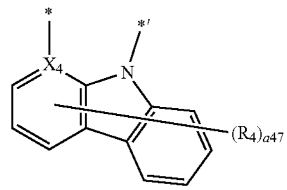
Formula A4-2(65)
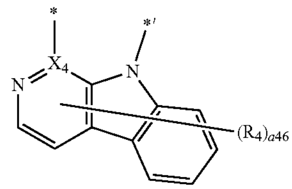
Formula A4-2(66)
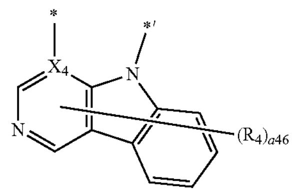
Formula A4-2(67)
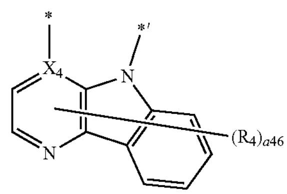
Formula A4-2(68)
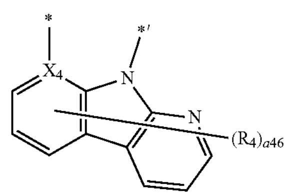
Formula A4-2(69)
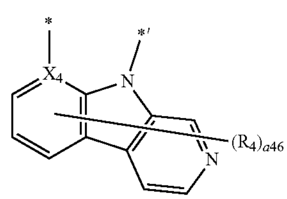
Formula A4-2(70)
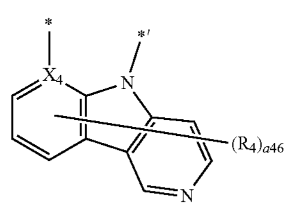
Formula A4-2(71)
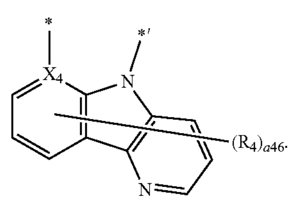

In Formulae A4-1 (1) to A4-1 (44) and A4-2(1) to A4-2(71), $X_4$, $R_4$, *, and *' are the same as described herein, $X_{41}$ may be O, S, $N(R_{41})$, $C(R_{41})(R_{42})$, or $Si(R_{41})(R_{42})$, $X_{43}$ may be N or $C(R_{43})$, $X_{44}$ may be N or $C(R_{44})$, $R_{41}$ to $R_{48}$ are the same as described in connection with $R_4$, a47 may be an integer from 0 to 7, a46 may be an integer from 0 to 6, a45 may be an integer from 0 to 5, a44 may be an integer from 0 to 4, a43 may be an integer from 0 to 3, and a42 may be an integer from 0 to 2.

In one or more embodiments, $A_2$ in Formula 1 may be represented by Formula A2-2 (for example, one of Formulae A2-2(1) to A2-2(58)).

$A_1$ may be represented by one of Formulae A1-1-1 to A1-1-10 and A1-2-1 to A1-2-4, $A_2$ may be represented by one of Formulae A2-2-1 to A2-2-4, $A_3$ may be represented by one of Formulae A3-1-1 to A3-1-10, and/or $A_4$ may be represented by one of Formulae A4-1-1 to A4-1-14, but embodiments of the present disclosure are not limited thereto:

Formula A1-1-1

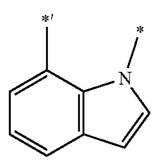

Formula A1-1-2

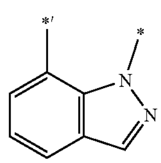

Formula A1-1-3

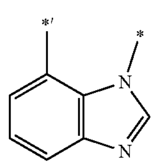

Formula A1-1-4

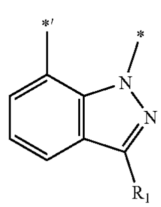

Formula A1-1-5

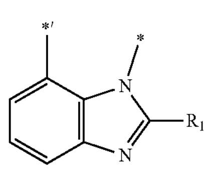

-continued

Formula A1-1-6

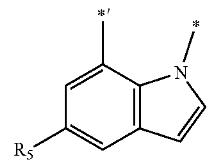

Formula A1-1-7

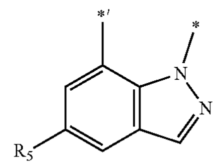

Formula A1-1-8

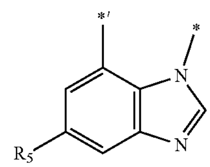

Formula A1-1-9

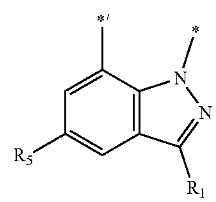

Formula A1-1-10

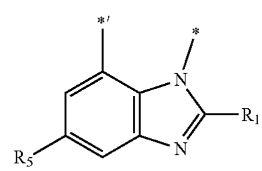

Formula A1-2-1

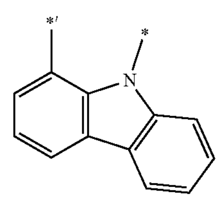

Formula A1-2-2

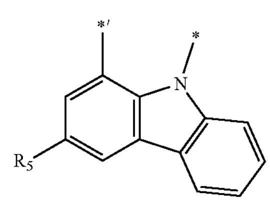

Formula A1-2-3

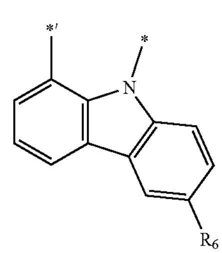

-continued
Formula A1-2-4
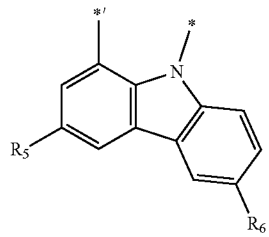
Formula A2-2-1
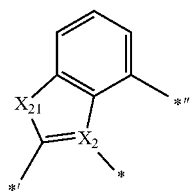
Formula A2-2-2
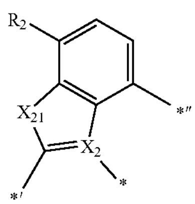
Formula A2-2-3
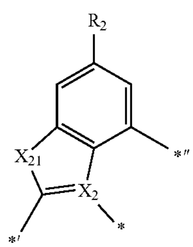
Formula A2-2-4
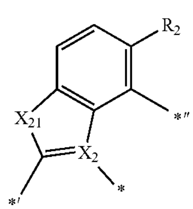
Formula A3-3-1
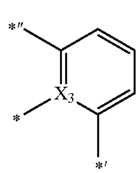
Formula A3-3-2
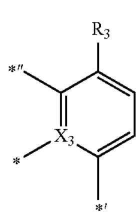
-continued
Formula A3-3-3
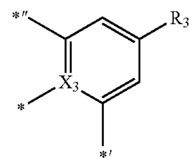
Formula A3-1-4
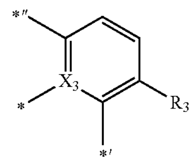
Formula A3-1-5
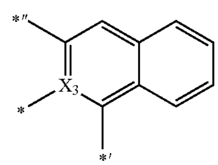
Formula A3-1-6
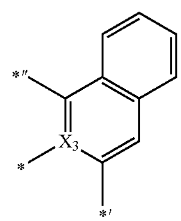
Formula A3-1-7
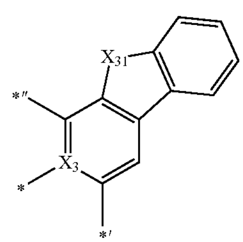
Formula A3-1-8
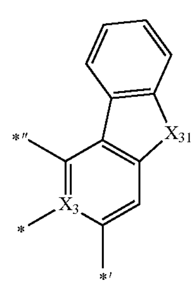
Formula A3-1-9
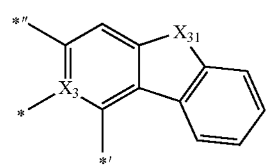

-continued
Formula A3-1-10
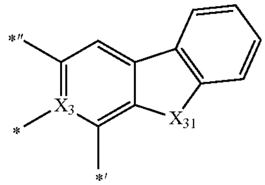
Formula A4-1-1
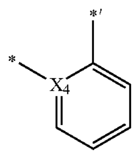
Formula A4-1-2
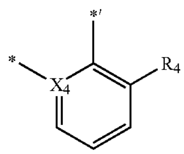
Formula A4-1-3
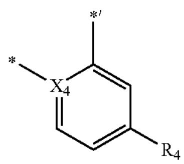
Formula A4-1-4
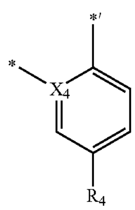
Formula A4-1-5
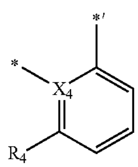
Formula A4-1-6
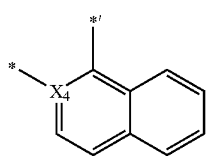
Formula A4-1-7
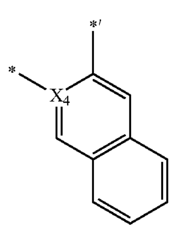
-continued
Formula A4-1-8
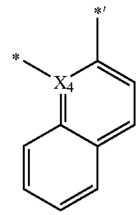
Formula A4-1-9
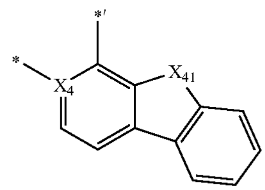
Formula A4-1-10
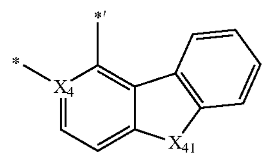
Formula A4-1-11
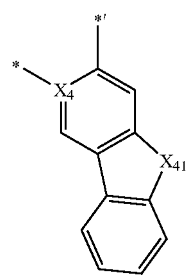
Formula A4-1-12
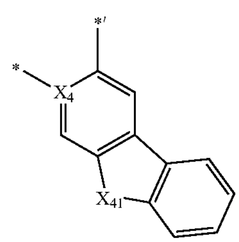
Formula A4-1-13
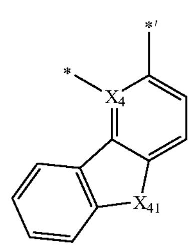

-continued

Formula A4-1-14

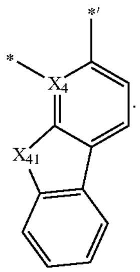

In Formulae A1-1-1 to A1-1-10, A1-2-1 to A1-2-4, A2-2-1 to A2-2-4, A3-1-1 to A3-1-10, and A4-1-1 to A4-1-14, $X_1$ to $X_4$ and $R_1$ to $R_6$ are the same as described herein, provided that $R_1$ to $R_6$ are not hydrogen, $X_{21}$ may be O, S, $N(R_{21})$, $C(R_{21})(R_{22})$, or $Si(R_{21})(R_{22})$, and $R_{21}$ and $R_{22}$ are the same as described in connection with $R_2$, $X_{31}$ may be O, S, $N(R_{31})$, $C(R_{31})(R_{32})$, or $Si(R_{31})(R_{32})$, and $R_{31}$ and $R_{32}$ are the same as described in connection with $R_3$, $X_{41}$ may be O, S, $N(R_{41})$, $C(R_{41})(R_{42})$, or $Si(R_{41})(R_{42})$, and $R_{41}$ and $R_{42}$ are the same as described in connection with $R_4$, in Formulae A1-1-1 to A1-1-10 and A1-2-1 to A1-2-4, * indicates a binding site to M in Formula 1, and *' indicates a binding site to $T_1$ in Formula 1, in Formulae A2-2-1 to A2-2-4, * indicates a binding site to M in Formula 1, *' indicates a binding site to $T_1$ in Formula 1, and *" indicates a binding site to $T_2$ in Formula 1, in Formulae A3-1-1 to A3-1-10, * indicates a binding site to M in Formula 1, *" indicates a binding site to $T_2$ in Formula 1, and *' indicates a binding site to $T_3$ in Formula 1, and in Formulae A4-1-1 to A4-1-14, * indicates a binding site to M in Formula 1, and *' indicates a binding site to $T_3$ in Formula 1.

In Formula 1, i) two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, ii) two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, iii) two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, iv) two of a plurality of neighboring groups $R_5$ may optionally be linked to form a substituted or unsubstituted $C_5$-$C_{30}$ carbocyclic group or a substituted or unsubstituted $C_1$-$C_{30}$ heterocyclic group, v) two of a plurality of neighboring groups $R_6$ may optionally be linked to form a substituted or unsubstituted $C_5$-$C_{30}$ carbocyclic group or a substituted or unsubstituted $C_1$-$C_{30}$ heterocyclic group, and vi) two or more neighboring groups selected from $R_2$ to $R_5$ may optionally be linked to form a substituted or unsubstituted $C_5$-$C_{30}$ carbocyclic group or a substituted or unsubstituted $C_1$-$C_{30}$ heterocyclic group.

For example, i) a substituted or unsubstituted $C_5$-$C_{30}$ carbocyclic group or a substituted or unsubstituted $C_1$-$C_{30}$ heterocyclic group, formed by optionally linking two of a plurality of neighboring groups $R_2$, ii) a substituted or unsubstituted $C_5$-$C_{30}$ carbocyclic group or a substituted or unsubstituted $C_1$-$C_{30}$ heterocyclic group, formed by optionally linking two of a plurality of neighboring groups $R_3$, iii) a substituted or unsubstituted $C_5$-$C_{30}$ carbocyclic group or a substituted or unsubstituted $C_1$-$C_{30}$ heterocyclic group, formed by optionally linking two of a plurality of neighboring groups $R_4$, iv) a substituted or unsubstituted $C_5$-$C_{30}$ carbocyclic group or a substituted or unsubstituted $C_1$-$C_{30}$ heterocyclic group, formed by optionally linking two of a plurality of neighboring groups $R_5$, v) a substituted or unsubstituted $C_5$-$C_{30}$ carbocyclic group or a substituted or unsubstituted $C_1$-$C_{30}$ heterocyclic group, formed by optionally linking two of a plurality of neighboring groups $R_6$, and vi) a substituted or unsubstituted $C_5$-$C_{30}$ carbocyclic group or a substituted or unsubstituted $C_1$-$C_{30}$ heterocyclic group, formed by optionally linking two neighboring groups selected from $R_2$ to $R_5$ in Formula 1 may each independently be selected from:

a cyclopentadiene group, a cyclohexane group, a cycloheptane group, an adamantane group, a bicycloheptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group; and a cyclopentadiene group, a cyclohexane group, a cycloheptane group, an adamantane group, a bicycloheptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each substituted with at least one $R_{10a}$, and $R_{10a}$ is the same as described in connection with $R_1$.

"An azabenzothiophene group, an azabenzofuran group, an azaindene group, an azaindole group, an azabenzosilole group, an azadibenzothiophene group, an azadibenzofuran group, an azafluorene group, an azacarbazole group, and an azadibenzosilole group" as used herein mean hetero-rings that respectively have the same backbones as "a benzothiophene group, a benzofuran group, an indene group, an indole group, a benzosilole group, a dibenzothiophene group, a dibenzofuran group, a fluorene group, a carbazole group, and a dibenzosilole group", provided that at least one of carbons forming rings thereof is substituted with nitrogen.

$A_1$ and $A_4$ in Formula 1 are not linked to each other. That is, the organometallic compound represented by Formula 1 may have three cyclometallated rings sharing M with one another.

i) When $A_1$ in Formula 1 is a moiety represented by Formula A1-1, the organometallic compound represented by Formula 1 may satisfy "Condition 1" below, and ii) when $A_1$ in Formula 1 is a moiety represented by Formula A1-2, the organometallic compound represented by Formula 1 may satisfy at least one of "Condition 1" to "Condition 3" below:

"Condition 1"

$A_2$ in Formula 1 is represented by Formula A2-2 or A2-3,

"Condition 2"

$A_3$ in Formula 1 is represented by Formula A3-2 or A3-3, and

"Condition 3"
$A_4$ in Formula 1 is represented by Formula A4-2.
In an embodiment, the organometallic compound satisfies "Condition 1".
The organometallic compound represented by Formula 1 may be selected from Compounds 1 to 273, but embodiments of the present disclosure are not limited thereto:
1
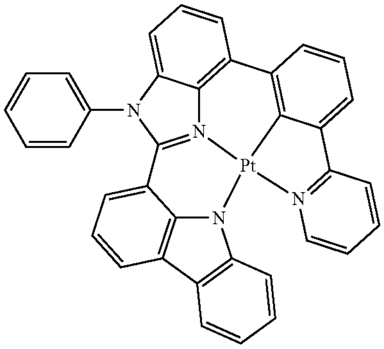
2
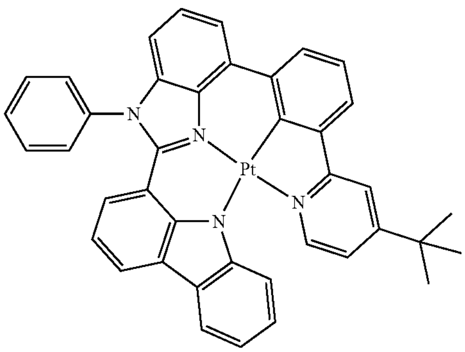
3
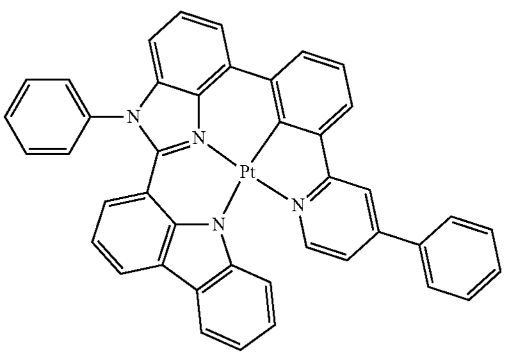
4
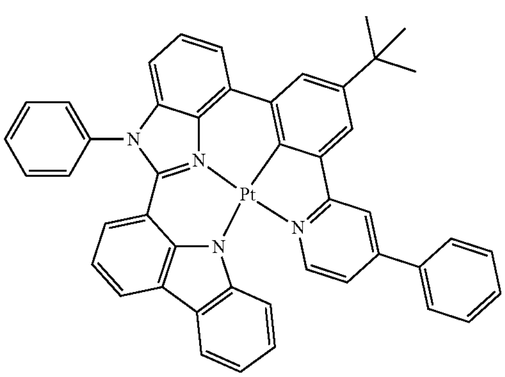
-continued
5
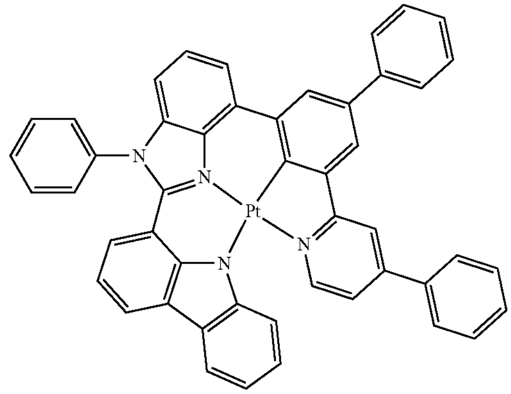
6
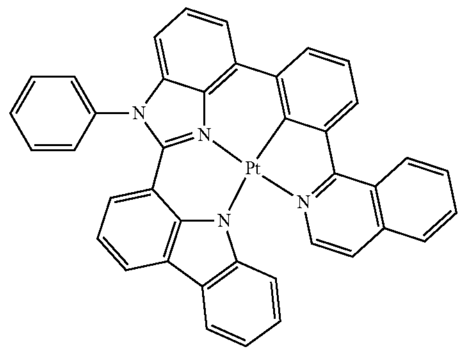
7
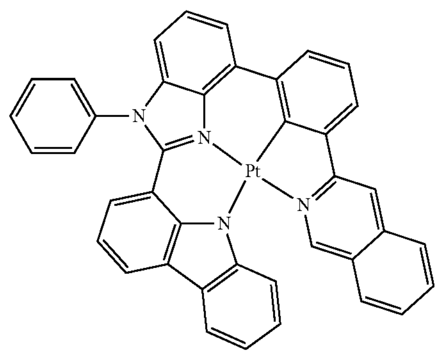
8
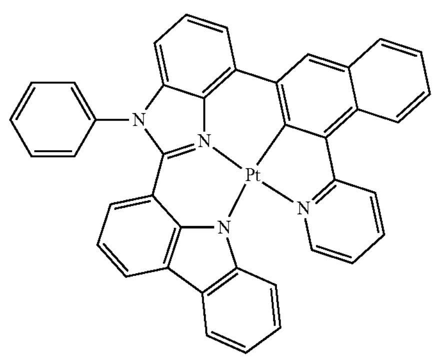

-continued
9
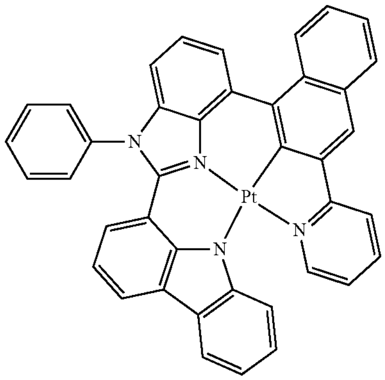
10
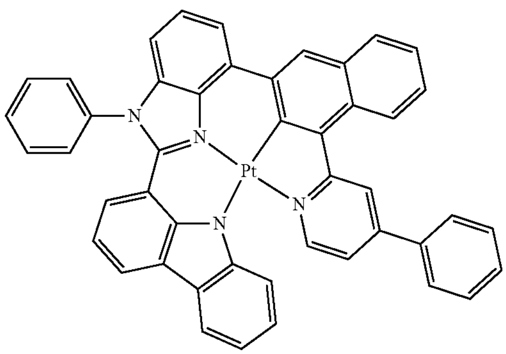
11
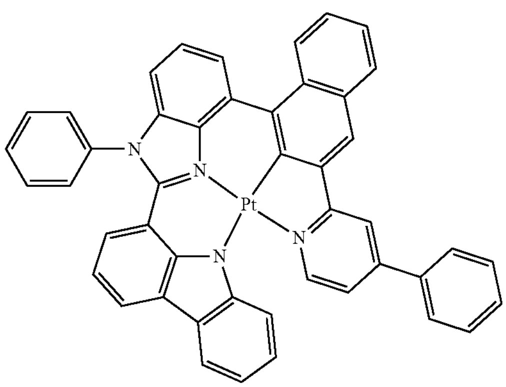
12
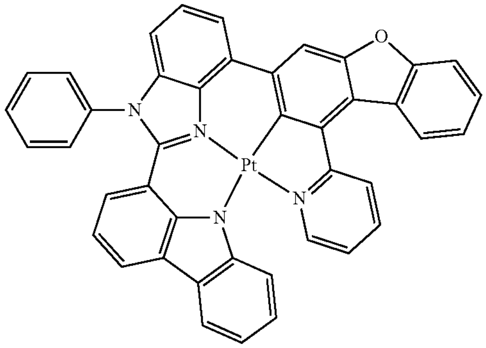
-continued
13
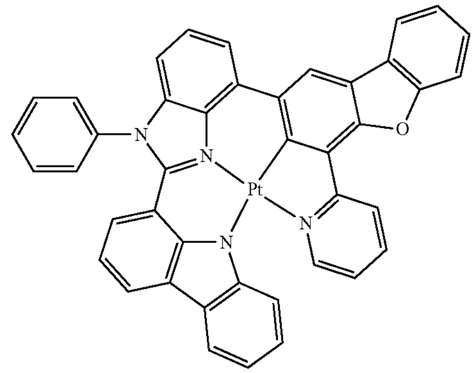
14
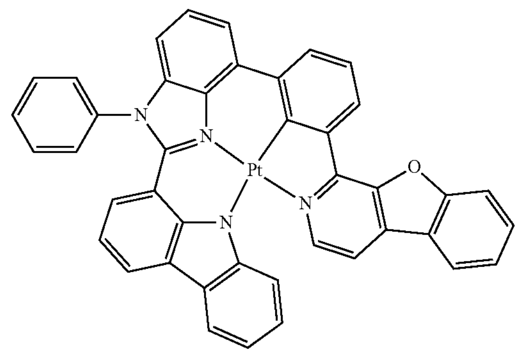
15
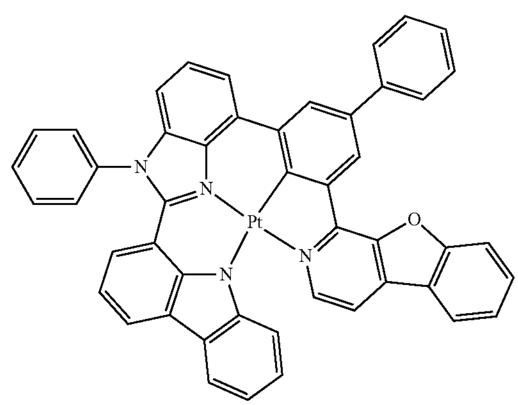
16
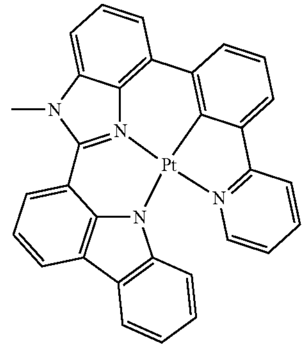

-continued
17
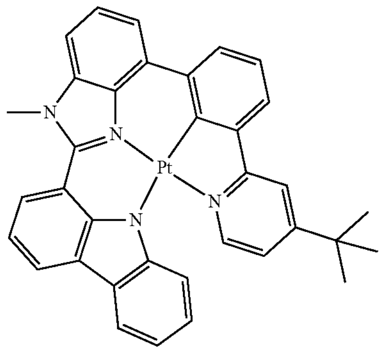
18
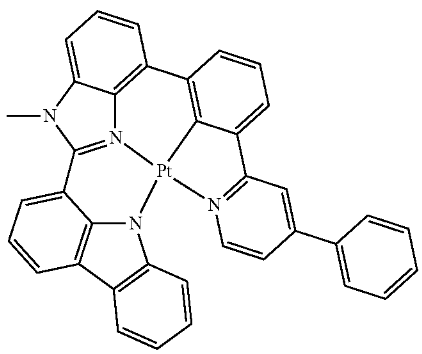
19
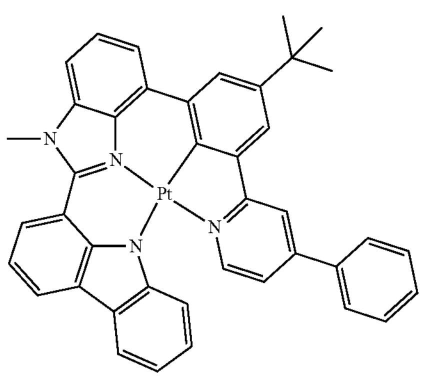
20
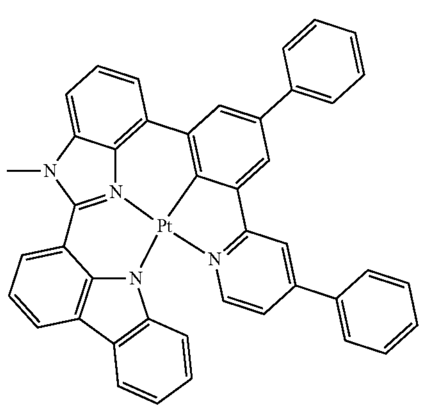
-continued
21
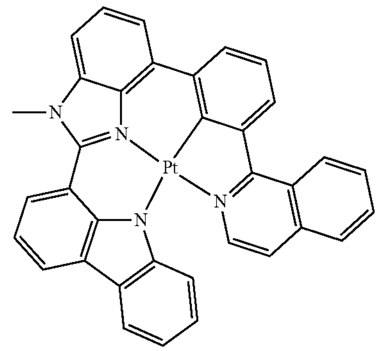
22
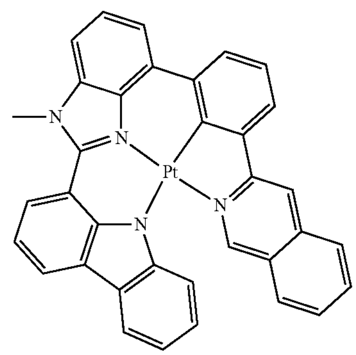
23
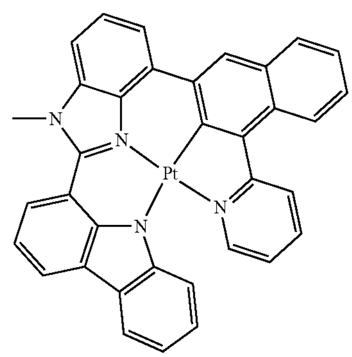
24
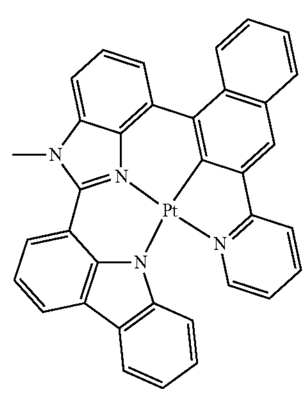

-continued
25
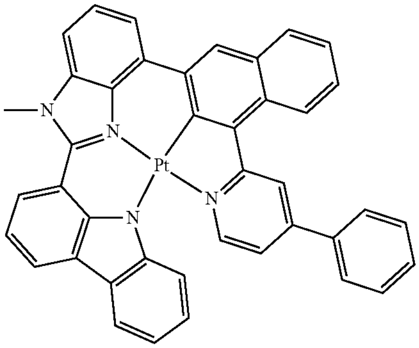
26
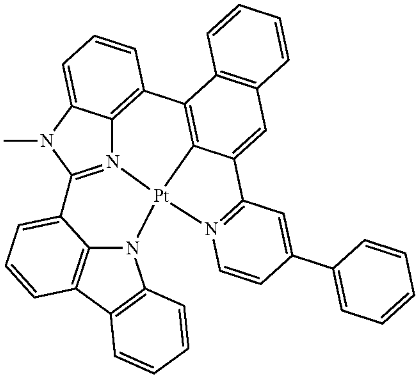
27
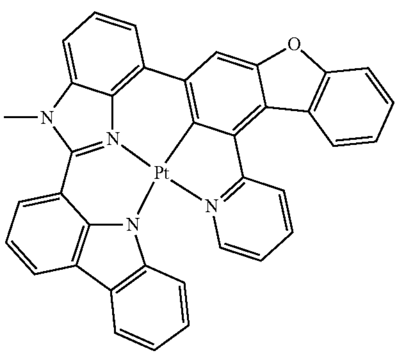
28
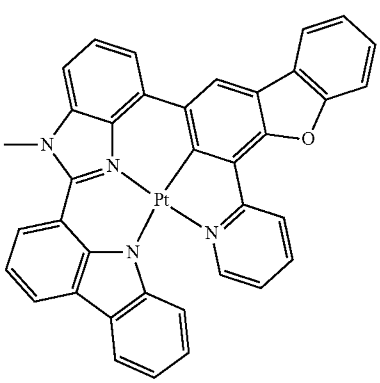
-continued
29
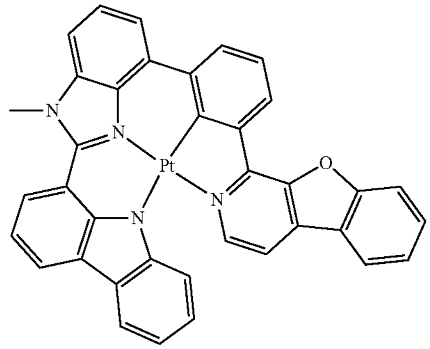
30
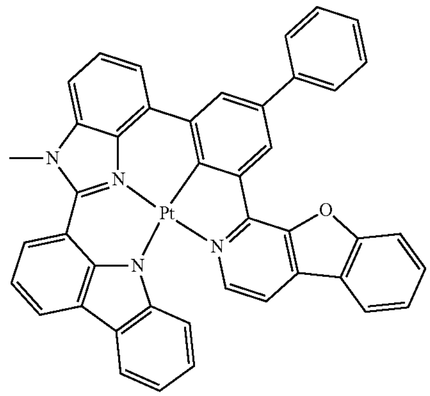
31
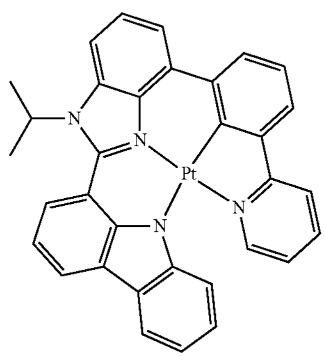
32
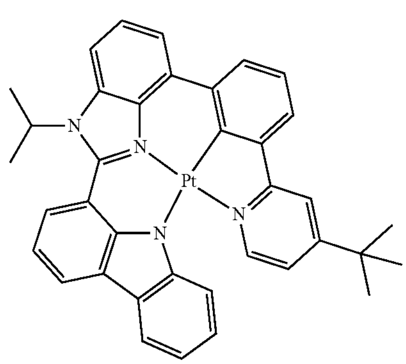

-continued
33
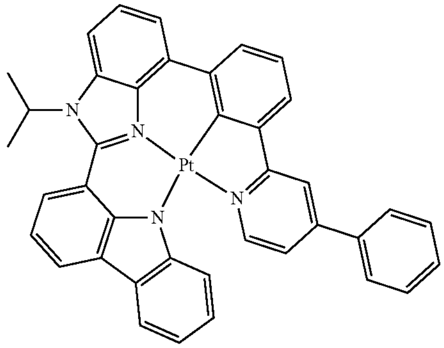
34
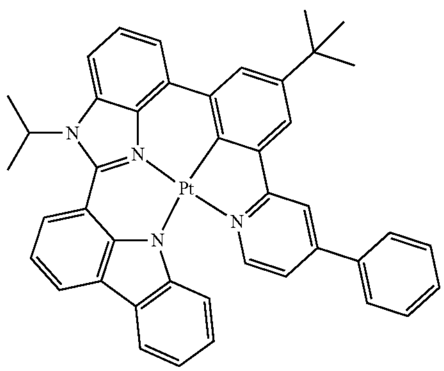
35
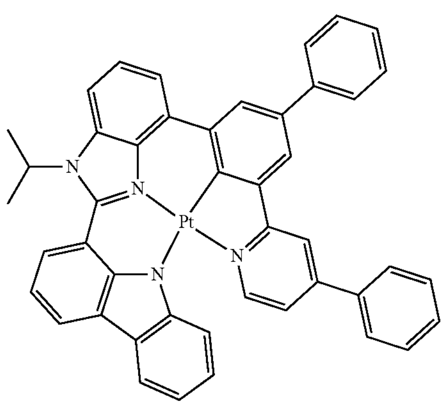
36
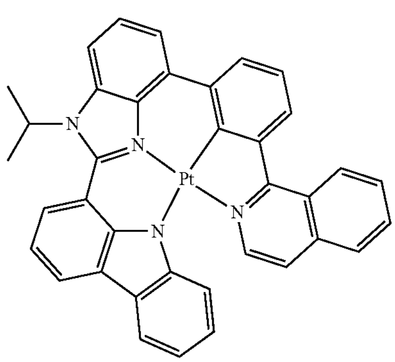
-continued
37
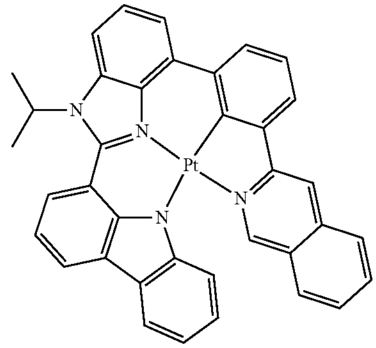
38
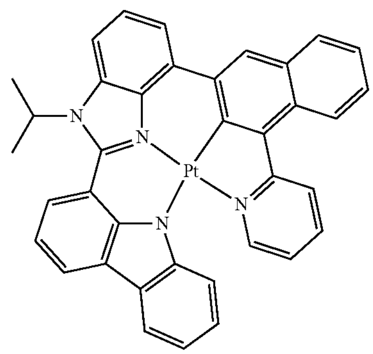
39
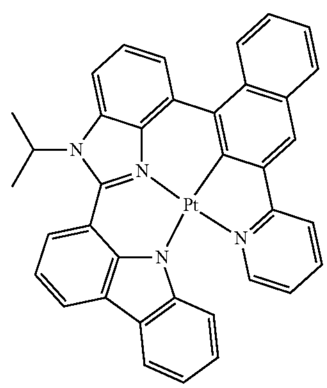
40
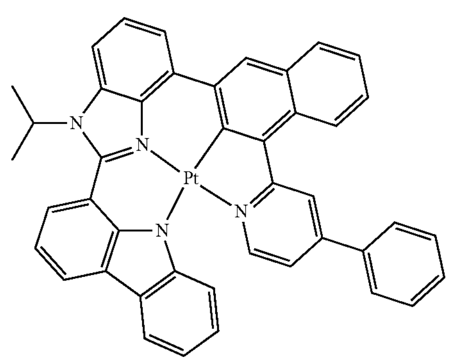

-continued
41
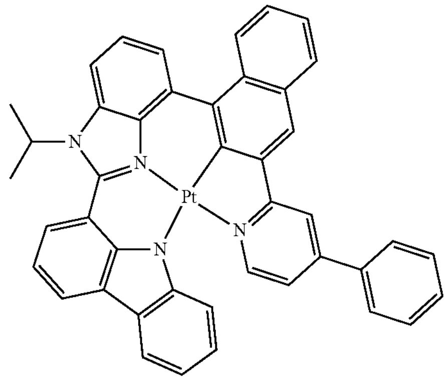
42
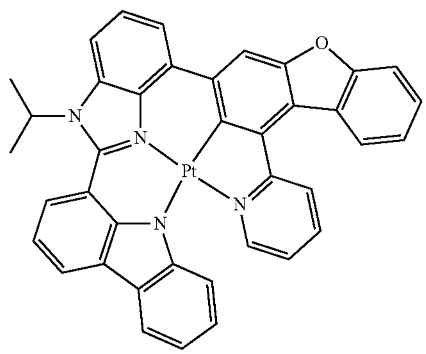
43
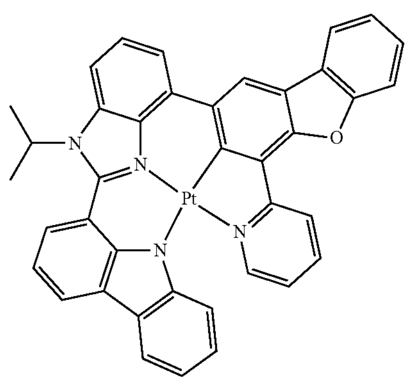
44
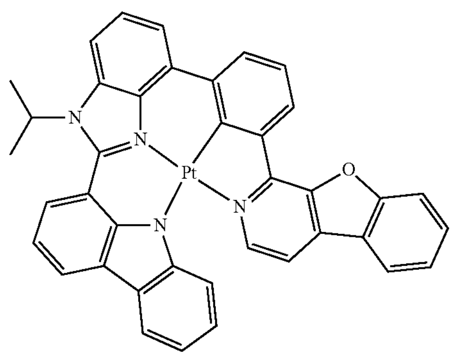
-continued
45
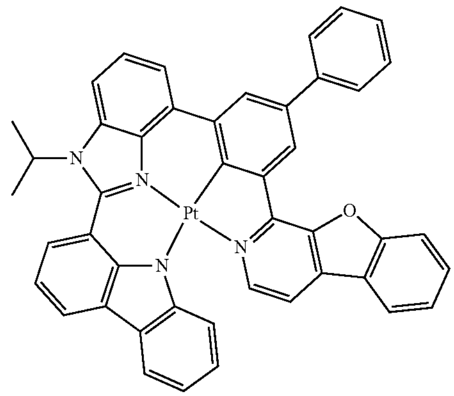
46
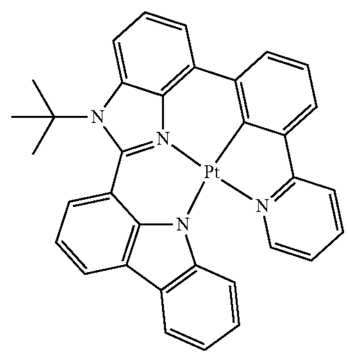
47
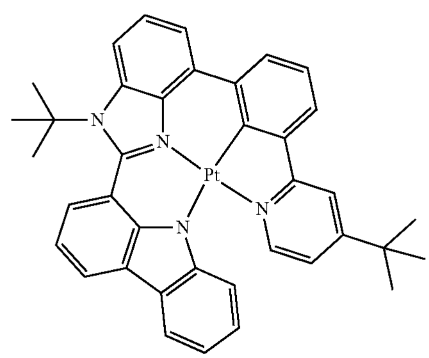
48
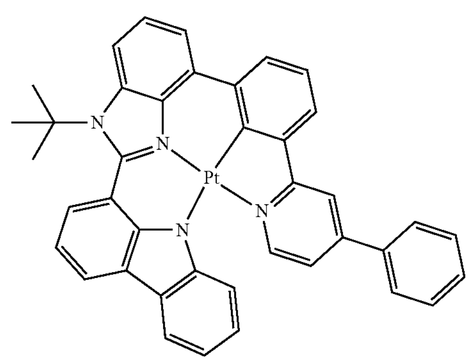

49
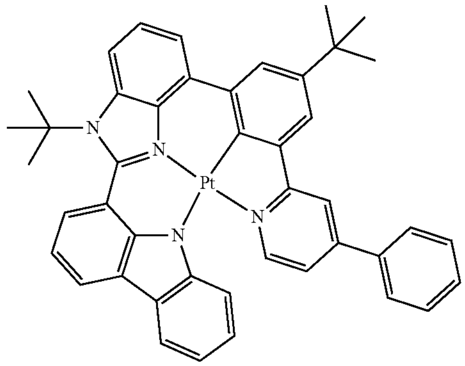
50
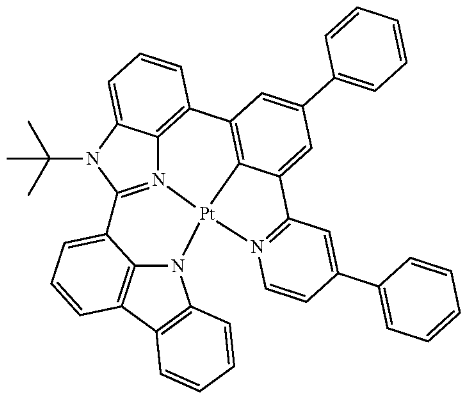
51
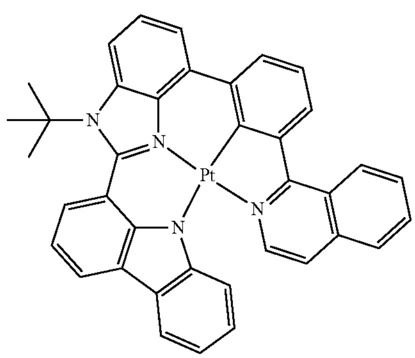
52
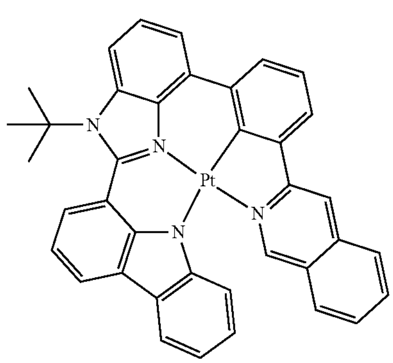
53
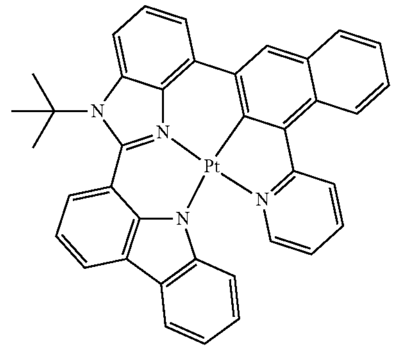
54
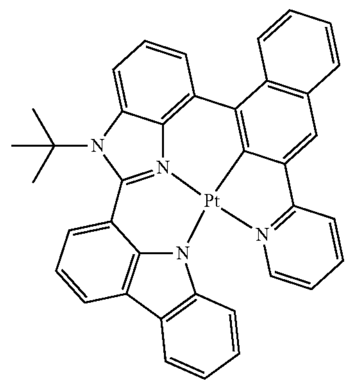
55
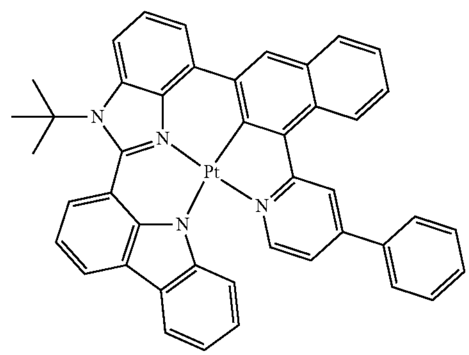
56
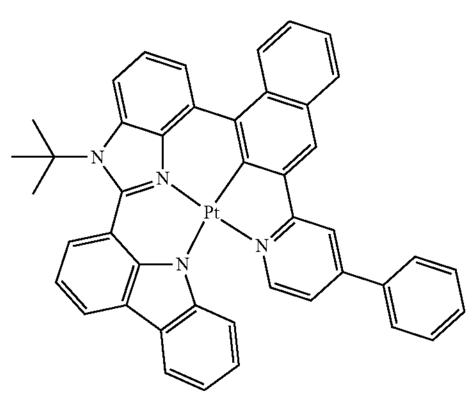

-continued
57
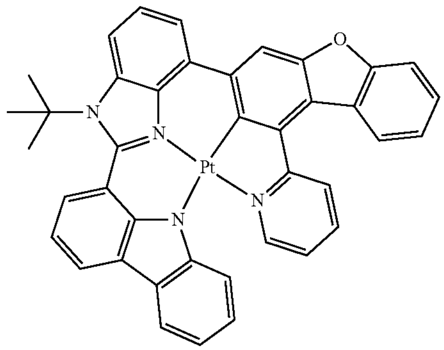
58
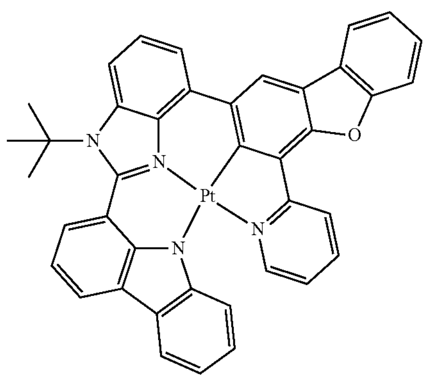
59
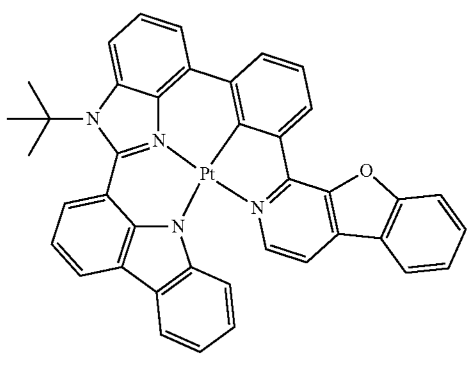
60
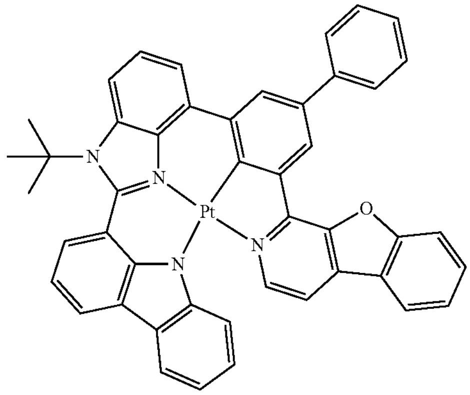
-continued
61
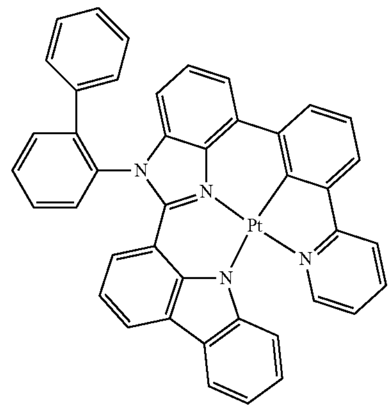
62
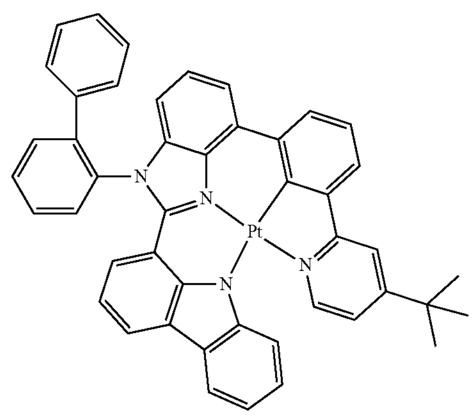
63
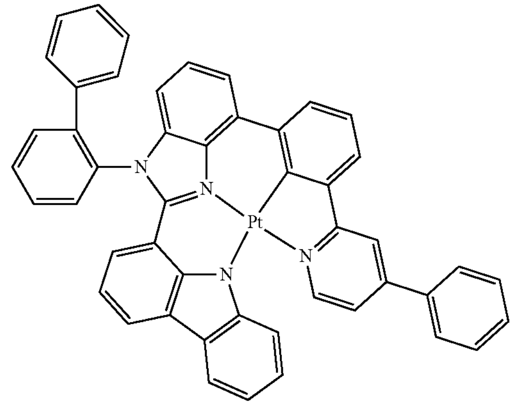

-continued
64
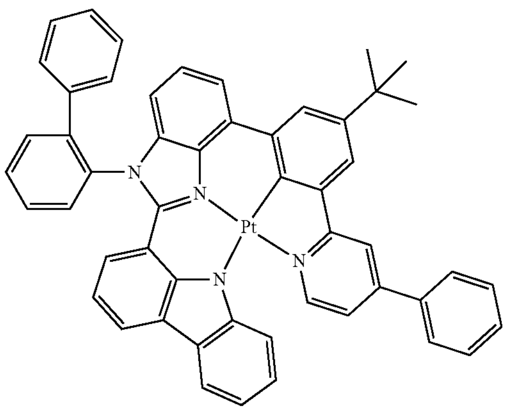
65
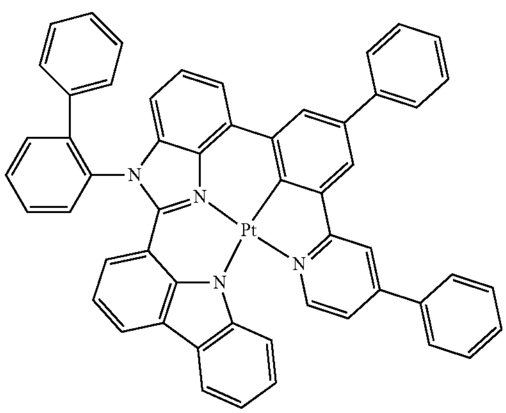
66
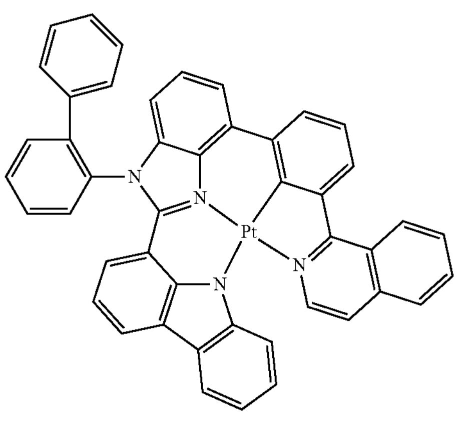
-continued
67
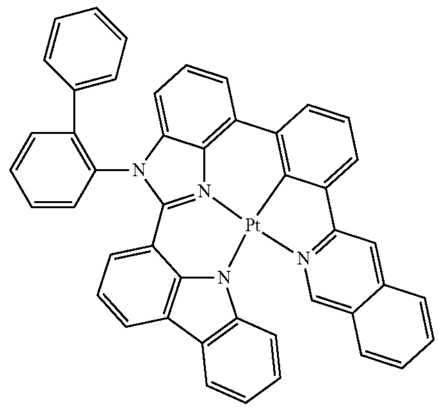
68
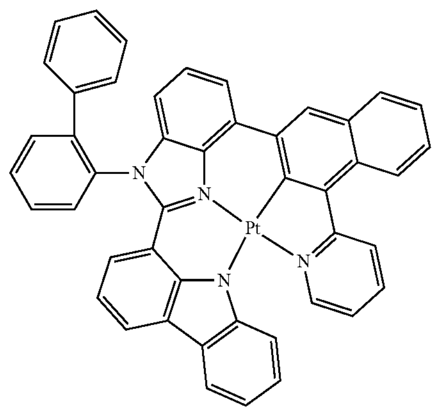
69
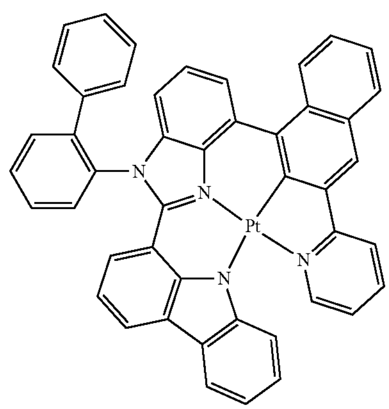
70
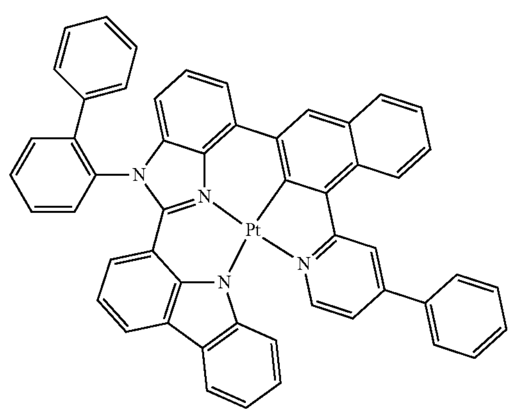

-continued
71
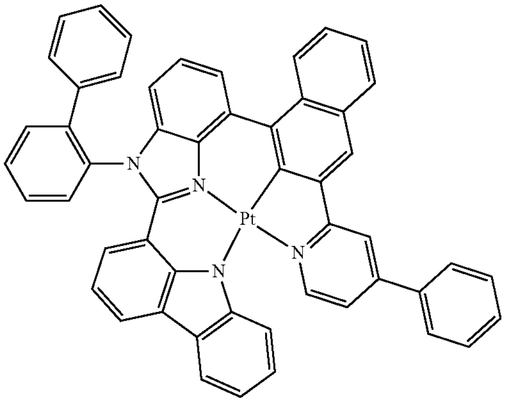
72
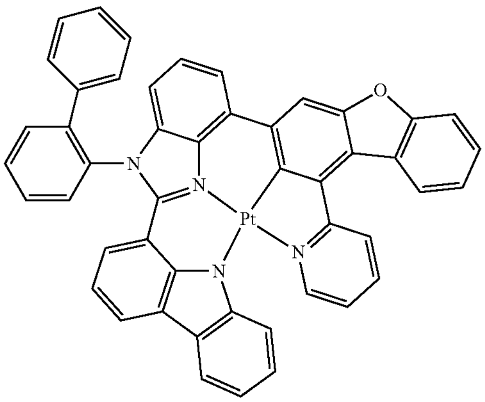
73
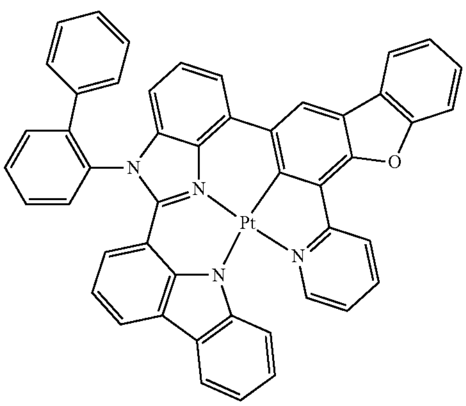
74
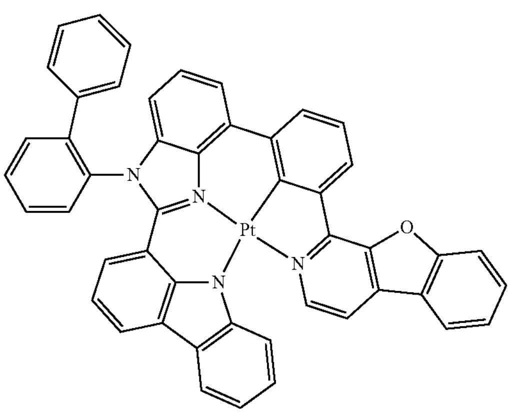
-continued
75
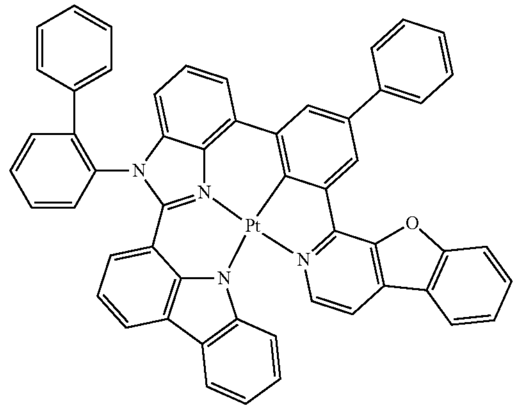
76
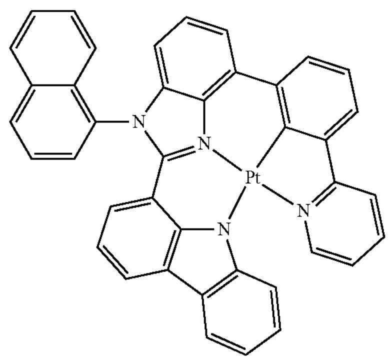
77
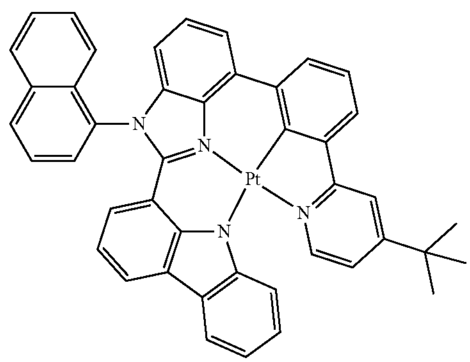
78
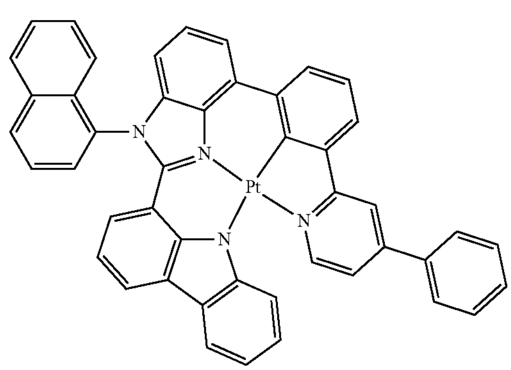

-continued
79
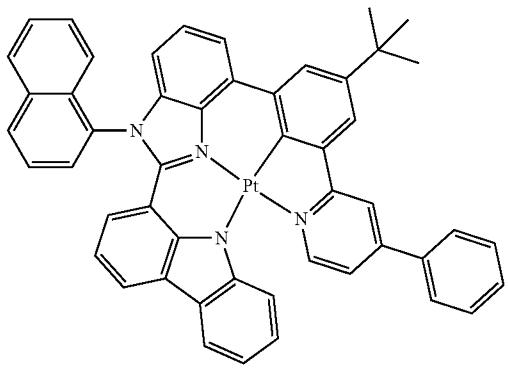
80
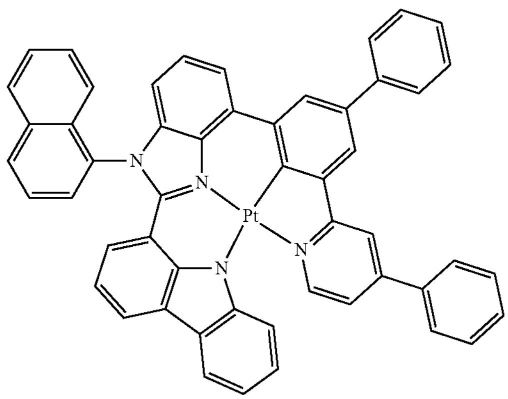
81
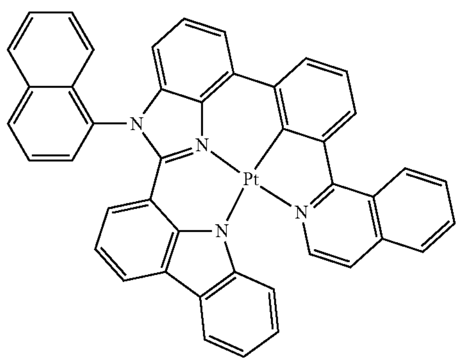
82
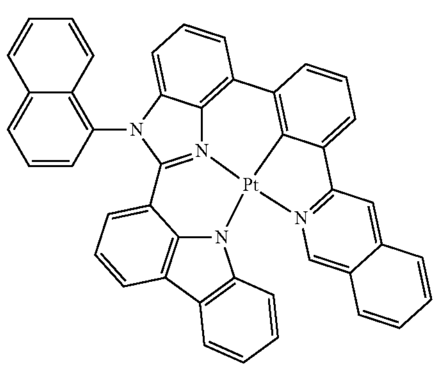
-continued
83
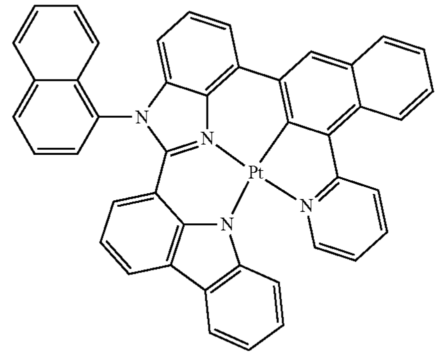
84
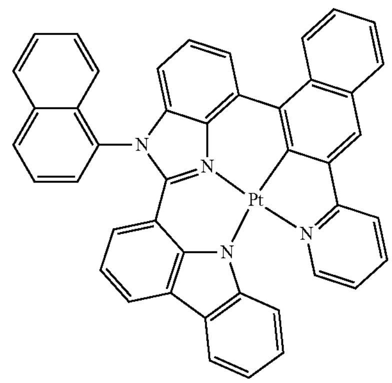
85
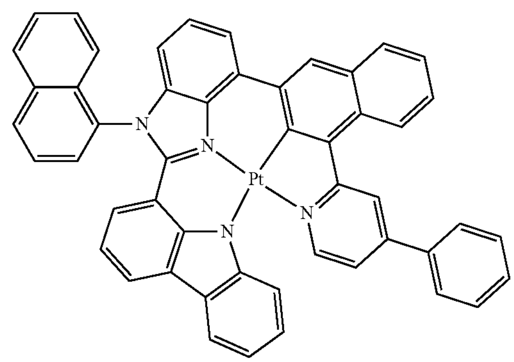
86
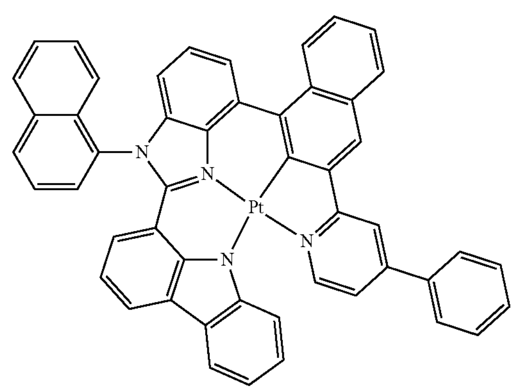

-continued
87
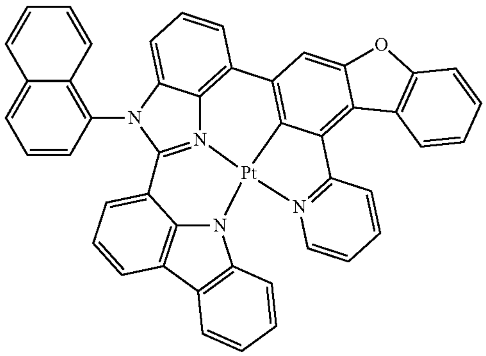
88
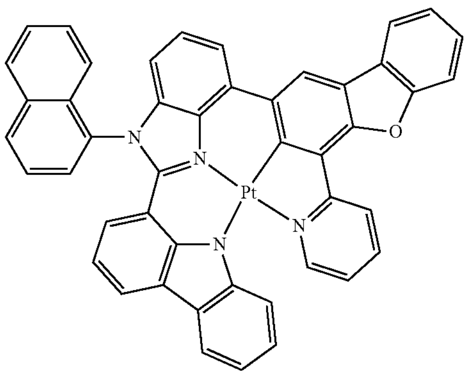
89
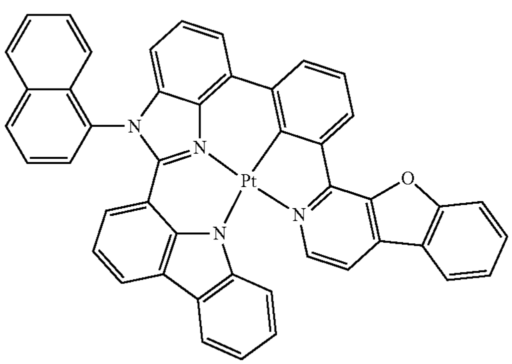
90
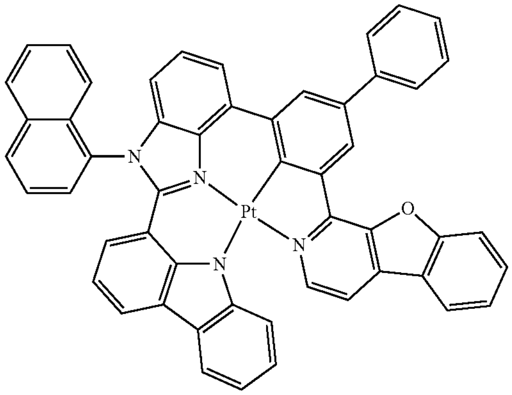
-continued
91
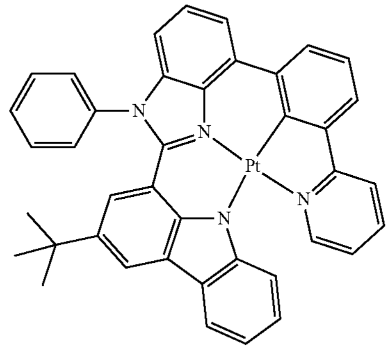
92
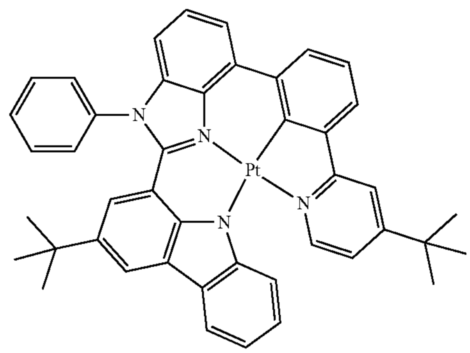
93
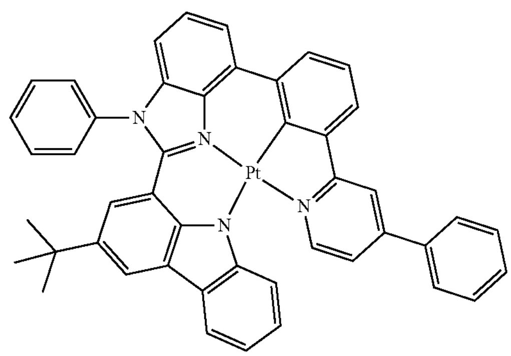
94
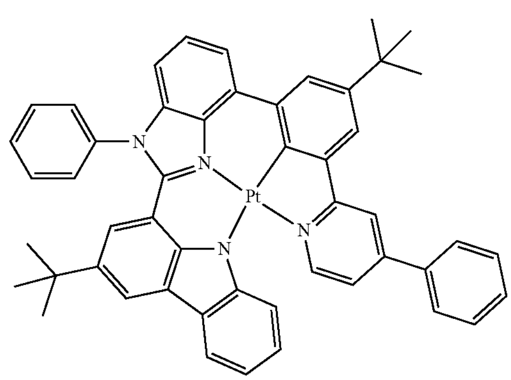

-continued
95
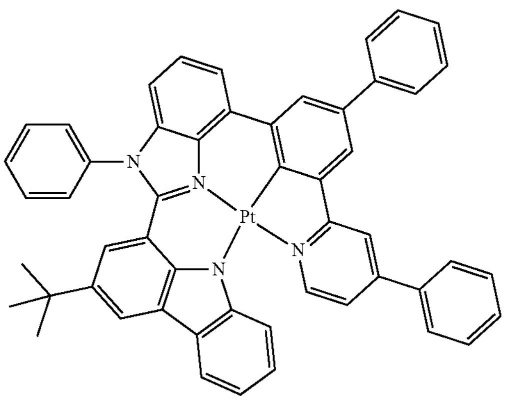
96
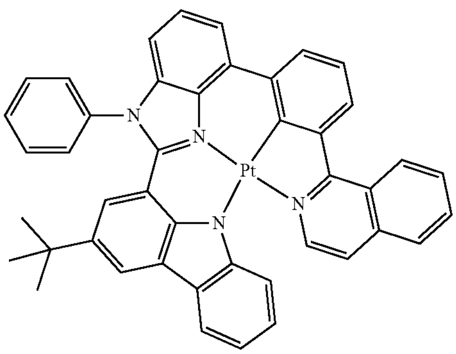
97
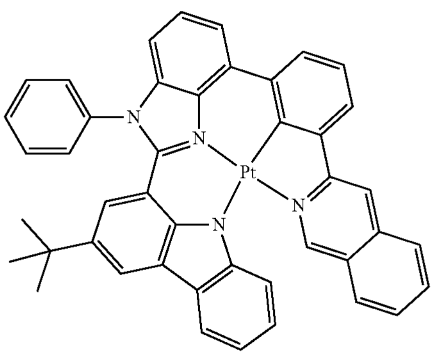
98
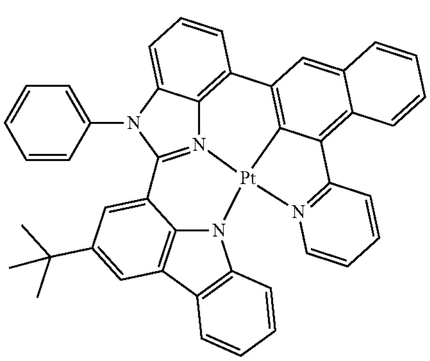
-continued
99
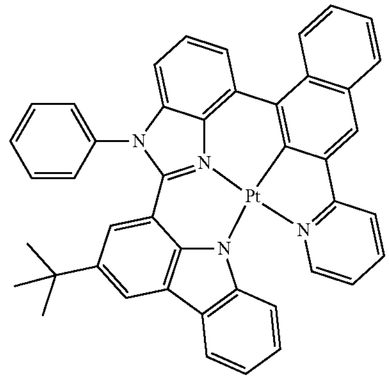
100
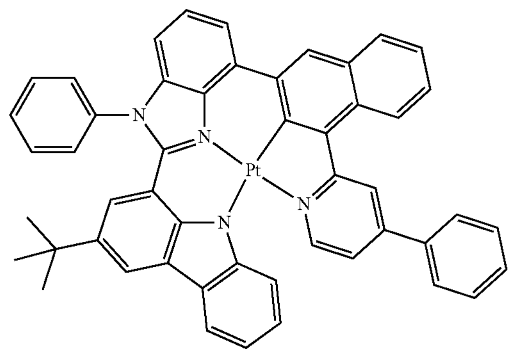
101
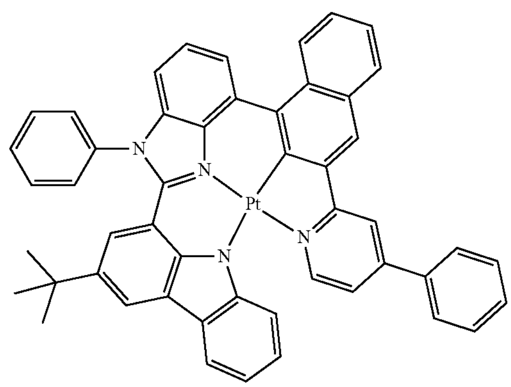
102
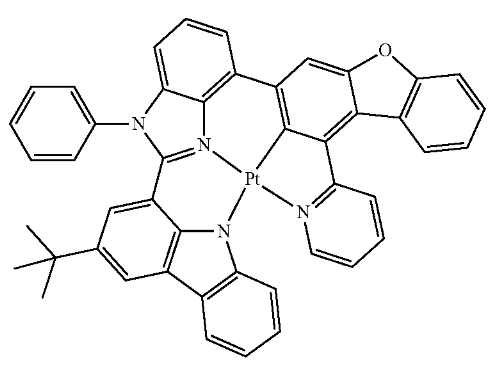

-continued
103
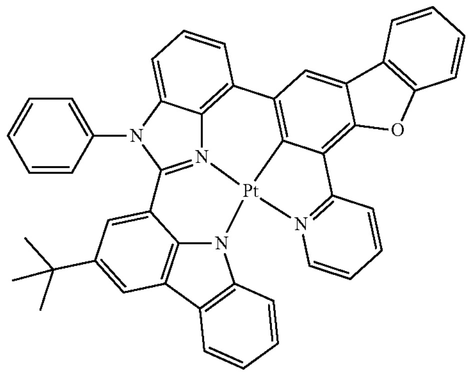
104
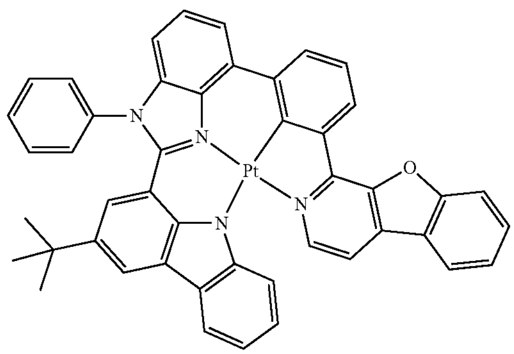
105
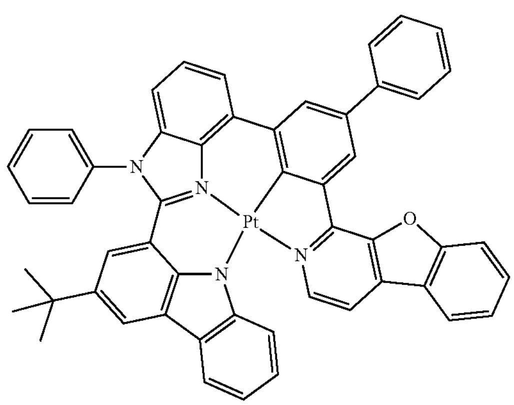
106
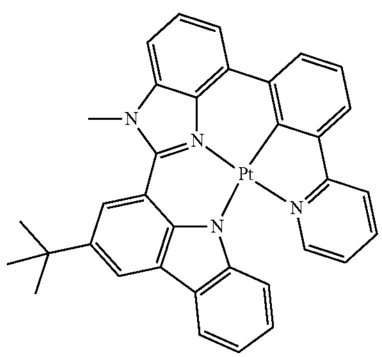
-continued
107
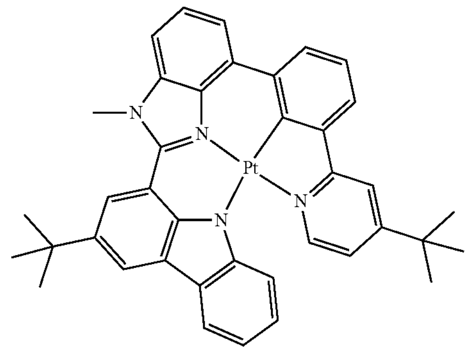
108
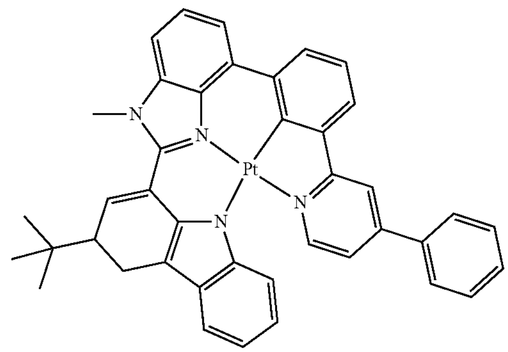
109
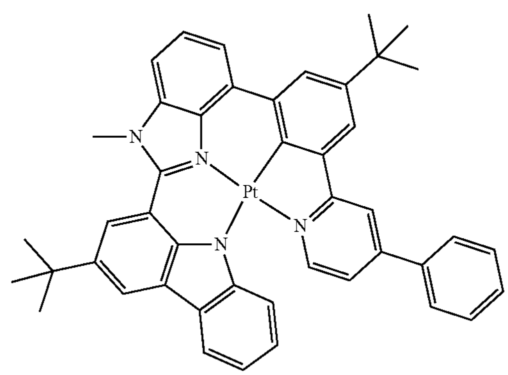
110
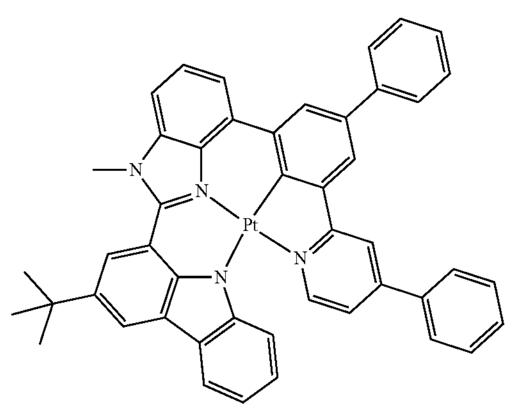

111
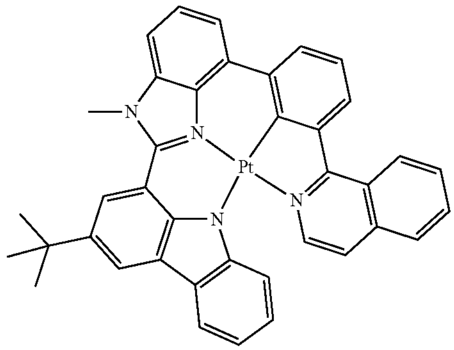
112
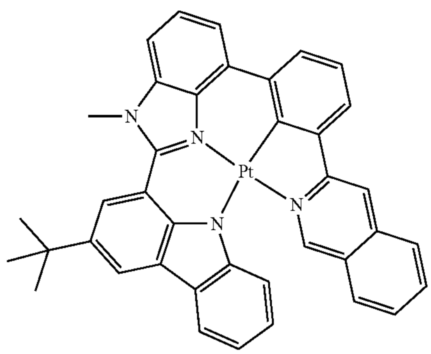
113
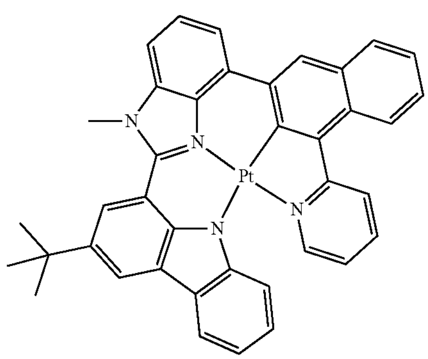
114
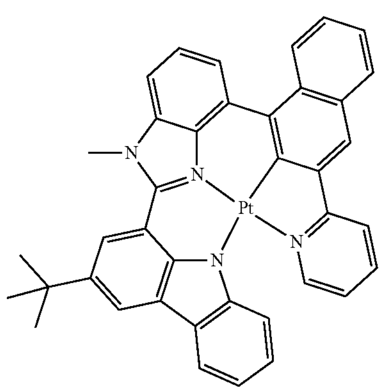
115
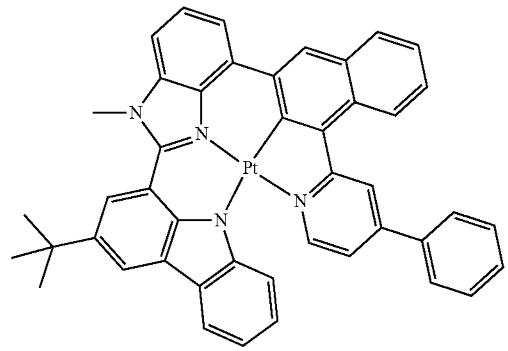
116
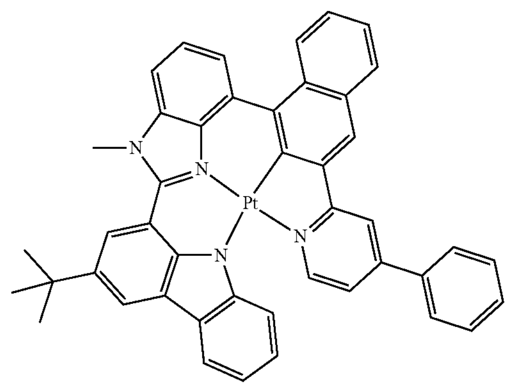
117
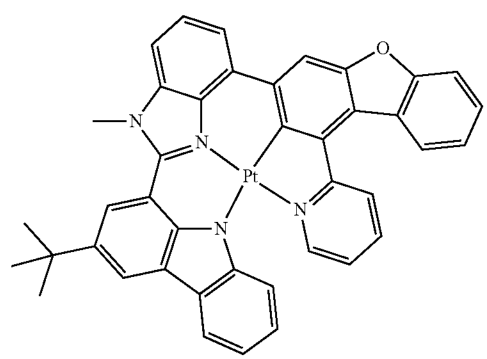
118
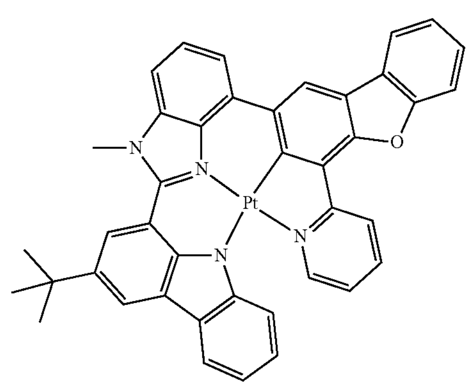

119
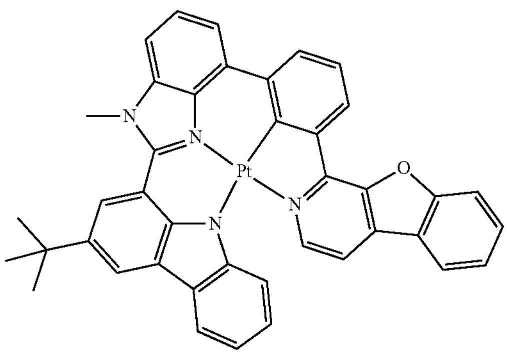
120
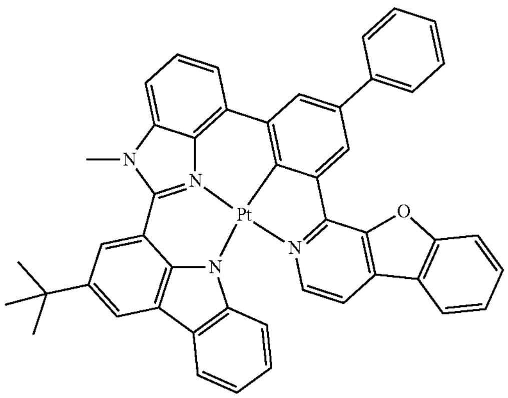
121
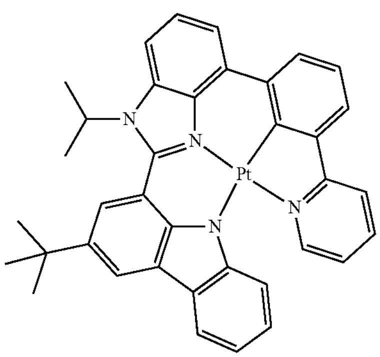
122
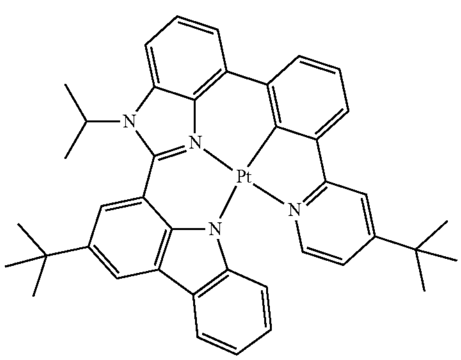
123
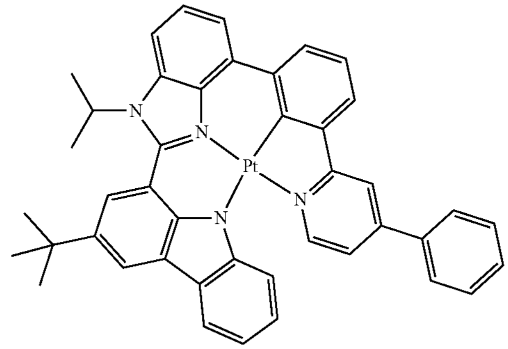
124
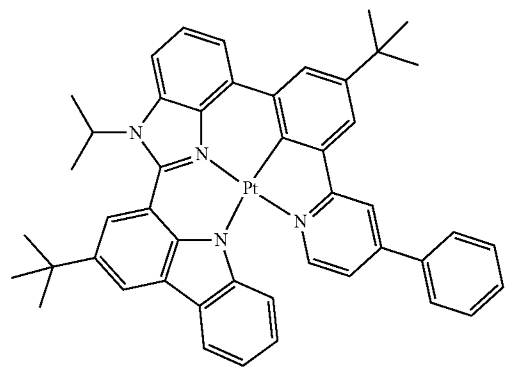
125
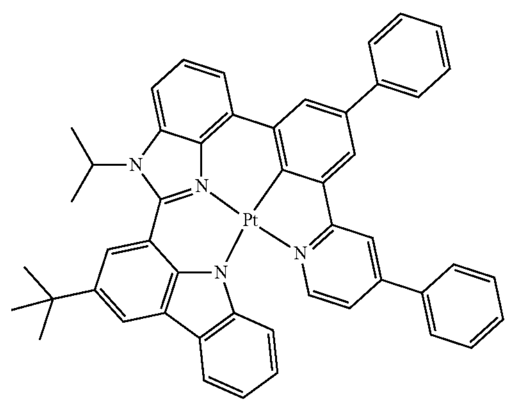
126
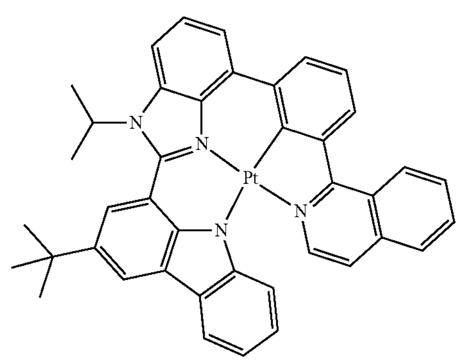

127
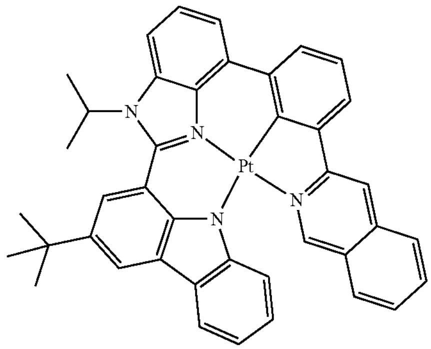
128
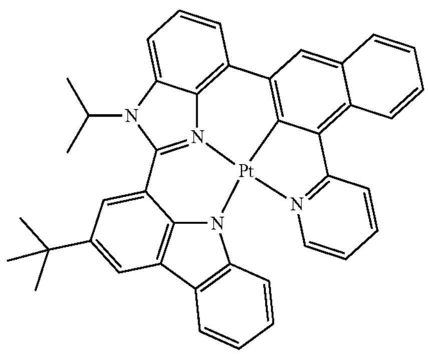
129
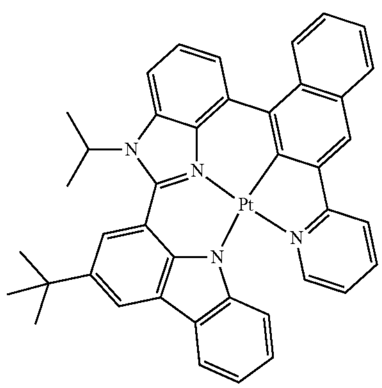
130
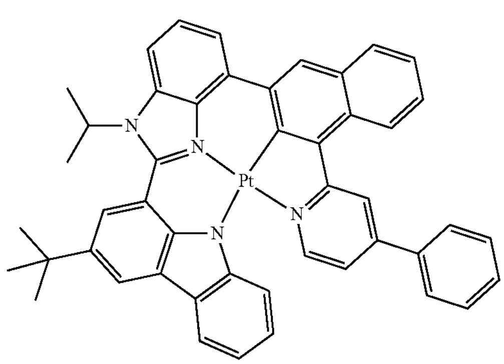
131
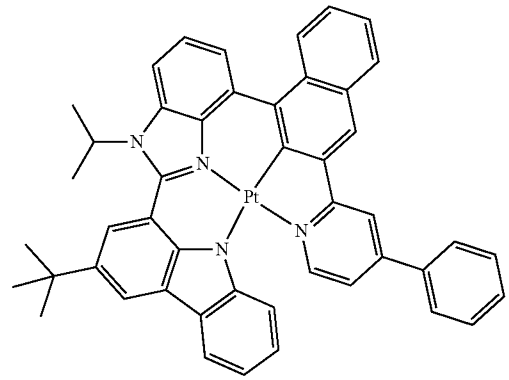
132
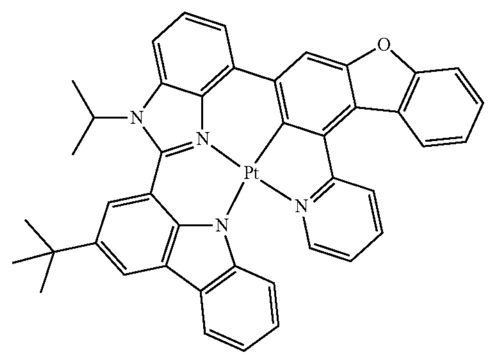
133
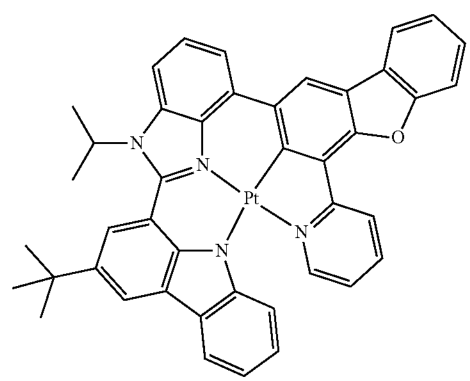
134
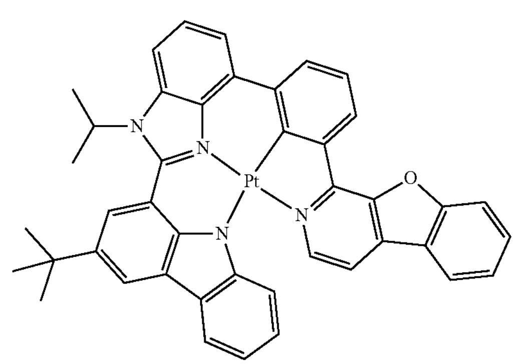

-continued
135
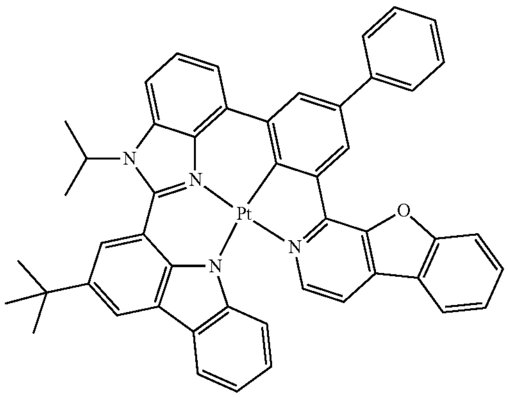
136
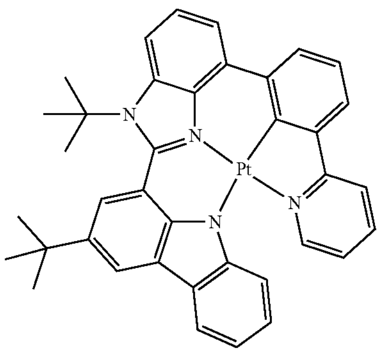
137
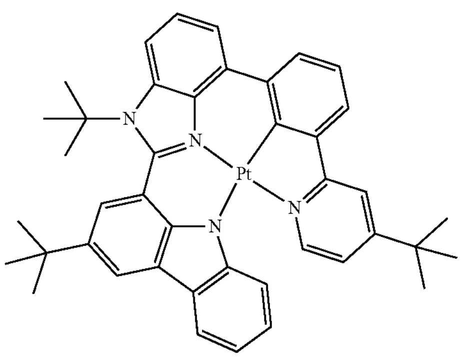
138
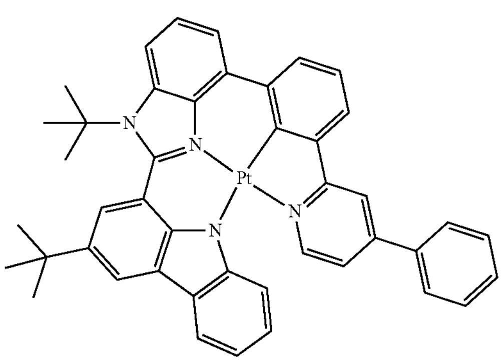
-continued
139
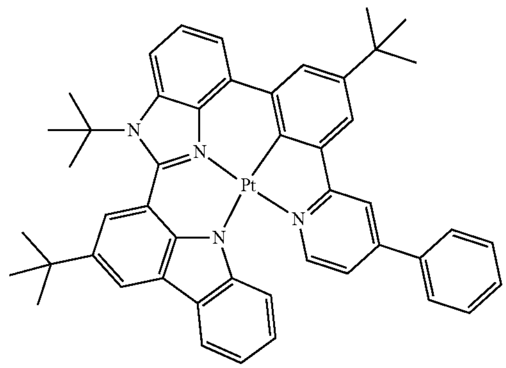
140
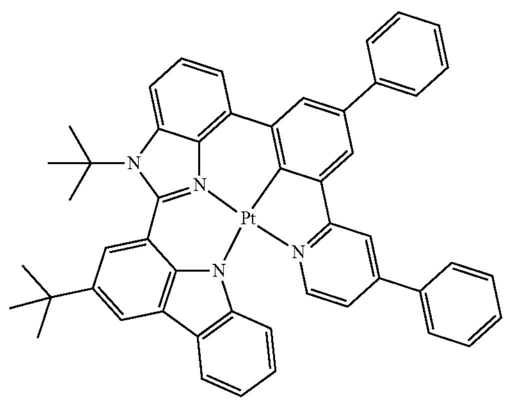
141
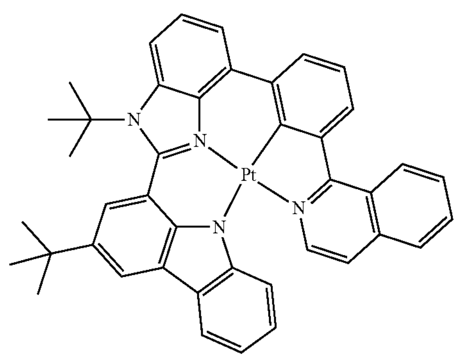
142
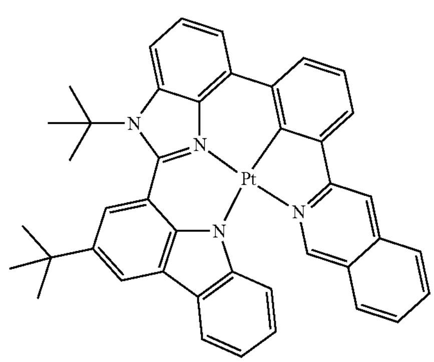

-continued
143
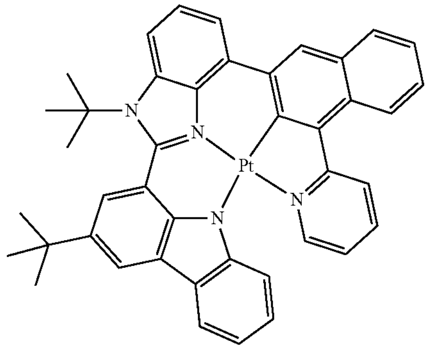
144
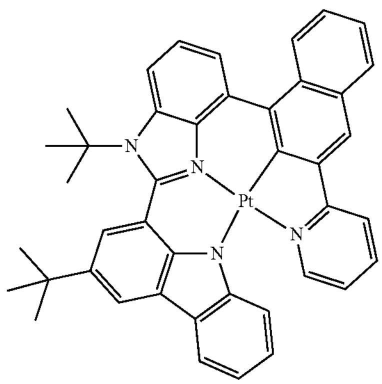
145
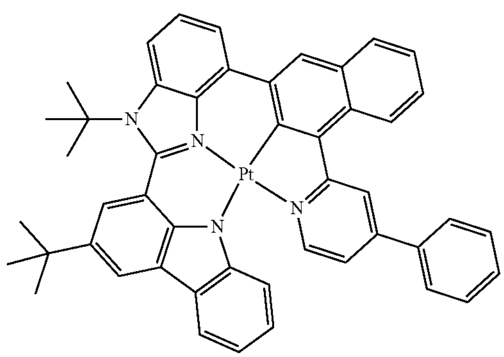
146
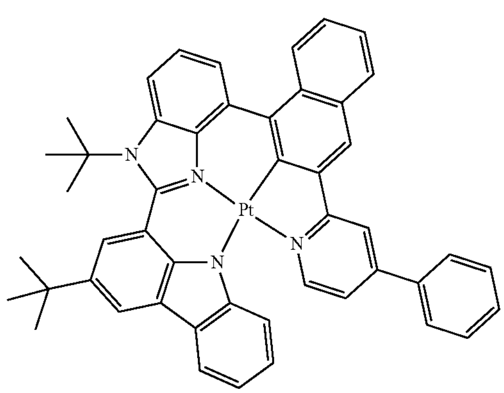
-continued
147
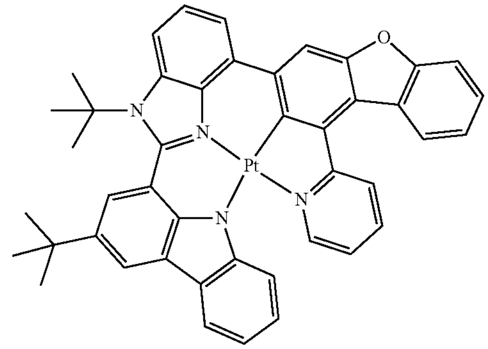
148
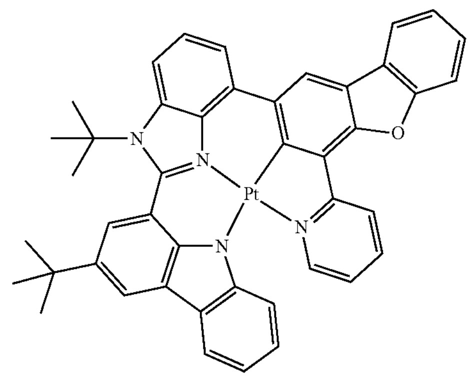
149
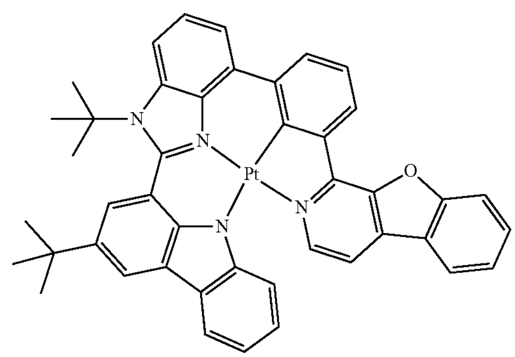
150
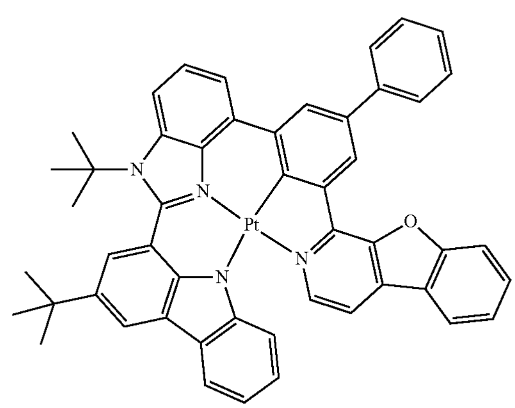

151
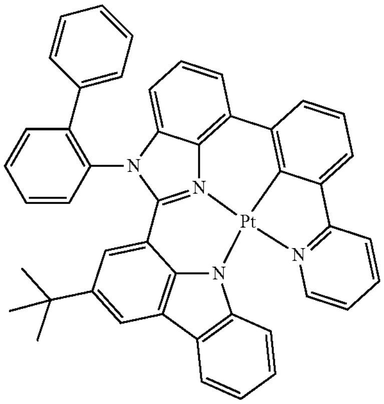
152
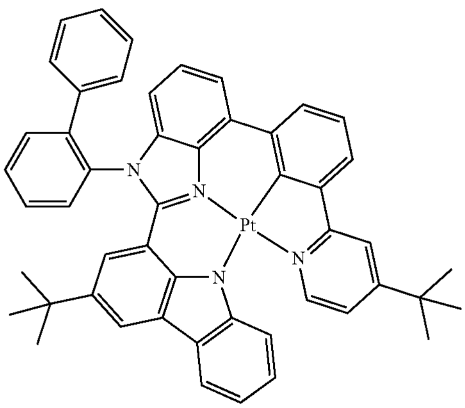
153
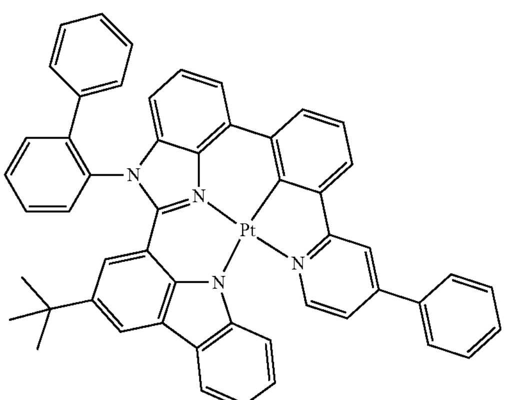
154
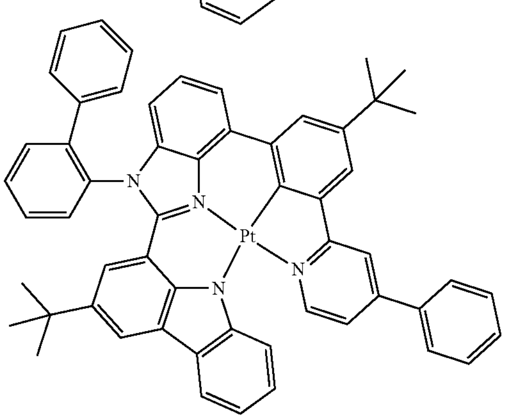
155
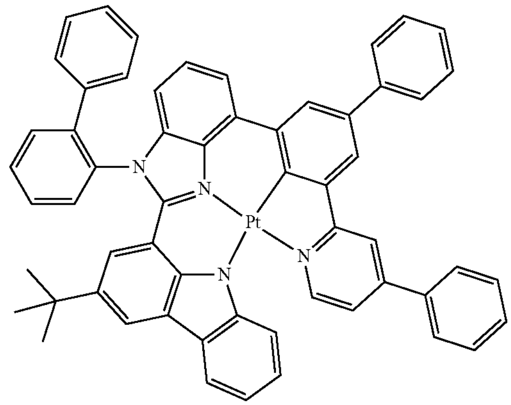
156
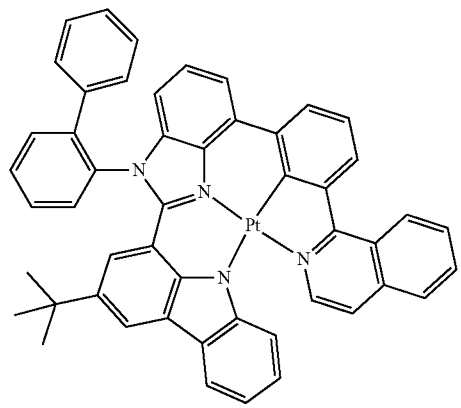
157
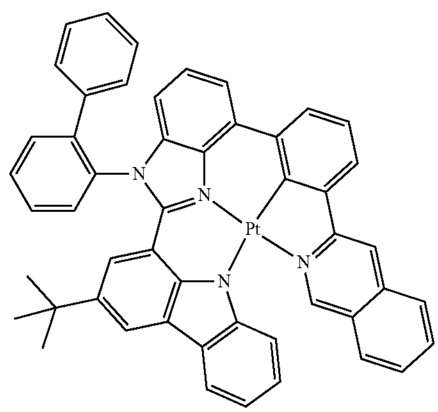
158
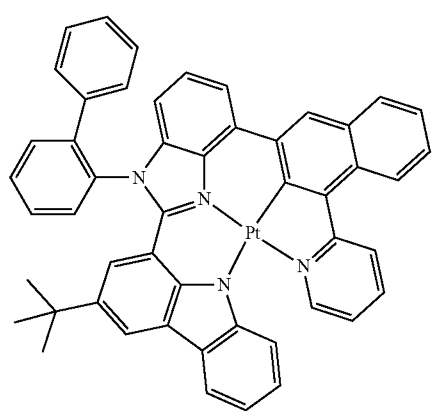

-continued
159
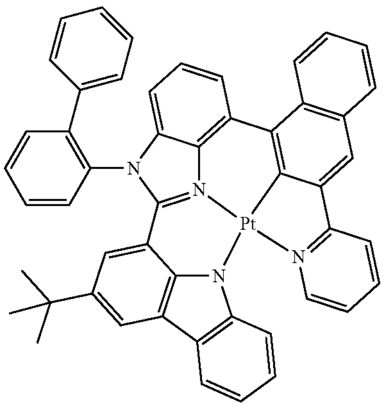
160
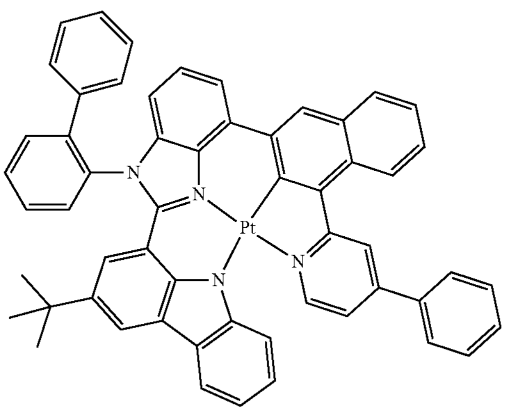
161
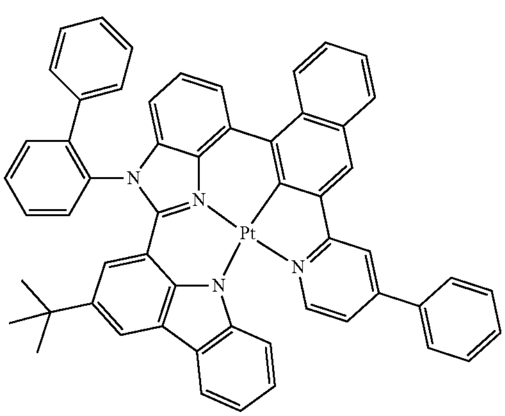
-continued
162
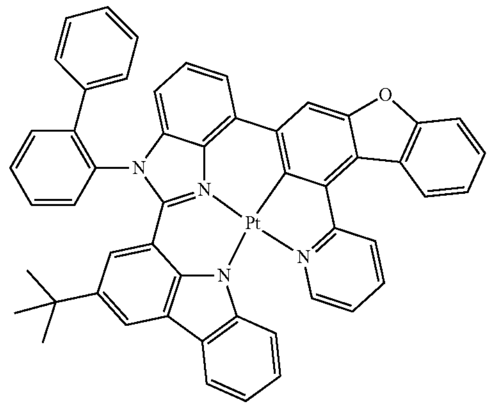
163
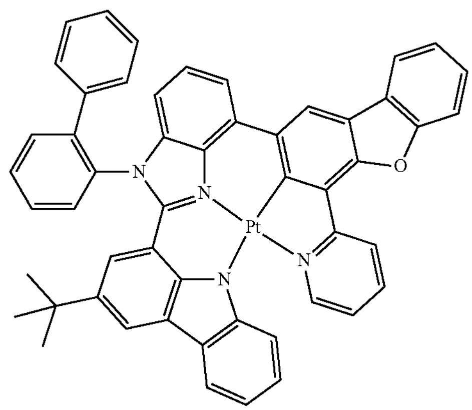
164
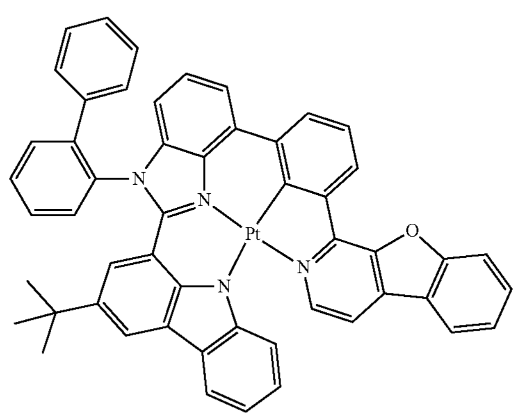

165
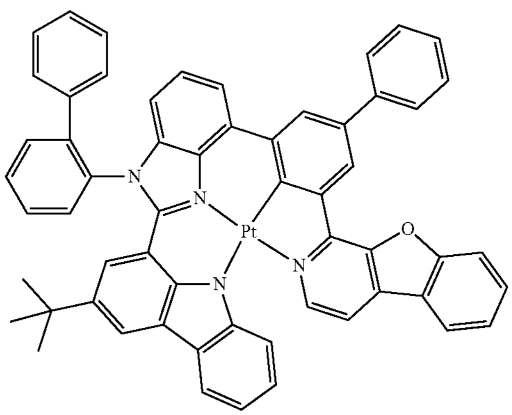
166
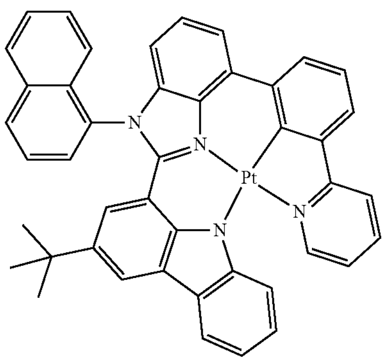
167
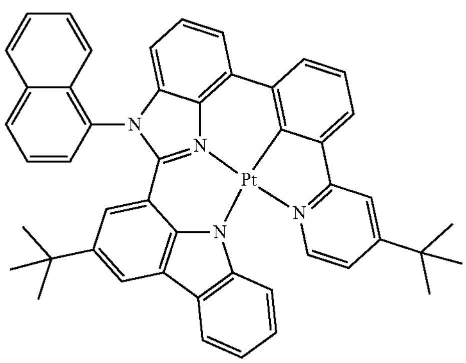
168
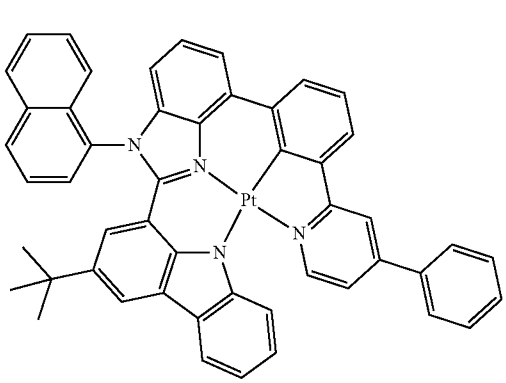
169
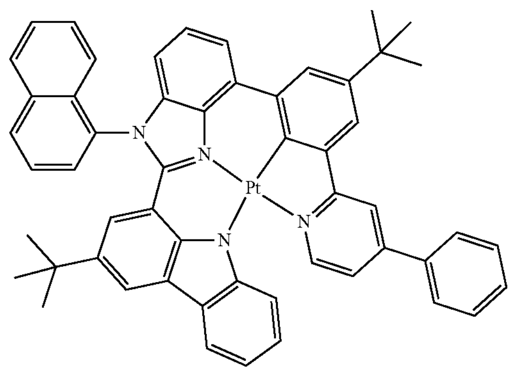
170
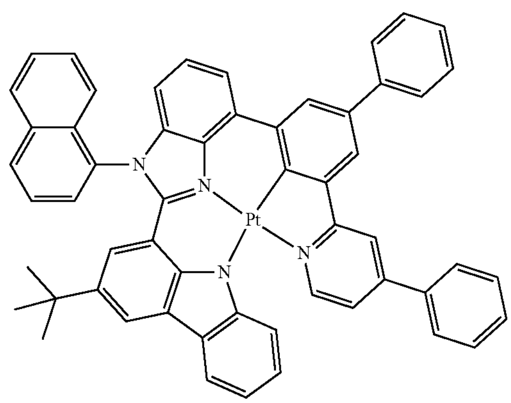
171
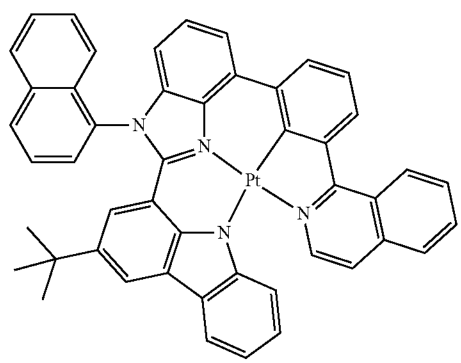
172
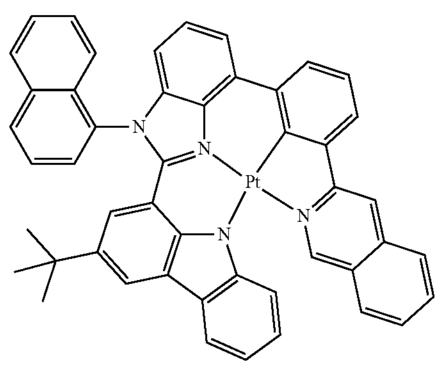

173
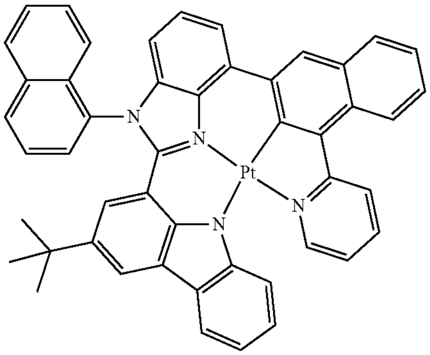
174
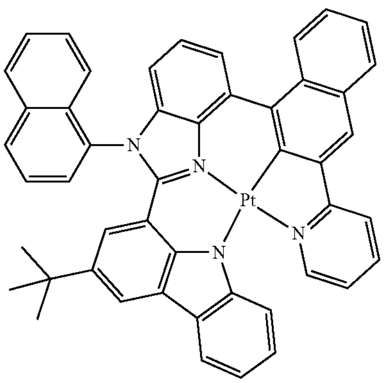
175
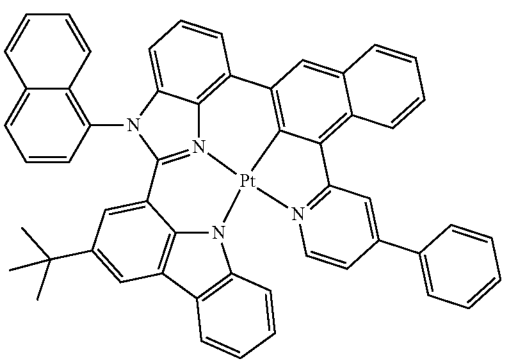
176
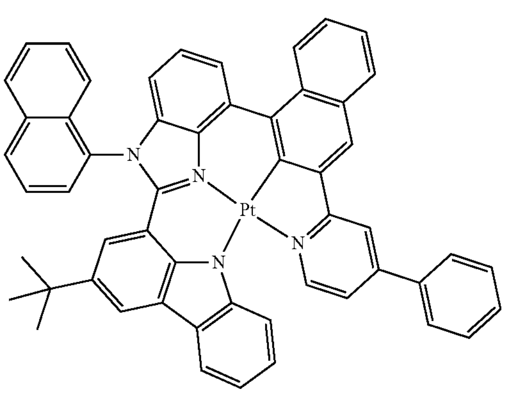
177
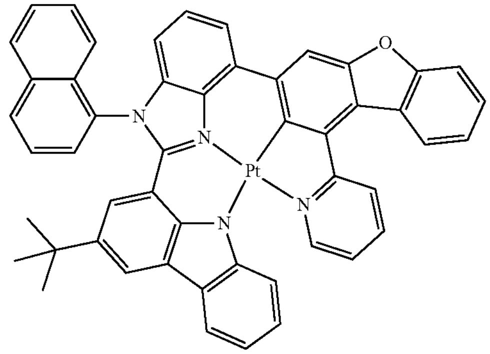
178
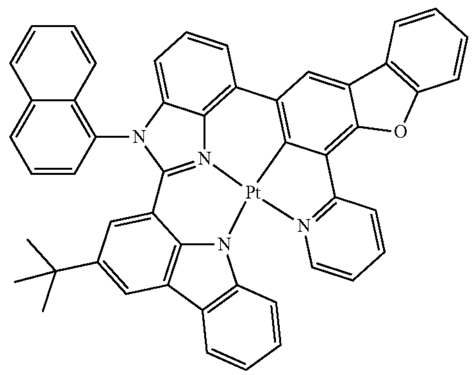
179
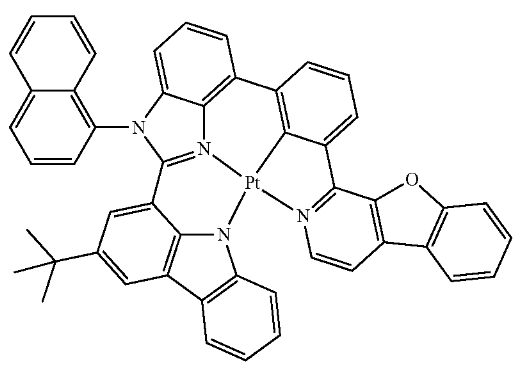
180
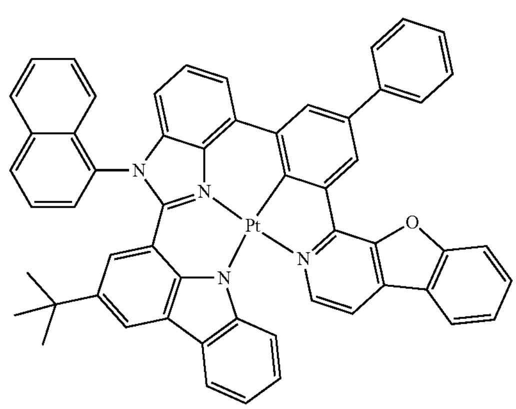

181
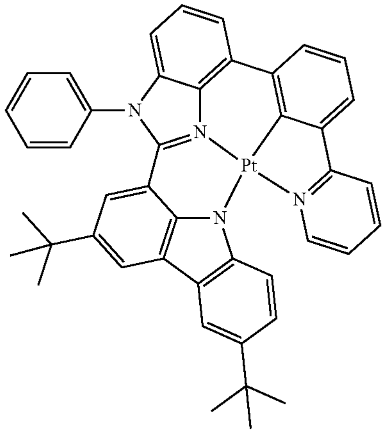
182
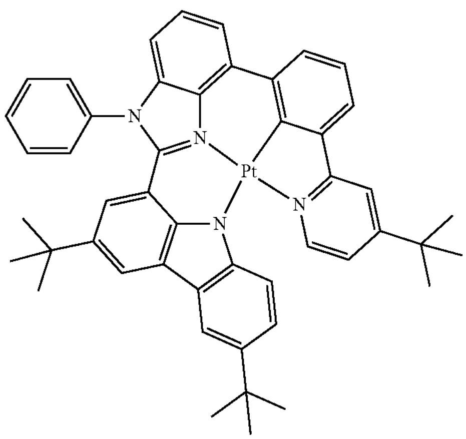
183
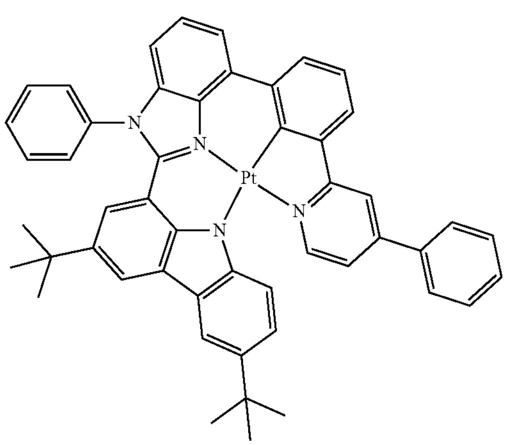
184
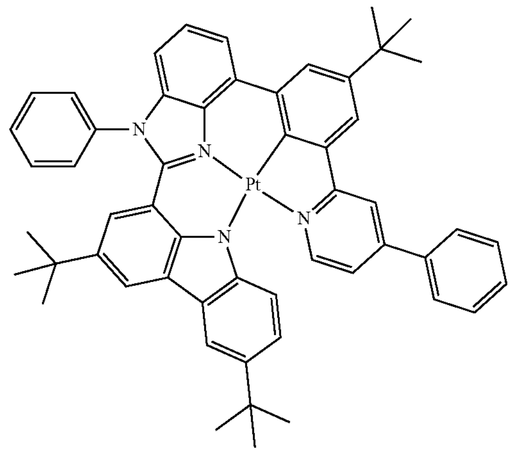
185
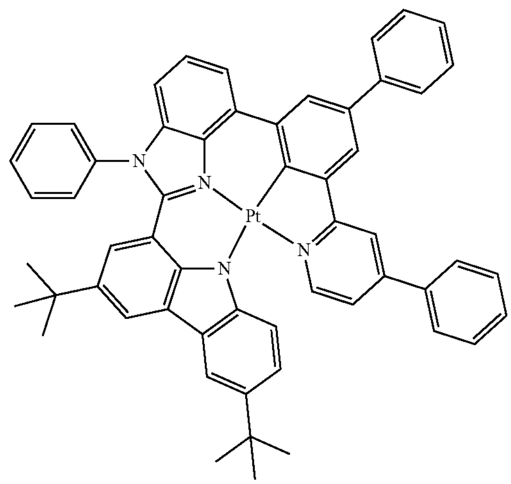
186
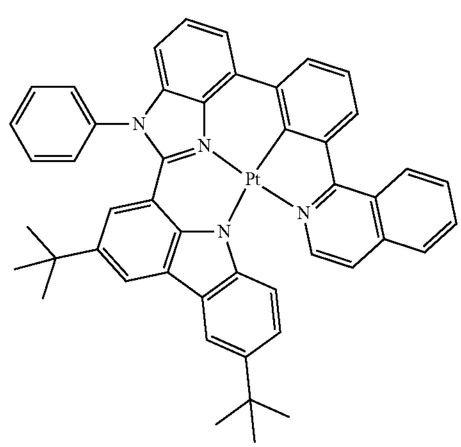

187
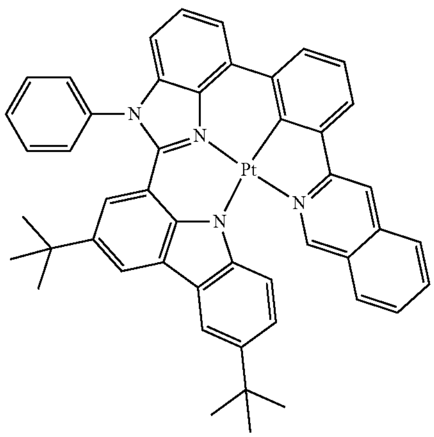
188
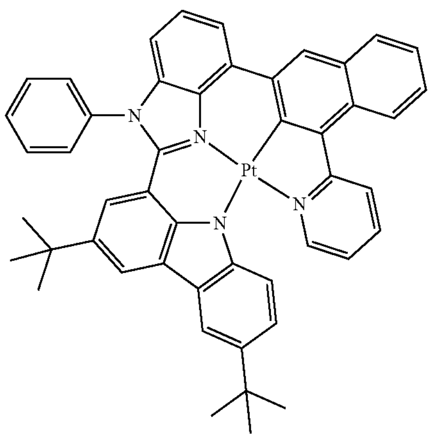
189
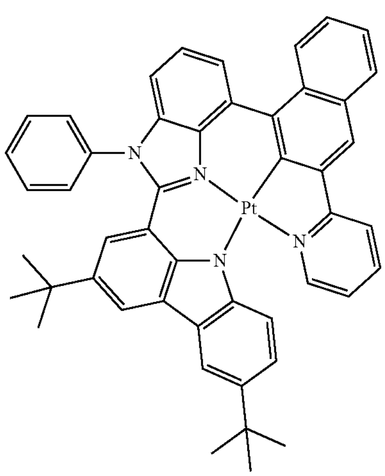
190
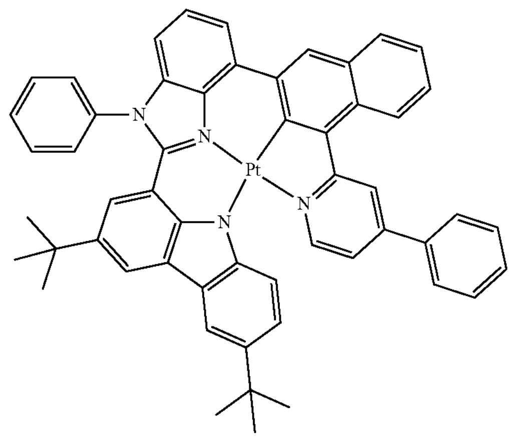
191
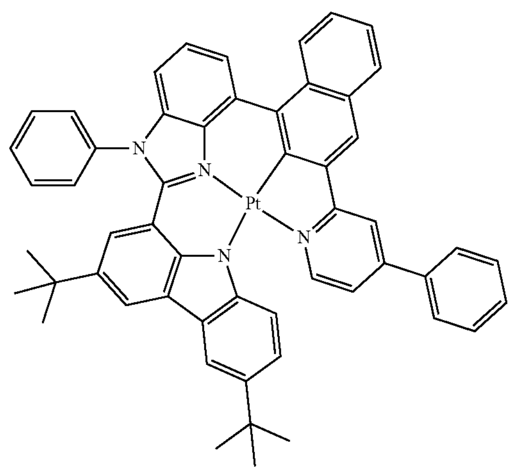
192
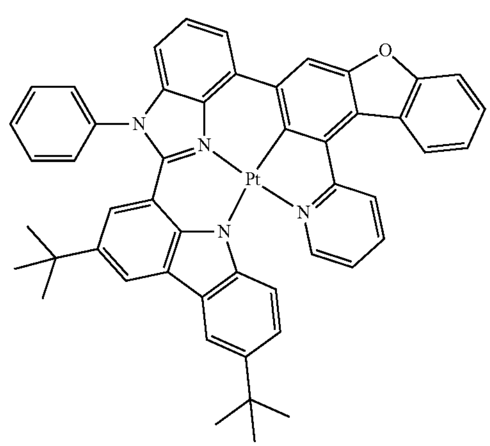

193
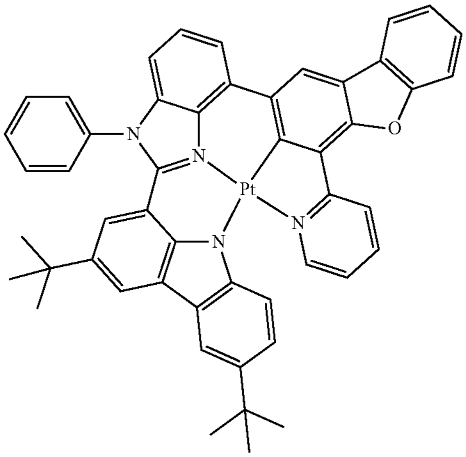
194
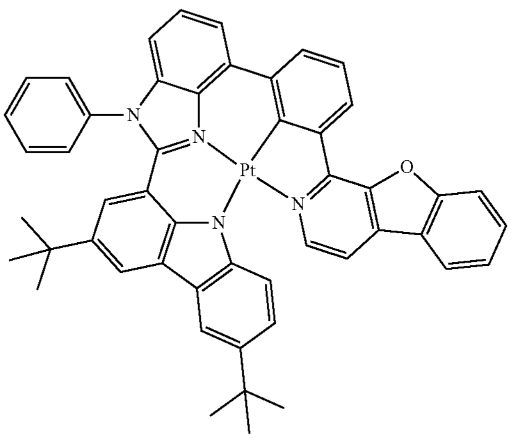
195
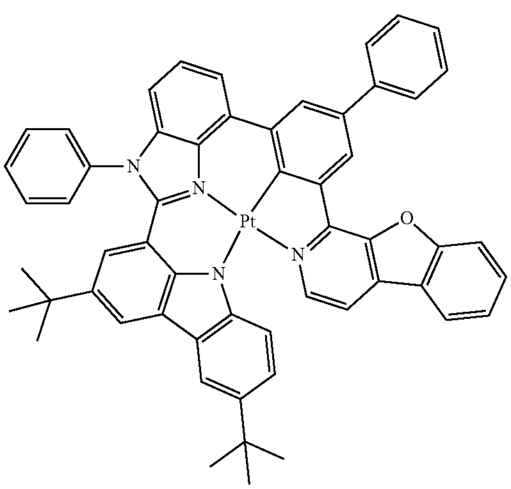
196
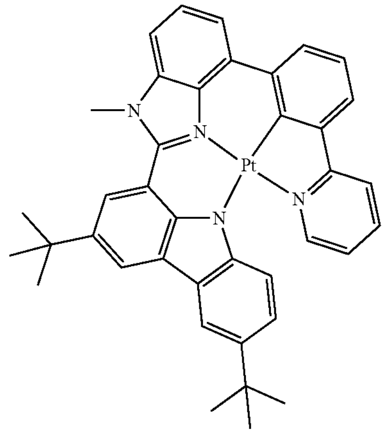
197
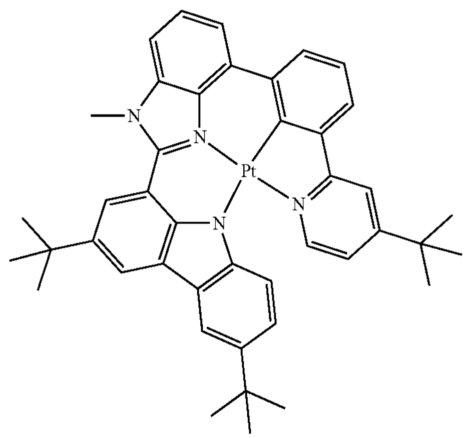
198
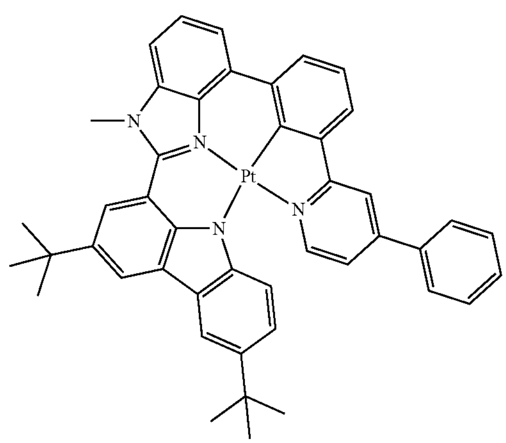

-continued
199
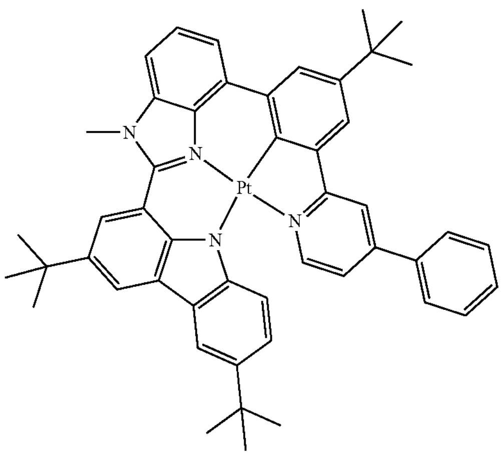
200
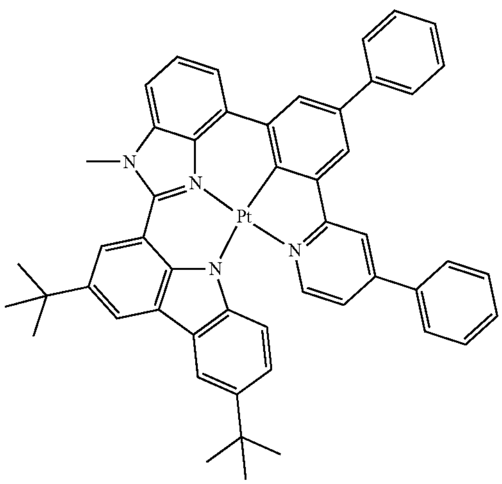
201
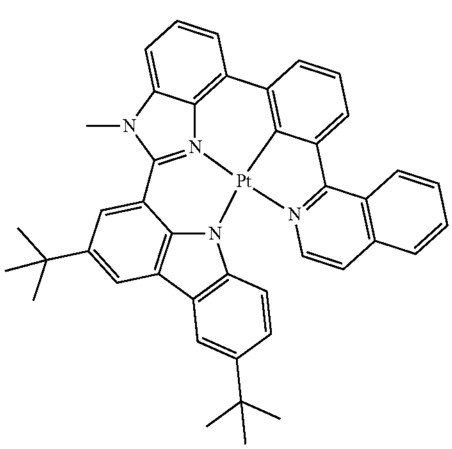
-continued
202
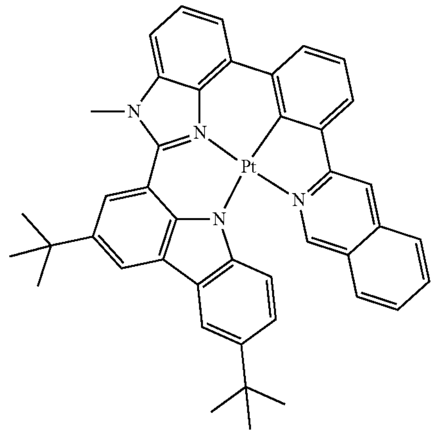
203
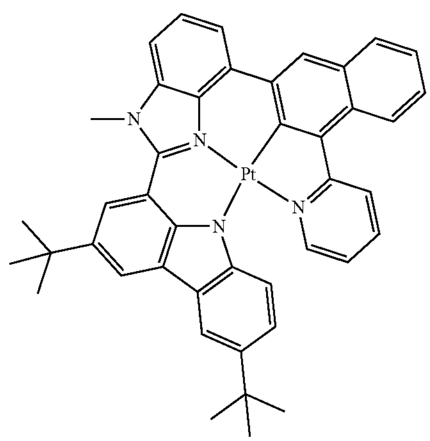
204
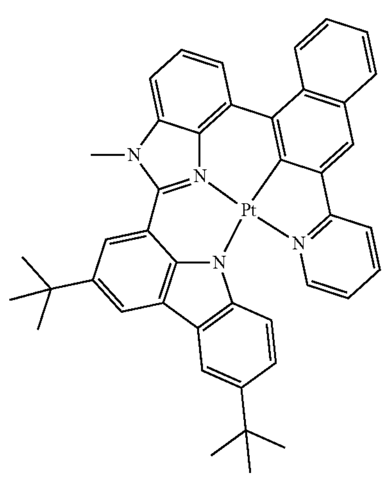

-continued
205
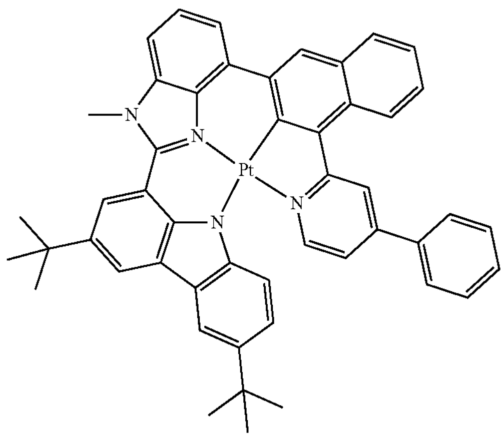
206
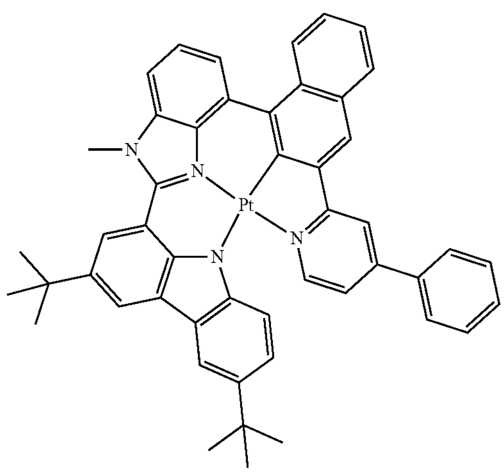
207
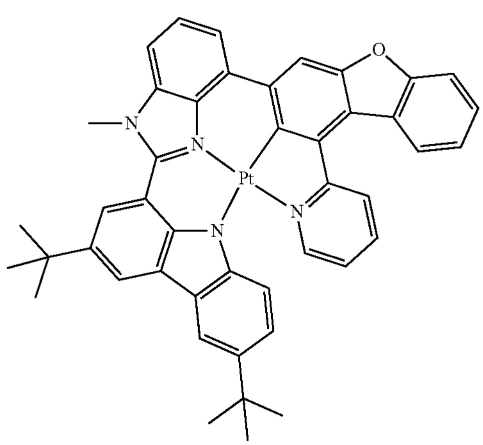
-continued
208
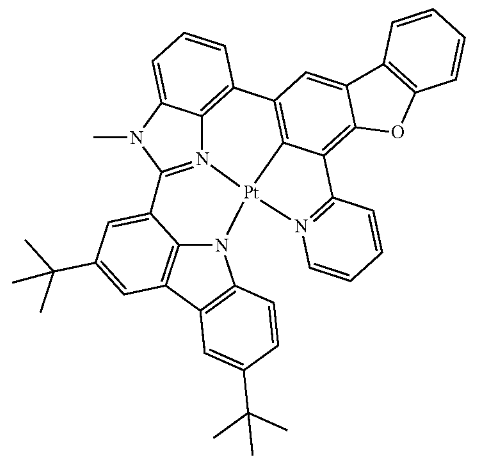
209
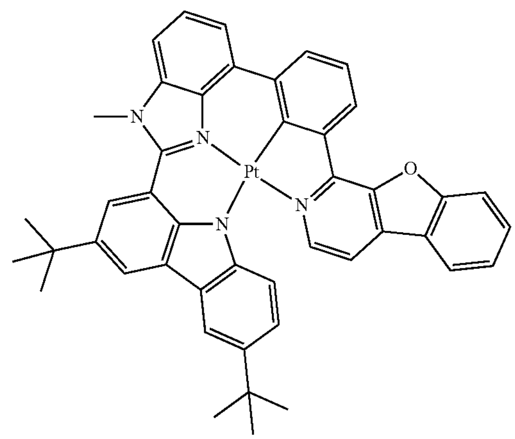
210
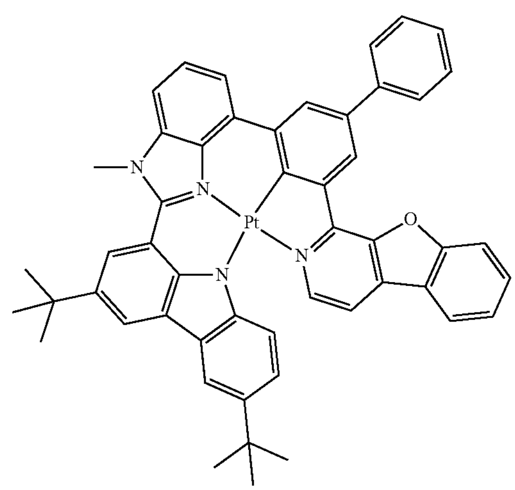

-continued
211
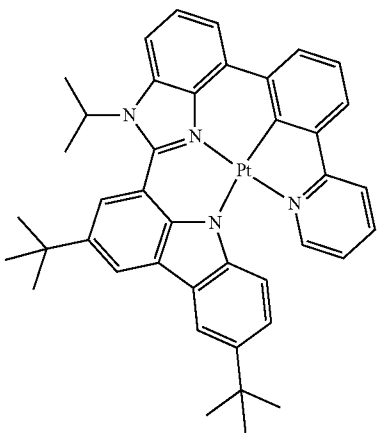
212
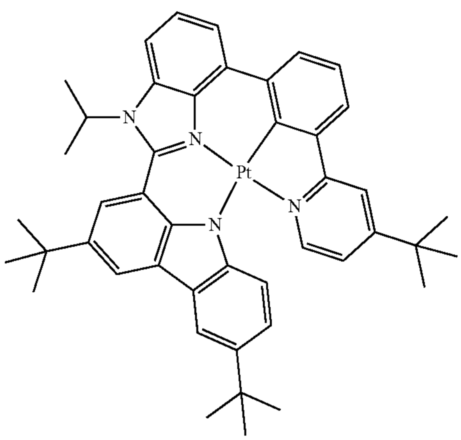
213
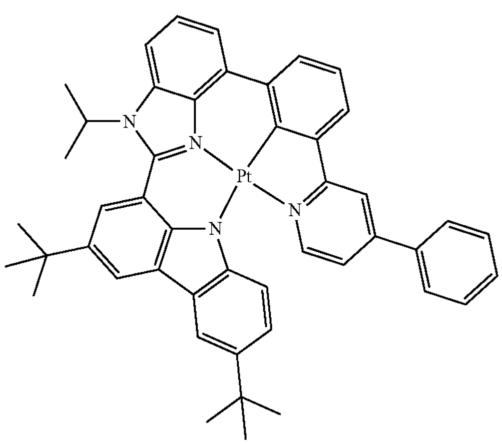
-continued
214
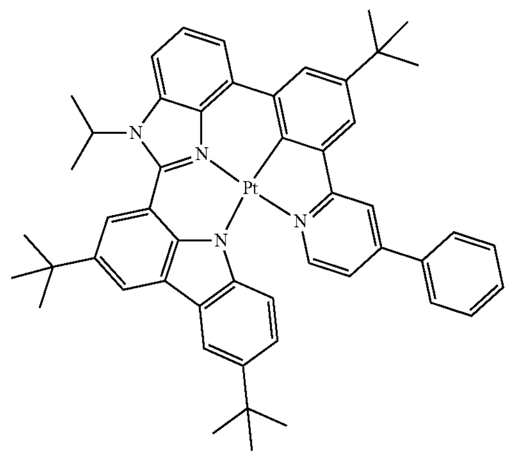
215
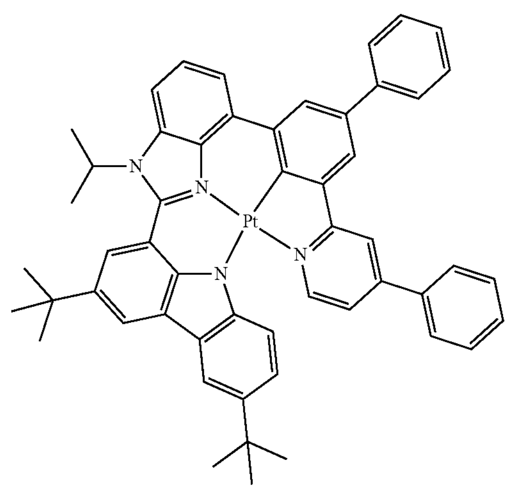
216
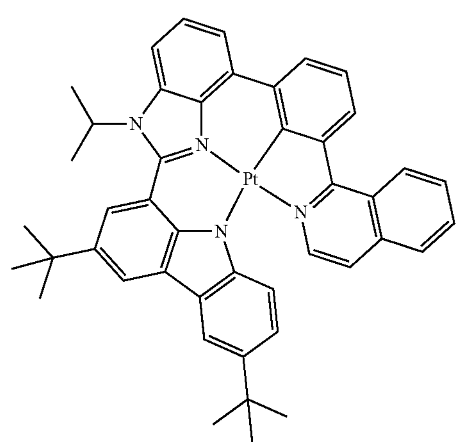

217
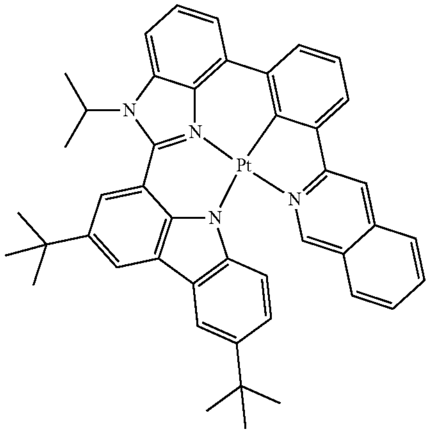
220
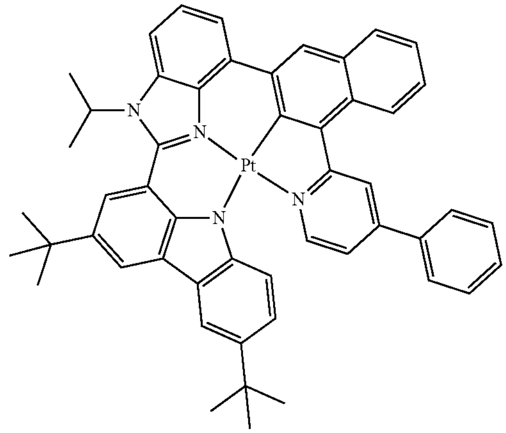
218
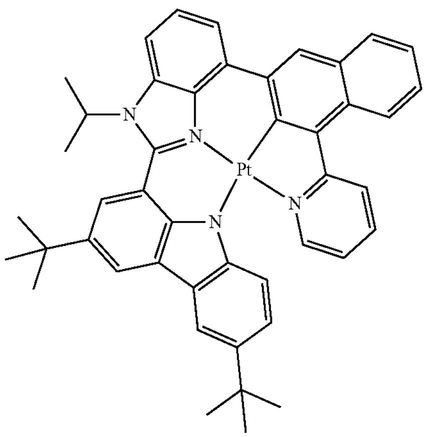
221
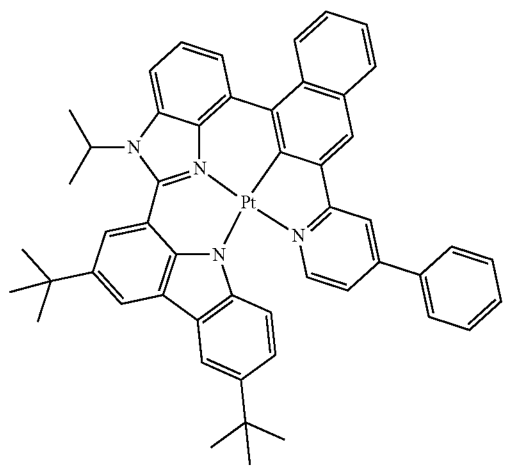
219
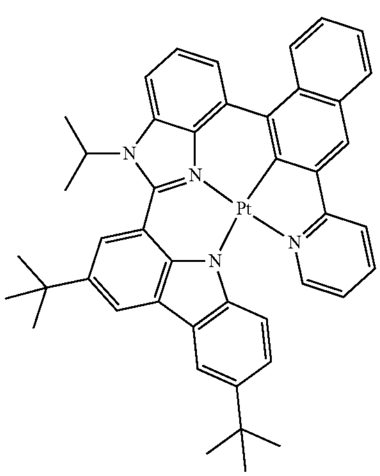
222
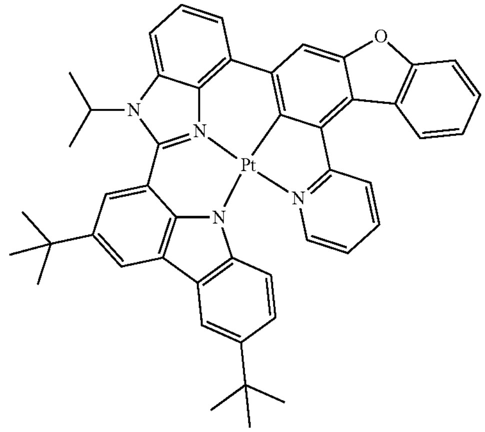

-continued
223
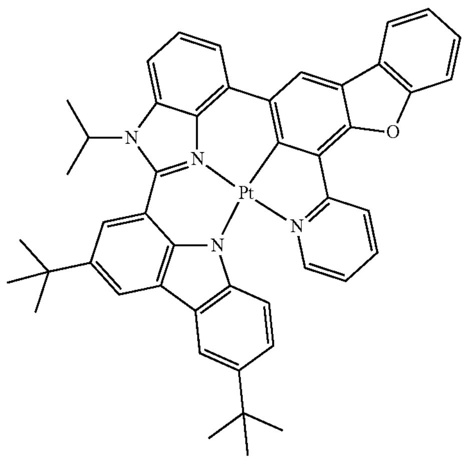
224
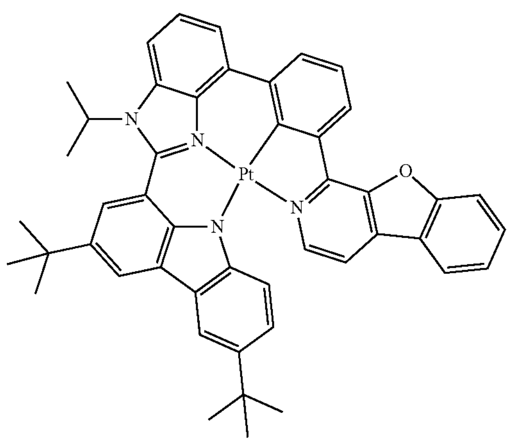
225
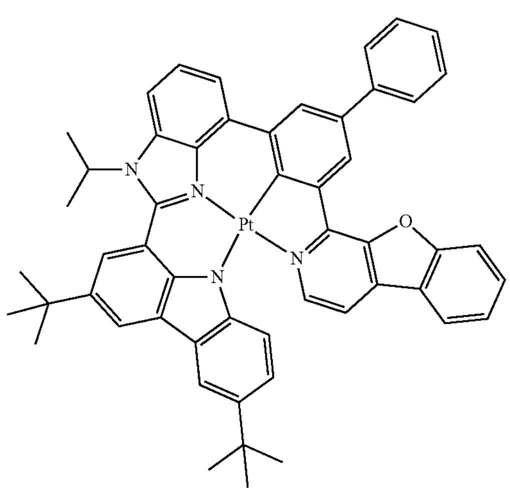
-continued
226
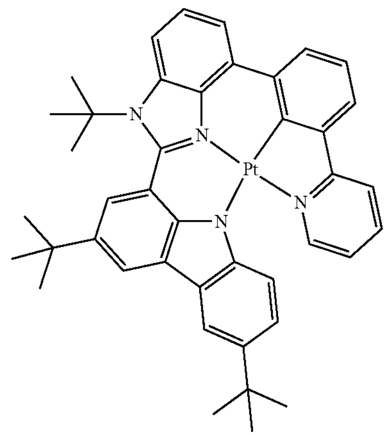
227
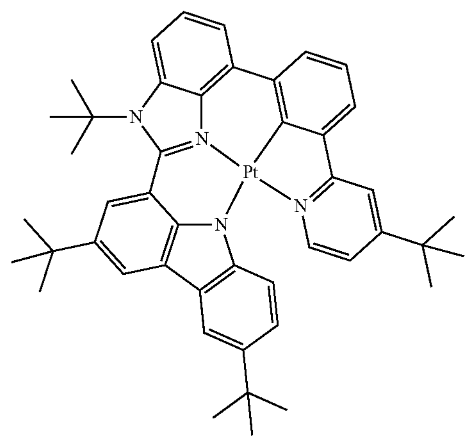
228
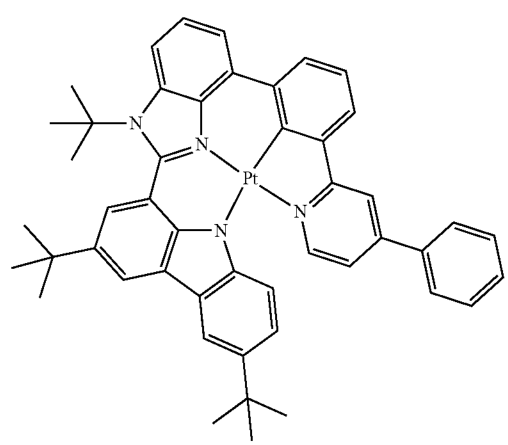

229
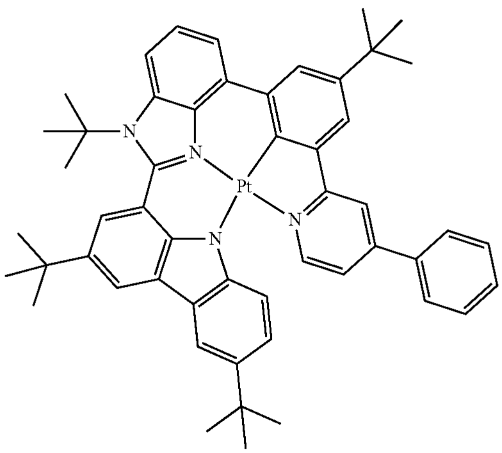
230
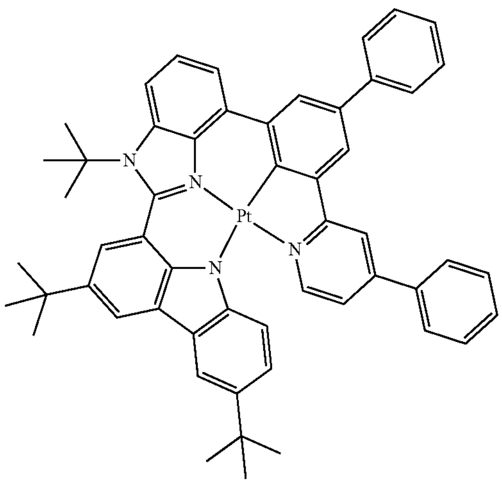
231
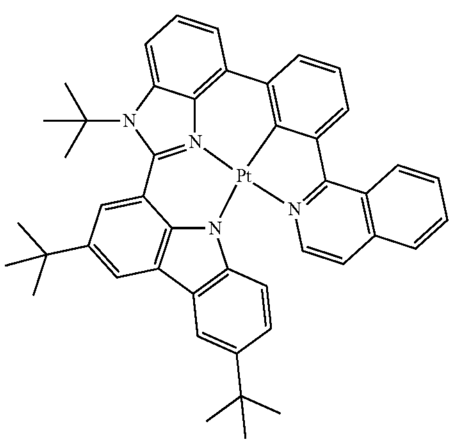
232
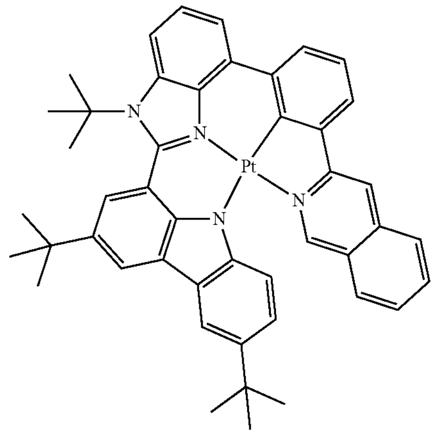
233
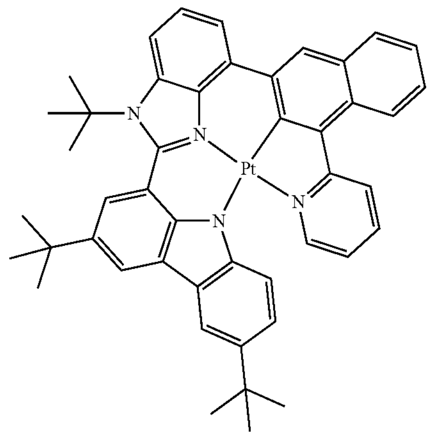
234
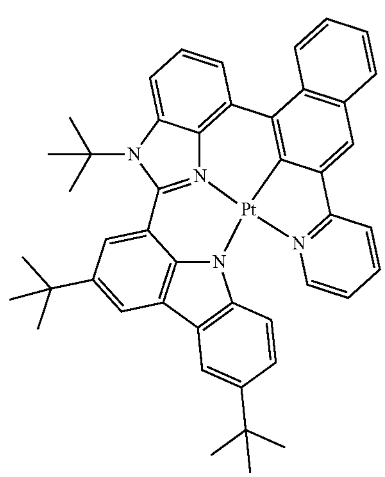

235
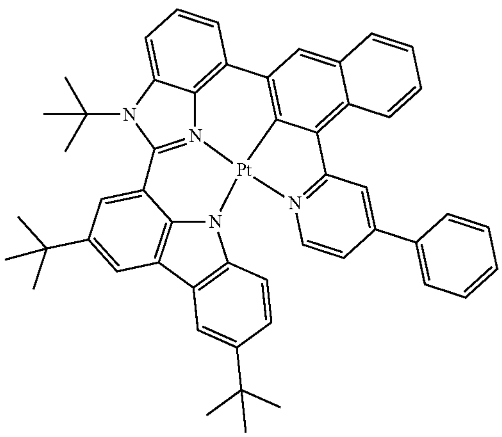
236
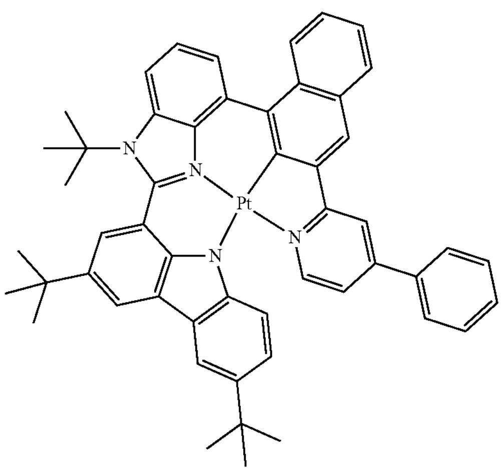
237
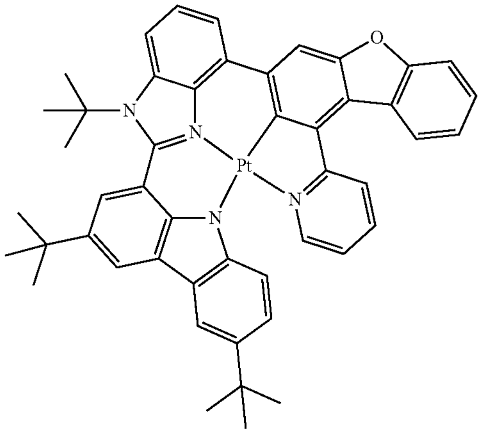
238
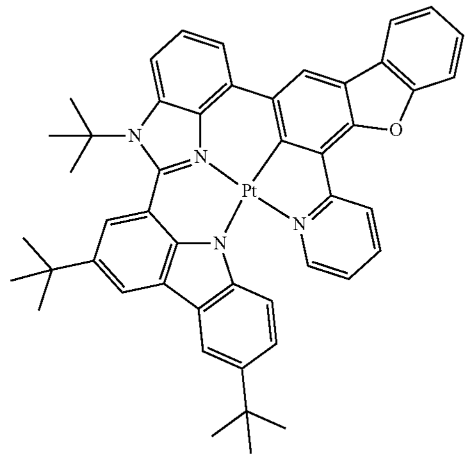
239
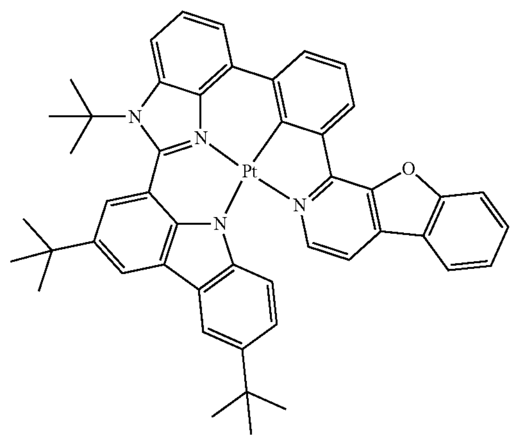
240
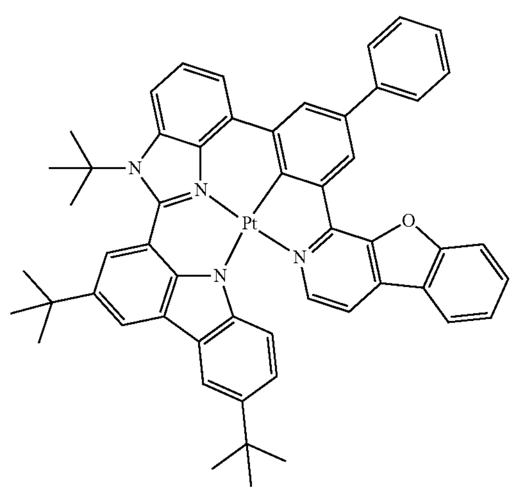

-continued
241
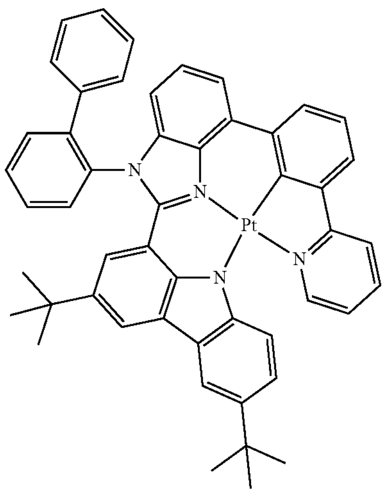
242
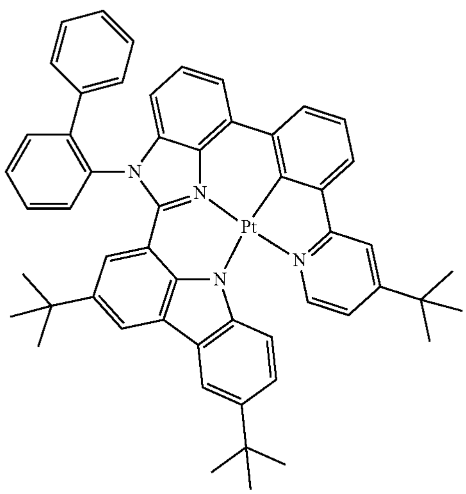
243
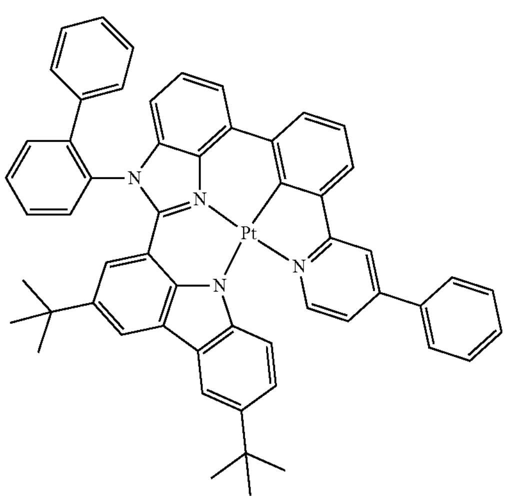
-continued
244
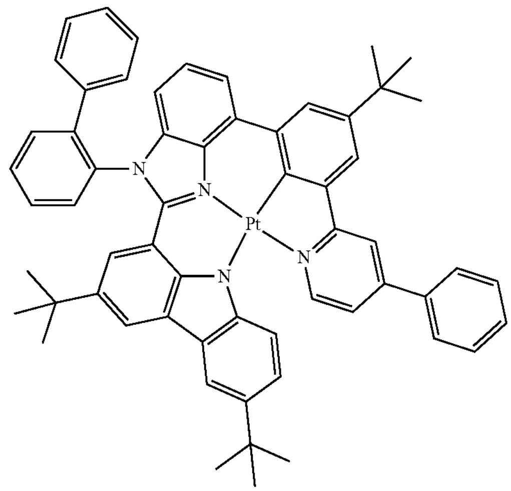
245
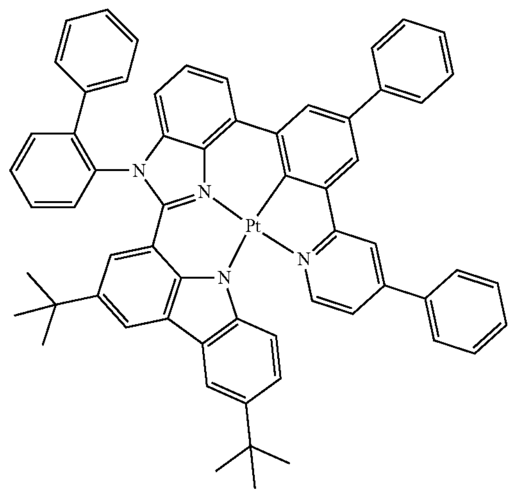
246
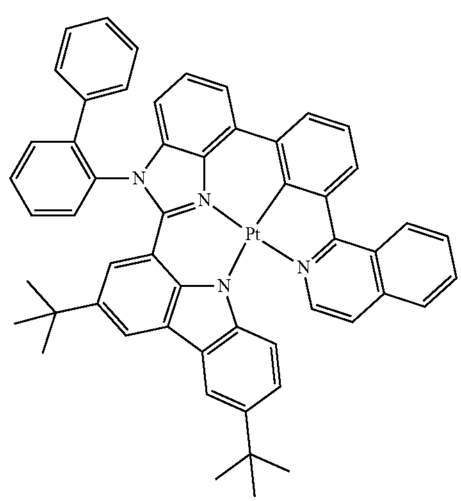

-continued
247
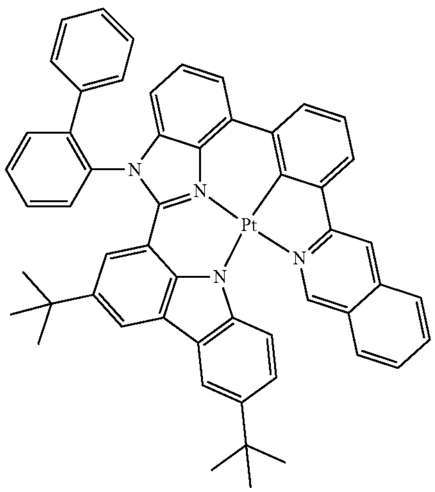
248
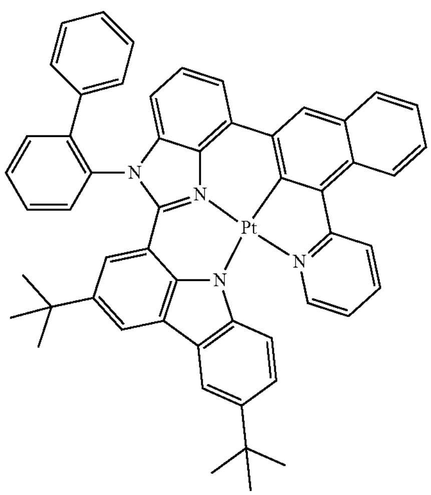
249
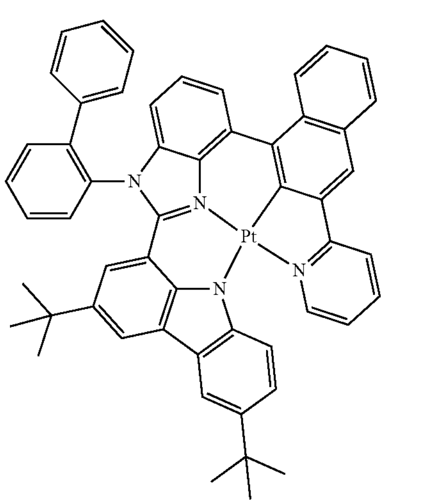
-continued
250
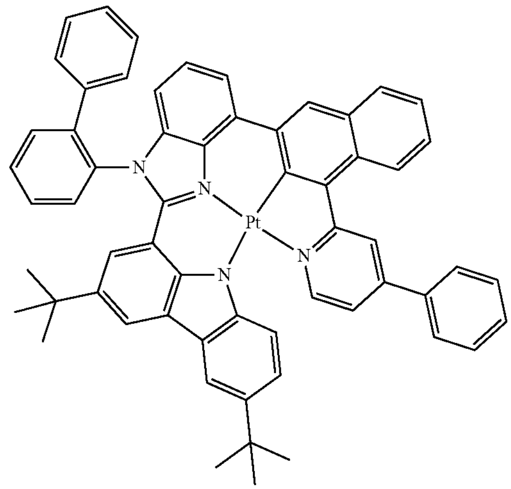
251
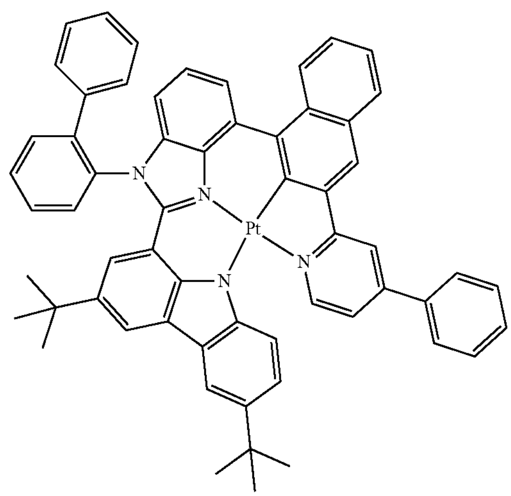
252
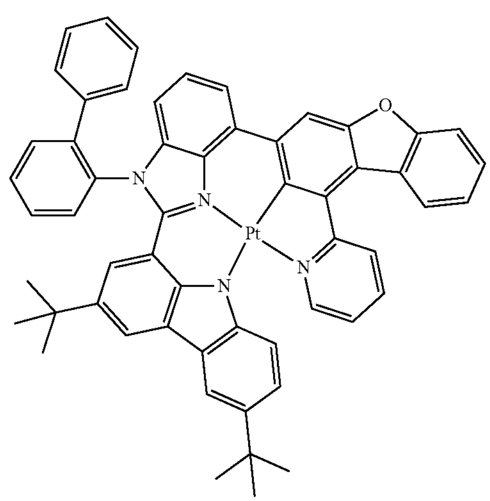

-continued
253
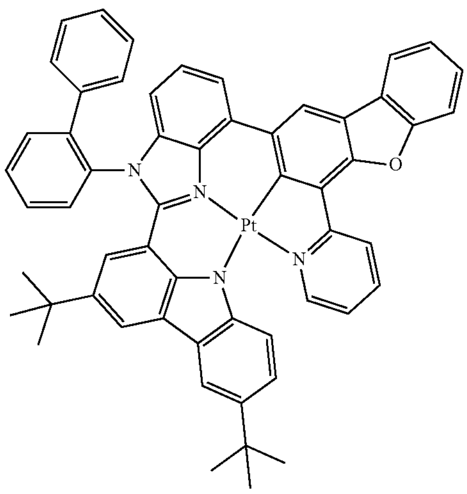
254
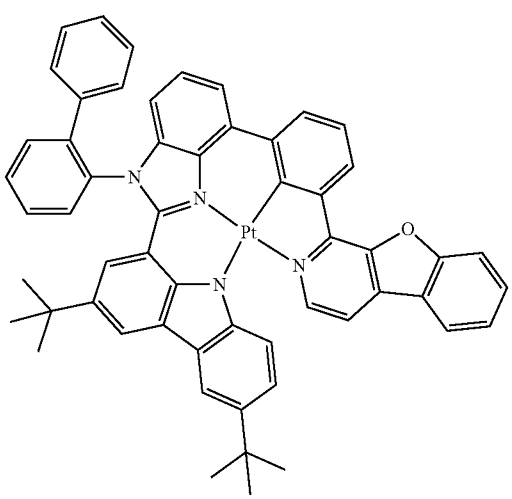
255
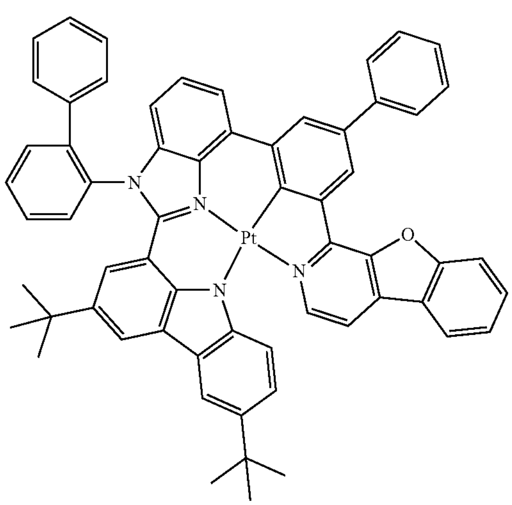
-continued
256
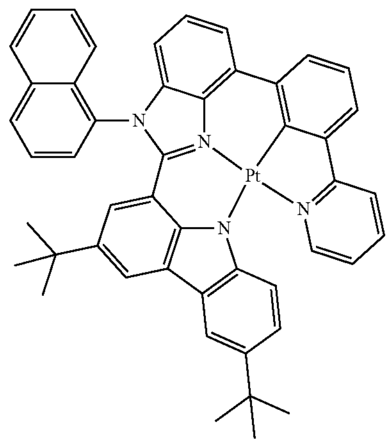
257
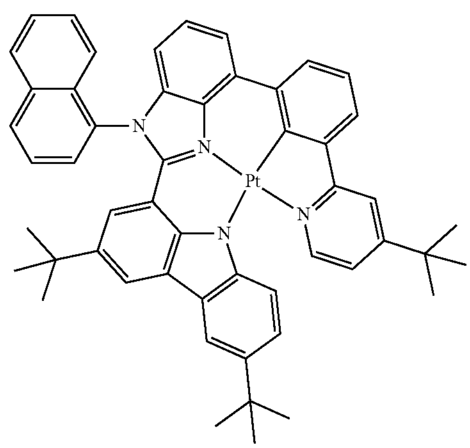
258
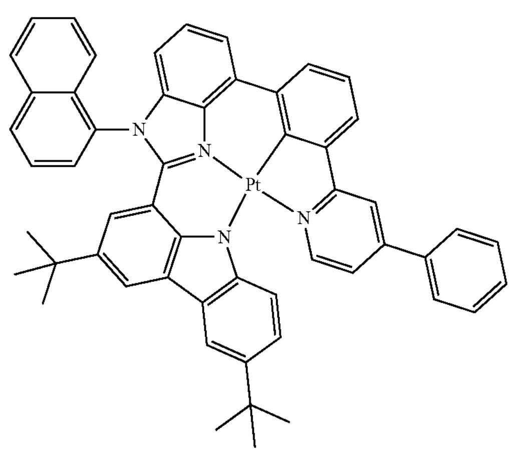

259
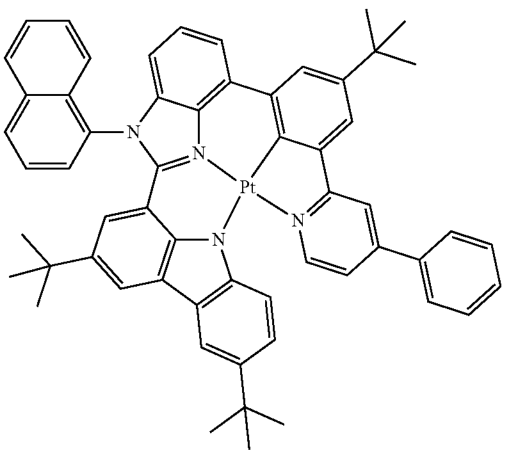
260
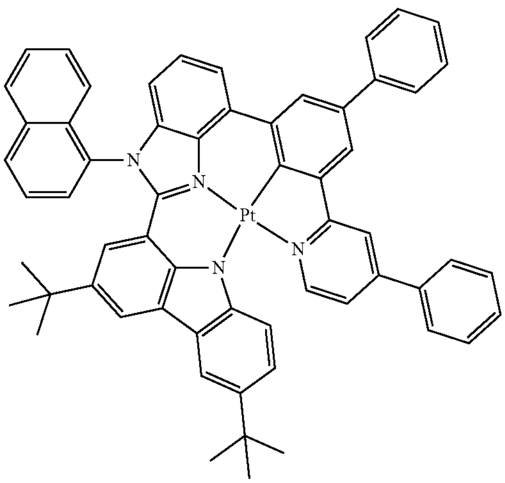
261
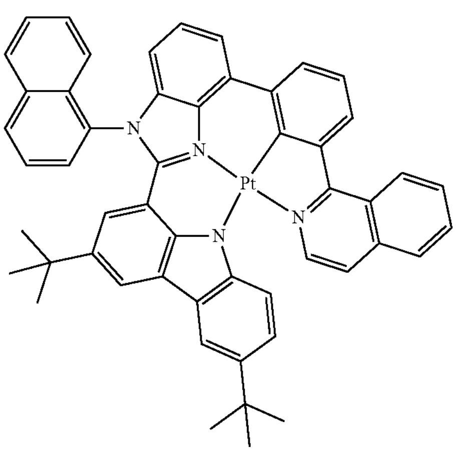
262
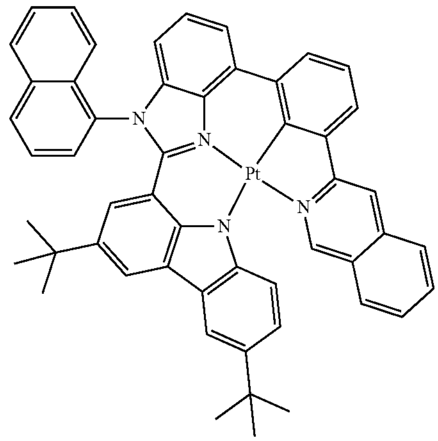
263
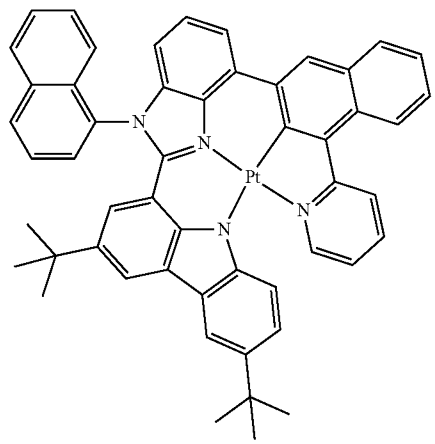
264
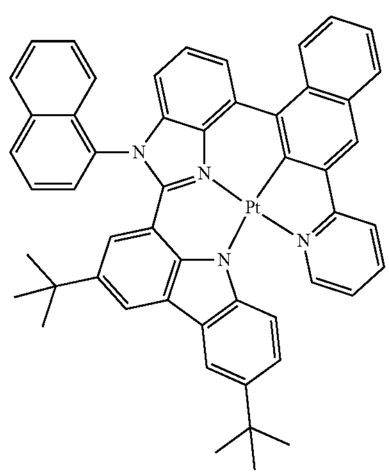

-continued
265
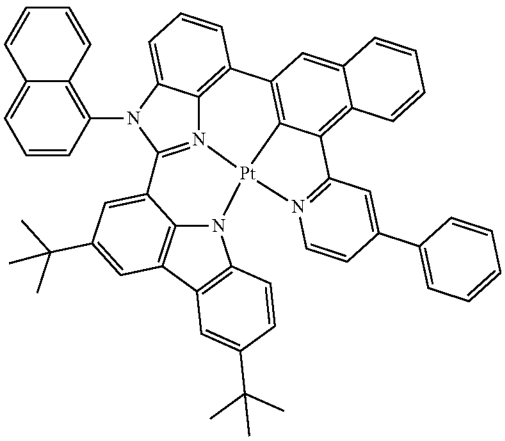
266
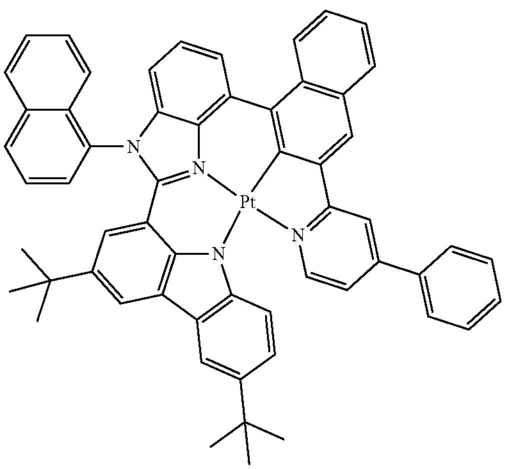
267
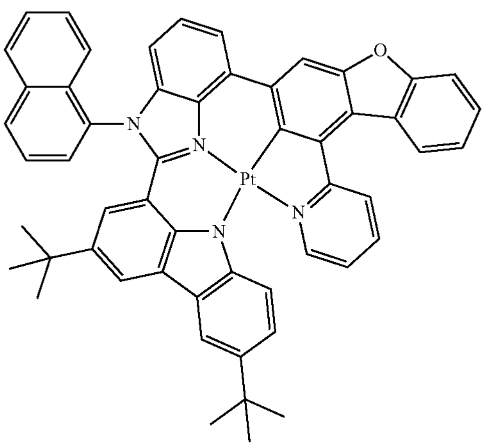
-continued
268
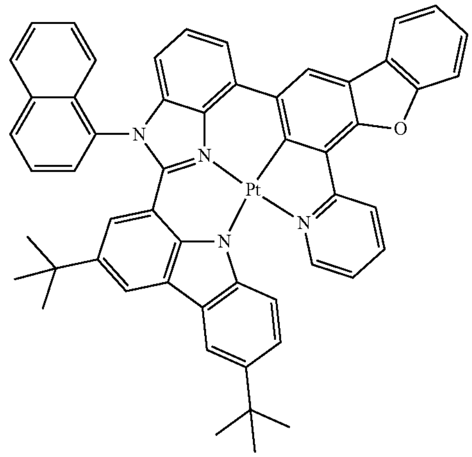
269
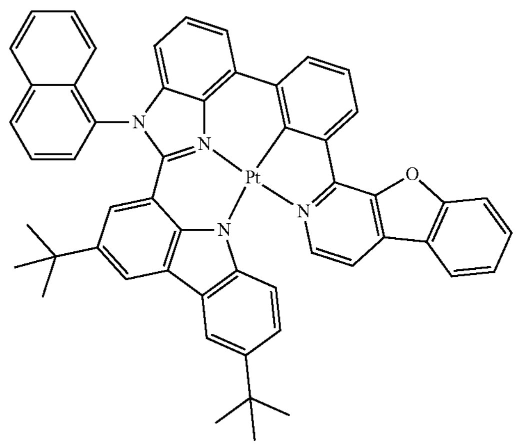
270
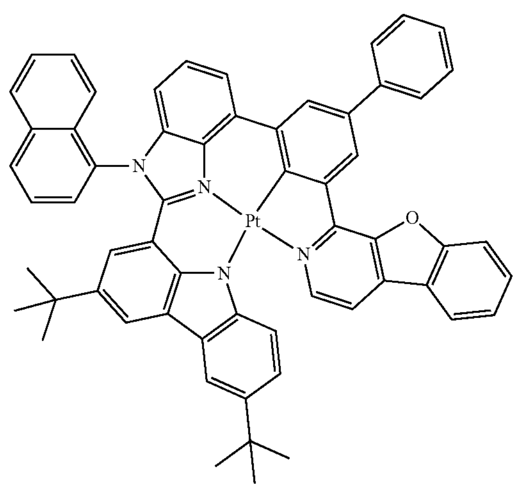

-continued

271

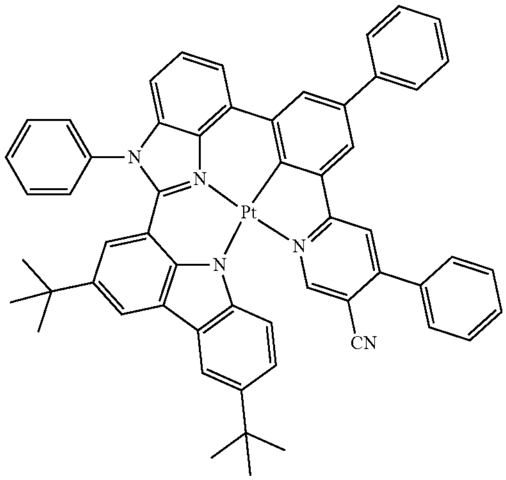

272

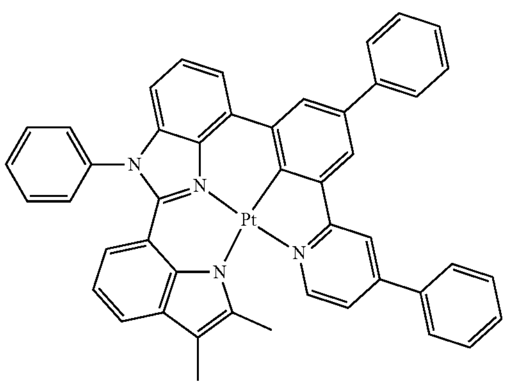

273

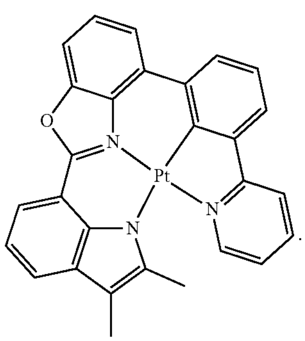

In Formula 1, two bonds selected from a bond between $A_1$ and M, a bond between $A_2$ and M, a bond between $A_3$ and M, and a bond between $A_4$ and M may each be a covalent bond, and the others thereof may each be a coordinate bond. Accordingly, since the organometallic compound is electrically neutral, molecular structural stability and thermal stability thereof may be increased.

In addition, $A_1$ in Formula 1 may be represented by Formula A1-1 or A1-2, and ring $CY_1$ in Formulae A1-1 and A1-2 may be a 5-membered ring. Accordingly, planarity of the organometallic compound increases, and the lifespan and/or efficiency of an electronic device, for example, an organic light-emitting device, which includes an organometallic compound, may be improved.

Furthermore, i) when $A_1$ in Formula 1 is represented by Formula A1-1, the organometallic compound represented by Formula 1 satisfies "Condition 1", and ii) when $A_1$ in Formula 1 is represented by Formula A1-2, the organometallic compound represented by Formula 1 satisfies at least one of "Condition 1" to "Condition 3". Accordingly, appropriate angles may be maintained between different structural moieties included in the organometallic compound, and the organometallic compound may have a stable covalent number and/or coordination number, thereby more improving molecular stability of the organometallic compound.

For example, the highest occupied molecular orbital (HOMO) energy level, the lowest unoccupied molecular orbital (LUMO) energy level, an energy band gap ($E_g$), a singlet ($S_1$) energy level, and a triplet ($T_1$) energy level of some Compounds were evaluated by using a density functional theory (DFT) method of a Gaussian program (B3LYP, structurally optimized at a level of 6-31G(d,p)). Evaluation results thereof are shown in Table 1.

TABLE 1

| Compound No. | HOMO (eV) | LUMO (eV) | Eg energy level (eV) | $S_1$ energy level (eV) | $T_1$ energy level (eV) |
|---|---|---|---|---|---|
| 185 | −4.505 | −1.791 | 2.714 | 2.230 | 2.091 |
| 5 | −4.598 | −1.802 | 2.796 | 2.301 | 2.158 |
| 271 | −4.594 | −2.287 | 2.307 | 1.848 | 1.736 |
| 272 | −4.477 | −1.805 | 2.672 | 2.213 | 2.028 |
| 273 | −4.694 | −1.813 | 2.881 | 2.406 | 1.984 |

From Table 1, it is confirmed that the organometallic compound represented by Formula 1 has such electrical characteristics that are suitable for use in an electronic device, for example, for use as a dopant for an organic light-emitting device.

Synthesis methods of the organometallic compound represented by Formula 1 may be apparent to those of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes:

a first electrode;

a second electrode; and an organic layer that is disposed between the first electrode and the second electrode, wherein the organic layer includes an emission layer and at least one of the organometallic compound represented by Formula 1.

The organic light-emitting device may have, due to the inclusion of an organic layer including the organometallic compound represented by Formula 1, a low driving voltage, high emission efficiency, high quantum emission efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this embodiment, the organometallic compound may act as a dopant, and the emission layer may further include a host (that is, an amount of the organometallic compound represented by Formula 1 is smaller than an amount of the host).

The expression "(an organic layer) includes at least one organometallic compound" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include, as the organometallic compound, only Compound 1. In this embodiment, Compound 1 may be included in an emission layer of the organic light-emitting device. In one or more embodiments, the organic layer may include, as the organometallic compound, Compound 1 and Compound 2. In this regard, Compound 1 and Compound 2 may be included in an identical layer (for example, Compound 1 and Compound 2 all may be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, or any combination thereof, and wherein the electron transport region includes a hole blocking layer, an electron transport layer, an electron injection layer, or any combination thereof.

The term "organic layer" as used herein refers to a single layer and/or a plurality of layers disposed between the first electrode and the second electrode of the organic light-emitting device. The "organic layer" may include, in addition to an organic compound, an organometallic complex including metal.

The FIG. 1*s* a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. As the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec (Angstroms per second) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

-continued
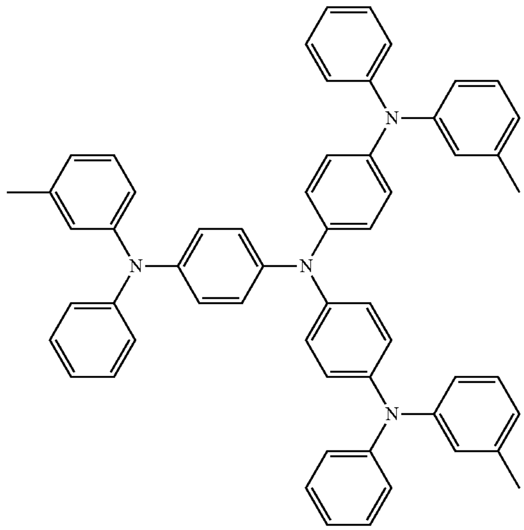
m-MTDATA
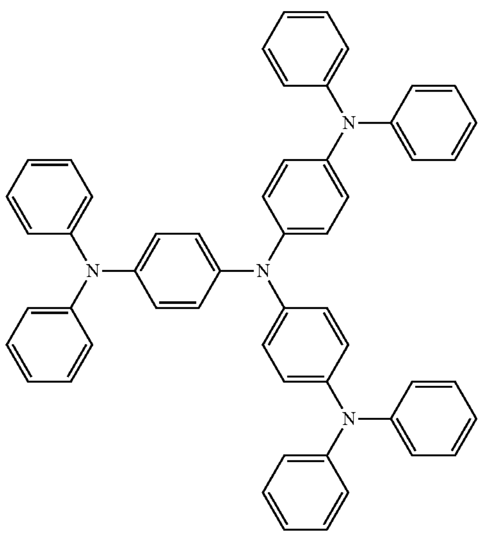
TDATA
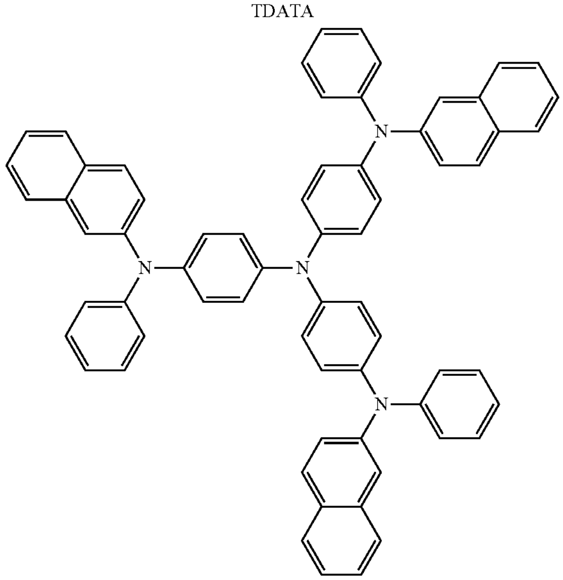
2-TNATA
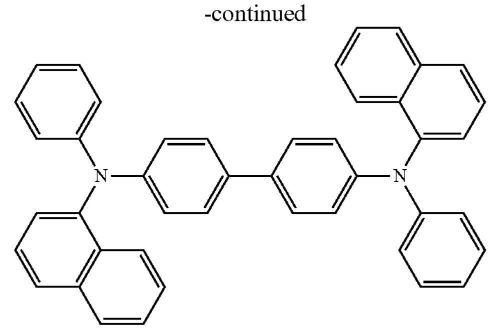
NPB
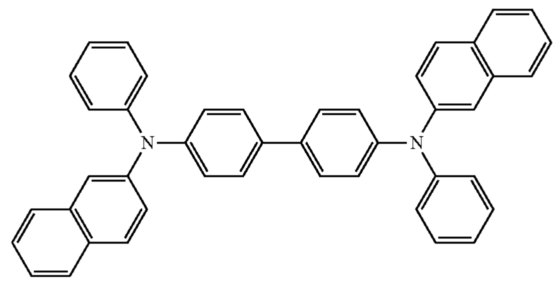
β-NPB
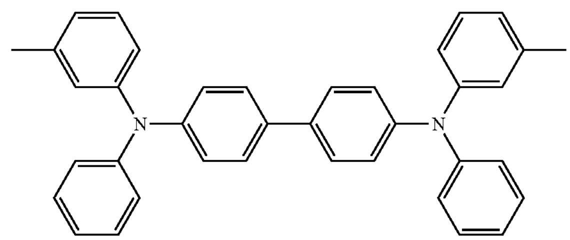
TPD
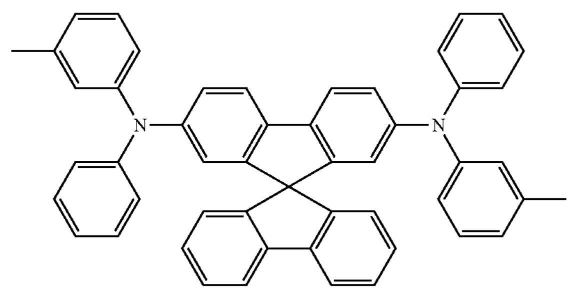
Spiro-TPD
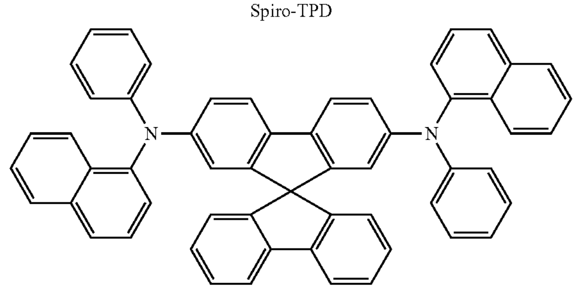
Spiro-NPB -continued

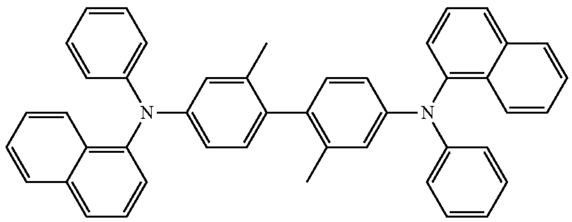

methylated NPB

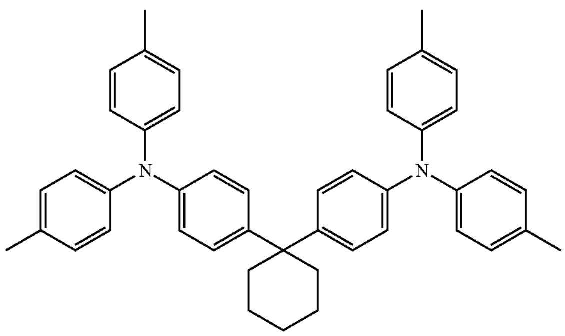

TAPC

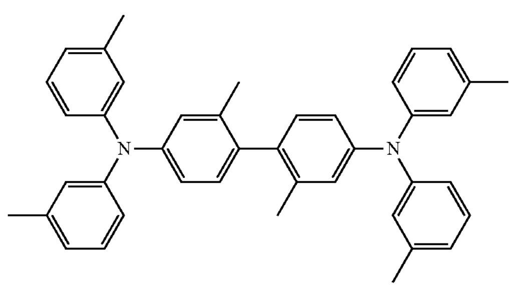

HMTPD

Formula 201

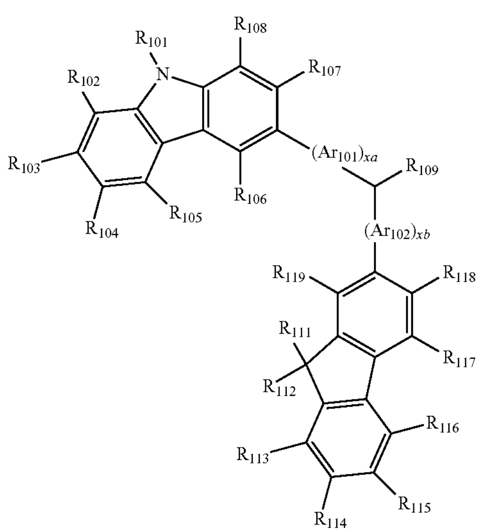

-continued

Formula 202

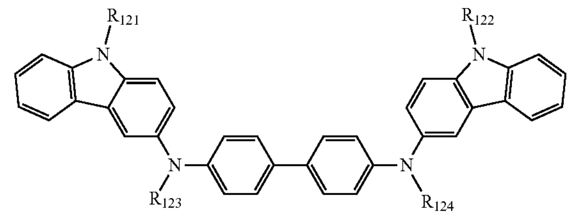

$Ar_{101}$ and $Ar_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

xa and xb in Formula 201 may each independently be an integer from 0 to 5, or may each independently be 0, 1, or 2. For example, xa may be 1, and xb may be 0, but embodiments of the present disclosure are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, and so on), and a $C_1$-$C_{10}$ alkoxy group (for example, a methoxy group, an ethoxy group, a propoxy group, a butoxy group, a pentoxy group, and so on);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In an embodiment, the compound represented by Formula 201 may be represented by Formula 201A, but embodiments of the present disclosure are not limited thereto:

Formula 201A

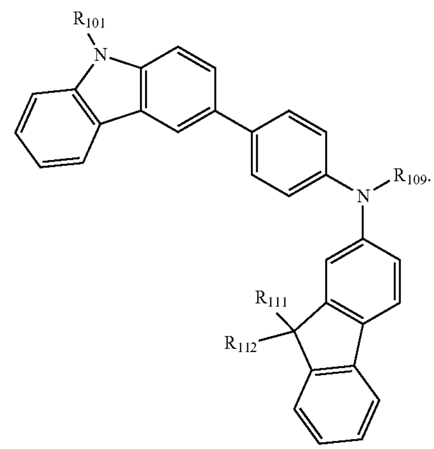

$R_{101}$, $R_{111}$, $R_{112}$, and $R_{109}$ in Formula 201A are the same as described herein.

For example, the compound represented by Formula 201, and the compound represented by Formula 202 may include compounds HT1 to HT20 illustrated below, but are not limited thereto:

HT1

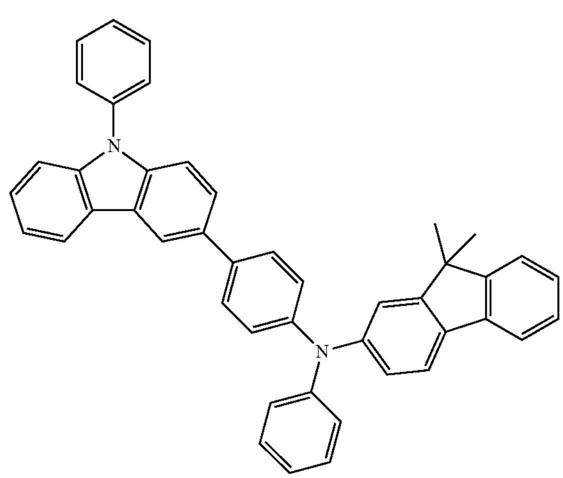

HT2

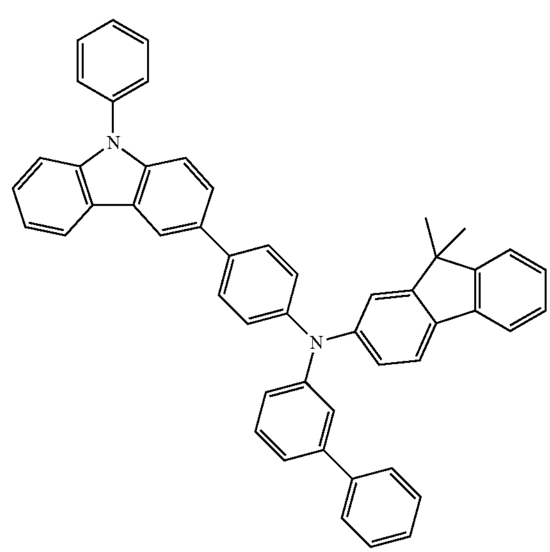

-continued
HT3
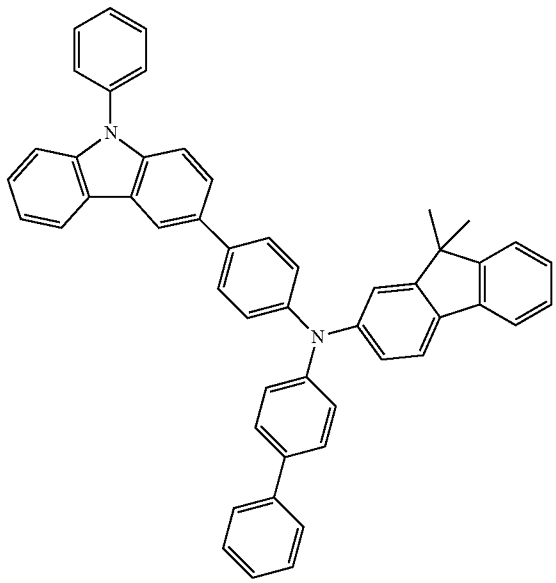
HT4
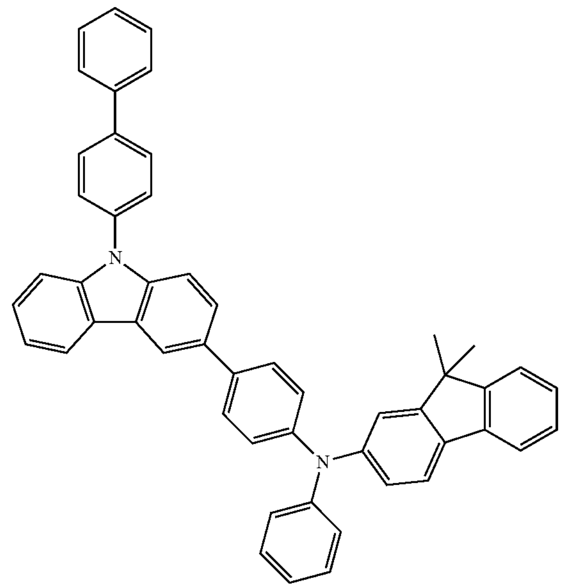
HT5
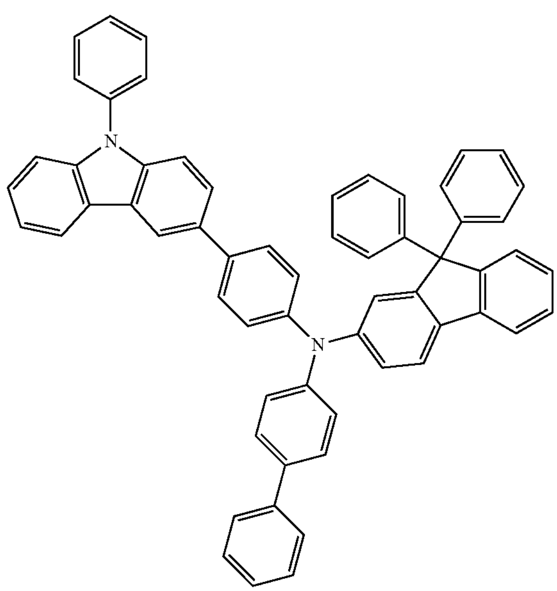
HT6
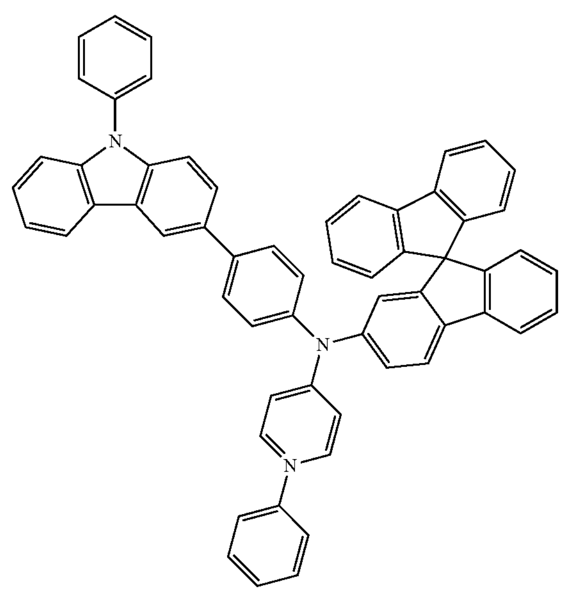

-continued
HT7
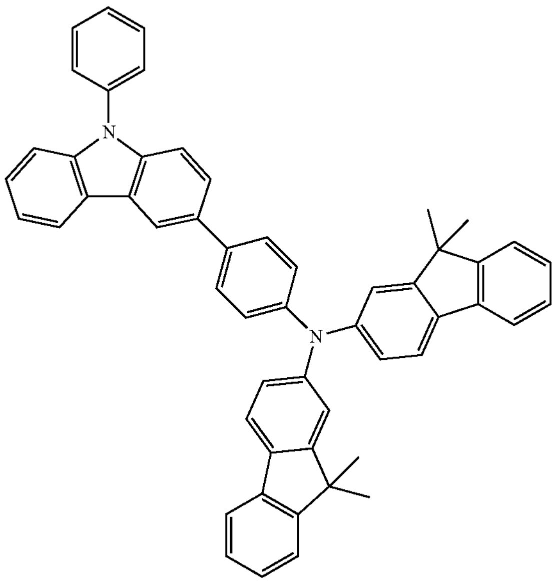
HT8
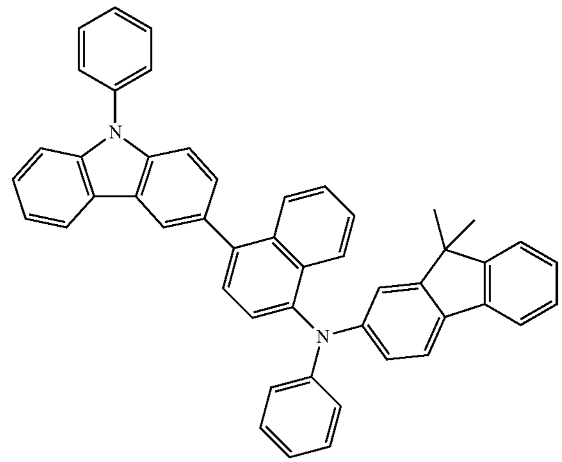
HT9
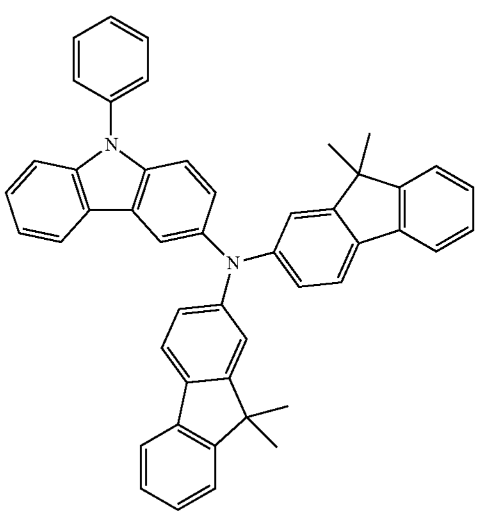
HT10
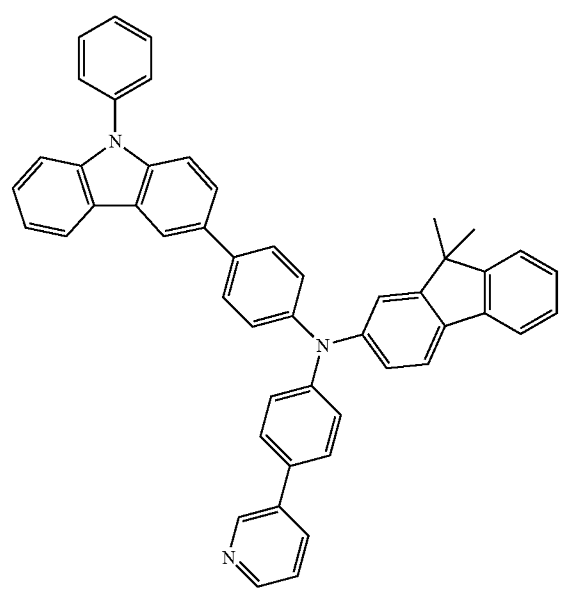

-continued
HT11
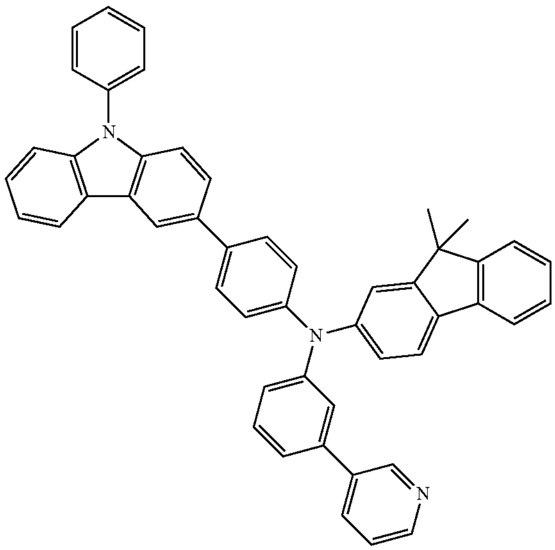
HT12
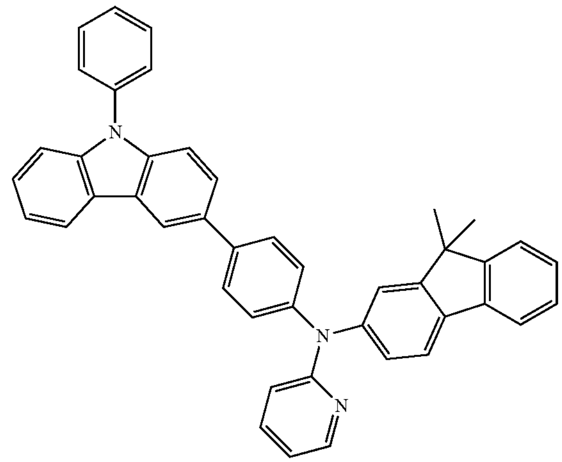
HT13
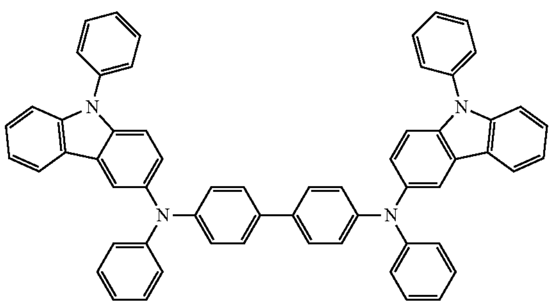
HT14
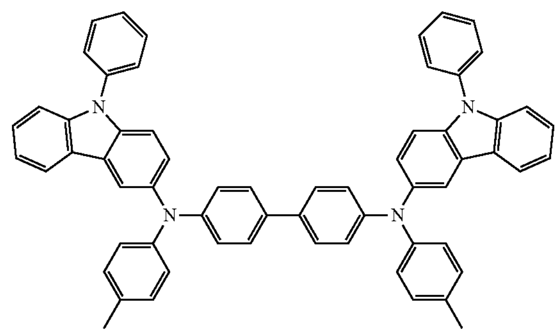
HT15
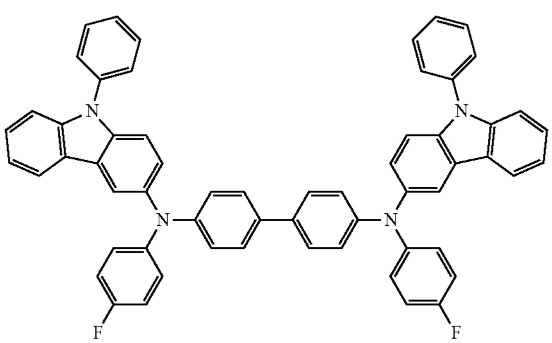
HT16
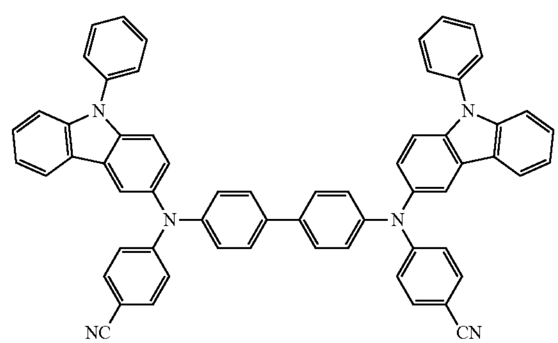

-continued

HT17

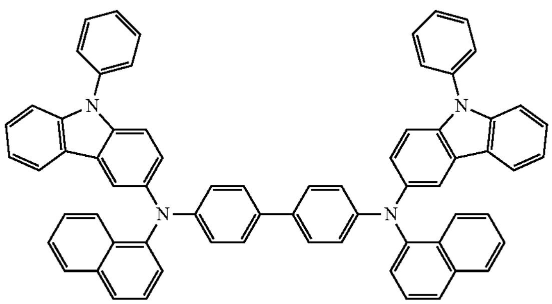

HT18

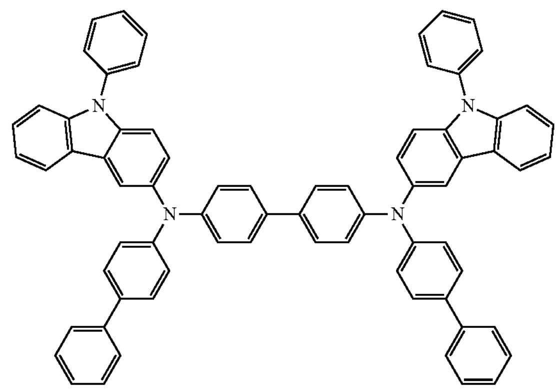

HT19

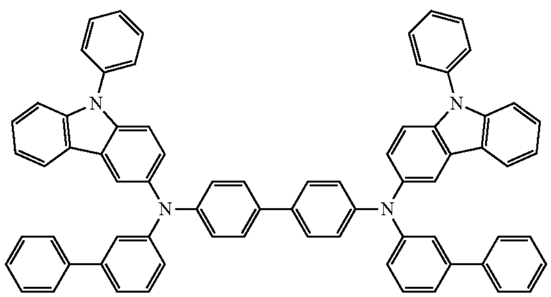

HT20

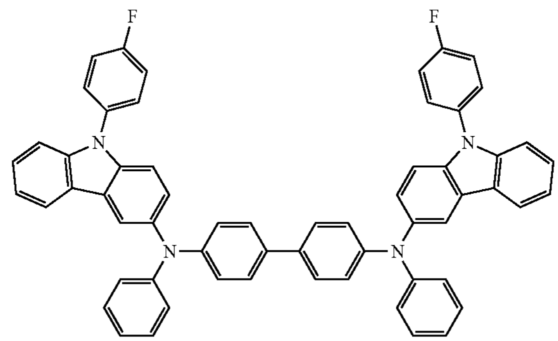

A thickness of the hole transport region may be in a range of about 100 Å (Angstroms) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto:

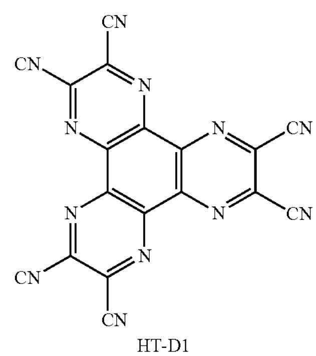

HT-D1

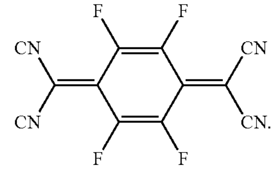

F4-TCNQ

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

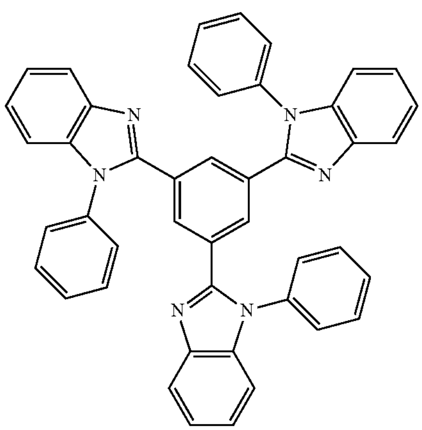

TPBi

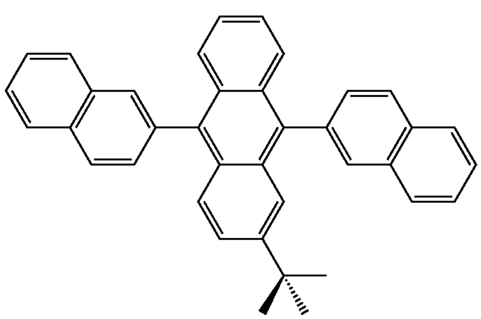

TBADN

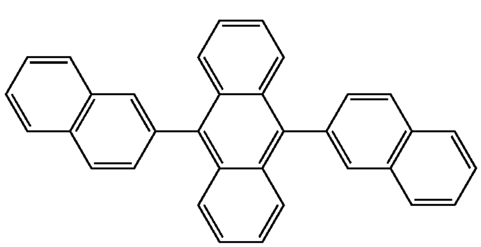

ADN

-continued

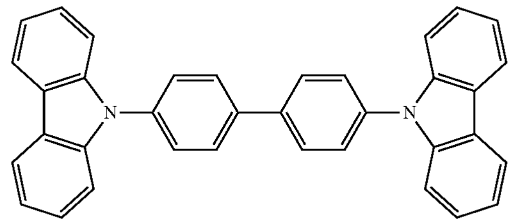

CBP

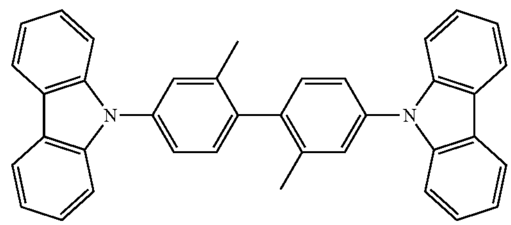

CDBP

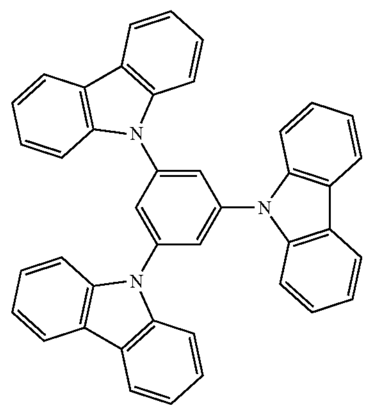

TCP

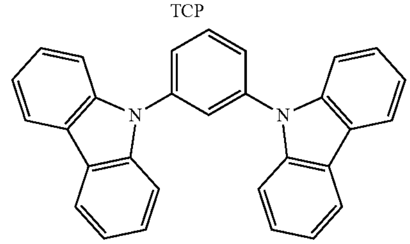

mCP

H50

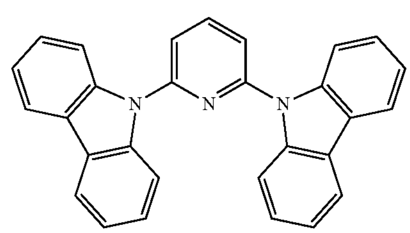

H51

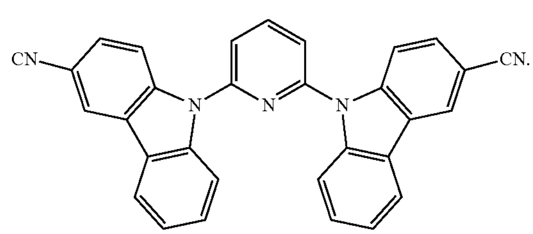

In one or more embodiments, the host may further include a compound represented by Formula 301 below.

Formula 301

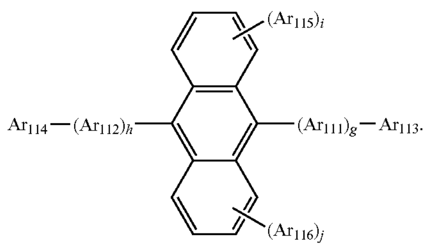

$Ar_{111}$ and $Ar_{112}$ in Formula 301 may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i, and j in Formula 301 may each independently be an integer from 0 to 4, for example, 0, 1, or 2.

$Ar_{113}$ to $Ar_{116}$ in Formula 301 may each independently be selected from:

a $C_1$-$C_{10}$ alkyl group substituted with at least one selected from a phenyl group, a naphthyl group, and an anthracenyl group;

a phenyl group, a naphthyl group, an anthracenyl group, a pyrenyl group, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

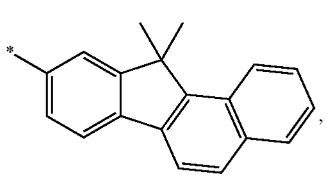 [SMILES: *c1ccc2c(c1)C(C)(C)c1c-2ccc2ccccc12]

but embodiments of the present disclosure are not limited thereto.

In one or more embodiments, the host may include a compound represented by Formula 302:

Formula 302

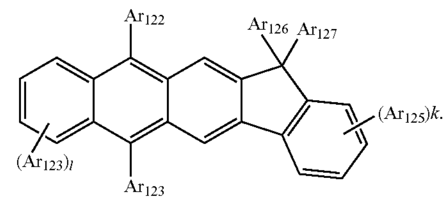

$Ar_{122}$ to $Ar_{125}$ in Formula 302 are the same as described in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

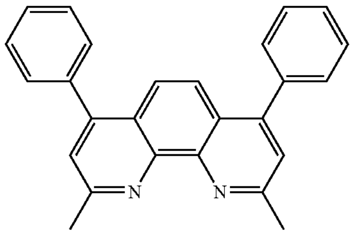
BCP

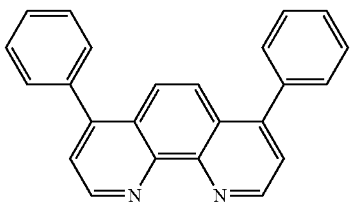
Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, Bphen, $Alq_3$, BAlq, TAZ, and NTAZ:

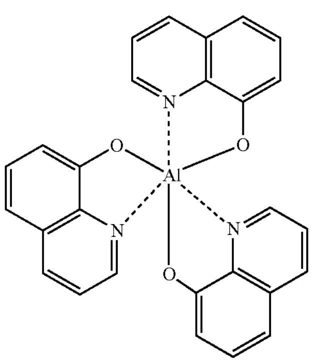
$Alq_3$

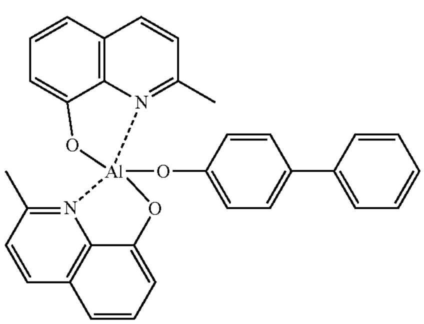
BAlq

-continued

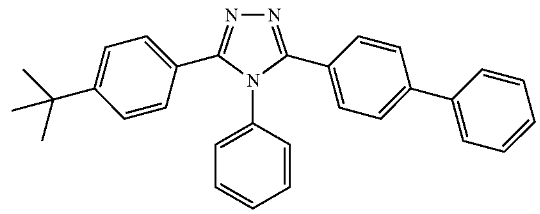
TAZ

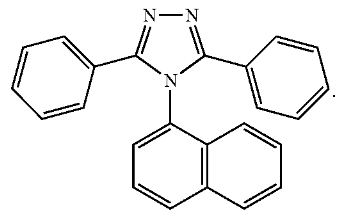
NTAZ

In one or more embodiments, the electron transport layer may include at least one of ET1 to ET25, but are not limited thereto:

ET1

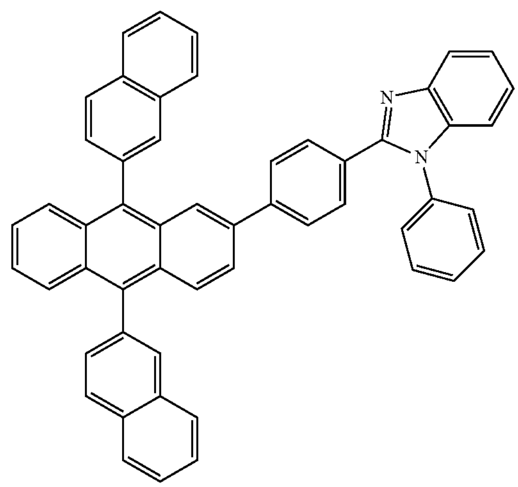

ET2

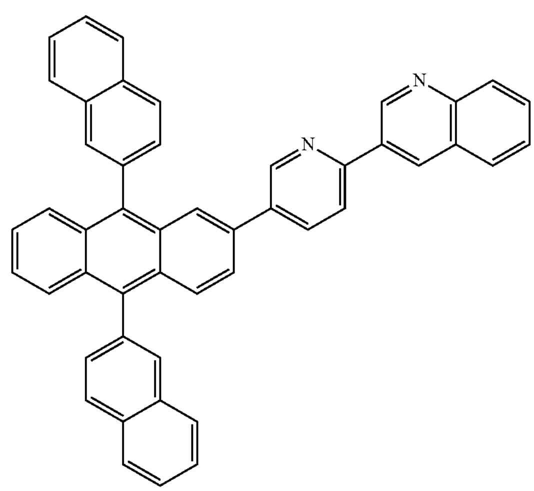

-continued
ET3
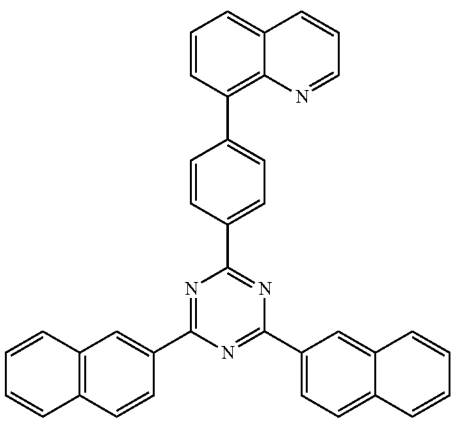
ET4
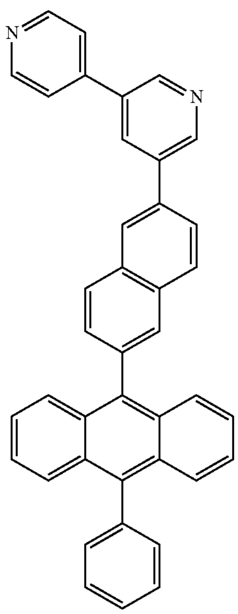
ET5
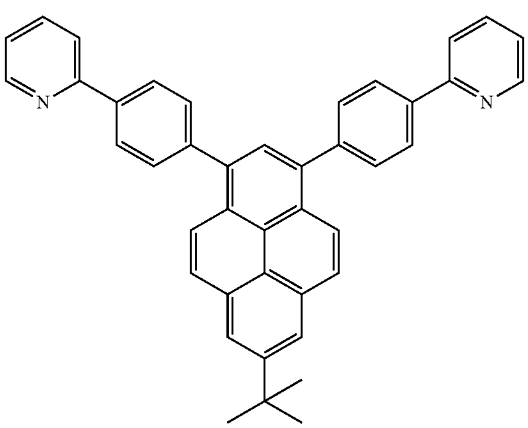
-continued
ET6
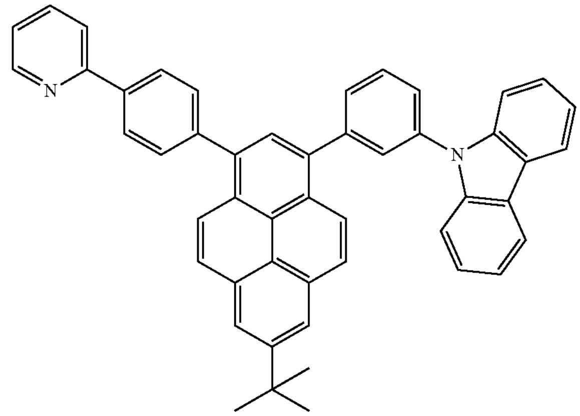
ET7
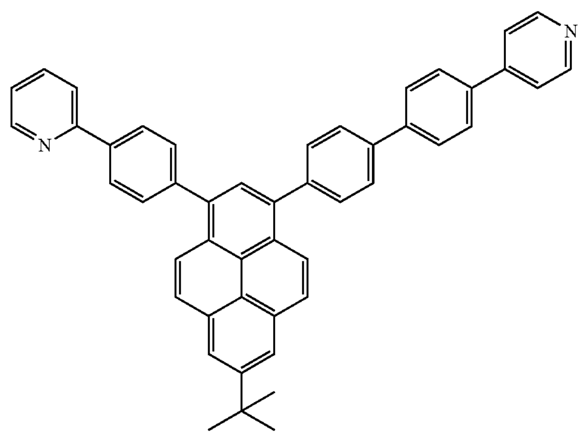
ET8
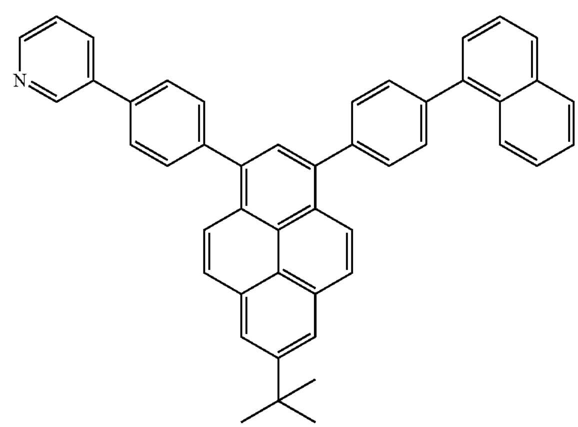

204
-continued
ET9
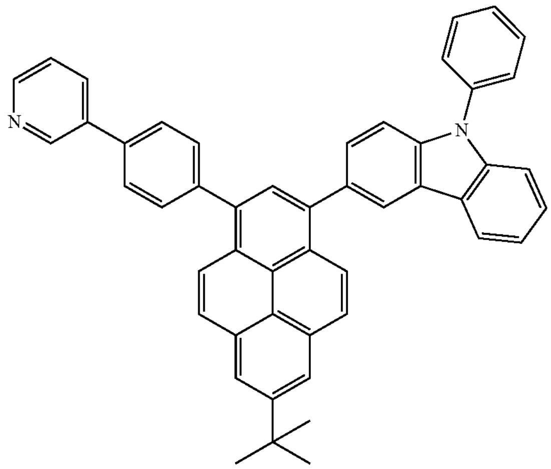
ET10
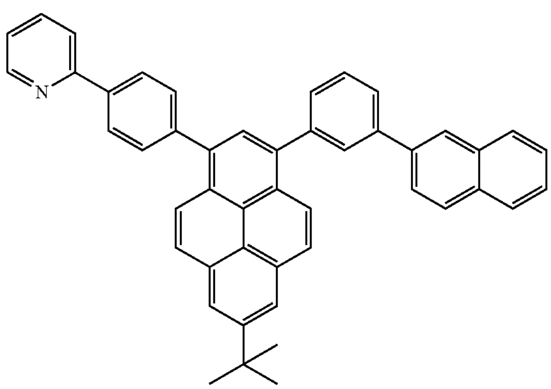
ET11
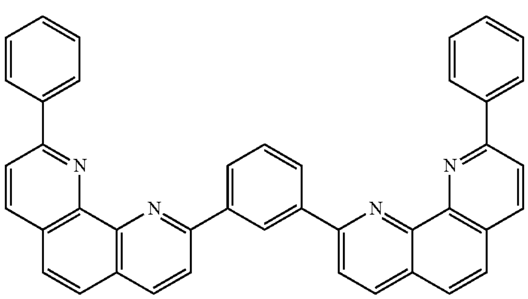
ET12
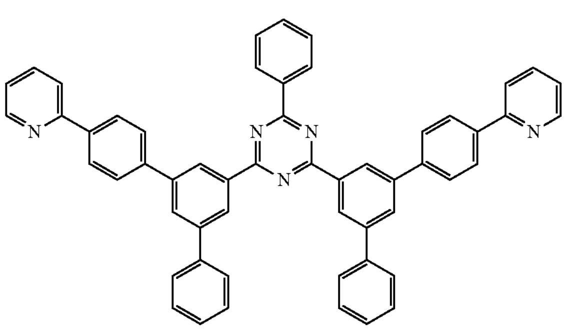
ET13
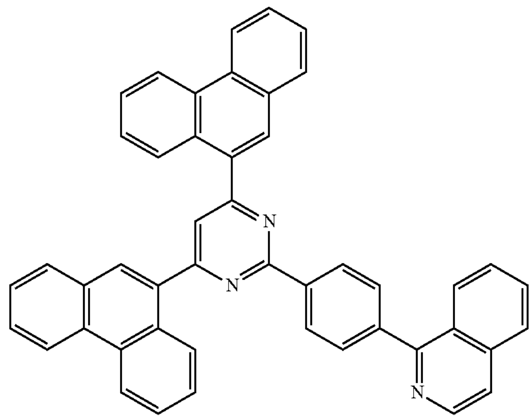
ET14
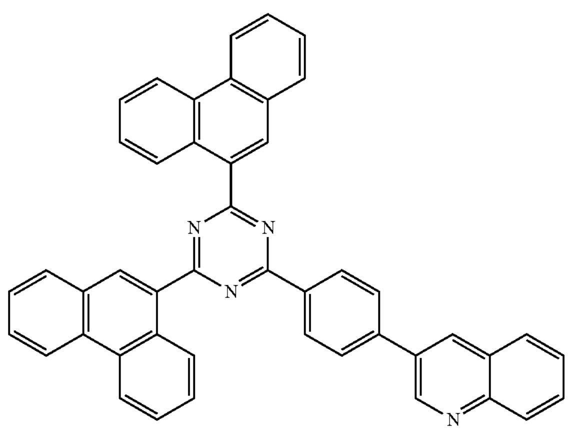
ET15
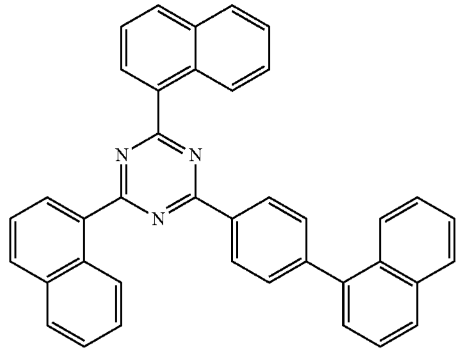

-continued
ET16
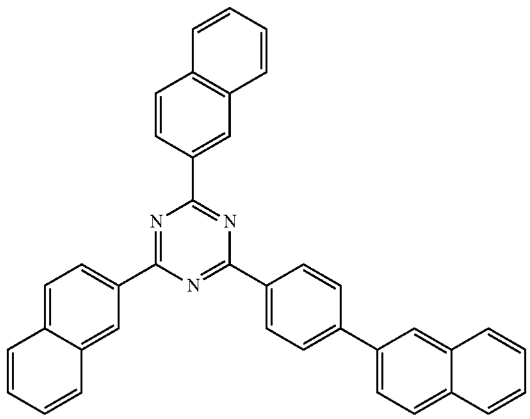
ET17
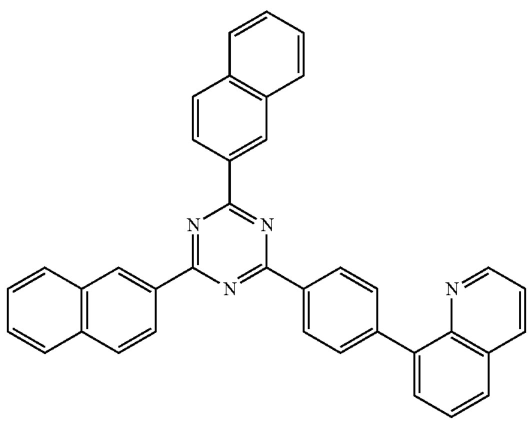
ET18
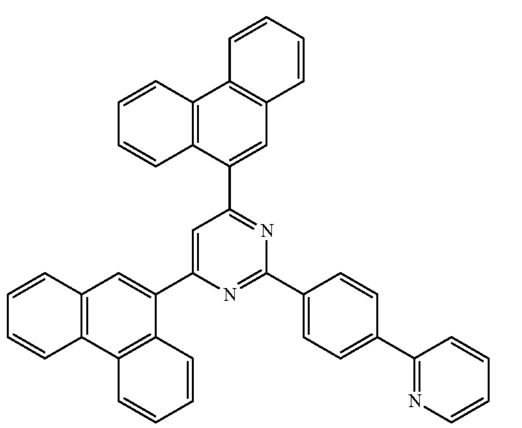
-continued
ET19
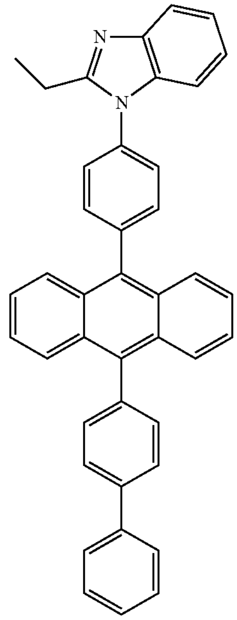
ET20
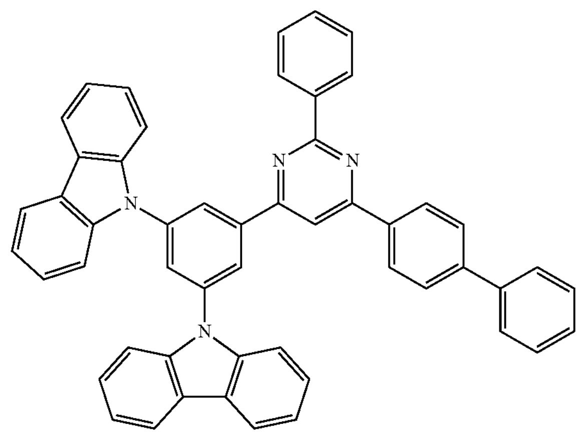
ET21
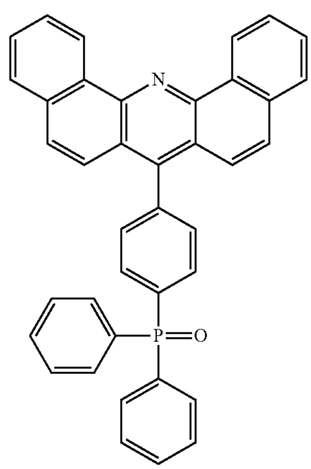

-continued

ET22

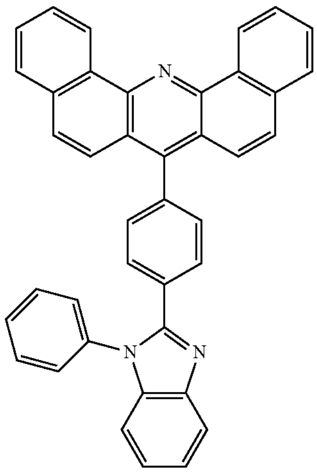

ET23

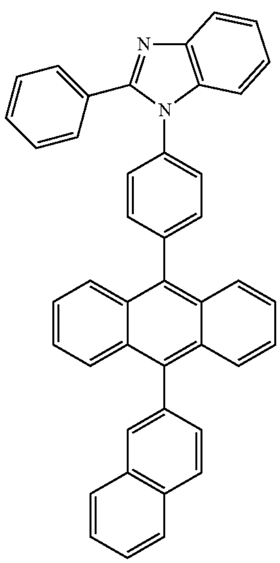

ET24

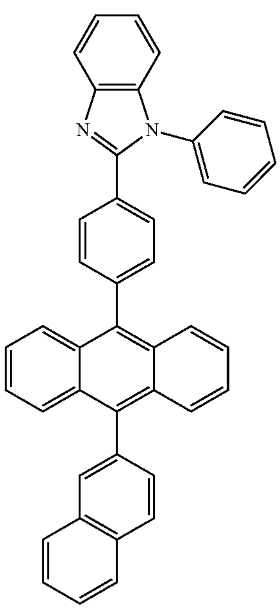

-continued

ET25

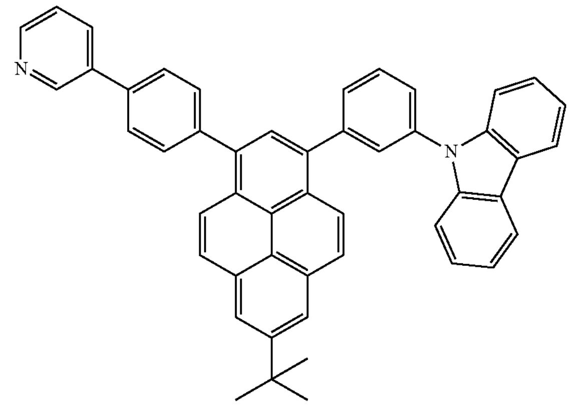

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2:

ET-D1

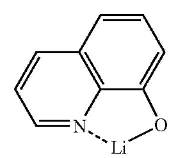

ET-D2

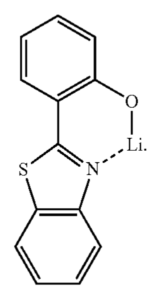

The electron transport region may include an electron injection layer that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

Another aspect of the present disclosure provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy (iso-propoxy) group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof, and no aromaticity. Non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having an aromatic system having 6 to 60 carbon atoms, and the term "$C_6$-$C_{60}$ arylene group" as used herein refers to a divalent group having an aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, Si, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), the term "$C_6$-$C_{60}$ arylthio group" as used herein indicates —$SA_{103}$ (wherein $A_{103}$ is the $C_6$-$C_{60}$ aryl group), and the term "$C_7$-$C_{60}$ arylalkyl group" as used herein indicates -$A_{104}A_{105}$ (wherein $A_{104}$ is the $C_6$-$C_{59}$ aryl group and $A_{105}$ is the $C_1$-$C_{53}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group," as used herein, refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the $C_1$-$C_{60}$ heteroaryloxy group, the $C_1$-$C_{60}$ heteroarylthio group, the $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(═O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(═O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(═O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent.

For example, when the term "substituted $C_1$-$C_{30}$ alkyl" refers to a $C_1$-$C_{30}$ alkyl group substituted with $C_6$-$C_{30}$ aryl group, the total number of carbon atoms in the resulting aryl substituted alkyl group is $C_7$-$C_{60}$.

Hereinafter, a compound and an organic light-emitting device according to embodiments are described in detail with reference to Synthesis Examples and Examples. However, the organic light-emitting device is not limited thereto. The wording "B was used instead of A" used in describing Synthesis Examples means that an amount of A used in molar equivalents was identical to an amount of B used in molar equivalent.

EXAMPLES

Synthesis Example 1: Synthesis of Compound 185

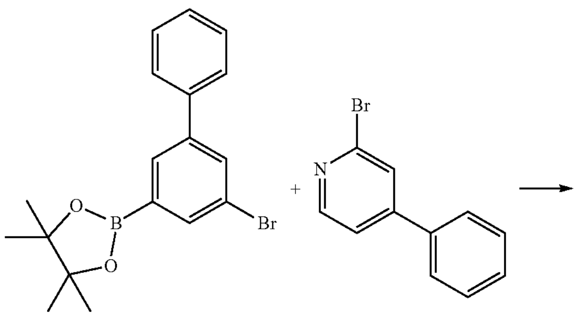

A

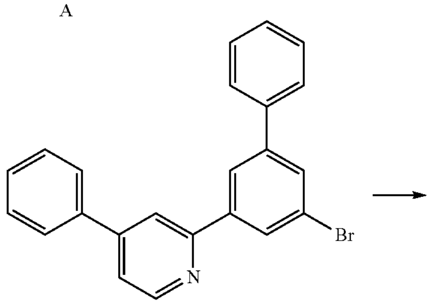

B

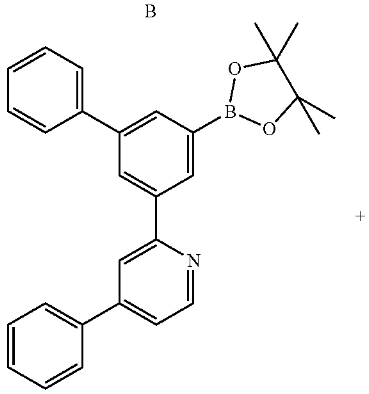

C

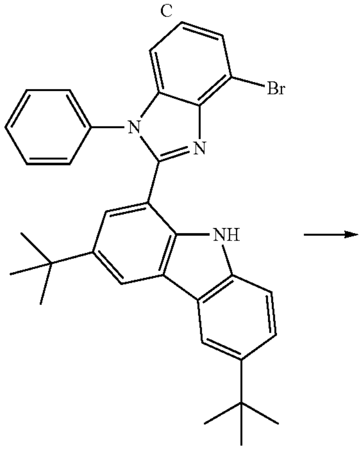

D

-continued

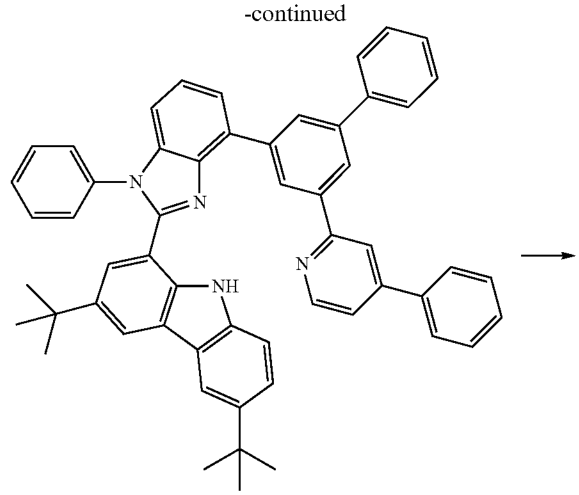

E

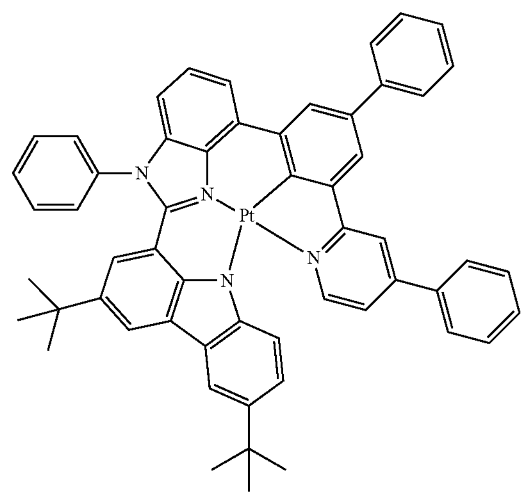

Compound 185

Synthesis of Intermediate B (2-(5-bromo-[1,1'-biphenyl]-3-yl)-4-phenylpyridine)

5 grams (g) (17.9 millimoles, mmol, 1.2 equivalents, equiv.) of Intermediate A, 3.5 g (14.9 mmol, 1 equiv.) of 2-bromo-4-phenylpyridine, 1.2 g (1.05 mmol, 0.07 equiv.) of tetrakis(triphenylphosphine)palladium(0), and 5.2 g (37.4 mmol, 2.5 equiv.) of potassium carbonate were mixed with 50 milliliters (mL) (concentration 0.6 molar, M) of a solvent in which tetrahydrofuran (THF), distilled water ($H_2O$), and ethanol (EtOH) were mixed at a ratio of 3:1:1, and the mixture was refluxed for 17 hours. The resultant mixture was cooled to room temperature and a precipitate was filtered. Then, a filtrate obtained therefrom was washed by using ethyl acetate (EA)/$H_2O$ and purified by column chromatography (while increasing a rate of MC/Hex to between 25% and 50%) to obtain 4.2 g (yield: 72%) of Intermediate B. The obtained product was confirmed by Mass Spectrometry and HPLC analysis.

HRMS (MALDI) calcd for $C_{23}H_{16}BrN$: m/z 385.0466, Found: 385.0465.

Synthesis of Intermediate C (4-phenyl-2-(5-(4,4,5,5-tetramethyl-1,3,2-dioxaborolan-2-yl)-[1,1'-biphenyl]-3-yl)pyridine)

4.2 g (0.011 mmol, 1.0 equiv.) of Intermediate B, 4.1 g (0.016 mmol, 1.5 equiv.) of bispinacolatodiboron, 2.1 g (0.022 mmol, 2 equiv.) of potassium acetate, and 0.44 g (0.001 mmol, 0.05 equiv.) of $PdCl_2$(dppf) were mixed with 38 mL (0.8 M) of toluene and the mixture was refluxed for 12 hours. The resultant mixture was cooled to room temperature and a precipitate was filtered. Then, a filtrate obtained therefrom was washed by using EA/$H_2O$ and purified by column chromatography (while increasing a rate of EA/Hex to between 2% and 5%) to obtain 3.5 g (yield: 75%) of Intermediate C. The obtained product was confirmed by Mass Spectrometry and HPLC analysis.

HRMS (MALDI) calcd for $C_{29}H_{28}BNO_2$: m/Z 433.2213, Found: 433.2211.

Synthesis of Intermediate E (3,6-di-tert-butyl-1-(1-phenyl-4-(5-(4-phenylpyridin-2-yl)-[1,1'-biphenyl]-3-yl)-1H-benzo[d]imidazol-2-yl)-9H-carbazole)

3.5 g (0.008 mmol, 1.2 equiv.) of Intermediate C, 3.7 g (0.007 mol, 1 equiv.) of Intermediate D (1-(4-bromo-1-phenyl-1H-benzo[d]imidazol-2-yl)-3,6-di-tert-butyl-9H-carbazole), 0.54 g (0.001 mmol, 0.07 equiv.) of tetrakis (triphenylphosphine)palladium(0), and 2.8 g (0.020 mmol, 3 equiv.) of potassium carbonate were mixed with 20 mL of a solvent in which THF and distilled water ($H_2O$) were mixed at a ratio of 3:1, and the mixture was refluxed for 12 hours. The resultant mixture was cooled to room temperature and a precipitate was filtered. The filtrate obtained therefrom was washed by using EA/$H_2O$ and purified by column chromatography (while increasing a rate of EA/Hex to between 20% and 35%) to obtain 3.1 g (yield: 60%) of Intermediate E. The obtained product was confirmed by Mass Spectrometry and HPLC analysis.

HRMS (MALDI) calcd for $C_{56}H_{48}N_4$: m/z 776.3879, Found: 776.3875.

Synthesis of Compound 185

3.1 g (3.99 mmol) of Intermediate E and 1.99 g (4.79 mmol, 1.0 equiv.) of $K_2PtCl_4$ were mixed with 70 mL of a solvent in which 60 mL of AcOH and 10 mL of $H_2O$ were mixed, and the mixture was refluxed for 16 hours. The resultant mixture was cooled to room temperature and a precipitate was filtered. The precipitate was dissolved again in MC, washed by using $H_2O$, and purified by column chromatography (MC 40%, EA 1%, Hex 59%) to obtain 2.8 g (yield: 72%) of Compound 185. The obtained product was confirmed by Mass Spectrometry and HPLC analysis.

HRMS (MALDI) calcd for $C_{56}H_{46}N_4Pt$: m/z 969.3370, Found: 969.3372.

Synthesis Example 2: Synthesis of Compound 5

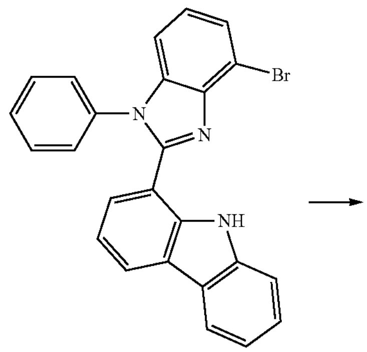

F

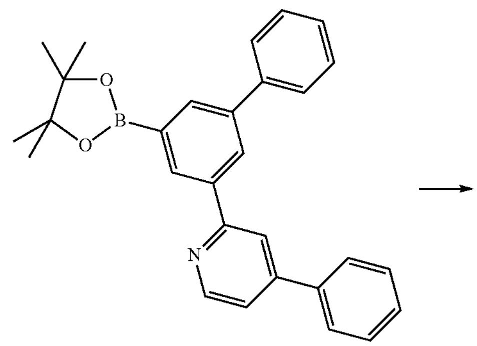

C

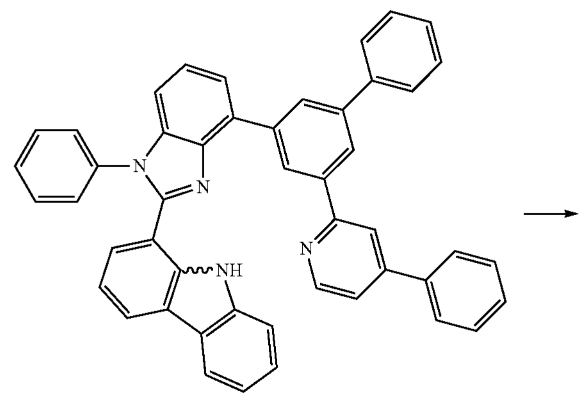

G

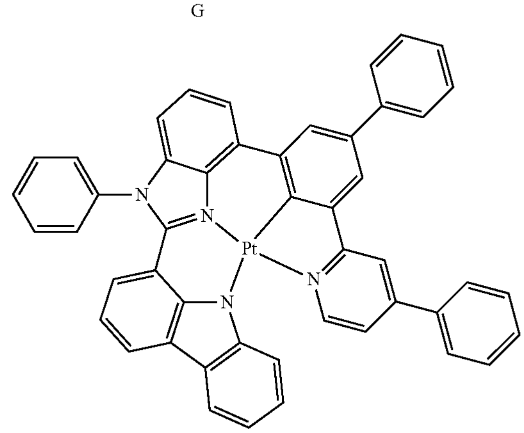

Compound 5

Synthesis of Intermediate G (1-(1-phenyl-4-(5-(4-phenylpyridin-2-yl)-[1,1'-biphenyl]-3-yl)-1H-benzo[d]imidazol-2-yl)-9H-carbazole)

2.3 g (yield: 61%) of Intermediate G was synthesized in the same manner as Intermediate E in Synthesis Example 1, except that 2.5 g (0.006 mmol) of Intermediate F (1-(4-bromo-1-phenyl-1H-benzo[d]imidazol-2-yl)-9H-carbazole) was used instead of Intermediate D, and 2.9 g (0.007 mmol) of Intermediate C was used.

HRMS (MALDI) calcd for $C_{48}H_{32}N_4$: m/z 664.2627, Found: 664.2624.

Synthesis of Compound 5

Compound 5 was synthesized in the same manner as Compound 185 in Synthesis Example 1, except that 2.3 g (3.46 mmol) of Intermediate G was used instead of Intermediate E.

HRMS (MALDI) calcd for $C_{48}H_{30}N_4Pt$: m/z 857.8800, Found: 857.8802.

Evaluation Example 1: Evaluation of Photoluminescence Quantum Yields (PLQY)

A $CH_2Cl_2$ solution of polymethyl methacrylate (PMMA) and a mixture of 8 wt % of CBP and Compound 5 (an amount of Compound 5 was 10 parts by weight based on 100 parts by weight of the mixture) were mixed. The resultant mixture was coated on a quartz substrate by using a spin coater, thermally treated at a temperature of 80° C. in an oven, and then cooled to room temperature, thereby completing the manufacture of a film.

Photoluminescence quantum yields (PLQY) in film of Compound 5 were evaluated by using a Hamamatsu Photonics absolute PL quantum yield measurement system equipped with a xenon light source, a monochromator, a photonic multichannel analyzer, and an integrating sphere and using PLQY measurement software (Hamamatsu Photonics, Ltd., Shizuoka, Japan). This process was repeated on Compound 185 to evaluate PLQY in film of Compound 185. Results are shown in Table 2.

TABLE 2

| | Compound 5 | Compound 185 |
|---|---|---|
| PLQY | 0.966 | 0.890 |

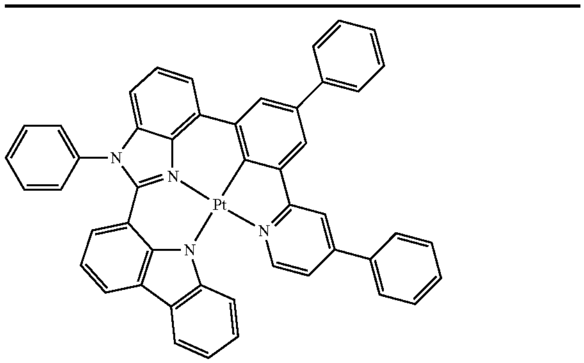

5

TABLE 2-continued

| Compound 5 | Compound 185 |
|---|---|

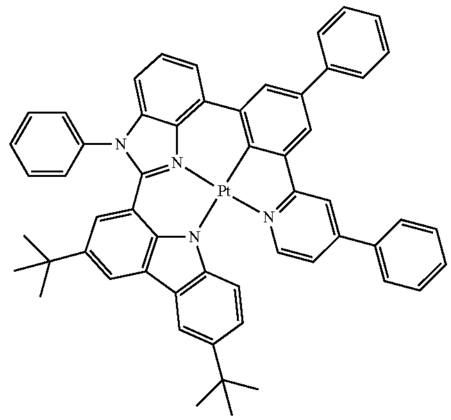

185

Referring to Table 2, it is determined that Compounds 5 and 185 have high PLQY in film.

Evaluation Example 2: Measurement of Decay Time

A quartz substrate washed by chloroform and distilled water was prepared, and films 1 and 2 each having a thickness of 50 nanometers (nm) were prepared by vacuum-depositing (co-depositing) certain materials shown in Table 3 at a degree of vacuum of $10^{-7}$ torr.

TABLE 3

| Film name | Compound used to manufacture film |
|---|---|
| Film 1 | CBP: Compound 5 (weight ratio of 9:1) |
| Film 2 | CBP: Compound 185 (weight ratio of 9:1) |

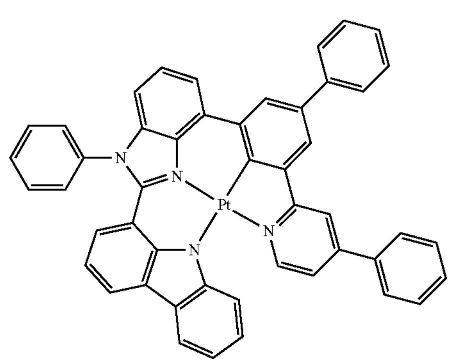

5

TABLE 3-continued

| Film name | Compound used to manufacture film |
|---|---|
| | 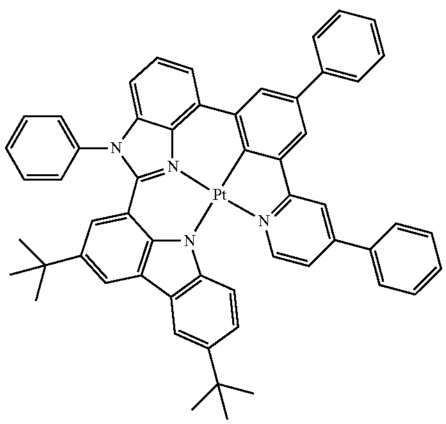 185 |

Then, PL spectra of the films 1 and 2 prepared as described above were evaluated at room temperature by using a time-resolved photoluminescence (TRPL) measurement system FluoTime 300 (manufactured by PicoQuant) and a pumping source PLS340 (excitation wavelength=340 nm, spectral width=20 nm) (manufactured by PicoQuant), wavelengths of main peaks of the PL spectra were determined, and the number of photons emitted from each film at the main peak by a photon pulse (pulse width=500 picoseconds, ps) applied to each film by PLS340 was measured over time based on Time-Correlated Single Photon Counting (TCSPC). By repeating the above processes, a sufficiently fittable TRPL curve was obtained. Then, a decay time $T_{decay}$(Ex) of each of the films 1 and 2 was obtained by fitting two or more exponential decay functions to a result obtained from the TRPL curve. Results thereof are shown in Table 4. A function represented by Equation 1 was used for the fitting, and the greatest value among $T_{decay}$ values obtained from the exponential decay functions used for the fitting was taken as $T_{decay}$(Ex). At this time, the same measurement was performed once more for the same measurement time as that for calculating the TRPL curve in a dark state (a state in which the pumping signal input to the certain film was blocked) to obtain a baseline or background signal curve. The baseline or background curve was used as a baseline for fitting. □=□=1□□□□□□−□/□□□□□□, □

TABLE 4

| Film name | Decay time (microseconds, μs) |
|---|---|
| Film 1 (Compound 5) | 4.809 |
| Film 2 (Compound 185) | 4.464 |

Referring to Table 4, it is determined that Compounds 5 and 185 have a relatively short decay time.

Evaluation Example 3: Evaluation of HOMO Energy Levels

HOMO energy levels of Compounds 5 and 185 were measured according to a method described in Table 5, and results thereof are shown in Table 6.

TABLE 5

| | |
|---|---|
| HOMO energy level evaluation method | A voltage-current (V-A) graph of each Compound was obtained by using a cyclic voltammetry (CV) (electrolyte: 0.1M $Bu_4NPF_6$/solvent: $CH_2Cl_2$/electrode: 3-electrode system (working electrode: Pt disc (1 mm diameter), reference electrode: Pt wire, and auxiliary electrode: Pt wire)), and then, HOMO energy level of each Compound was calculated from an oxidation onset potential of the V-A graph. |

TABLE 6

| Compound No. | HOMO energy level (eV) (found) |
|---|---|
| 5 | −5.22 |
| 185 | −5.20 |

Referring to Table 6, it is determined that Compounds 5 and 18 have electrical characteristics suitable for use in an organic light-emitting device.

Example 1

A glass substrate, on which ITO/Ag/ITO were respectively deposited to thicknesses of 70 Å/1,000 Å/70 Å (Å=angstrom) as an anode, was cut to a size of 50 mm×50 mm×0.5 mm (mm=millimeter), sonicated with iso-propyl alcohol and pure water each for 5 minutes, and then cleaned by exposure to ultraviolet (UV) rays and ozone for 30 minutes. Then, the glass substrate was provided to a vacuum deposition apparatus.

2-TNATA was deposited on the anode to form a hole injection layer having a thickness of 600 Å, and 4,4'-bis[N-(1-naphthyl)-N-phenylamino]biphenyl (NPB) was deposited on the hole injection layer to form a hole transport layer having a thickness of 1,350 Å.

CBP (host) and Compound 5 (dopant) were co-deposited on the hole transport layer at a weight ratio of 94:6 to form an emission layer having a thickness of 400 Å, and BCP was deposited on the emission layer to form a hole blocking layer having a thickness of 50 Å. Then, $Alq_3$ was deposited on the hole blocking layer to form an electron transport layer having a thickness of 350 Å, LiF was deposited on the electron transport layer to form an electron injection layer having a thickness of 10 Å, and MgAg was deposited on the electron injection layer at a ratio of 90:10 to form a cathode having a thickness of 120 Å, thereby completing the manufacture of an organic light-emitting device (emitting red light) having a structure of ITO/Ag/ITO/2-TNATA (600 Å) /NPB (1,350 Å)/CBP+Compound 5 (6 wt %) (400 Å)/BCP (50 Å)/$Alq_3$ (350 Å)/LiF (10 Å)/MgAg (120 Å).

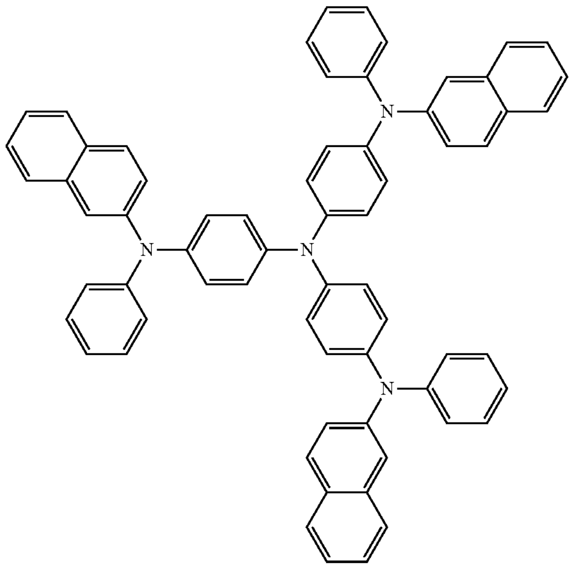

2-TNATA

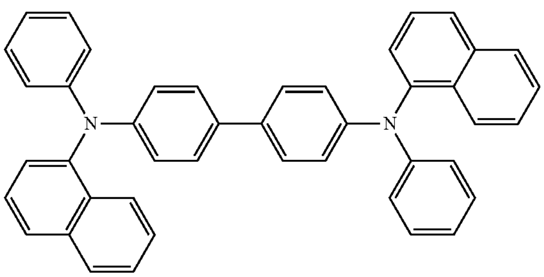

NPB

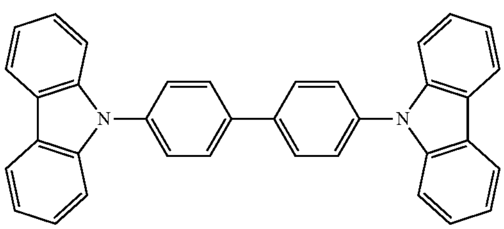

CBP

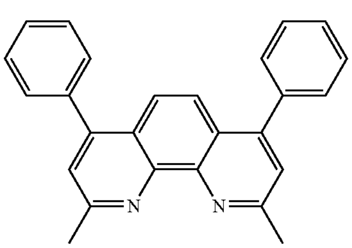

BCP

-continued

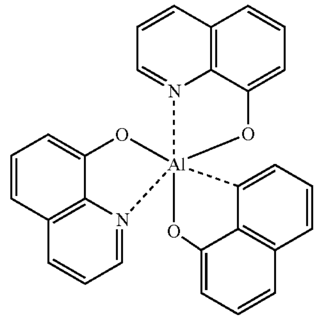

$Alq_3$

Example 2

An organic light-emitting device was manufactured in the same manner as in Example 1, except that Compound 185 shown in Table 7 was used instead of Compound 5 as a dopant in forming an emission layer.

Evaluation Example 4: Evaluation of Characteristics of Organic Light-Emitting Devices The driving voltage, emission efficiency, quantum emission efficiency, maximum emission wavelength, and full width at half maximum (FWHM) of the organic light-emitting devices manufactured according to Examples 1 and 2 were evaluated, and evaluation results thereof are shown in Table 7. This evaluation was performed by using a current-voltage meter (Keithley 2400) and a luminance meter (Minolta Cs-1000 A).

TABLE 7

| | Dopant | Driving voltage (V) | Emission efficiency (cd/A) | Quantum emission efficiency (%) | Maximum emission wavelength (nm) | FWHM (nm) |
|---|---|---|---|---|---|---|
| Example 1 | Compound 5 | 3.32 | 77.7 | 24.5 | 567 | 61.6 |
| Example 2 | Compound 185 | 3.40 | 70.6 | 26.3 | 586 | 69.2 |

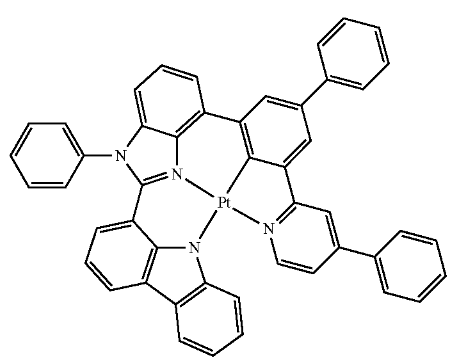

5

TABLE 7-continued

| Dopant | Driving voltage (V) | Emission efficiency (cd/A) | Quantum emission efficiency (%) | Maximum emission wavelength (nm) | FWHM (nm) |
|---|---|---|---|---|---|
| 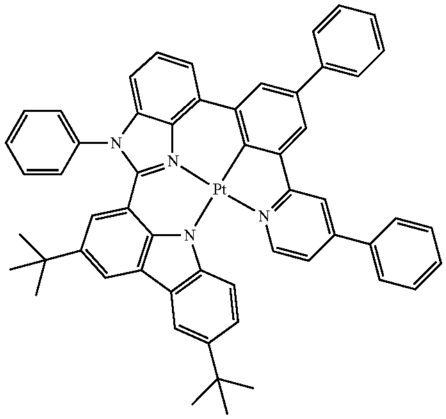 185 | | | | | |

Referring to Table 7, it is determined that the organic light-emitting devices of Examples 1 and 2 have excellent driving voltage, emission efficiency, and quantum emission efficiency characteristics and emit red light having a relatively small FWHM.

As described above, the organometallic compounds according to the embodiments of the present disclosure have excellent electrical characteristics and thermal stability, and accordingly, organic light-emitting devices including such organometallic compounds may have excellent driving voltage, emission efficiency, quantum emission efficiency, color purity, and/or lifespan characteristics. Also, due to excellent phosphorescent luminescence characteristics, such organometallic compounds may provide a diagnostic composition having high diagnostic efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. An organometallic compound represented by Formula 1:

Formula 1

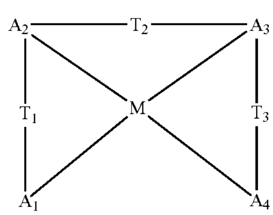

Formula A1-1

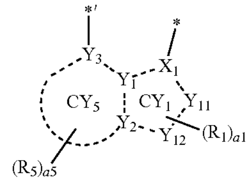

Formula A1-2

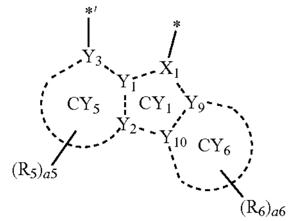

Formula A2-1

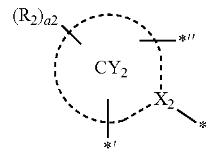

Formula A2-2

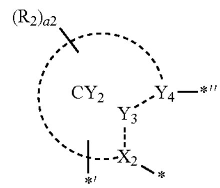

Formula A2-3

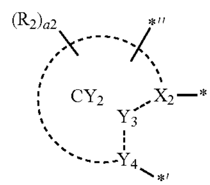

Formula A3-1

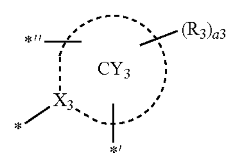

Formula A3-2

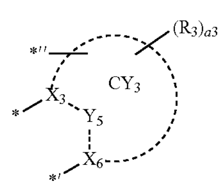

Formula A3-3

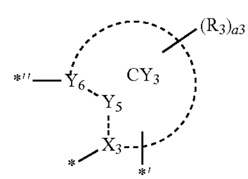

-continued

Formula A4-1

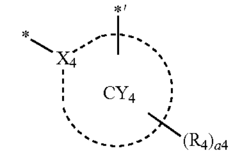

Formula A4-2

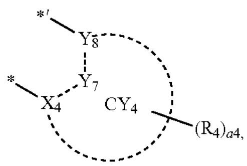

wherein

M in Formula 1 is beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), in Formula 1, two bonds selected from a bond between $A_1$ and M, a bond between $A_2$ and M, a bond between $A_3$ and M, and a bond between $A_4$ and M are each a covalent bond, and the others thereof are each a coordinate bond, $A_1$ in Formula 1 is represented by Formula A1-1 or A1-2, and in Formulae A1-1 and A1-2, * indicates a binding site to M in Formula 1, and *' indicates a binding site to $T_1$ in Formula 1, $A_2$ in Formula 1 is represented by one of Formula A2-1 to A2-3, and in Formulae A2-1 to A2-3, * indicates a binding site to M in Formula 1, *' indicates a binding site to $T_1$ in Formula 1, and *" indicates a binding site to $T_2$ in Formula 1, and in Formula A2-1, the two atoms to which *' and *" are linked are adjacent to $X_2$, $A_3$ in Formula 1 is represented by one of Formula A3-1 to A3-3, and in Formulae A3-1 to A3-3, * indicates a binding site to M in Formula 1, *" indicates a binding site to $T_2$ in Formula 1, and *' indicates a binding site to $T_3$ in Formula 1, and in Formula A3-1, the two atoms to which *' and *" are linked are adjacent to $X_3$, $A_4$ in Formula 1 is a first atom linked to M or a non-cyclic moiety comprising the first atom linked to M, or is represented by Formula A4-1 or A4-2, and in Formulae A4-1 and A4-2, * indicates a binding site to M in Formula 1, and *' indicates a binding site to $T_3$ in Formula 1, and in Formula A4-1, the atom to which *' is linked is adjacent to $X_4$, the first atom is B, N, P, C, Si, O, or S, in Formulae A1-1, A1-2, A2-1 to A2-3, A3-1 to A3-3, A4-1, and A4-2, $X_1$ to $X_4$ and $Y_1$ to $Y_{10}$ are each independently C or N, and $Y_{11}$ and $Y_{12}$ are each independently O, S, N, C, or Si, ring $CY_1$ in Formulae A1-1 and A1-2 is a 5-membered ring, rings $CY_2$ to $CY_6$ in Formulae A1-1, A1-2, A2-1 to A2-3, A3-1 to A3-3, A4-1, and A4-2 are each independently a $C_5$-$C_{30}$ carbocyclic group or a $C_1$-$C_{30}$ heterocyclic group, $T_1$ to $T_3$ in Formula 1 are each independently selected from a single bond, a double bond, *—N($R_7$)—*', *—B($R_7$)—*', *—P($R_7$)—*', *—C($R_7$)($R_8$)—*', *—Si($R_7$)($R_8$)—*', *—Ge($R_7$)($R_8$)—*', *—S—*', *—Se—*', *—O—*', *—C(═O)—*', *—S(═O)—*', *—S(═O)$_2$—*', *—C($R_7$)═*', *═C($R_7$)—*', *—C($R_7$)═C($R_8$)—*', *—C(═S)—*', and *—C≡C—*', $R_7$ and $R_8$ are optionally linked via a single bond, a double bond, or a first linking group to form a substituted or unsubstituted $C_5$-$C_{30}$ carbocyclic group or a substituted or unsubstituted $C_1$-$C_{30}$ heterocyclic group, $R_1$ to $R_8$ are each independently selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(═O)($Q_8$)($Q_9$), a1 in Formula A1-1 is an integer from 0 to 4, a2 to a6 in Formulae A1-1, A1-2, A2-1 to A2-3, A3-1 to A3-3, A4-1, and $A_4$-2 are each independently an integer from 0 to 20, two of a plurality of neighboring groups $R_2$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_3$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_4$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_5$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_6$ are optionally linked to form a substituted or unsubstituted $C_5$-$C_{30}$ carbocyclic group or a substituted or unsubstituted $C_1$-$C_{30}$ heterocyclic group, two or more neighboring groups selected from $R_2$ to $R_5$ are optionally linked to form a substituted or unsubstituted $C_5$-$C_{30}$ carbocyclic group or a substituted or unsubstituted $C_1$-$C_{30}$ heterocyclic group, $A_1$ and $A_4$ in Formula 1 are not linked to each other, i) when $A_1$ in Formula 1 is represented by Formula A1-1, the organometallic compound represented by Formula 1 satisfies "Condition 1", and ii) when $A_1$ in Formula 1 is represented by Formula A1-2, the organometallic compound represented by Formula 1 satisfies at least one of "Condition 1" to "Condition 3", "Condition 1"

$A_2$ in Formula 1 is represented by Formula A2-2 or A2-3,

"Condition 2"

$A_3$ in Formula 1 is represented by Formula A3-2 or A3-3, and

"Condition 3"

$A_4$ in Formula 1 is represented by Formula A4-2, wherein at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is selected from:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, and $—P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, and $—P(=O)(Q_{28})(Q_{29})$; and $N(Q_{31})(Q_{32})$, $—Si(Q_{33})(Q_{34})(Q_{35})$, $—B(Q_{36})(Q_{37})$, and $—P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

2. The organometallic compound of claim 1, wherein a bond between $A_1$ and M and a bond between $A_3$ and M are each a covalent bond, and a bond between $A_2$ and M and a bond between $A_4$ and M are each a coordinate bond, or a bond between $A_1$ and M and a bond between $A_4$ and M are each a covalent bond, and a bond between $A_2$ and M and a bond between $A_3$ and M are each a coordinate bond.

3. The organometallic compound of claim 1, wherein ring $CY_1$ is selected from a pyrrole group, a furan group, a thiophene group, a silole group, a pyrazole group, an imidazole group, a triazole group, a tetrazole group, an oxazole group, an isoxazole group, a thiazole group, an isothiazole group, an oxadiazole group, a thiadiazole group, an oxatriazole group, and a thiatriazole group.

4. The organometallic compound of claim 1, wherein rings $CY_2$ to $CY_6$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, and a 5,6,7,8-tetrahydroquinoline group.

5. The organometallic compound of claim 1, wherein at least one of rings $CY_2$ to $CY_4$ is a condensed ring with at least one 5-membered ring and at least one 6-membered ring or a condensed ring with at least two 6-membered rings, the 5-membered ring is selected from a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, and the 6-membered ring is selected from a cyclohexane group, a cyclohexene group, a benzene group, a pyridine group, a pyrimidine group, a pyrazine group, and a pyridazine group.

6. The organometallic compound of claim 1, wherein $T_1$ and $T_2$ are each a single bond.

7. The organometallic compound of claim 1, wherein $R_1$ to $R_8$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —$Si(Q_{33})(Q_{34})(Q_{35})$; and $N(Q_1)(Q_2)$, —$Si(Q_3)(Q_4)(Q_5)$, —$B(Q_6)(Q_7)$, and —$P(=O)(Q_8)(Q_9)$, and $Q_1$ to $Q_9$ and $Q_{33}$ to $Q_{35}$ are each independently selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CH_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

8. The organometallic compound of claim 1, wherein $R_1$ to $R_8$ are each independently selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-19, groups represented by Formulae 10-1 to 10-161, —$N(Q_1)(Q_2)$, —$Si(Q_3)(Q_4)(Q_5)$, —$B(Q_6)(Q_7)$, and —$P(=O)(Q_8)Q_9)$:

Formula 9-1
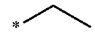
Formula 9-2
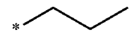
Formula 9-3
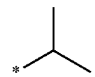
Formula 9-4
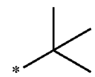
Formula 9-5
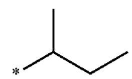
Formula 9-6
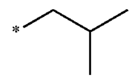
Formula 9-7
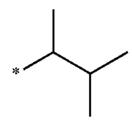
Formula 9-8
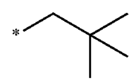
Formula 9-9
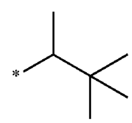
Formula 9-10
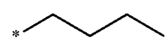
Formula 9-11
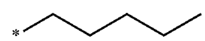
Formula 9-12
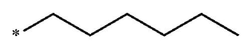
Formula 9-13
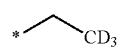
Formula 9-14
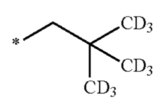
Formula 9-15
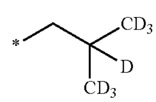
Formula 9-16
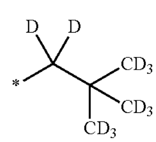
Formula 9-17
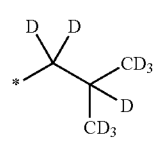
Formula 9-18
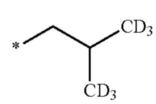

Formula 9-19
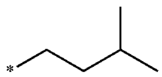
Formula 10-1
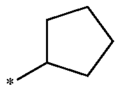
Formula 10-2
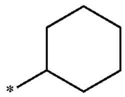
Formula 10-3
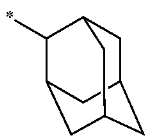
Formula 10-4
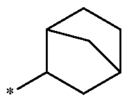
Formula 10-5
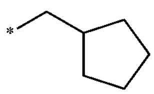
Formula 10-6
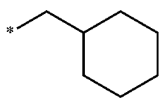
Formula 10-7
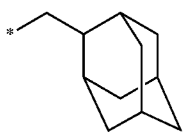
Formula 10-8
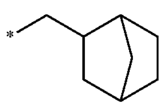
Formula 10-9
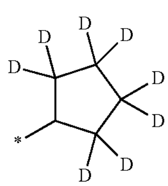
Formula 10-10
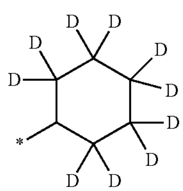
Formula 10-11
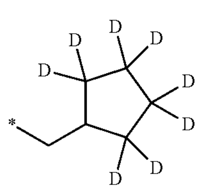
Formula 10-12
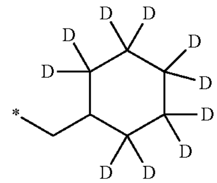
Formula 10-13
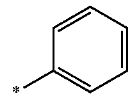
Formula 10-14
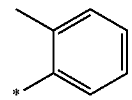
Formula 10-15
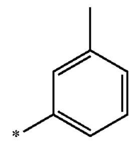
Formula 10-16
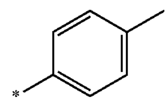
Formula 10-17
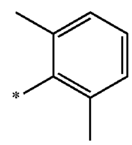
Formula 10-18
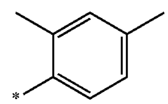
Formula 10-19
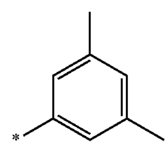
Formula 10-20
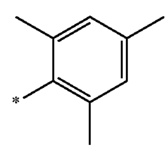
Formula 10-21
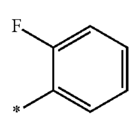
Formula 10-22
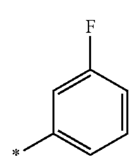
Formula 10-23
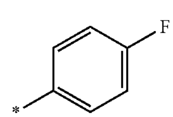

-continued
Formula 10-24
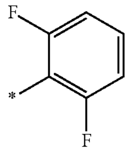
Formula 10-25
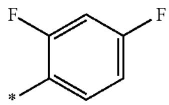
Formula 10-26
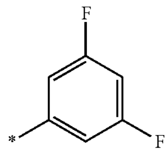
Formula 10-27
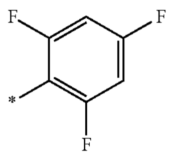
Formula 10-28
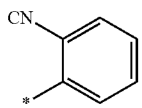
Formula 10-29
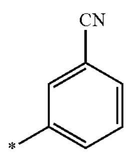
Formula 10-30
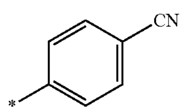
Formula 10-31
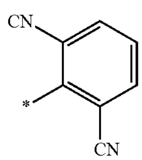
Formula 10-32
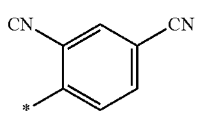
Formula 10-33
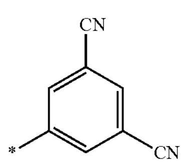
Formula 10-34
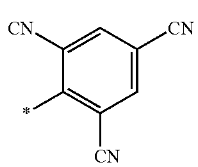
-continued
Formula 10-35
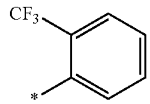
Formula 10-36
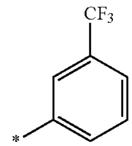
Formula 10-37
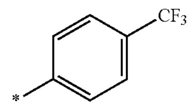
Formula 10-38
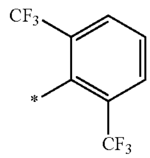
Formula 10-39
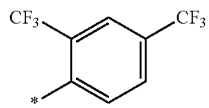
Formula 10-40
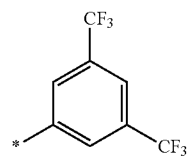
Formula 10-41
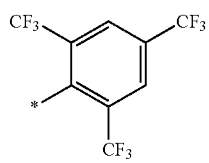
Formula 10-42
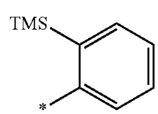
Formula 10-43
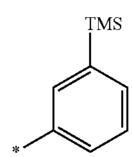
Formula 10-44
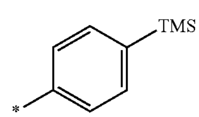
Formula 10-45
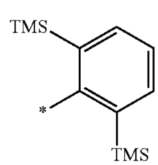

-continued
Formula 10-46
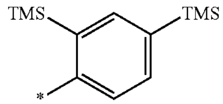
Formula 10-47
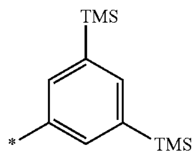
Formula 10-48
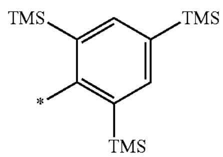
Formula 10-49
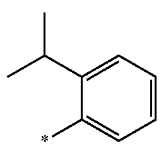
Formula 10-50
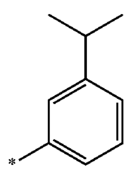
Formula 10-51
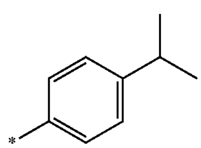
Formula 10-52
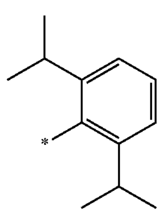
Formula 10-53
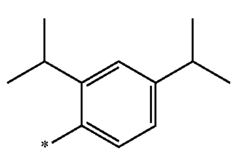
Formula 10-54
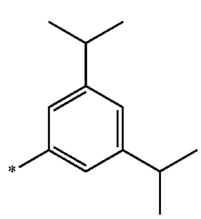
-continued
Formula 10-55
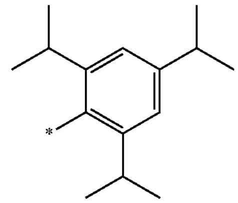
Formula 10-56
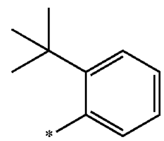
Formula 10-57
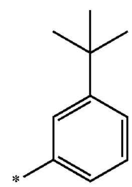
Formula 10-58
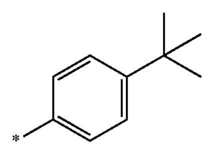
Formula 10-59
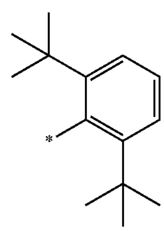
Formula 10-60
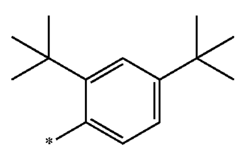
Formula 10-61
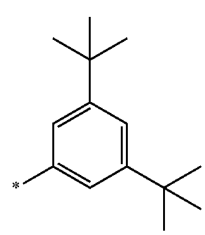
Formula 10-62
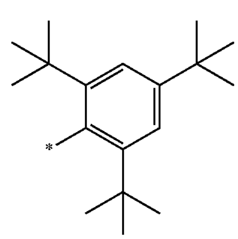

-continued
Formula 10-63
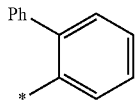
Formula 10-64
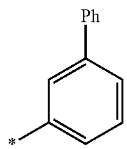
Formula 10-65
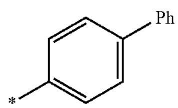
Formula 10-66
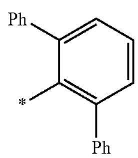
Formula 10-67
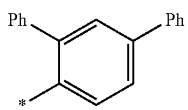
Formula 10-68
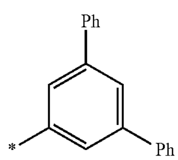
Formula 10-69
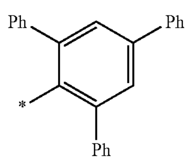
Formula 10-70
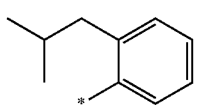
Formula 10-71
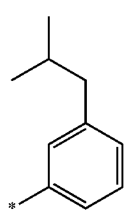
Formula 10-72
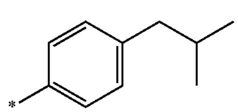
-continued
Formula 10-73
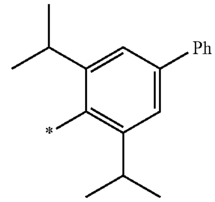
Formula 10-74
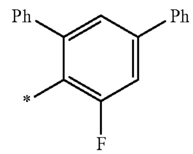
Formula 10-75
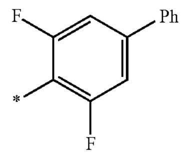
Formula 10-76
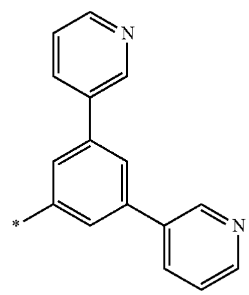
Formula 10-77
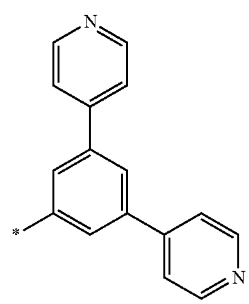
Formula 10-78
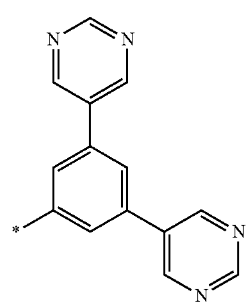

-continued
Formula 10-79
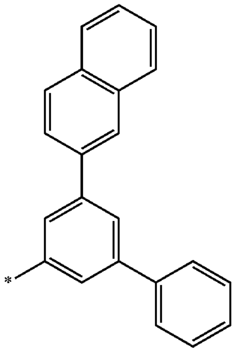
Formula 10-80
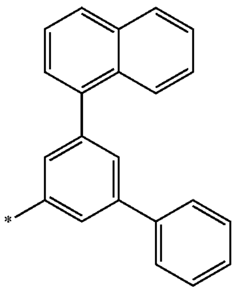
Formula 10-81
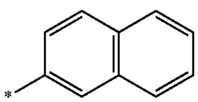
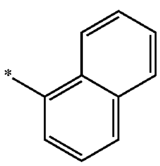
Formula 10-83
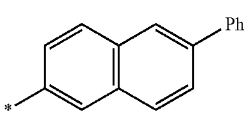
Formula 10-84
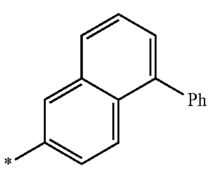
Formula 10-85
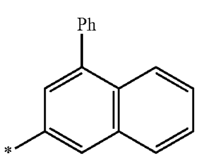
Formula 10-86
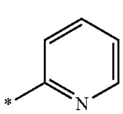
Formula 10-87
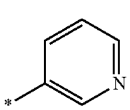
-continued
Formula 10-88
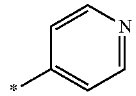
Formula 10-89
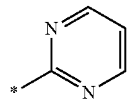
Formula 10-90
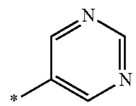
Formula 10-91
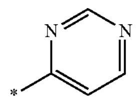
Formula 10-92
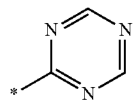
Formula 10-93
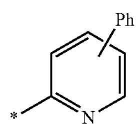
Formula 10-94
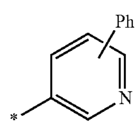
Formula 10-95
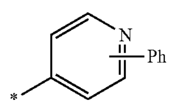
Formula 10-96
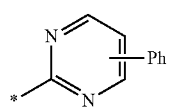
Formula 10-97
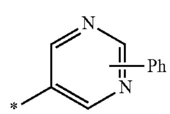
Formula 10-98
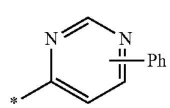
Formula 10-99
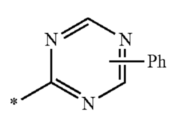
Formula 10-100
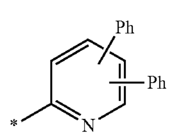

Formula 10-101
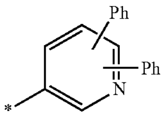
Formula 10-102
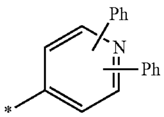
Formula 10-103
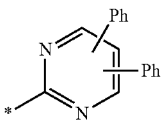
Formula 10-104
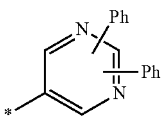
Formula 10-105
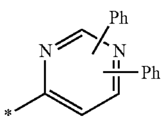
Formula 10-106
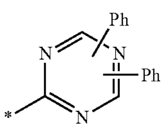
Formula 10-107
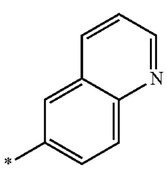
Formula 10-108
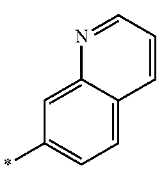
Formula 10-109
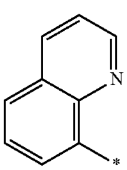
Formula 10-110
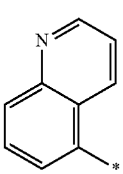
Formula 10-111
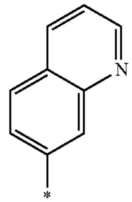
Formula 10-112
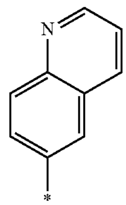
Formula 10-113
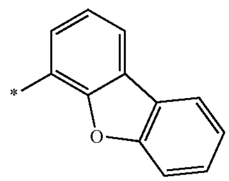
Formula 10-114
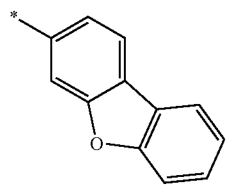
Formula 10-115
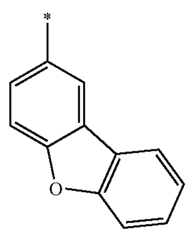
Formula 10-116
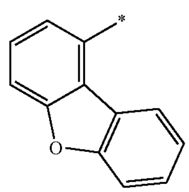
Formula 10-117
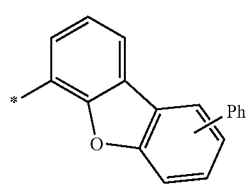
Formula 10-118
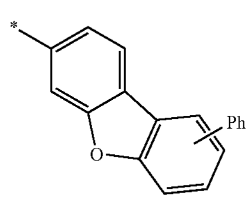

-continued
Formula 10-119
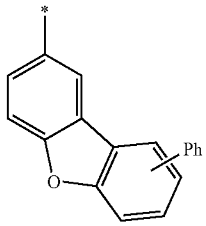
Formula 10-120
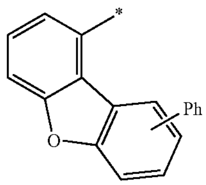
Formula 10-121
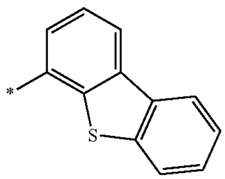
Formula 10-122
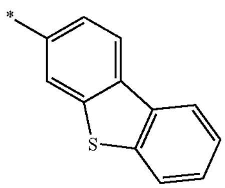
Formula 10-123
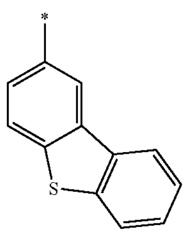
Formula 10-124
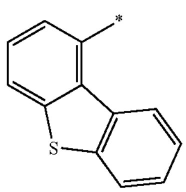
Formula 10-125
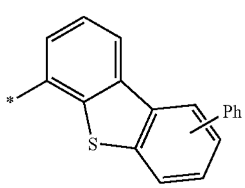
Formula 10-126
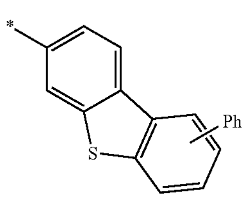
-continued
Formula 10-127
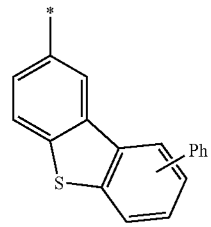
Formula 10-128
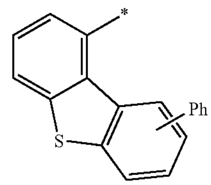
Formula 10-129
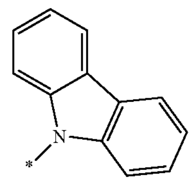
Formula 10-130
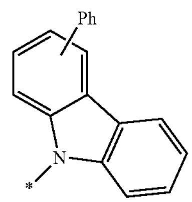
Formula 10-131
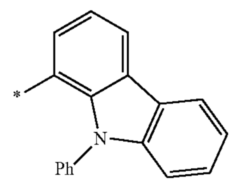
Formula 10-132
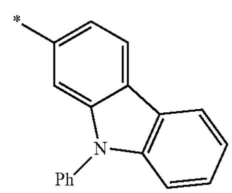
Formula 10-133
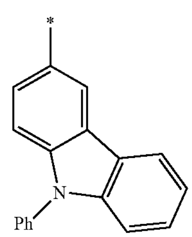
Formula 10-134
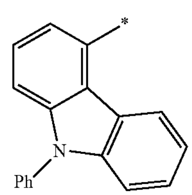

-continued
Formula 10-135
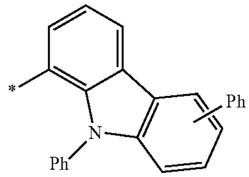
Formula 10-136
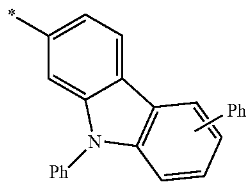
Formula 10-137
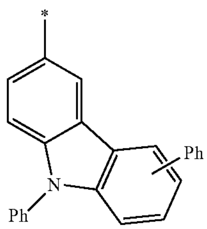
Formula 10-138
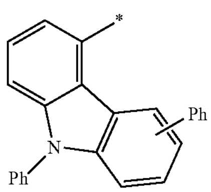
Formula 10-139
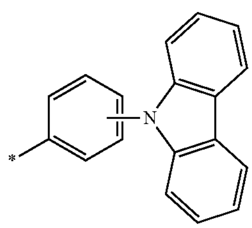
Formula 10-140
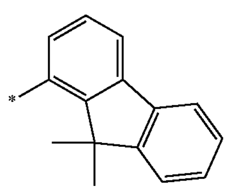
Formula 10-141
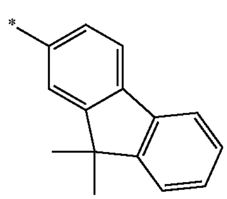
-continued
Formula 10-142
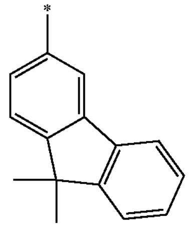
Formula 10-143
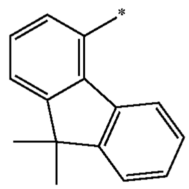
Formula 10-144
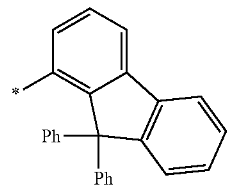
Formula 10-145
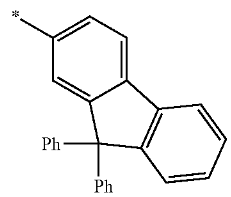
Formula 10-146
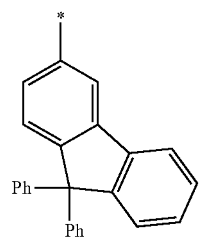
Formula 10-147
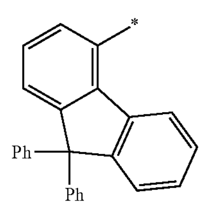
Formula 10-148
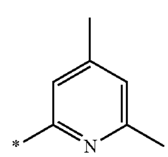
Formula 10-149
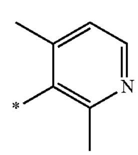

-continued

Formula 10-150

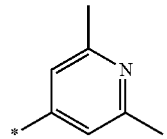

Formula 10-151

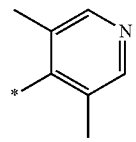

Formula 10-152

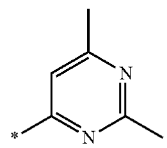

Formula 10-153

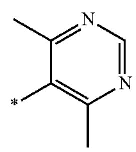

Formula 10-154

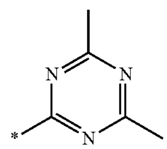

Formula 10-155

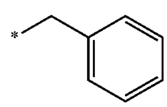

Formula 10-156

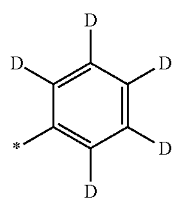

Formula 10-157

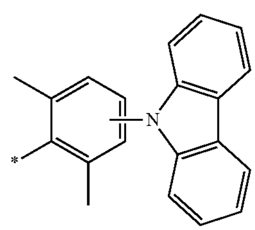

Formula 10-158

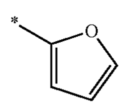

Formula 10-159

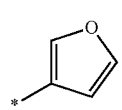

Formula 10-160

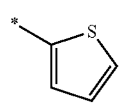

-continued

Formula 10-161

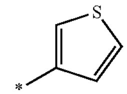

, wherein, in Formulae 9-1 to 9-19 and 10-1 to 10-161, "Ph" indicates a phenyl group, "TMS" indicates a trimethylsilyl group, and * indicates a binding site to a neighboring atom and $Q_1$ to $Q_9$ are the same as described in claim 1.

9. The organometallic compound of claim 1, wherein $A_1$ is represented by one of Formulae A1-1(1) to A1-1(24) and A1-2(1) to A1-2(8):

Formula A1-1(1)

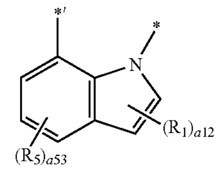

Formula A1-1(2)

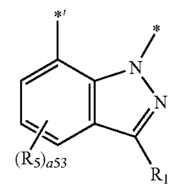

Formula A1-1(3)

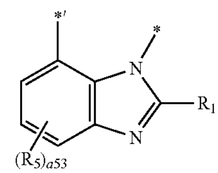

Formula A1-1(4)

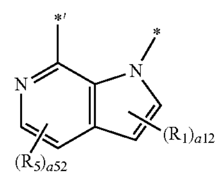

Formula A1-1(5)

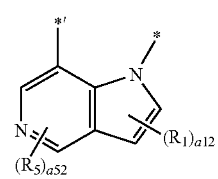

Formula A1-1(6)

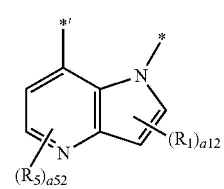

-continued
Formula A1-1(7)
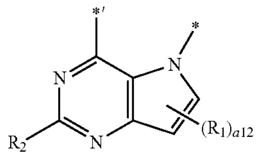
Formula A1-1(8)
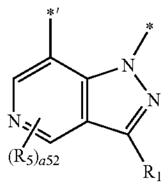
Formula A1-1(9)
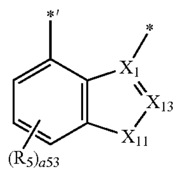
Formula A1-1(10)
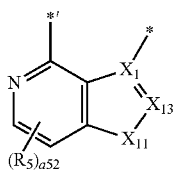
Formula A1-1(11)
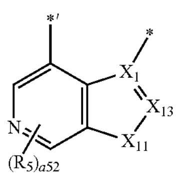
Formula A1-1(12)
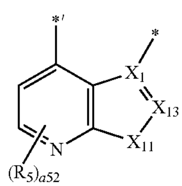
Formula A1-1(13)
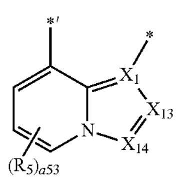
Formula A1-1(14)
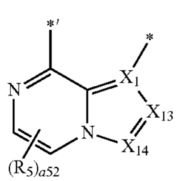
Formula A1-1(15)
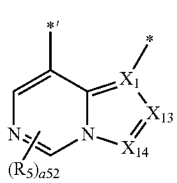
-continued
Formula A1-1(16)
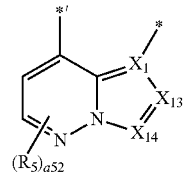
Formula A1-1(17)
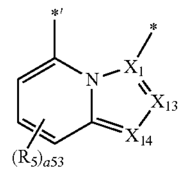
Formula A1-1(18)
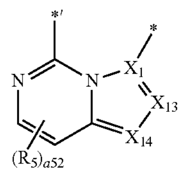
Formula A1-1(19)
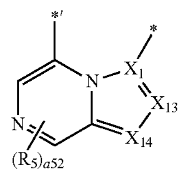
Formula A1-1(20)
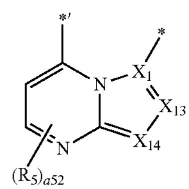
Formula A1-1(21)
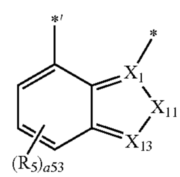
Formula A1-1(22)
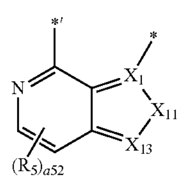
Formula A1-1(23)
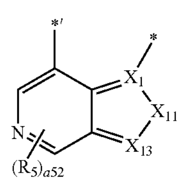
Formula A1-1(24)
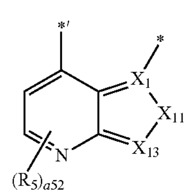

-continued

Formula A1-2(1)

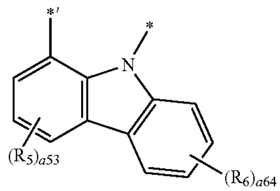

Formula A1-2(2)

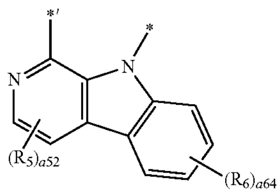

Formula A1-2(3)

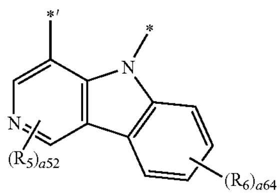

Formula A1-2(4)

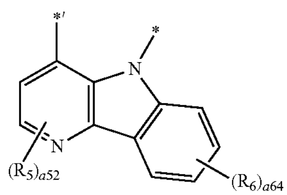

Formula A1-2(5)

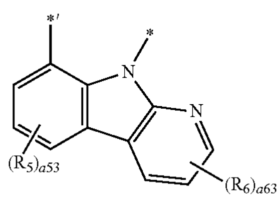

Formula A1-2(6)

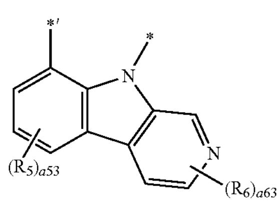

Formula A1-2(7)

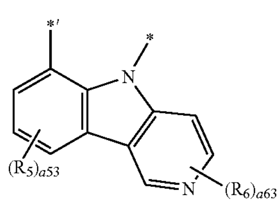

Formula A1-2(8)

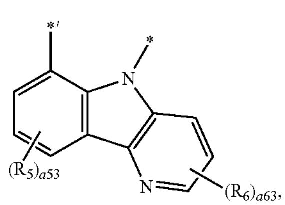

wherein, in Formulae A1-1(1) to A1-1(24) and A1-2(1) to A1-2(8), $X_1$, $R_1$, $R_5$, $R_6$, *, and *' are the same as described in claim 1, $X_{11}$ is O, S, $N(R_{11})$, $C(R_{11})(R_{12})$, or $Si(R_{11})(R_{12})$, $X_{13}$ is N or $C(R_{13})$, $X_{14}$ is N or $C(R_{14})$, $R_{11}$ to $R_{14}$ are the same as described in connection with $R_1$, a64 is an integer from 0 to 4, a53 and a63 are each independently an integer from 0 to 3, and a12 and a52 are each independently an integer from 0 to 2.

10. The organometallic compound of claim 1, wherein $A_2$ is represented by one of Formulae A2-1(1) to A2-1(17), A2-2(1) to A2-2(58), and A2-3(1) to A2-3(58):

Formula A2-1(1)

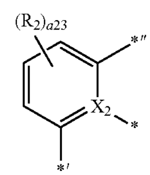

Formula A2-1(2)

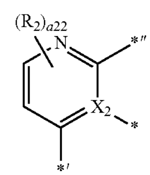

Formula A2-1(3)

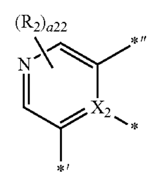

Formula A2-1(4)

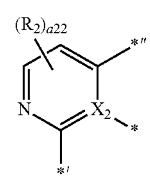

Formula A2-1(5)

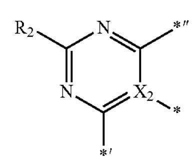

Formula A2-1(6)

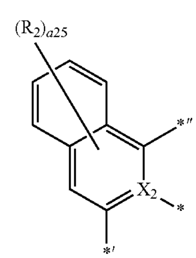

-continued
Formula A2-1(7)
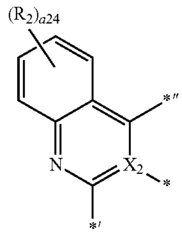
Formula A2-1(8)
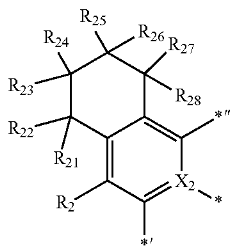
Formula A2-1(9)
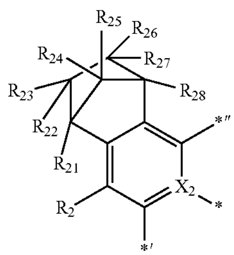
Formula A2-1(10)
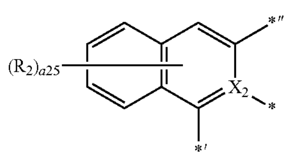
Formula A2-1(11)
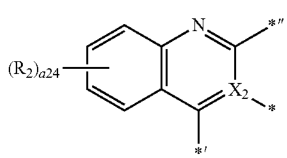
Formula A2-1(12)
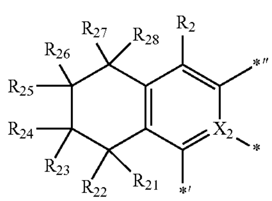
Formula A2-1(13)
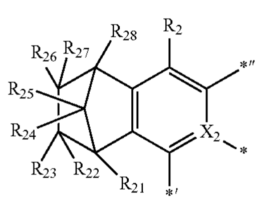
-continued
Formula A2-1(14)
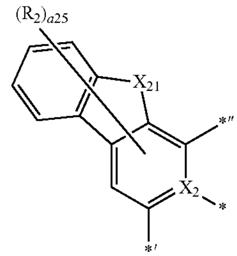
Formula A2-1(15)
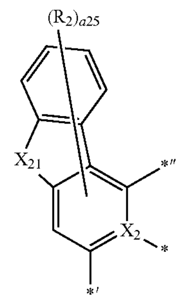
Formula A2-1(16)
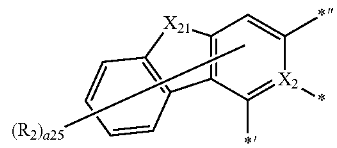
Formula A2-1(17)
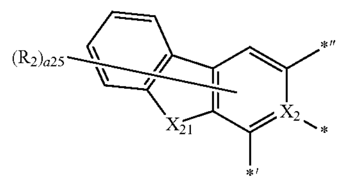
Formula A2-2(1)
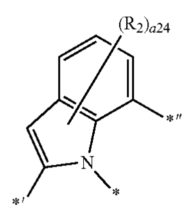
Formula A2-2(2)
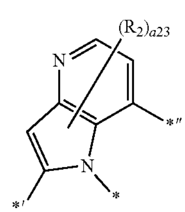
Formula A2-2(3)
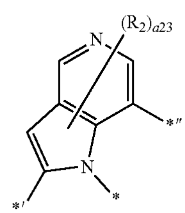

-continued
Formula A2-2(4)
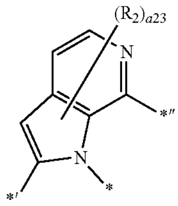
Formula A2-2(5)
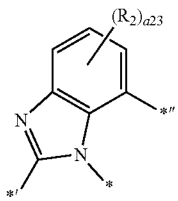
Formula A2-2(6)
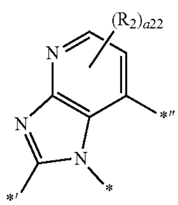
Formula A2-2(7)
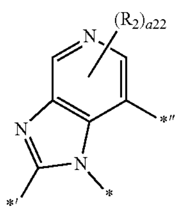
Formula A2-2(8)
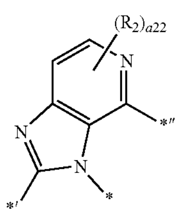
Formula A2-2(9)
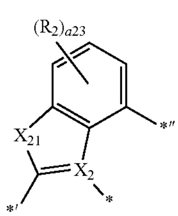
Formula A2-2(10)
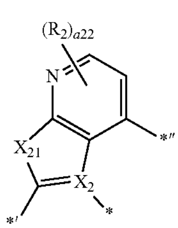
-continued
Formula A2-2(11)
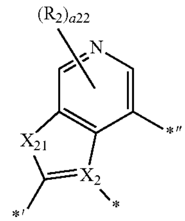
Formula A2-2(12)
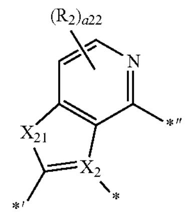
Formula A2-2(13)
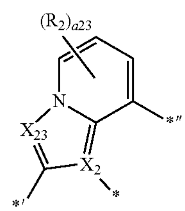
Formula A2-2(14)
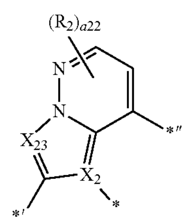
Formula A2-2(15)
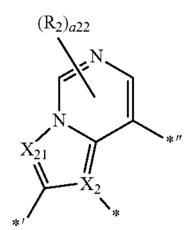
Formula A2-2(16)
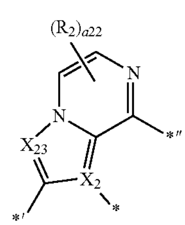
Formula A2-2(17)
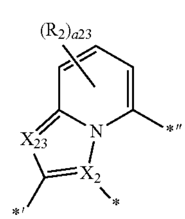

-continued
Formula A2-2(18)
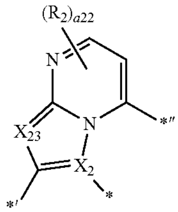
Formula A2-2(19)
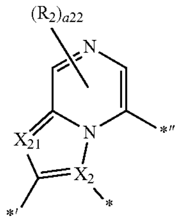
Formula A2-2(20)
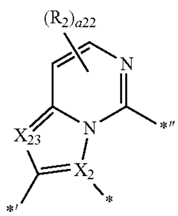
Formula A2-2(21)
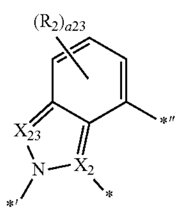
Formula A2-2(22)
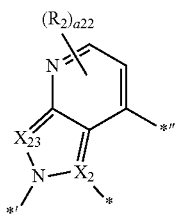
Formula A2-2(23)
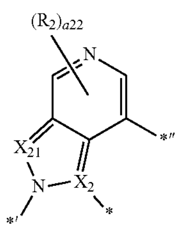
Formula A2-2(24)
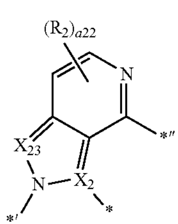
-continued
Formula A2-2(25)
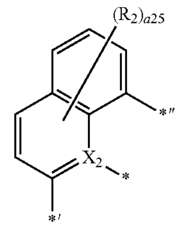
Formula A2-2(26)
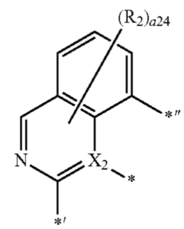
Formula A2-2(27)
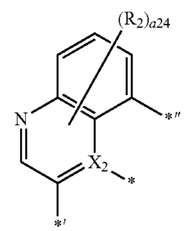
Formula A2-2(28)
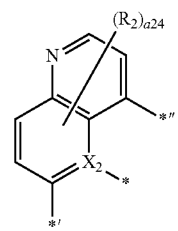
Formula A2-2(29)
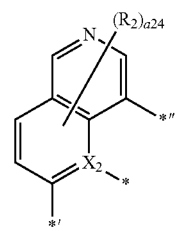
Formula A2-2(30)
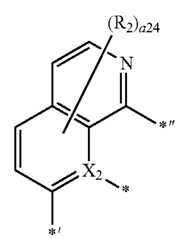
Formula A2-2(31)
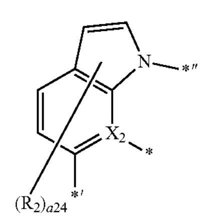

-continued
Formula A2-2(32)
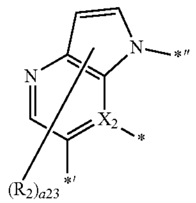
Formula A2-2(33)
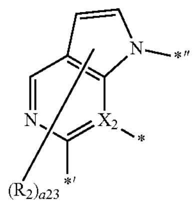
Formula A2-2(34)
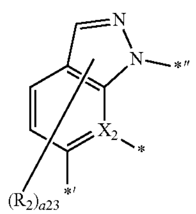
Formula A2-2(35)
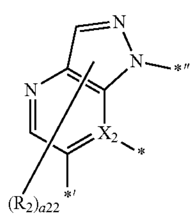
Formula A2-2(36)
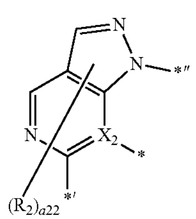
Formula A2-2(37)
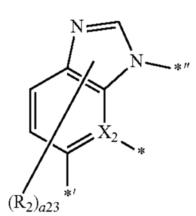
Formula A2-2(38)
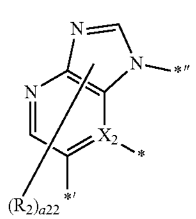
-continued
Formula A2-2(39)
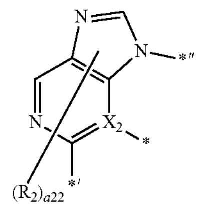
Formula A2-2(40)
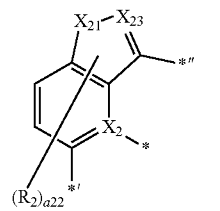
Formula A2-2(41)
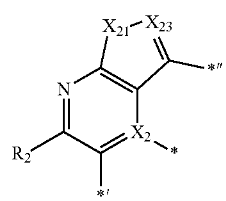
Formula A2-2(42)
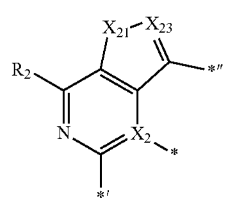
Formula A2-2(43)
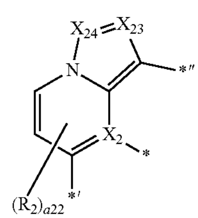
Formula A2-2(44)
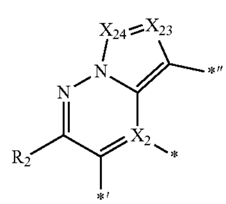
Formula A2-2(45)
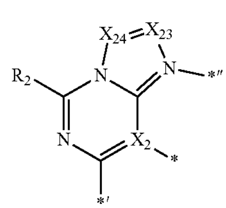

-continued
Formula A2-2(46)
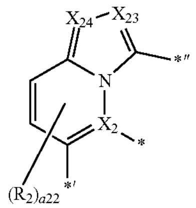
Formula A2-2(47)
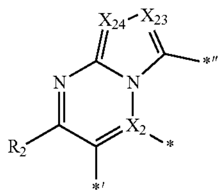
Formula A2-2(48)
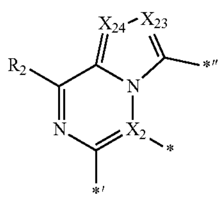
Formula A2-2(49)
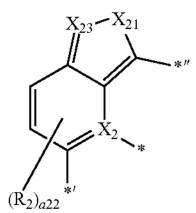
Formula A2-2(50)
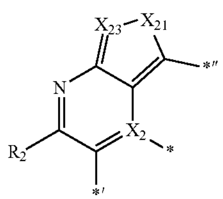
Formula A2-2(51)
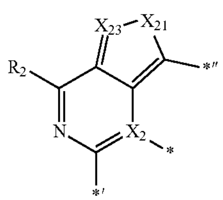
Formula A2-2(52)
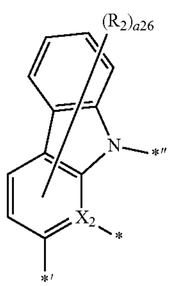
-continued
Formula A2-2(53)
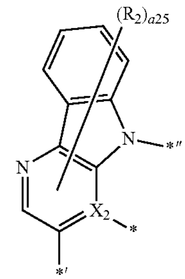
Formula A2-2(54)
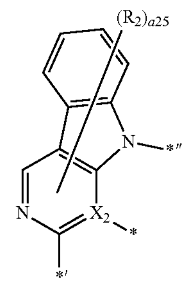
Formula A2-2(55)
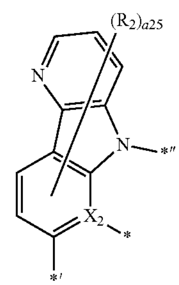
Formula A2-2(56)
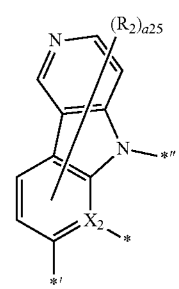
Formula A2-2(57)
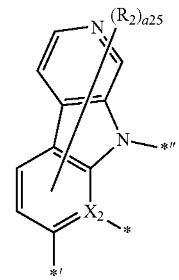

-continued
Formula A2-2(58)
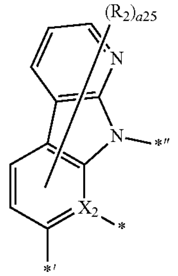
Formula A2-3(1)
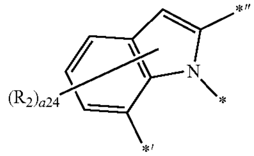
Formula A2-3(2)
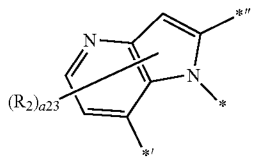
Formula A2-3(3)
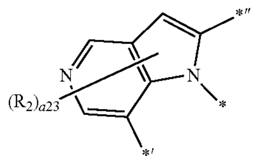
Formula A2-3(4)
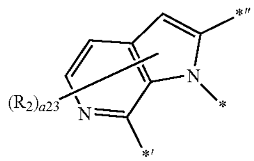
Formula A2-3(5)
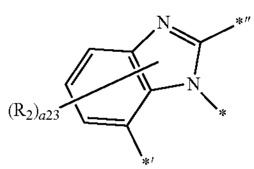
Formula A2-3(6)
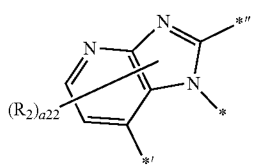
Formula A2-3(7)
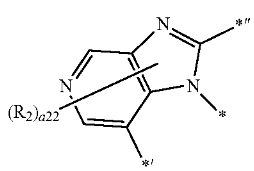
Formula A2-3(8)
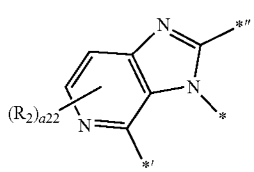
-continued
Formula A2-3(9)
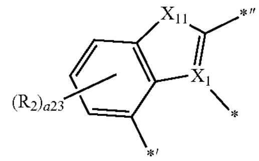
Formula A2-3(10)
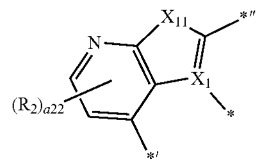
Formula A2-3(11)
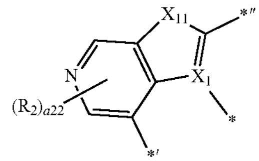
Formula A2-3(12)
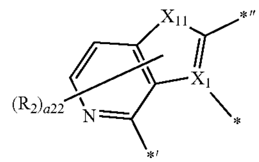
Formula A2-3(13)
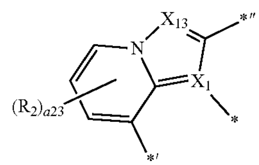
Formula A2-3(14)
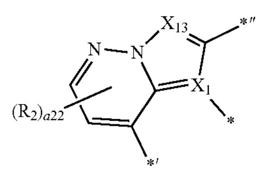
Formula A2-3(15)
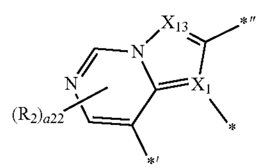
Formula A2-3(16)
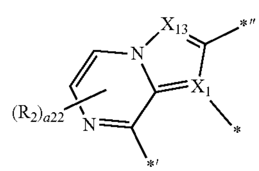
Formula A2-3(17)
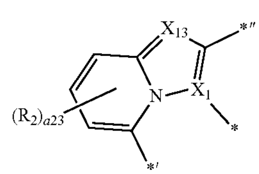

-continued
Formula A2-3(18)
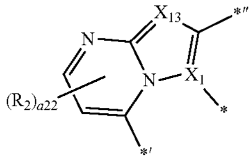
Formula A2-3(19)
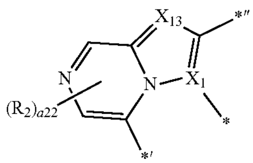
Formula A2-3(20)
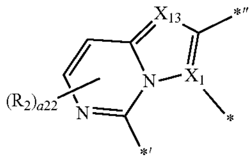
Formula A2-3(21)
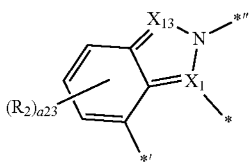
Formula A2-3(22)
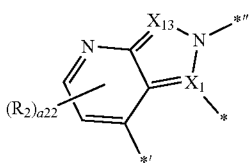
Formula A2-3(23)
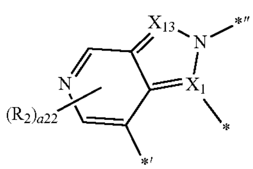
Formula A2-3(24)
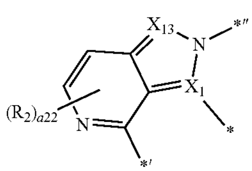
Formula A2-3(25)
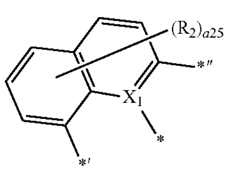
Formula A2-3(26)
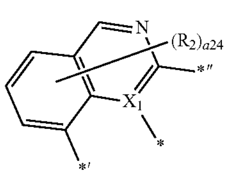
-continued
Formula A2-3(27)
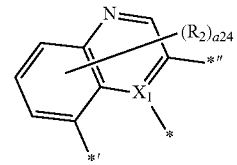
Formula A2-3(28)
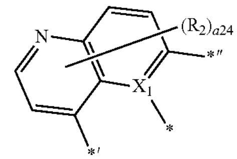
Formula A2-3(29)
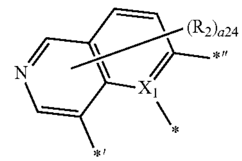
Formula A2-3(30)
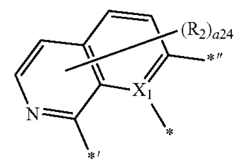
Formula A2-3(31)
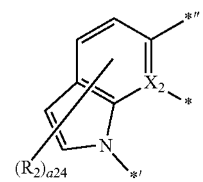
Formula A2-3(32)
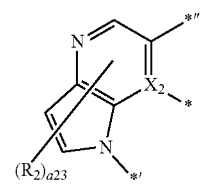
Formula A2-3(33)
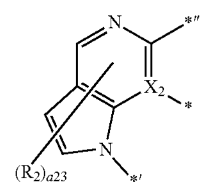
Formula A2-3(34)
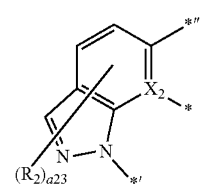
Formula A2-3(35)
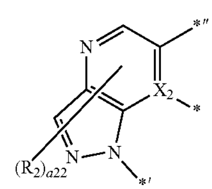

Formula A2-3(36)
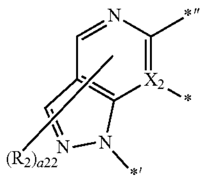
Formula A2-3(37)
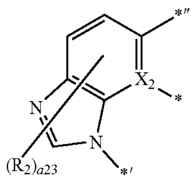
Formula A2-3(38)
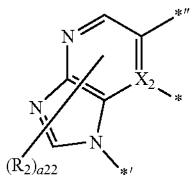
Formula A2-3(39)
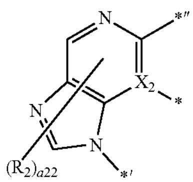
Formula A2-3(40)
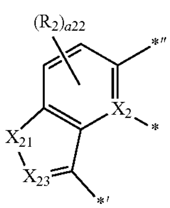
Formula A2-3(41)
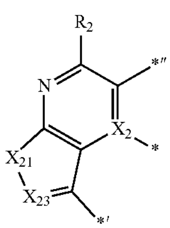
Formula A2-3(42)
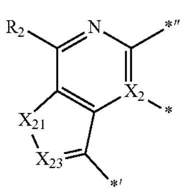
Formula A2-3(43)
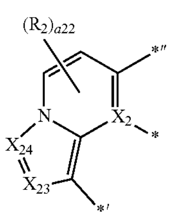
Formula A2-3(44)
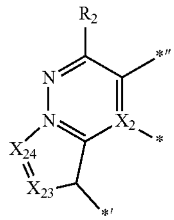
Formula A2-3(45)
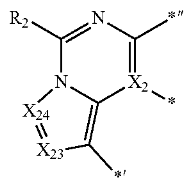
Formula A2-3(46)
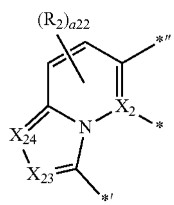
Formula A2-3(47)
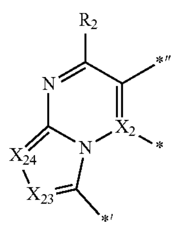
Formula A2-3(48)
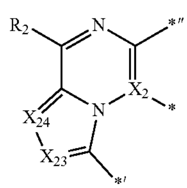
Formula A2-3(49)
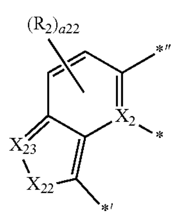
Formula A2-3(50)
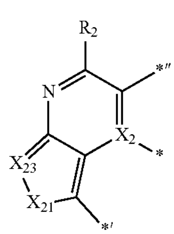

-continued

Formula A2-3(51)

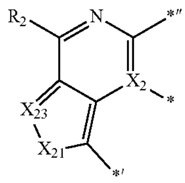

Formula A2-3(52)

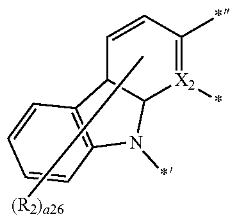

Formula A2-3(53)

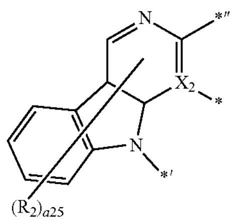

Formula A2-3(54)

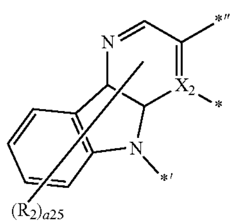

Formula A2-3(55)

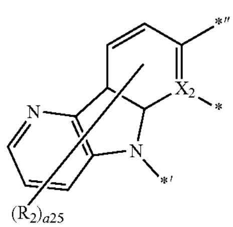

Formula A2-3(56)

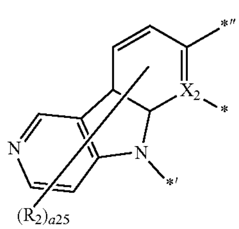

Formula A2-3(57)

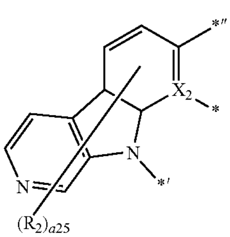

-continued

Formula A2-3(58)

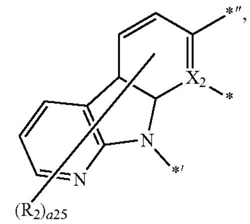

wherein, in Formulae A2-1(1) to A2-1(17), A2-2(1) to A2-2(58), and A2-3(1) to $A_2$-3(58), $X_2$ and $R_2$ are the same as described in claim 1, $X_{21}$ is O, S, $N(R_{21})$, $C(R_{21})(R_{22})$, or $Si(R_{21})(R_{22})$, $X_{23}$ is N or $C(R_{23})$, $X_{24}$ is N or $C(R_{24})$, $R_{21}$ to $R_{28}$ are the same as described in connection with $R_2$ in claim 1, a26 is an integer from 0 to 6, a25 is an integer from 0 to 5, a24 is an integer from 0 to 4, a23 is an integer from 0 to 3, a22 is an integer from 0 to 2, and , *', and *" are the same as described in connection with *, *', and *" in Formula A2-1.

11. The organometallic compound of claim 1, wherein $A_3$ is represented by one of Formulae A3-1(1) to A3-1 (21), A3-2(1) to A3-2(58), and A3-3(1) to A3-3(58):

Formula A3-1(1)

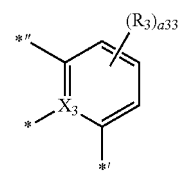

Formula A3-1(2)

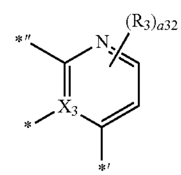

Formula A3-1(3)

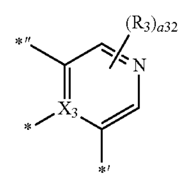

Formula A3-1(4)

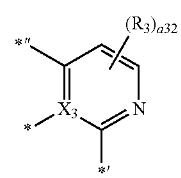

Formula A3-1(5)

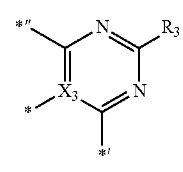

-continued
Formula A3-1(6)
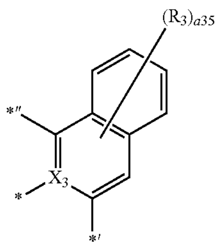
Formula A3-1(7)
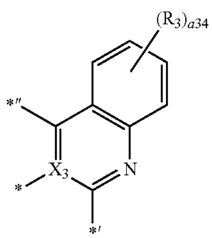
Formula A3-1(8)
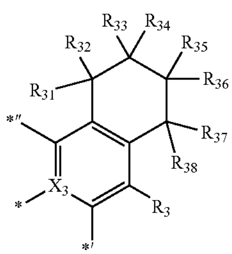
Formula A3-1(9)
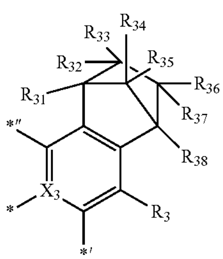
Formula A3-1(10)
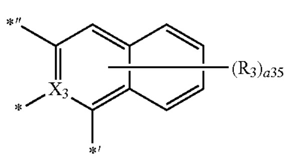
Formula A3-1(11)
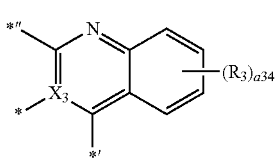
Formula A3-1(12)
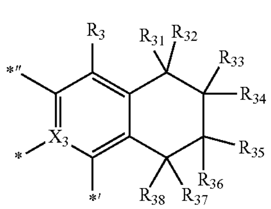
-continued
Formula A3-1(13)
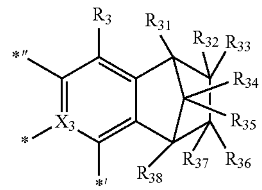
Formula A3-1(14)
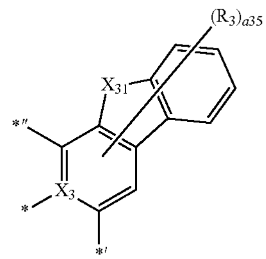
Formula A3-1(15)
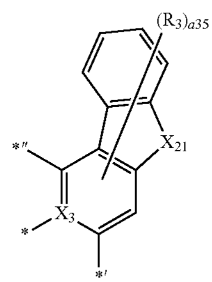
Formula A3-1(16)
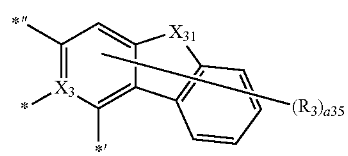
Formula A3-1(17)
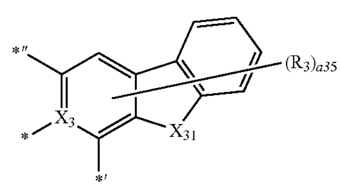
Formula A3-1(18)
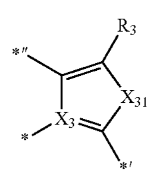
Formula A3-1(19)
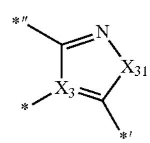
Formula A3-1(20)
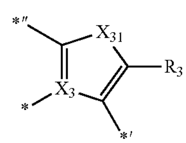

-continued
Formula A3-1(21)
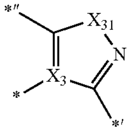
Formula A3-2(1)
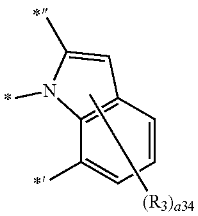
Formula A3-2(2)
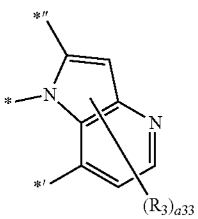
Formula A3-2(3)
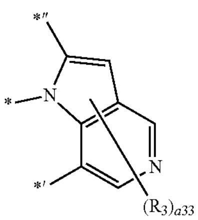
Formula A3-2(4)
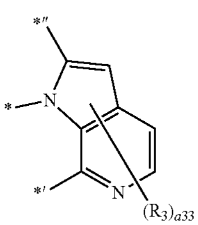
Formula A3-2(5)
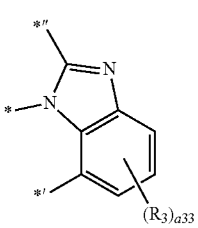
Formula A3-2(6)
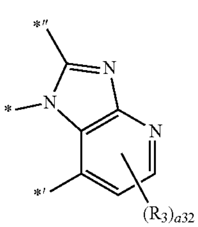
-continued
Formula A3-2(7)
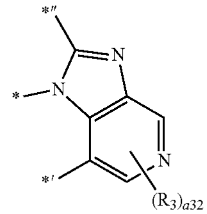
Formula A3-2(8)
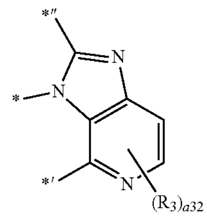
Formula A3-2(9)
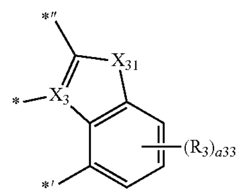
Formula A3-2(10)
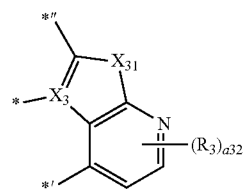
Formula A3-2(11)
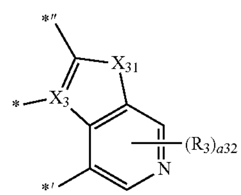
Formula A3-2(12)
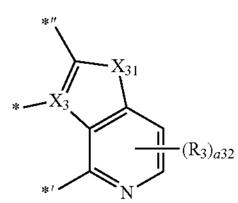
Formula A3-2(13)
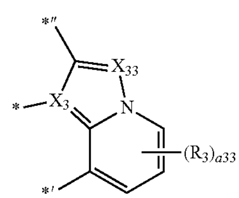
Formula A3-2(14)
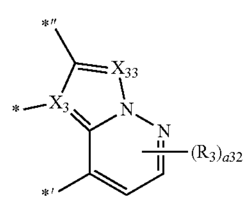

-continued
Formula A3-2(15)
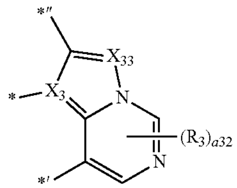
Formula A3-2(16)
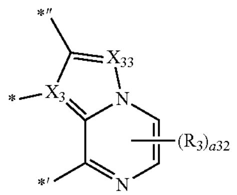
Formula A3-2(17)
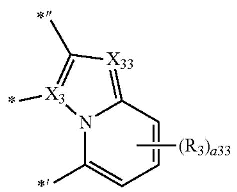
Formula A3-2(18)
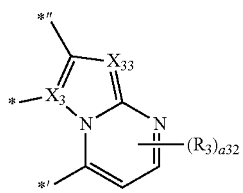
Formula A3-2(19)
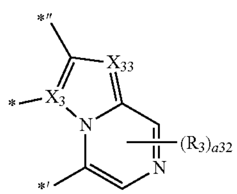
Formula A3-2(20)
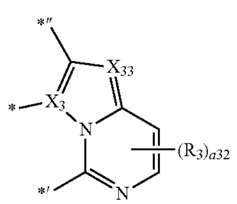
Formula A3-2(21)
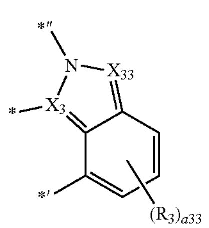
Formula A3-2(22)
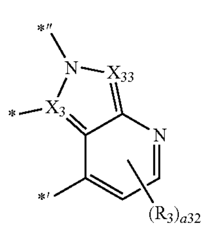
-continued
Formula A3-2(23)
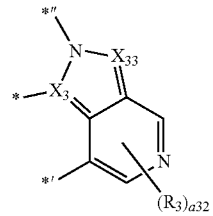
Formula A3-2(24)
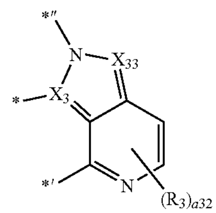
Formula A3-2(25)
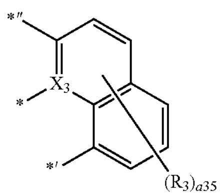
Formula A3-2(26)
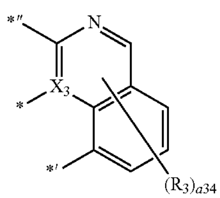
Formula A3-2(27)
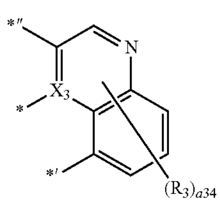
Formula A3-2(28)
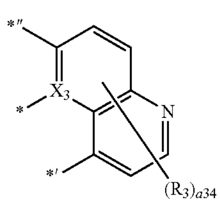
Formula A3-2(29)
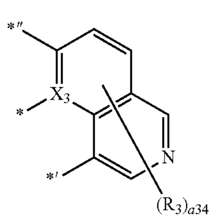

-continued
Formula A3-2(30)
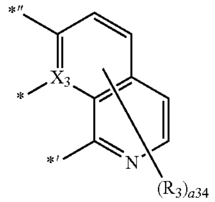
Formula A3-2(31)
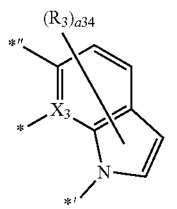
Formula A3-2(32)
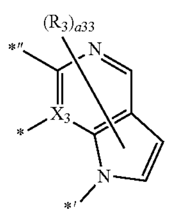
Formula A3-2(33)
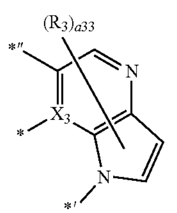
Formula A3-2(34)
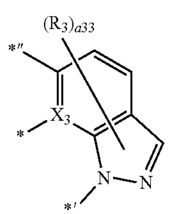
Formula A3-2(35)
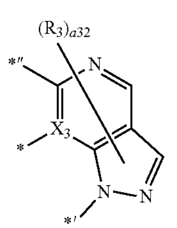
Formula A3-2(36)
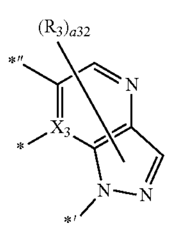
-continued
Formula A3-2(37)
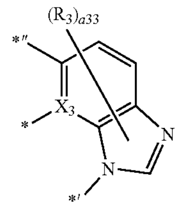
Formula A3-2(38)
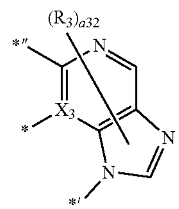
Formula A3-2(39)
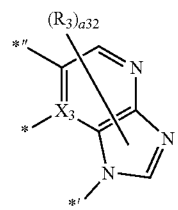
Formula A3-2(40)
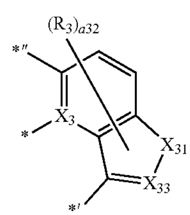
Formula A3-2(41)
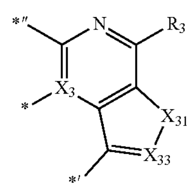
Formula A3-2(42)
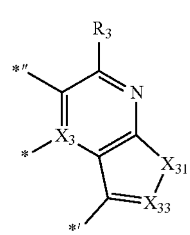
Formula A3-2(43)
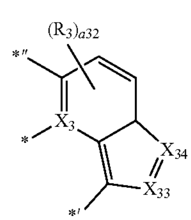

-continued
Formula A3-2(44)
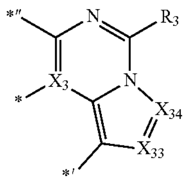
Formula A3-2(45)
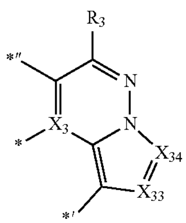
Formula A3-2(46)
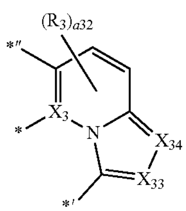
Formula A3-2(47)
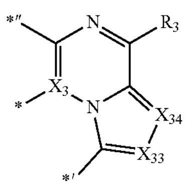
Formula A3-2(48)
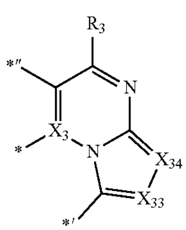
Formula A3-2(49)
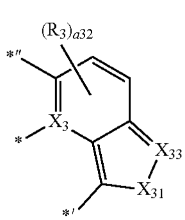
Formula A3-2(50)
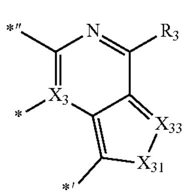
-continued
Formula A3-2(51)
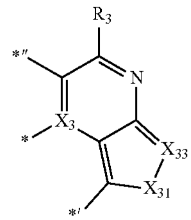
Formula A3-2(52)
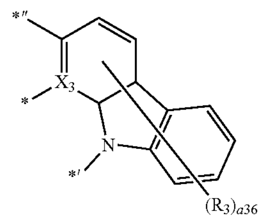
Formula A3-2(53)
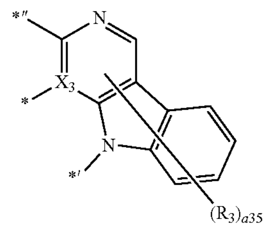
Formula A3-2(54)
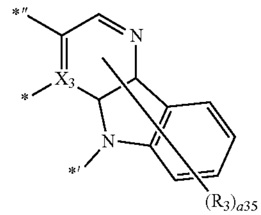
Formula A3-2(55)
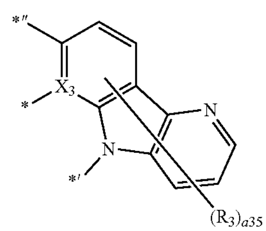
Formula A3-2(56)
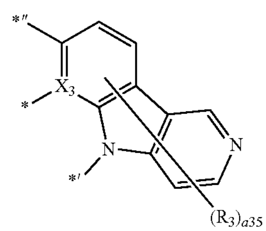
Formula A3-2(57)
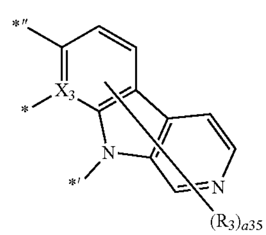

-continued
Formula A3-2(58)
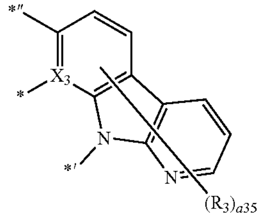
Formula A3-3(1)
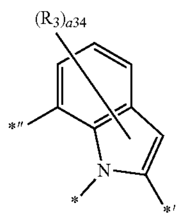
Formula A3-3(2)
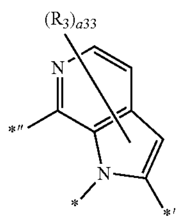
Formula A3-3(3)
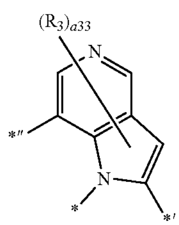
Formula A3-3(4)
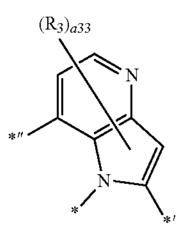
Formula A3-3(5)
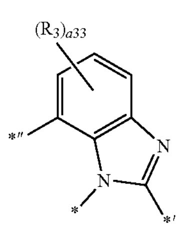
Formula A3-3(6)
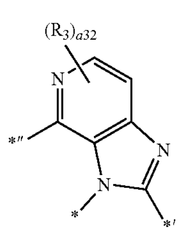
-continued
Formula A3-3(7)
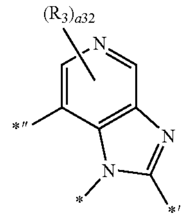
Formula A3-3(8)
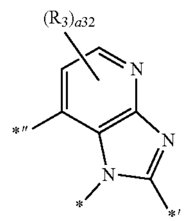
Formula A3-3(9)
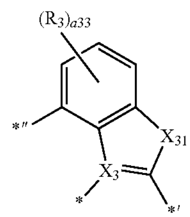
Formula A3-3(10)
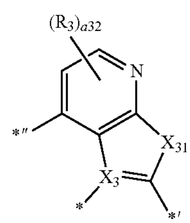
Formula A3-3(11)
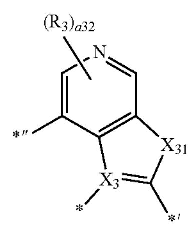
Formula A3-3(12)
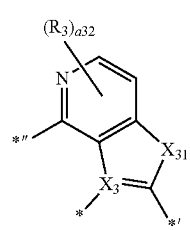
Formula A3-3(13)
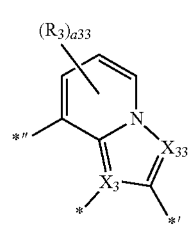

-continued
Formula A3-3(14)
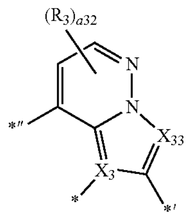
Formula A3-3(15)
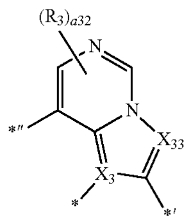
Formula A3-3(16)
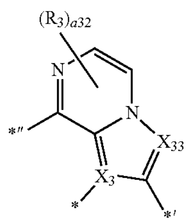
Formula A3-3(17)
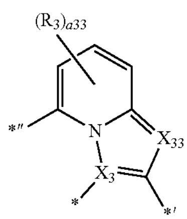
Formula A3-3(18)
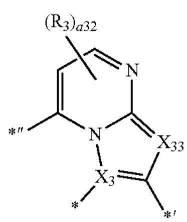
Formula A3-3(19)
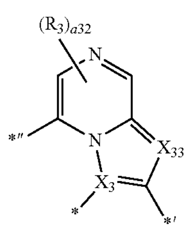
Formula A3-3(20)
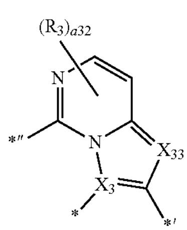
-continued
Formula A3-3(21)
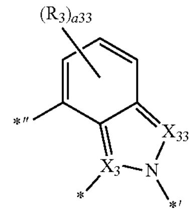
Formula A3-3(22)
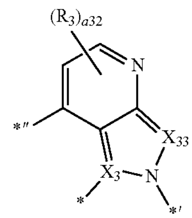
Formula A3-3(23)
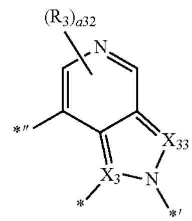
Formula A3-3(24)
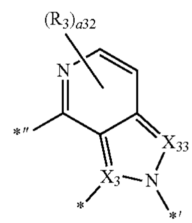
Formula A3-3(25)
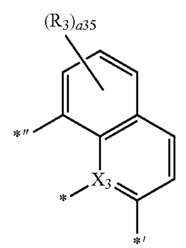
Formula A3-3(26)
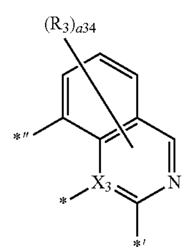
Formula A3-3(27)
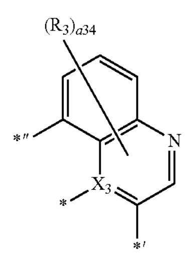

-continued
Formula A3-3(28)
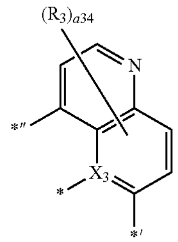
Formula A3-3(29)
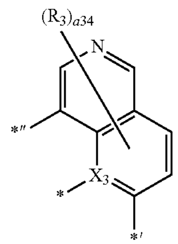
Formula A3-3(30)
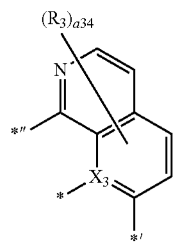
Formula A3-3(31)
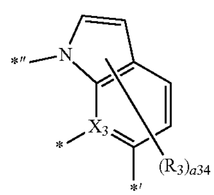
Formula A3-3(32)
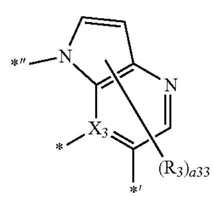
Formula A3-3(33)
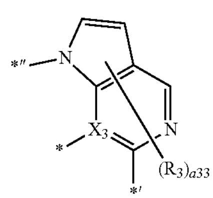
Formula A3-3(34)
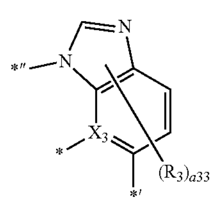
-continued
Formula A3-3(35)
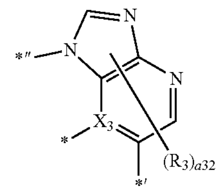
Formula A3-3(36)
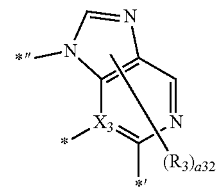
Formula A3-3(37)
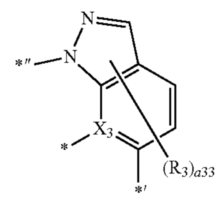
Formula A3-3(38)
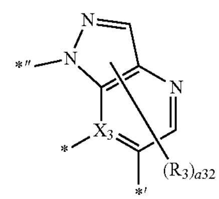
Formula A3-3(39)
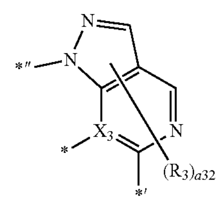
Formula A3-3(40)
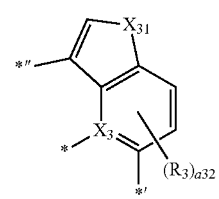
Formula A3-3(41)
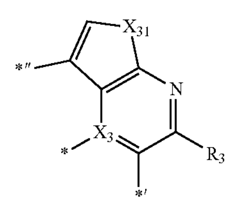
Formula A3-3(42)
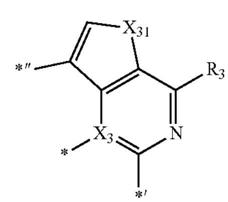

-continued
Formula A3-3(43)
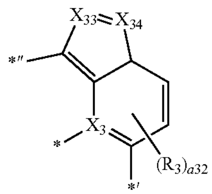
Formula A3-3(44)
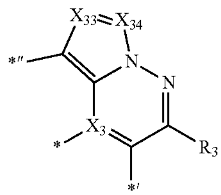
Formula A3-3(45)
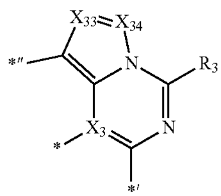
Formula A3-3(46)
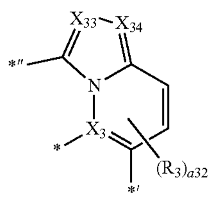
Formula A3-3(47)
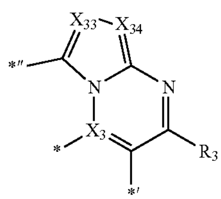
Formula A3-3(48)
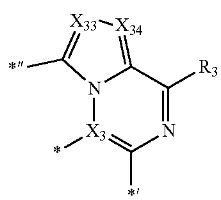
Formula A3-3(49)
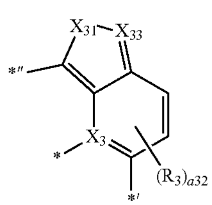
Formula A3-3(50)
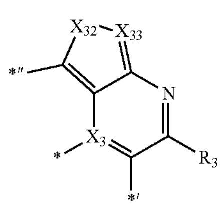
-continued
Formula A3-3(51)
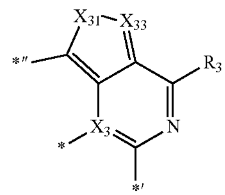
Formula A3-3(52)
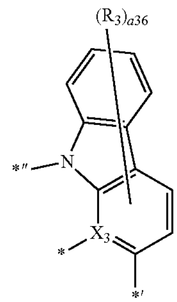
Formula A3-3(53)
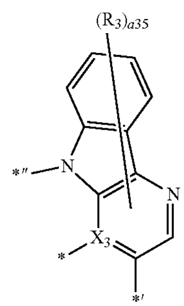
Formula A3-3(54)
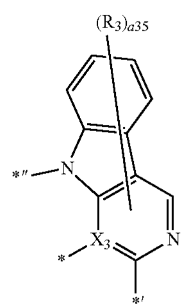
Formula A3-3(55)
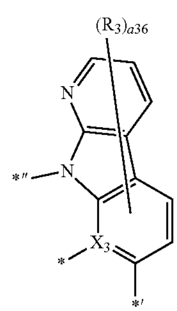

-continued

Formula A3-3(56)

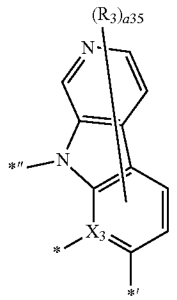

Formula A3-3(57)

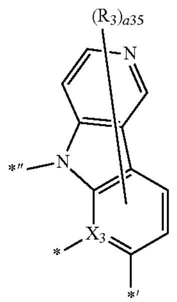

Formula A3-3(58)

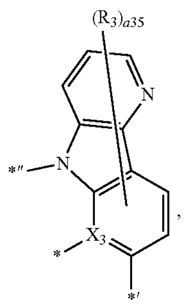

wherein, in Formulae A3-1(1) to A3-1(21), A3-2(1) to A3-2(58), and A3-3(1) to A3-3(58), $X_3$ and $R_3$ are the same as described in claim 1, $X_{31}$ is O, S, $N(R_{31})$, $C(R_{31})(R_{32})$, or $Si(R_{31})(R_{32})$, $X_{33}$ is N or $C(R_{33})$, $X_{34}$ is N or $C(R_{34})$, $R_{31}$ to $R_{38}$ are the same as described in connection with $R_3$ in claim 1, a36 is an integer from 0 to 6, a35 is an integer from 0 to 5, a34 is an integer from 0 to 4, a33 is an integer from 0 to 3, a32 is an integer from 0 to 2, and , *', and *" are the same as described in connection with *, *', and *" in Formula A3-1.

12. The organometallic compound of claim 1, wherein $A_4$ is represented by one of Formulae A4-1(1) to A4-1(44) and A4-2(1) to A4-2(71):

Formula A4-1(1)

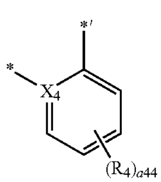

-continued

Formula A4-1(2)

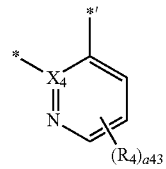

Formula A4-1(3)

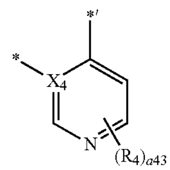

Formula A4-1(4)

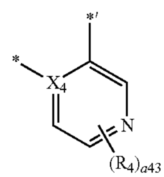

Formula A4-1(5)

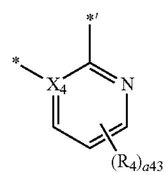

Formula A4-1(6)

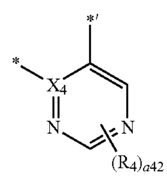

Formula A4-1(7)

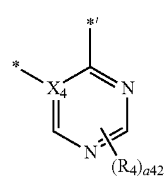

Formula A4-1(8)

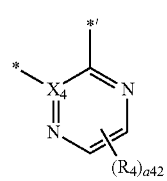

Formula A4-1(9)

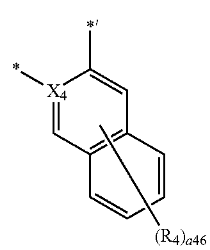

-continued
Formula A4-1(10)
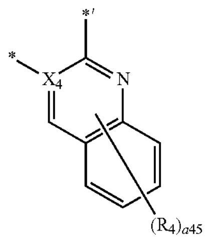
Formula A4-1(11)
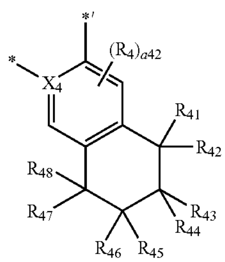
Formula A4-1(12)
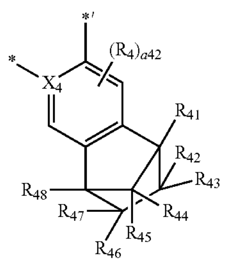
Formula A4-1(13)
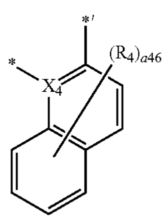
Formula A4-1(14)
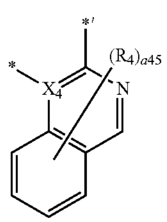
Formula A4-1(15)
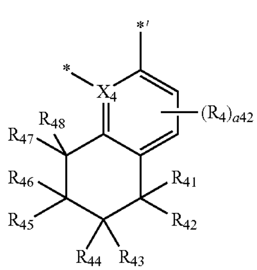
-continued
Formula A4-1(16)
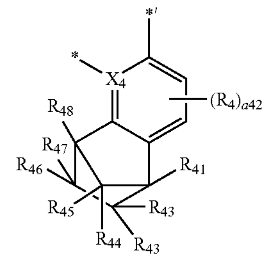
Formula A4-1(17)
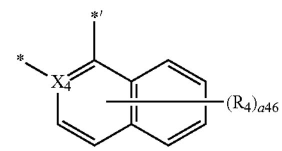
Formula A4-1(18)
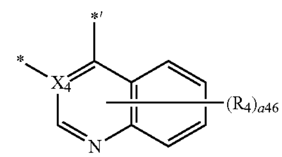
Formula A4-1(19)
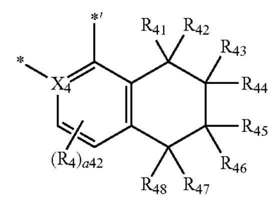
Formula A4-1(20)
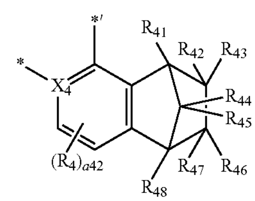
Formula A4-1(21)
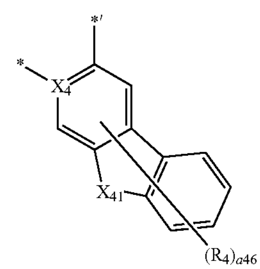
Formula A4-1(22)
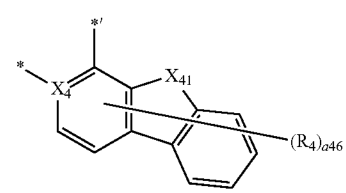
Formula A4-1(23)
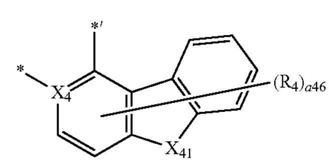

-continued
Formula A4-1(24)
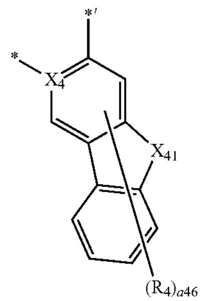
Formula A4-1(25)
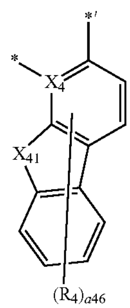
Formula A4-1(26)
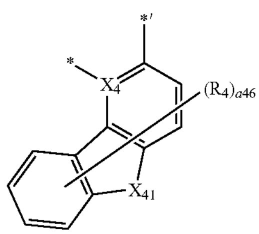
Formula A4-1(27)
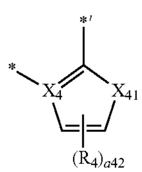
Formula A4-1(28)
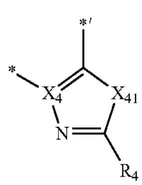
Formula A4-1(29)
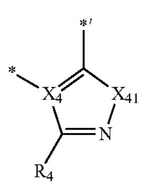
Formula A4-1(30)
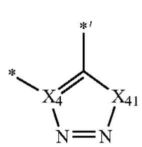
-continued
Formula A4-1(31)
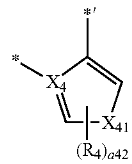
Formula A4-1(32)
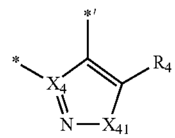
Formula A4-1(33)
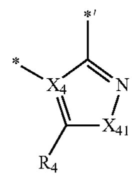
Formula A4-1(34)
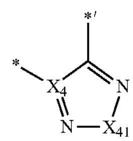
Formula A4-1(35)
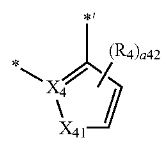
Formula A4-1(36)
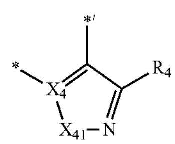
Formula A4-1(37)
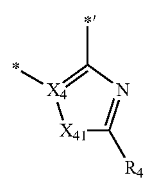
Formula A4-1(38)
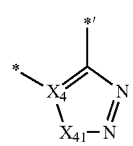
Formula A4-1(39)
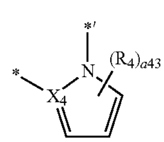
Formula A4-1(40)
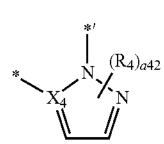

-continued
Formula A4-1(41)
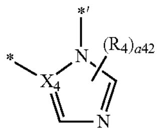
Formula A4-1(42)
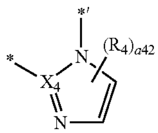
Formula A4-1(43)
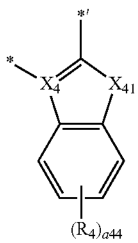
Formula A4-1(44)
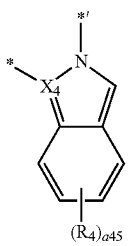
Formula A4-2(1)
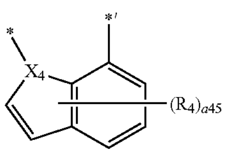
Formula A4-2(2)
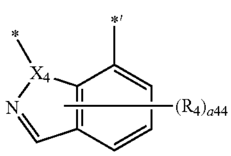
Formula A4-2(3)
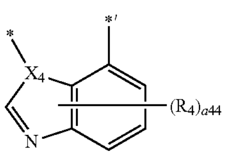
Formula A4-2(4)
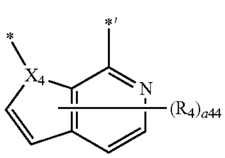
Formula A4-2(5)
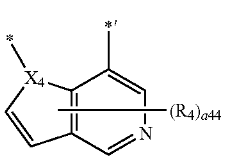
-continued
Formula A4-2(6)
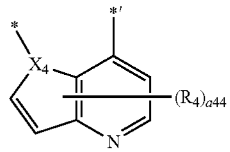
Formula A4-2(7)
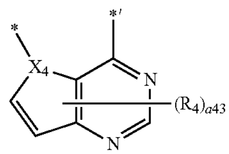
Formula A4-2(8)
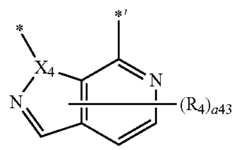
Formula A4-2(9)
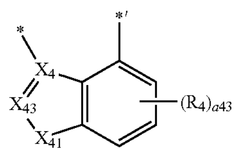
Formula A4-2(10)
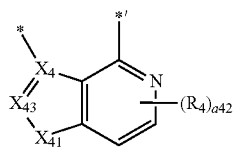
Formula A4-2(11)
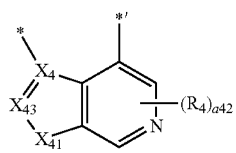
Formula A4-2(12)
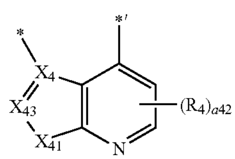
Formula A4-2(13)
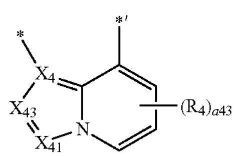
Formula A4-2(14)
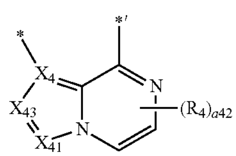
Formula A4-2(15)
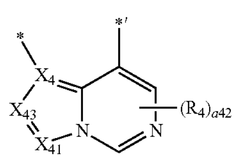

-continued
Formula A4-2(16)
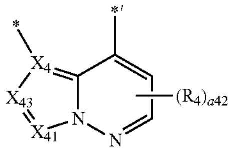
Formula A4-2(17)
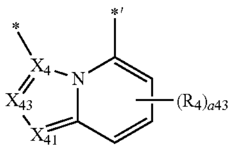
Formula A4-2(18)
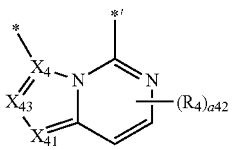
Formula A4-2(19)
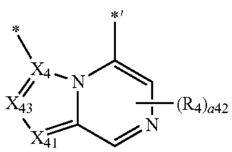
Formula A4-2(20)
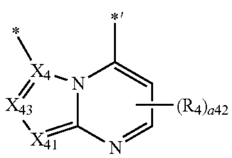
Formula A4-2(21)
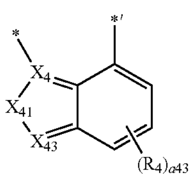
Formula A4-(22)
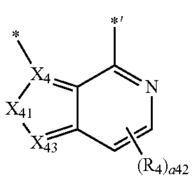
Formula A4-2(23)
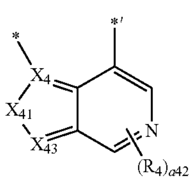
Formula A4-2(24)
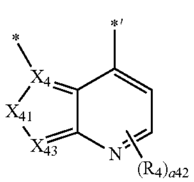
-continued
Formula A4-2(25)
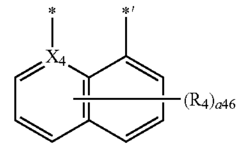
Formula A4-2(26)
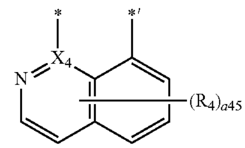
Formula 4A-2(27)
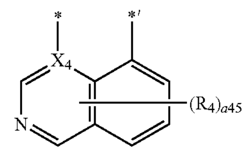
Formula A4-2(28)
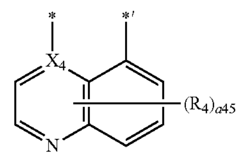
Formula A4-2(29)
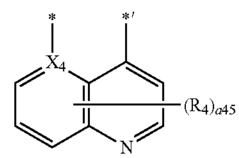
Formula A4-2(30)
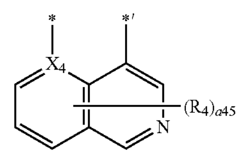
Formula A4-2(31)
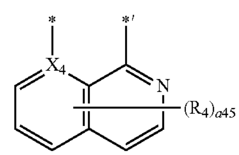
Formula A4-2(32)
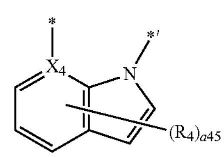
Formula A4-2(33)
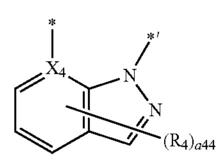
Formula A4-2(34)
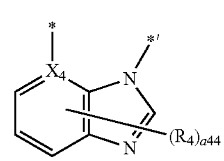

-continued
Formula A4-2(35)
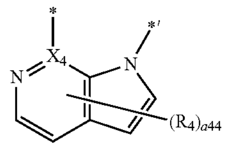
Formula A4-2(36)
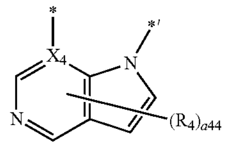
Formula A4-2(37)
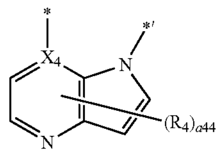
Formula A4-2(38)
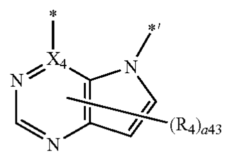
Formula A4-2(39)
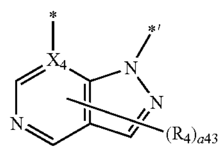
Formula A4-2(40)
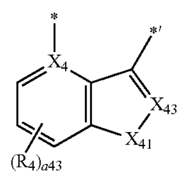
Formula A4-2(41)
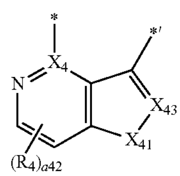
Formula A4-2(42)
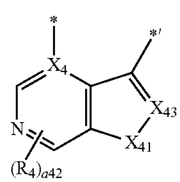
Formula A4-2(43)
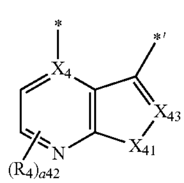
-continued
Formula A4-2(44)
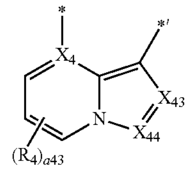
Formula A4-2(45)
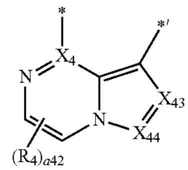
Formula A4-2(46)
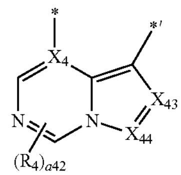
Formula A4-2(47)
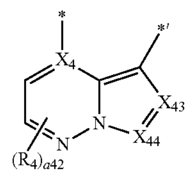
Formula A4-2(48)
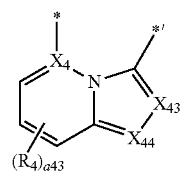
Formula A4-2(49)
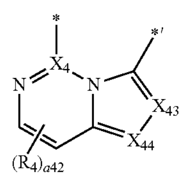
Formula A4-2(50)
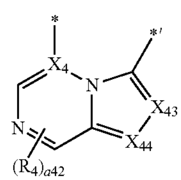
Formula A4-2(51)
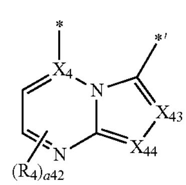
Formula A4-2(52)
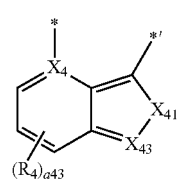

Formula A4-2(53)
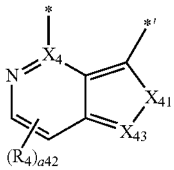
Formula A4-2(54)
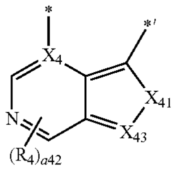
Formula A4-2(55)
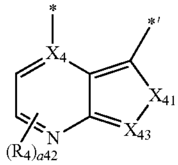
Formula A4-2(56)
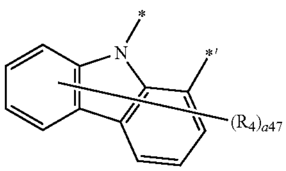
Formula A4-2(5)
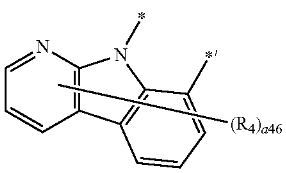
Formula A4-2(58)
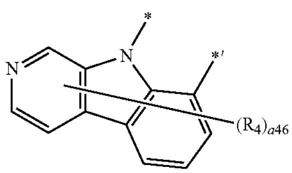
Formula A4-2(59)
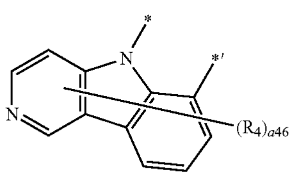
Formula A4-2(60)
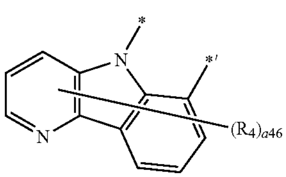
Formula A4-2(61)
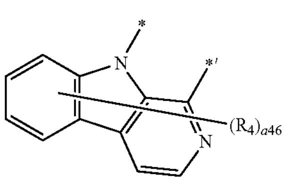
Formula A4-2(62)
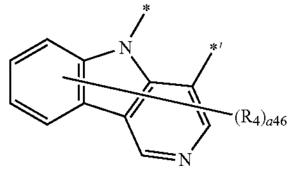
Formula A4-2(63)
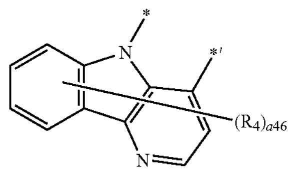
Formula A4-2(64)
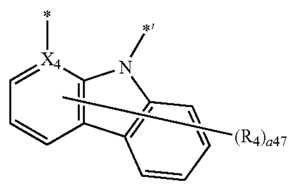
Formuloa A4-2(65)
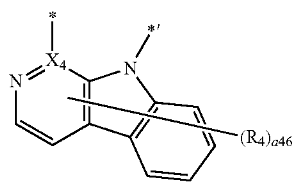
Formula A4-2(66)
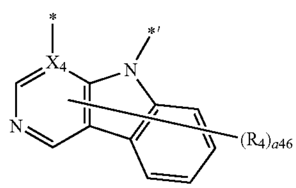
Formula A4-2(67)
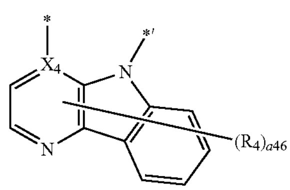
Formula A4-2(68)
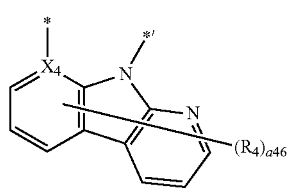
Formula A4-2(69)
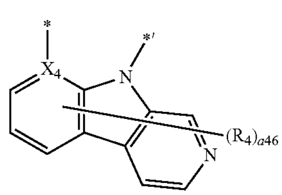

Formula A4-2(70)

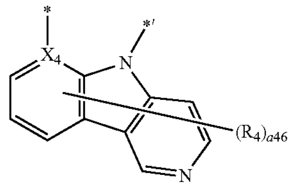

Formula A4-2(71)

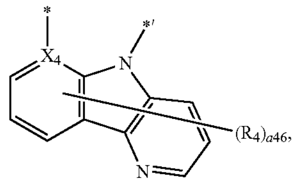

wherein, in Formulae A4-1(1) to A4-1(44) and A4-2(1) to A4-2(71), $X_4$, $R_4$, *, and *' are the same as described in claim 1, $X_{41}$ is O, S, $N(R_{41})$, $C(R_{41})(R_{42})$, or $Si(R_{41})(R_{42})$, $X_{43}$ is N or $C(R_{43})$, $X_{44}$ is N or $C(R_{44})$, $R_{41}$ to $R_{48}$ are the same as described in connection with $R_4$, a47 is an integer from 0 to 7, a46 is an integer from 0 to 6, a45 is an integer from 0 to 5, a44 is an integer from 0 to 4, a43 is an integer from 0 to 3, and a42 is an integer from 0 to 2.

13. The organometallic compound of claim 1, wherein $A_2$ is represented by Formula A2-2.

14. The organometallic compound of claim 1, wherein $A_1$ is represented by one of Formulae A1-1-1 to A1-1-10 and A1-2-1 to A1-2-4, $A_2$ is represented by one of Formulae A2-2-1 to A2-2-4, $A_3$ is represented by one of Formulae A3-1-1 to A3-1-10, and $A_4$ is represented by one of Formulae A4-1-1 to A4-1-14:

Formula A1-1-1

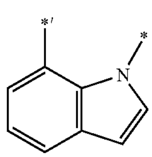

Formula A1-1-2

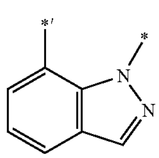

Formula A1-1-3

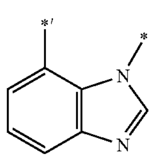

Formula A1-1-4

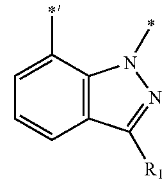

Formula A1-1-5

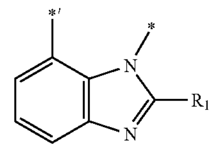

Formula A1-1-6

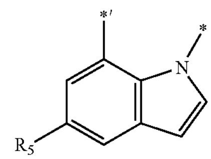

Formula A1-1-7

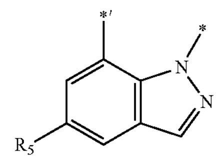

Formula A1-1-8

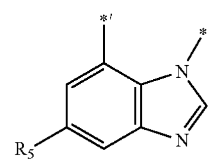

Formula A1-1-9

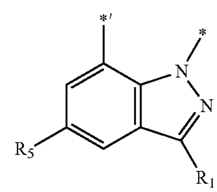

Formula A1-1-10

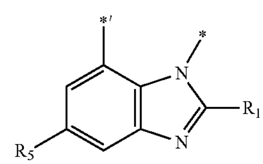

Formula A1-2-1

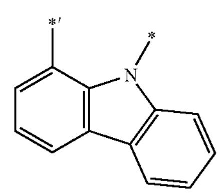

Formula A1-2-2

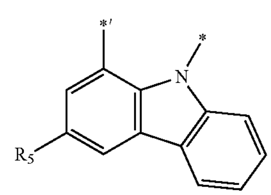

-continued
Formula A1-2-3
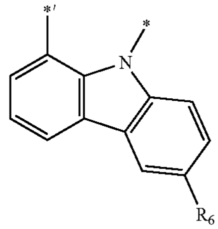
Formula A1-2-4
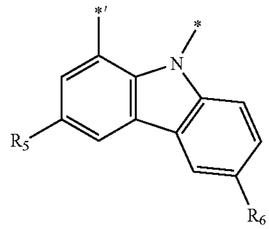
Formula A2-2-1
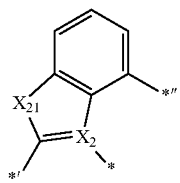
Formula A2-2-2
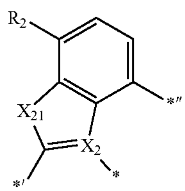
Formula A2-2-3
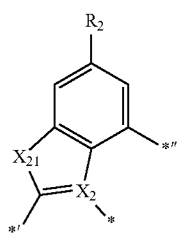
Formula A2-2-4
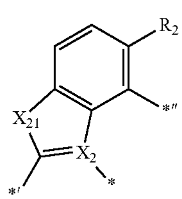
Formula A3-1-1
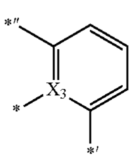
Formula A3-1-2
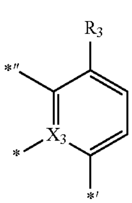
-continued
Formula A3-1-3
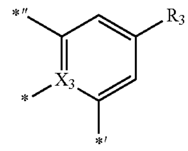
Formula A3-1-4
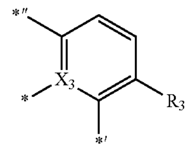
Formula A3-1-5
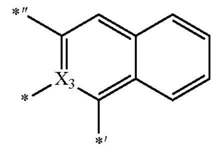
Formula A3-1-6
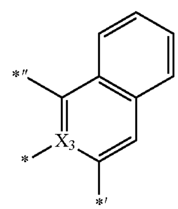
Formula A3-1-7
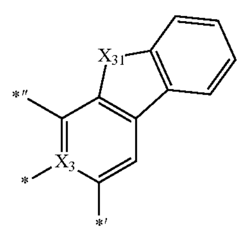
Formula A3-1-8
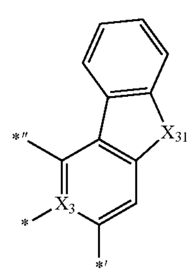
Formula A3-1-9
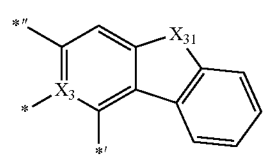
Formula A3-1-10
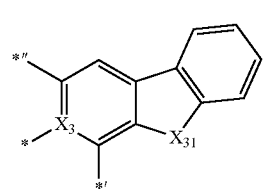

-continued

Formula A4-1-1

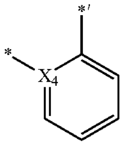

Formula A4-1-2

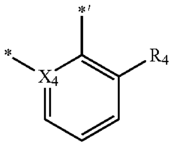

Formula A4-1-3

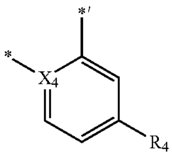

Formula A4-1-4

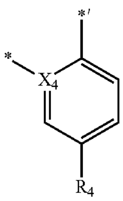

Formula A4-1-5

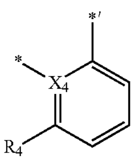

Formula A4-1-6

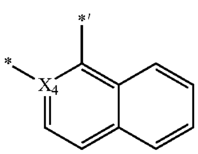

Formula A4-1-7

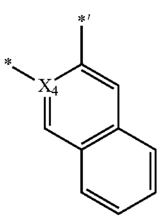

Formula A4-1-8

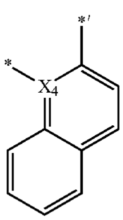

Formula A4-1-9

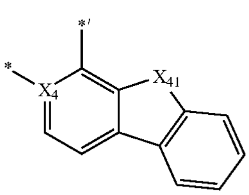

-continued

Formula A4-1-10

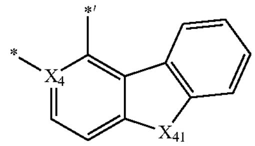

Formula A4-1-11

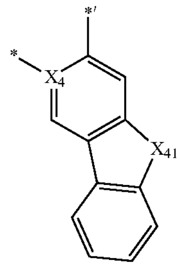

Formula A4-1-12

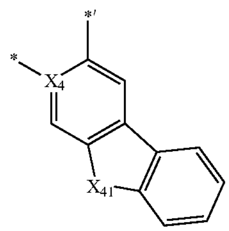

Formula A4-1-13

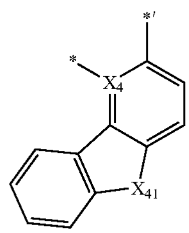

Formula A4-1-14

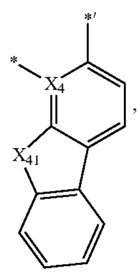

wherein, in Formulae A1-1-1 to A1-1-10, A1-2-1 to A1-2-4, A2-2-1 to A2-2-4, A3-1-1 to A3-1-10, and A4-1-1 to A4-1-14

$X_1$ to $X_4$ and $R_1$ to $R_6$ are the same as described in claim 1, provided that $R_1$ to $R_6$ are not hydrogen, $X_{21}$ is O, S, $N(R_{21})$, $C(R_{21})(R_{22})$, or $Si(R_{21})(R_{22})$, and $R_{21}$ and $R_{22}$ are the same as described in connection with $R_2$ in claim 1, $X_{31}$ is O, S, $N(R_{31})$, $C(R_{31})(R_{32})$, or $Si(R_{31})(R_{32})$, and $R_{31}$ and $R_{32}$ are the same as described in connection with $R_3$ in claim 1, $X_{41}$ is O, S, $N(R_{41})$, $C(R_{41})(R_{42})$, or $Si(R_{41})(R_{42})$, and $R_{41}$ and $R_{42}$ are the same as described in connection with $R_4$ in claim 1, in Formulae A1-1-1 to A1-1-10 and A1-2-1 to A1-2-4, * indicates a binding site to M in Formula 1, and *' indicates a binding site to $T_1$ in Formula 1, in Formulae A2-2-1 to A2-2-4, * indicates a binding site to M in Formula 1, *' indicates a binding site to $T_1$ in Formula 1, and *" indicates a binding site to $T_2$ in Formula 1, in Formulae A3-1-1 to A3-1-10, * indicates a binding site to M in Formula 1, *" indicates a binding site to $T_2$ in Formula 1, and *' indicates a binding site to $T_3$ in Formula 1, and in Formulae A4-1-1 to A4-1-14, * indicates a binding site to M in Formula 1, and *' indicates a binding site to $T_3$ in Formula 1.

15. The organometallic compound of claim 1, wherein the organometallic compound is one of Compounds 1 to 273:

1

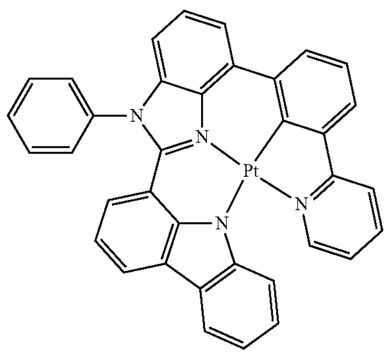

2

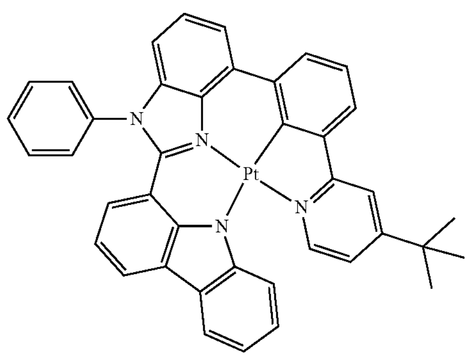

3

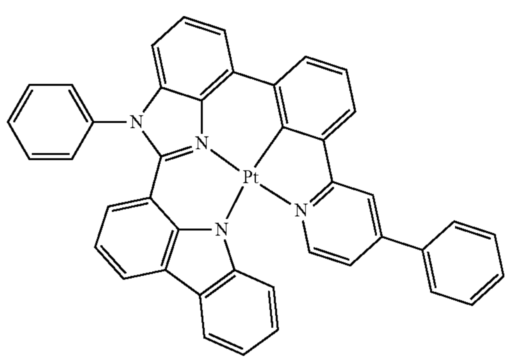

-continued

4

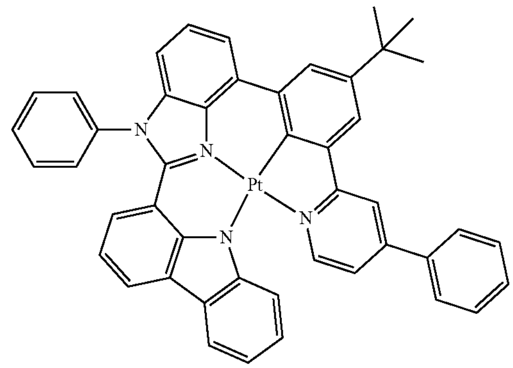

5

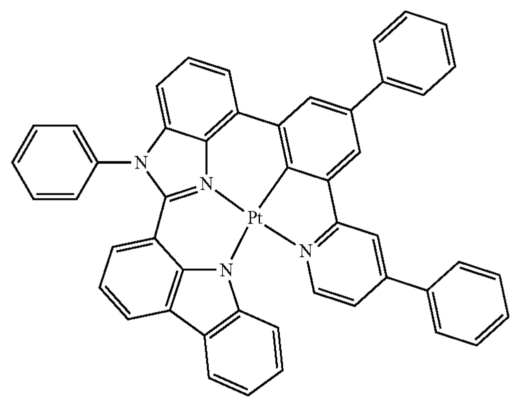

6

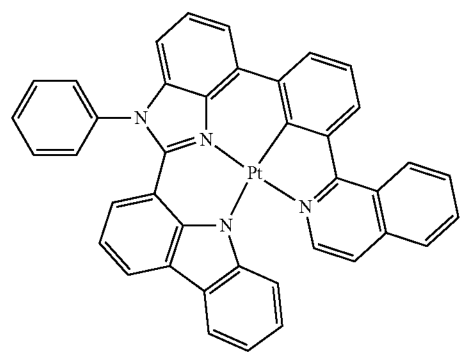

7

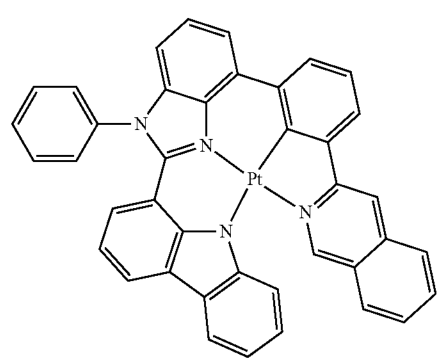

-continued
8
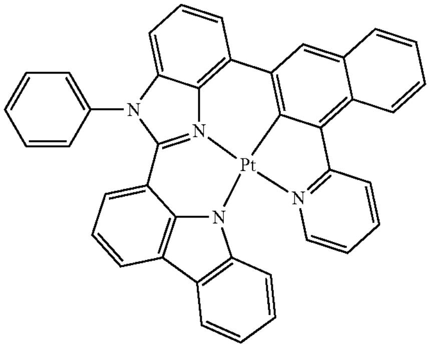
9
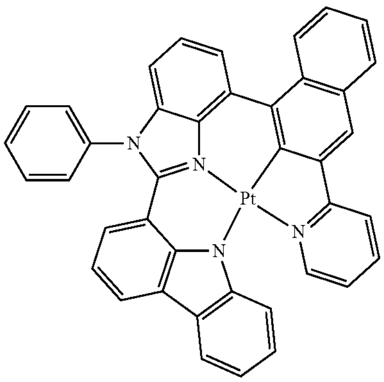
10
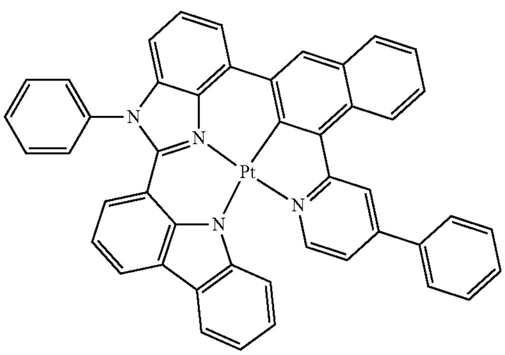
11
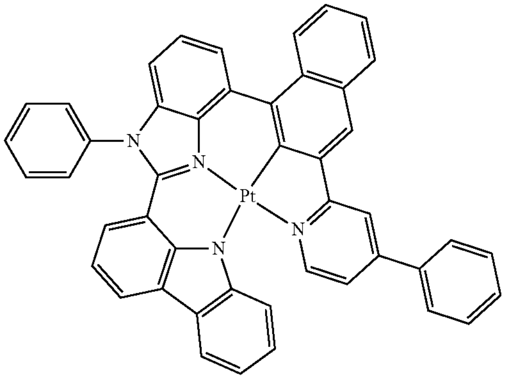
-continued
12
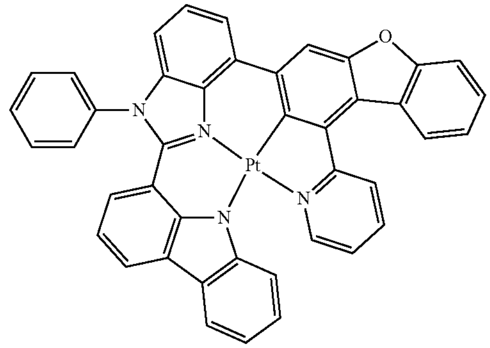
13
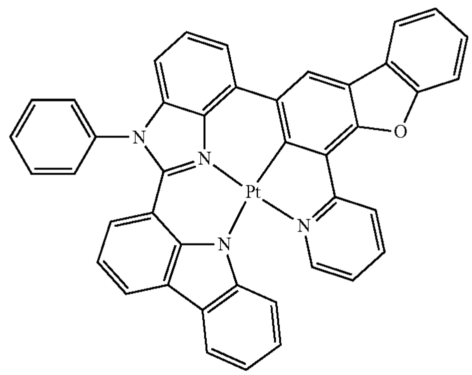
14
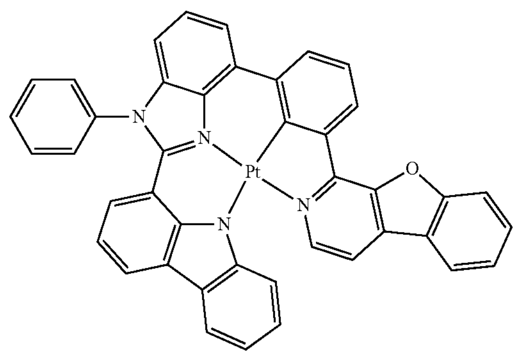
15
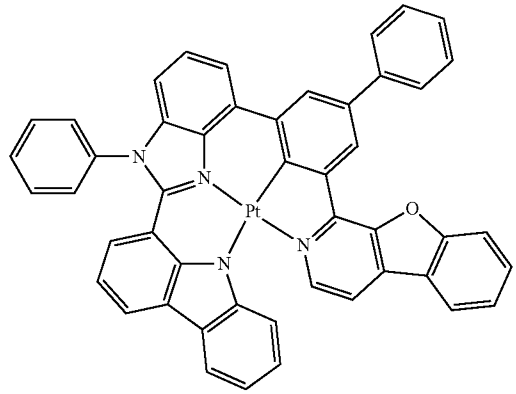

16
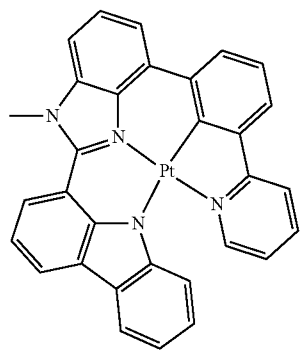
17
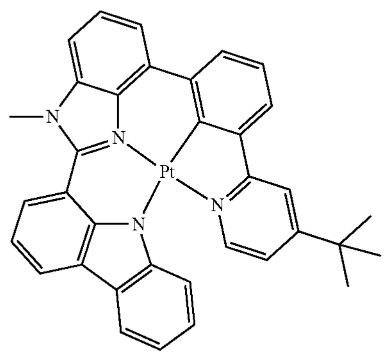
18
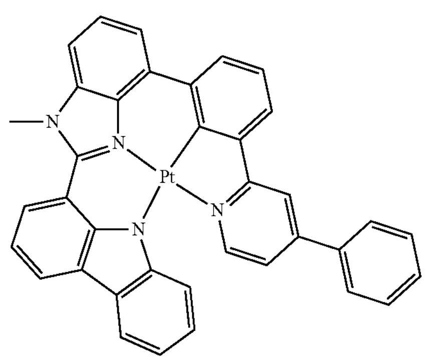
19
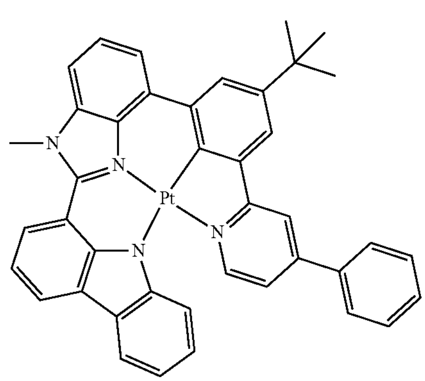
20
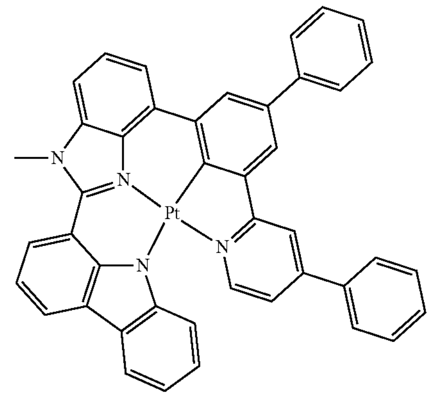
21
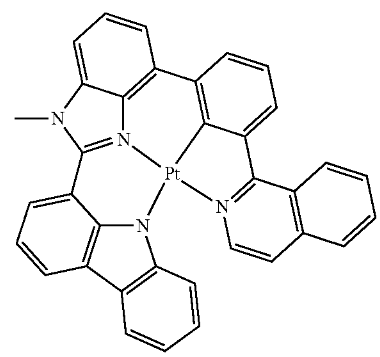
22
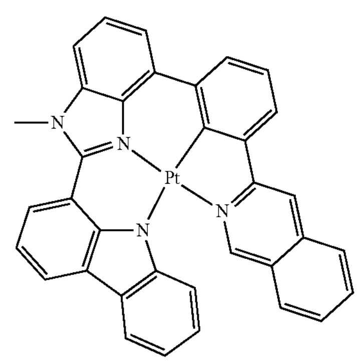
23
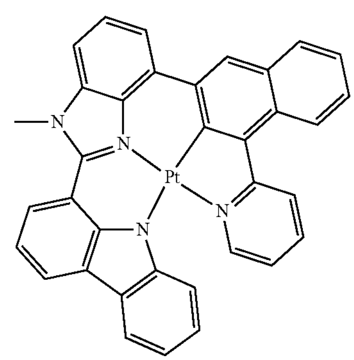

-continued
24
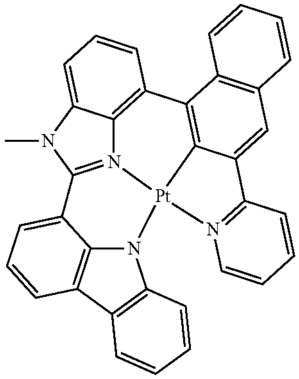
25
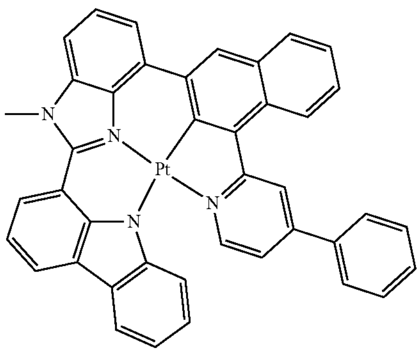
26
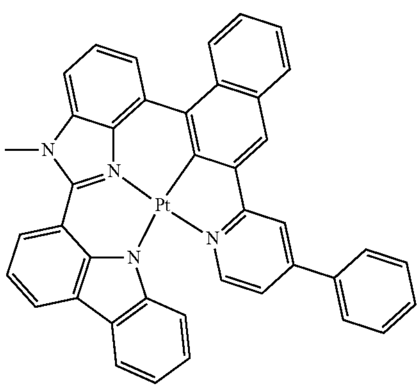
27
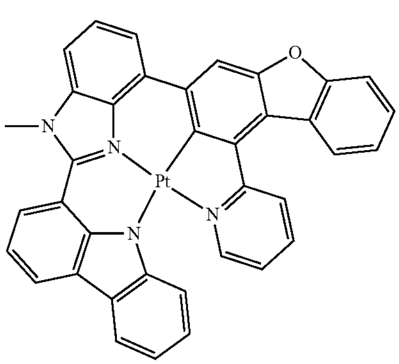
-continued
28
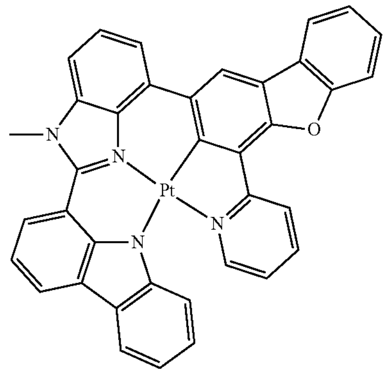
29
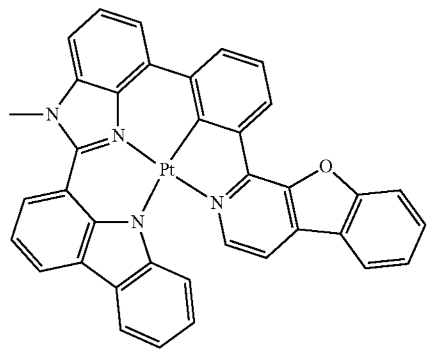
30
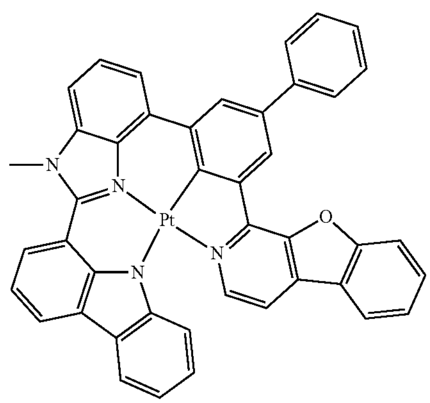
31
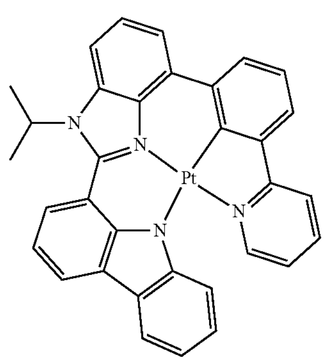

-continued
32
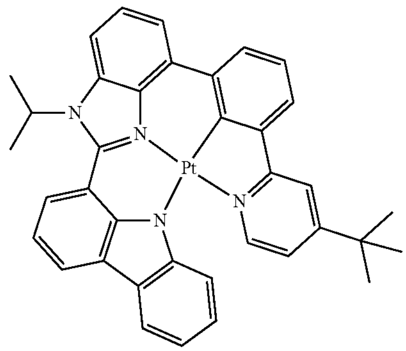
33
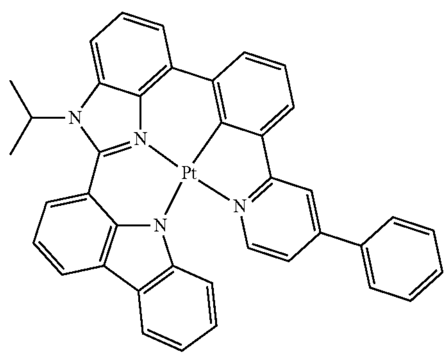
34
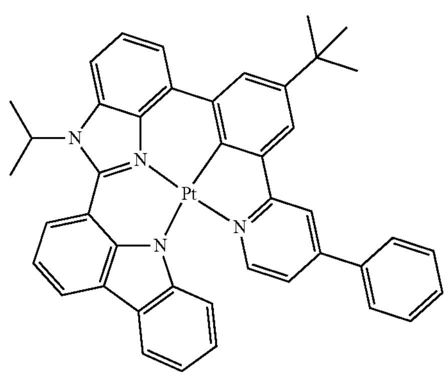
35
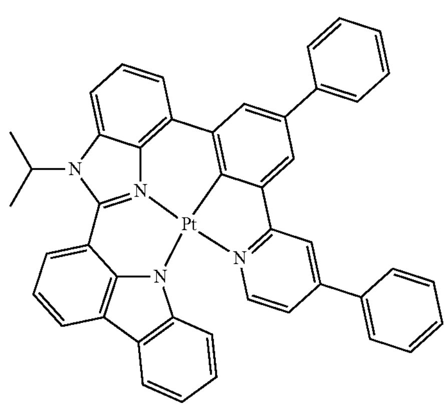
-continued
36
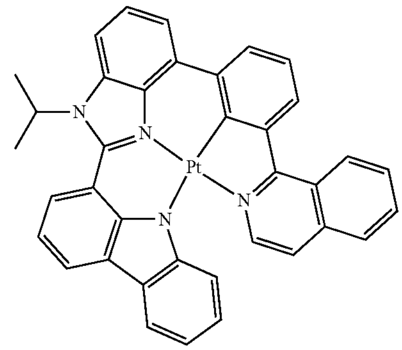
37
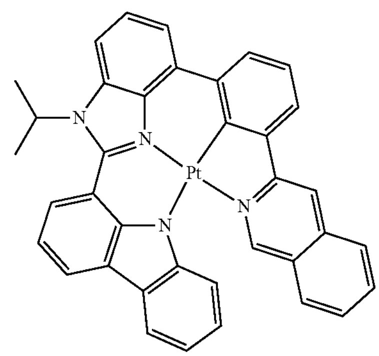
38
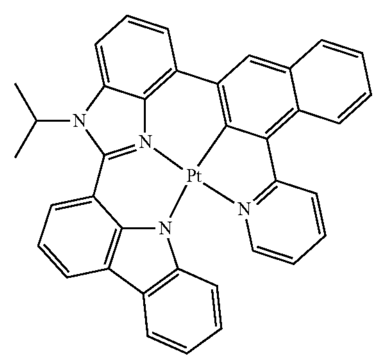
39
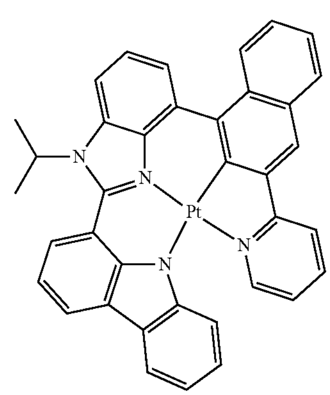

-continued
40
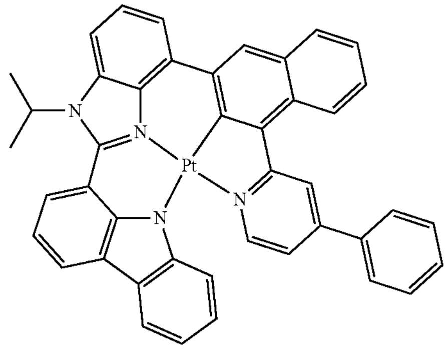
41
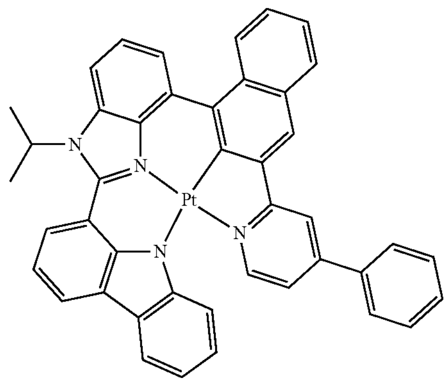
42
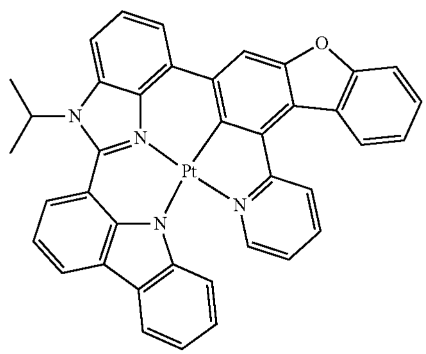
43
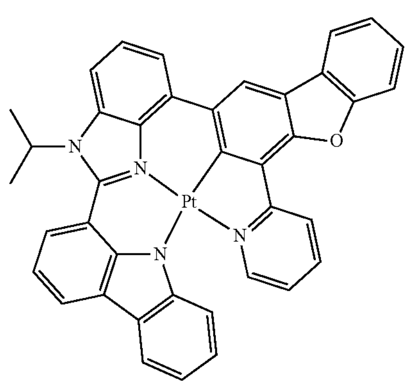
-continued
44
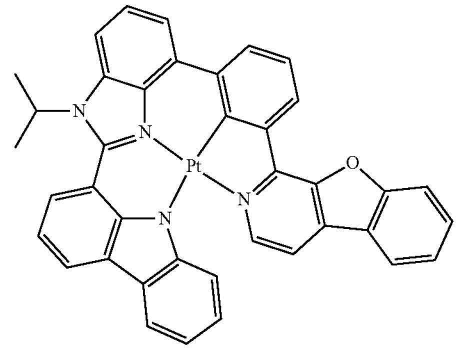
45
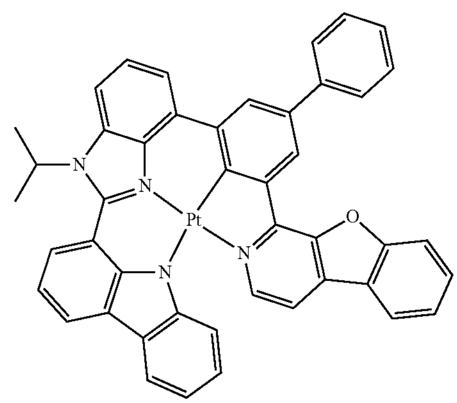
46
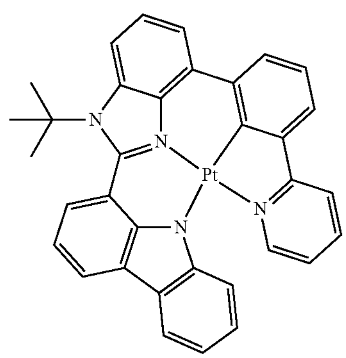
47
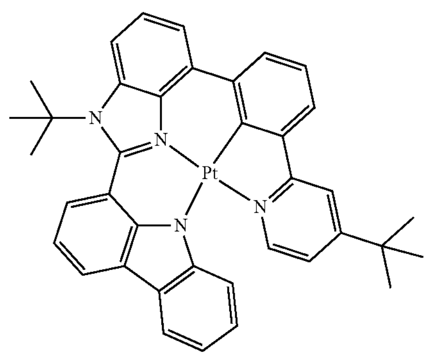

-continued
48
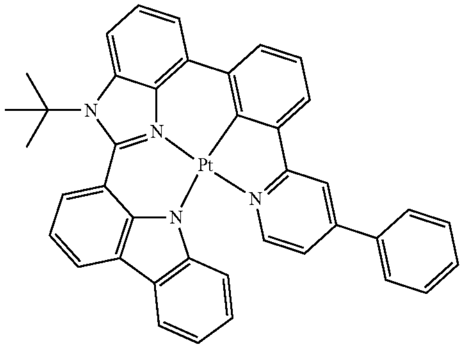
49
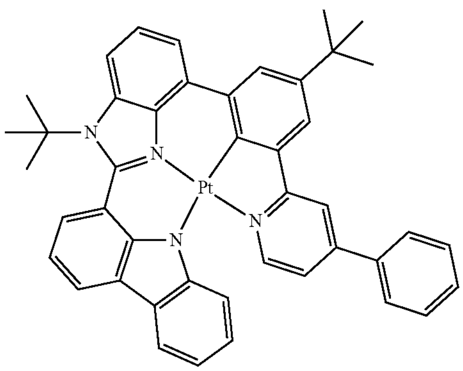
50
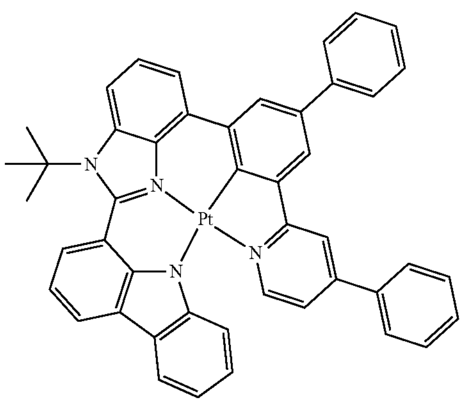
51
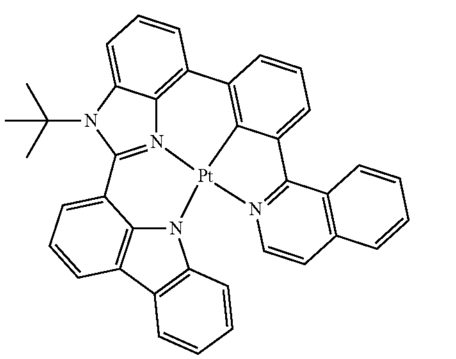
-continued
52
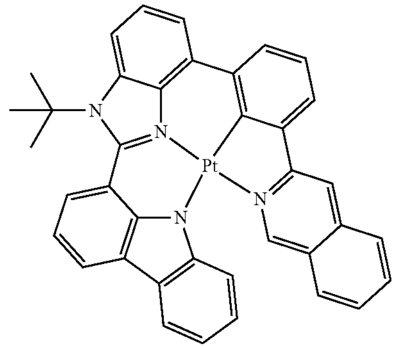
53
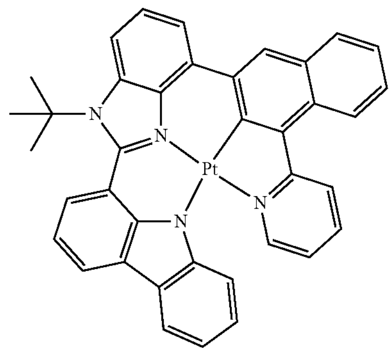
54
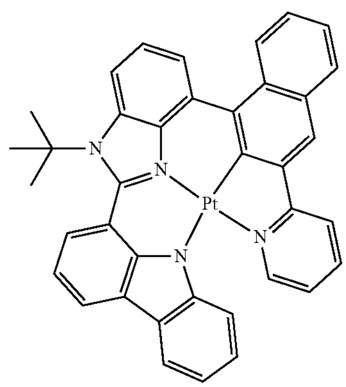
55
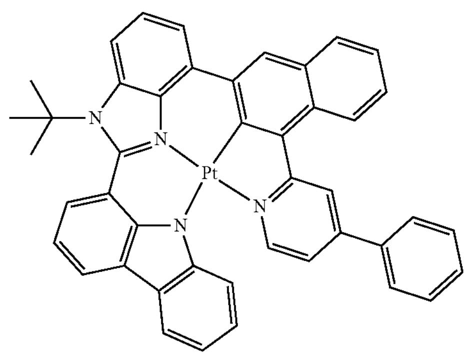

-continued
56
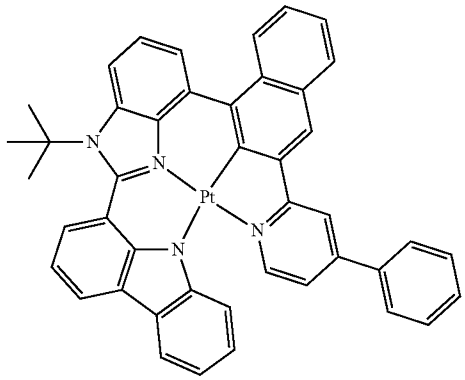
57
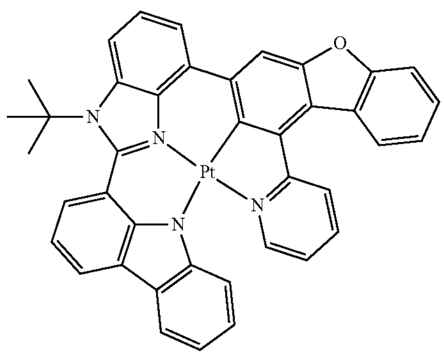
58
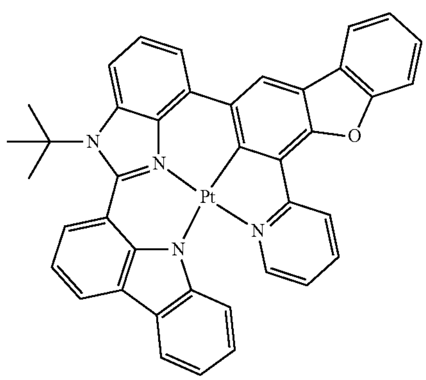
59
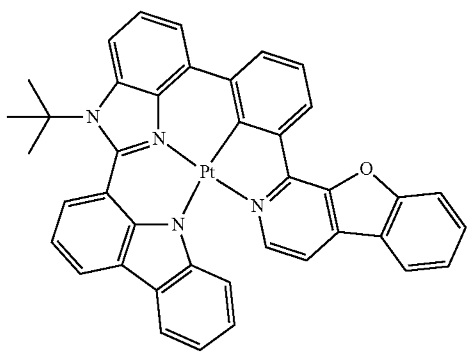
-continued
60
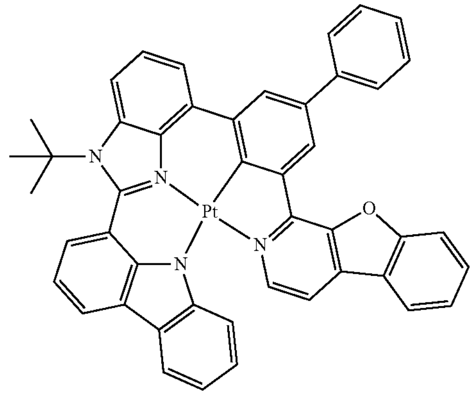
61
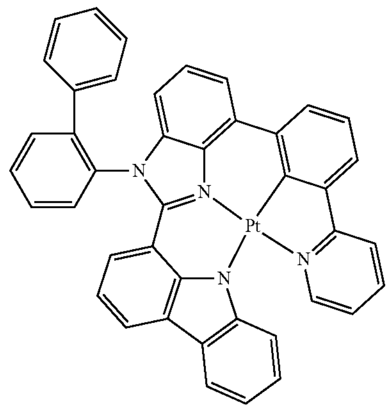
62
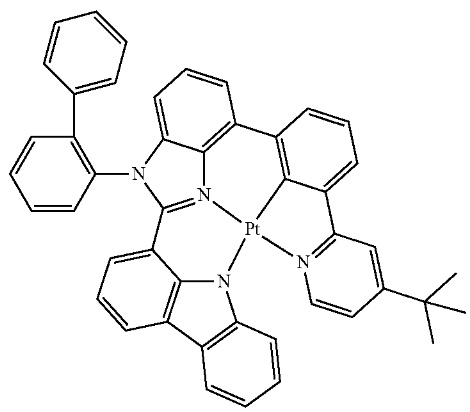
63
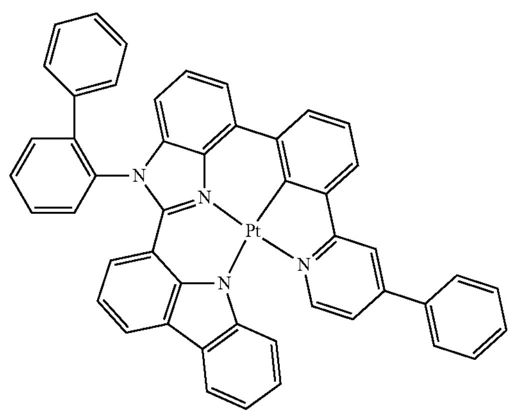

64
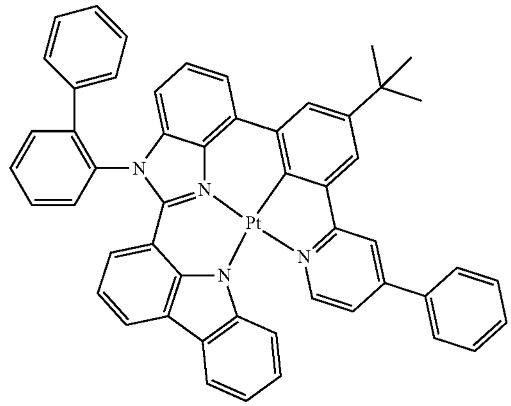
65
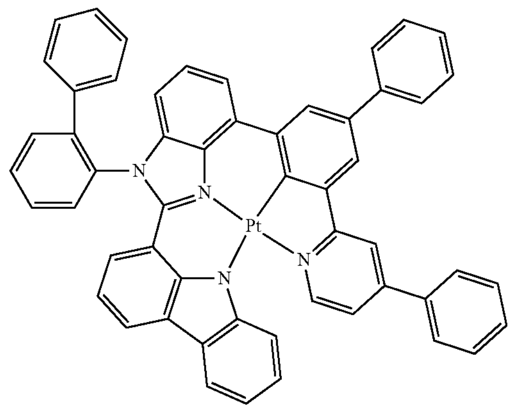
66
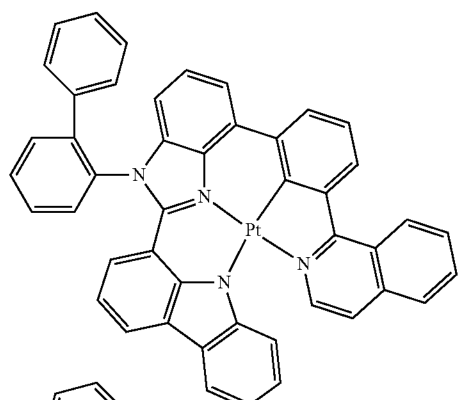
67
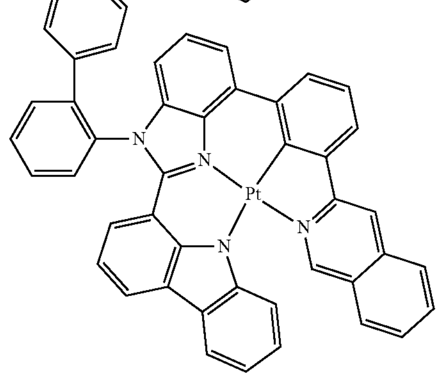
68
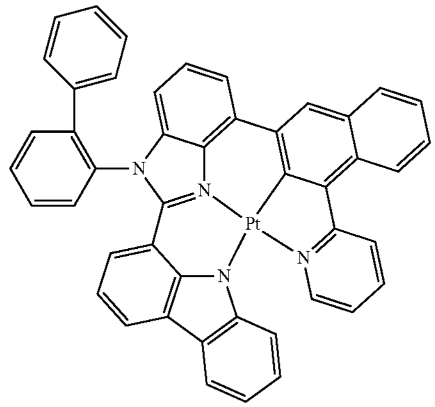
69
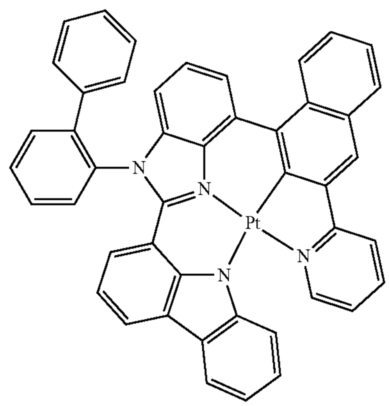
70
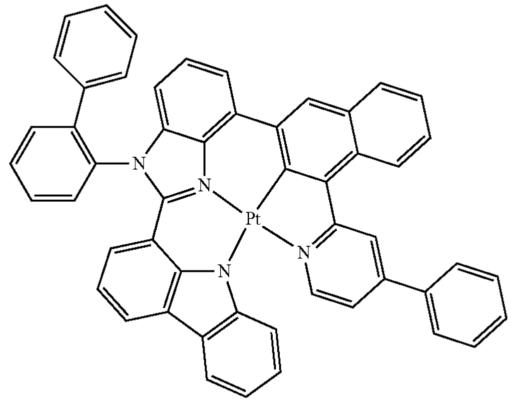

-continued
71
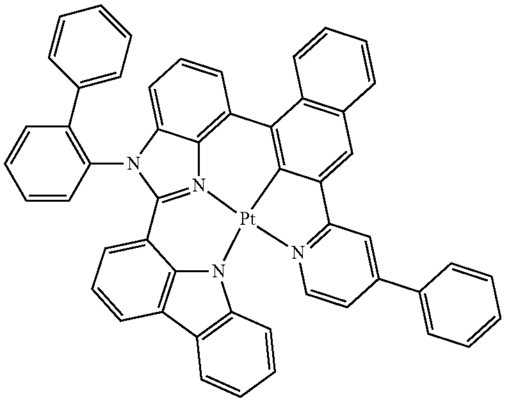
72
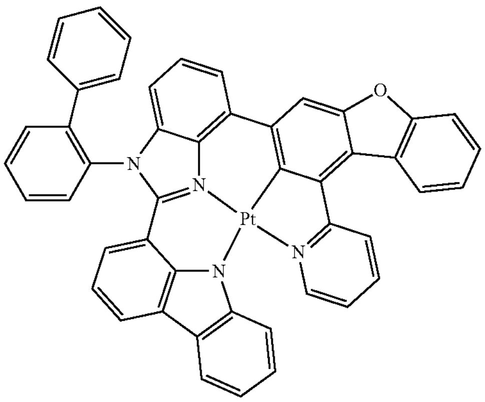
73
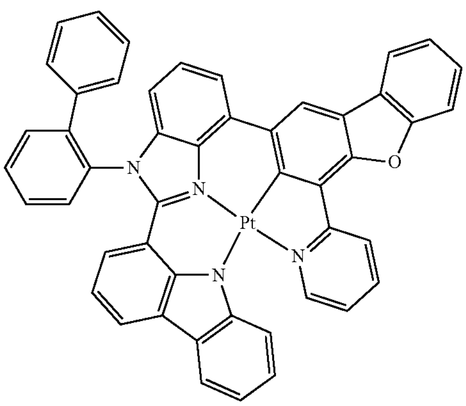
74
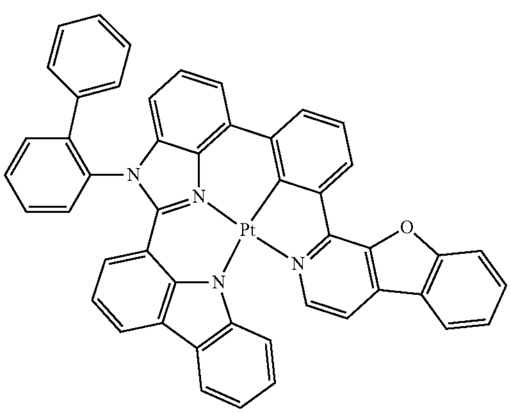
-continued
75
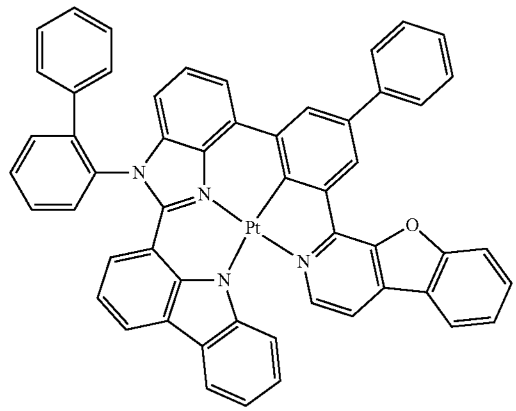
76
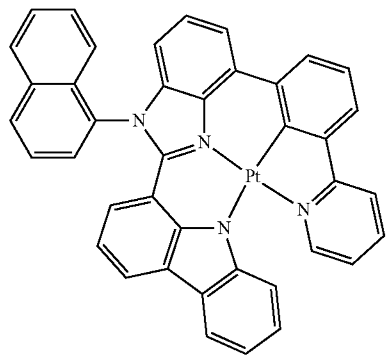
77
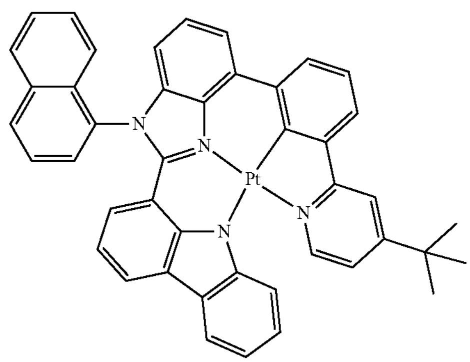
78
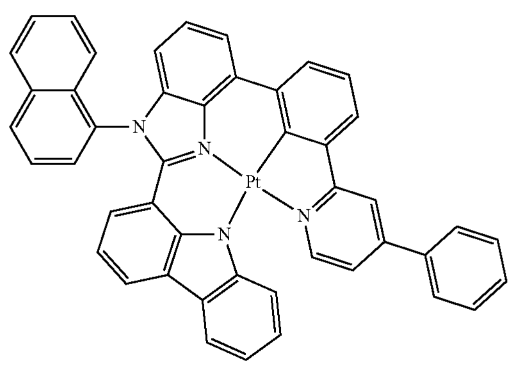

-continued
79
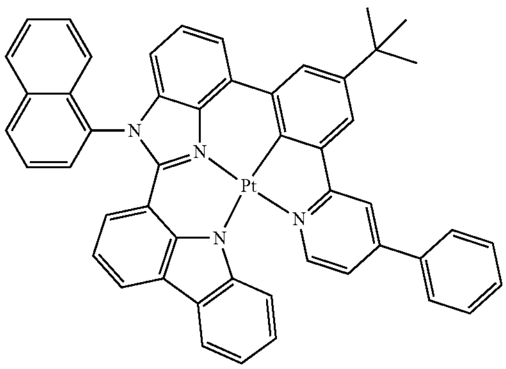
80
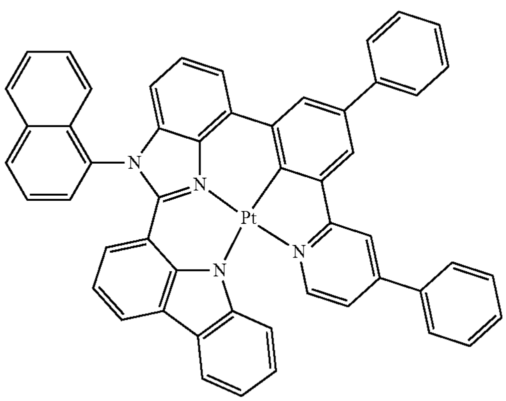
81
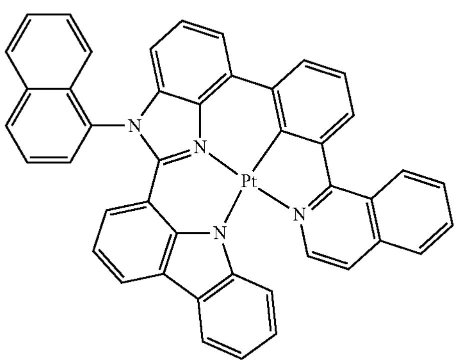
82
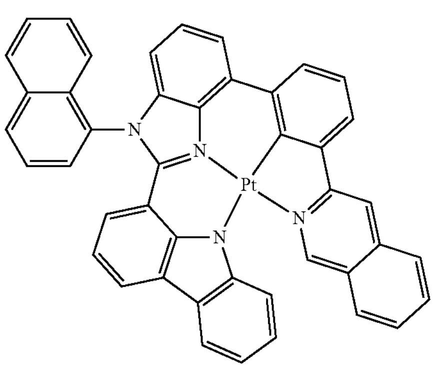
-continued
83
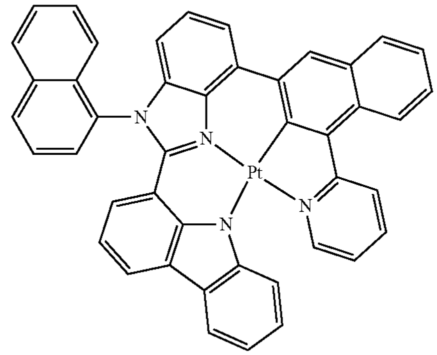
84
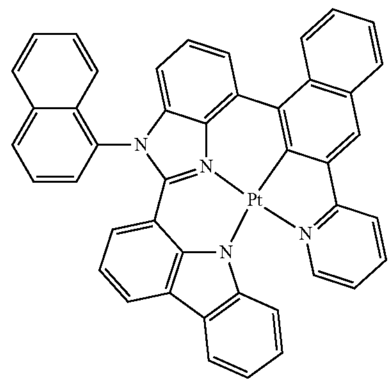
85
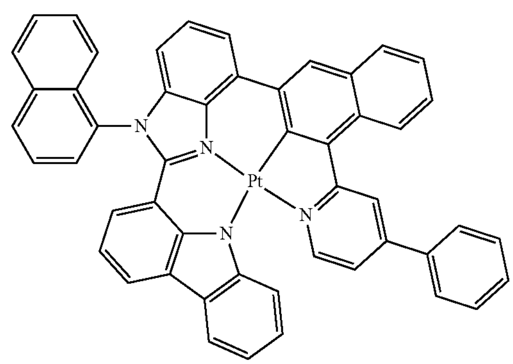
86
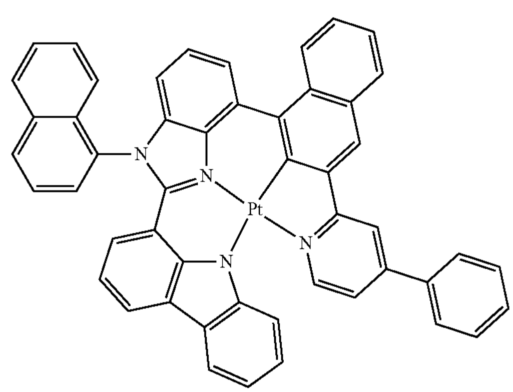

-continued
87
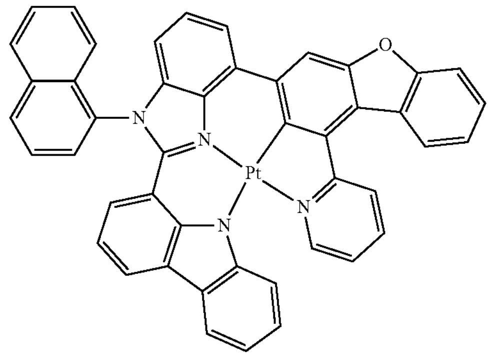
88
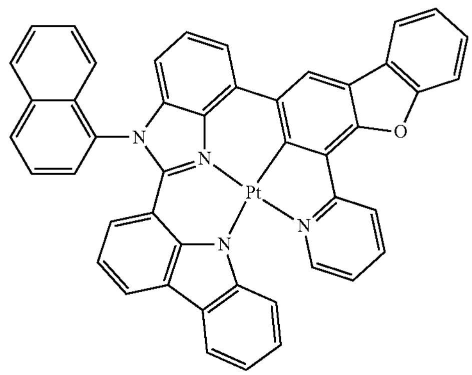
89
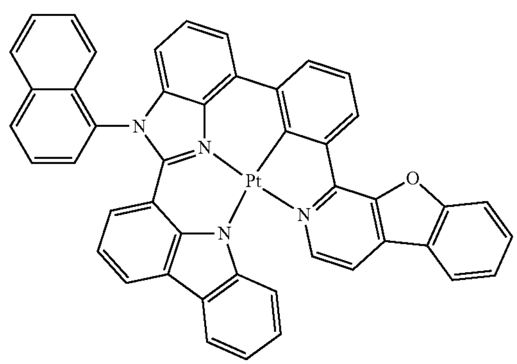
90
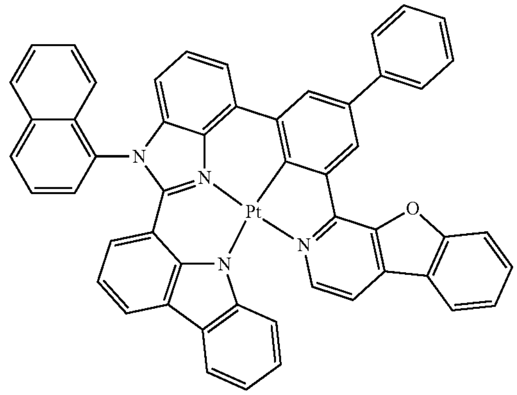
-continued
91
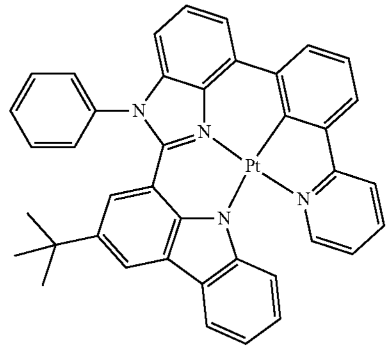
92
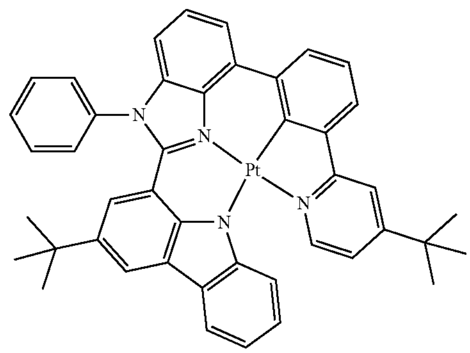
93
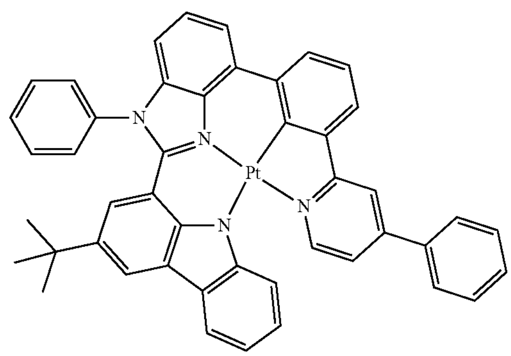
94
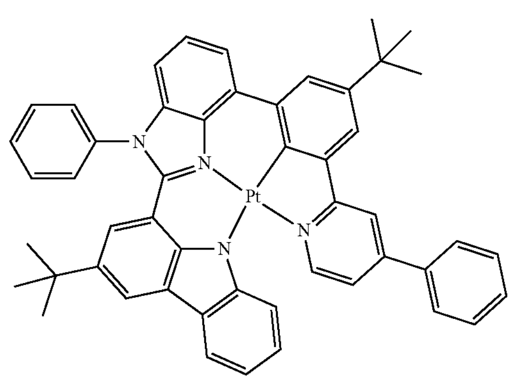

95
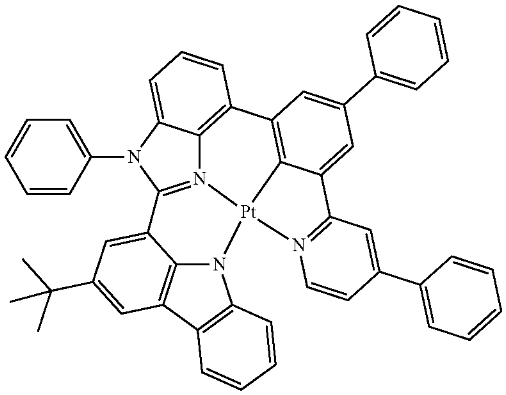
96
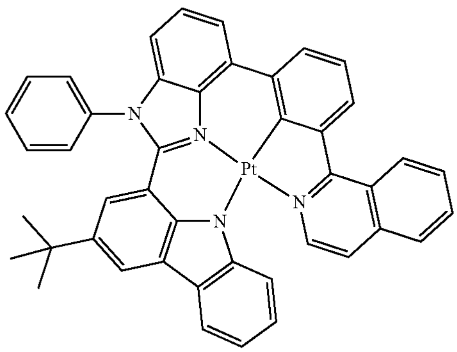
97
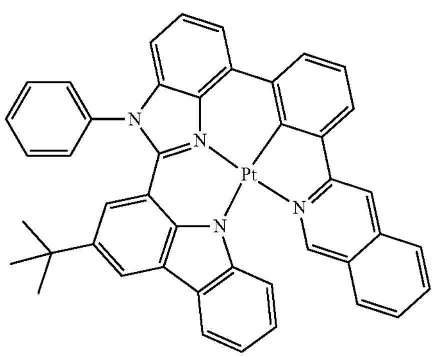
98
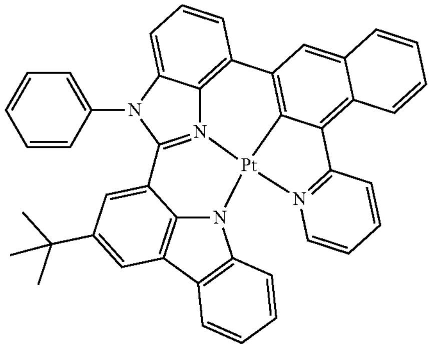
99
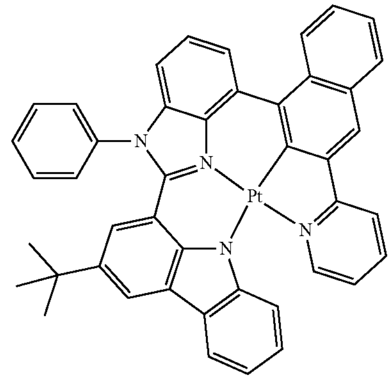
100
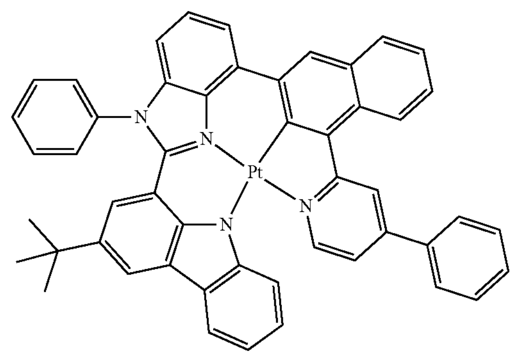
101
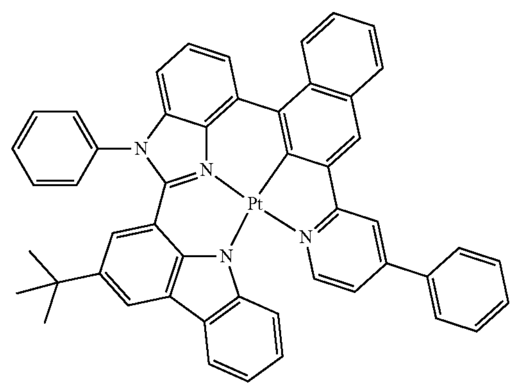
102
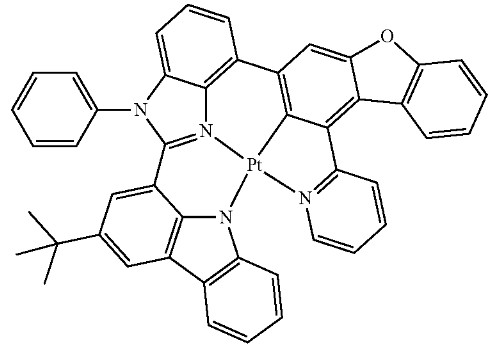

-continued
103
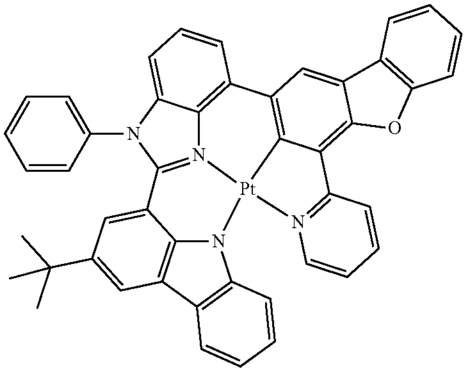
104
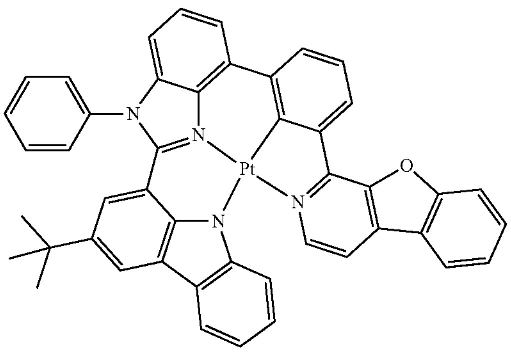
105
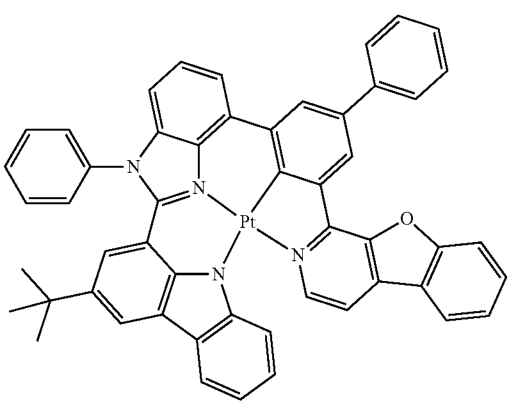
106
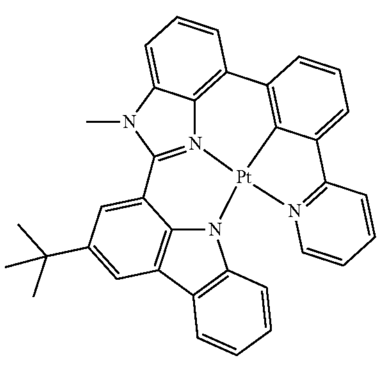
-continued
107
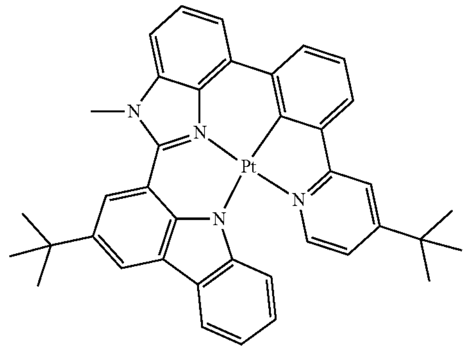
108
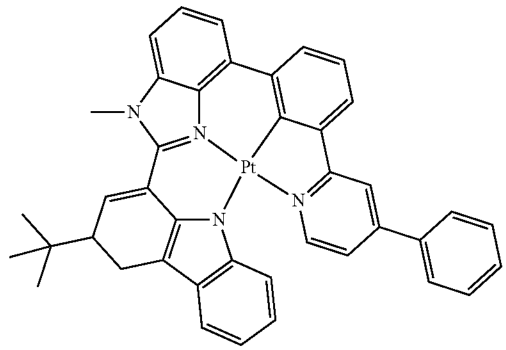
109
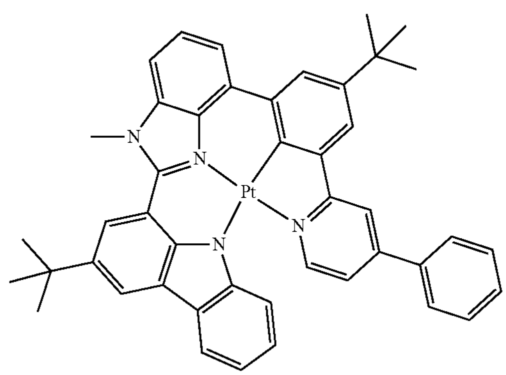
110
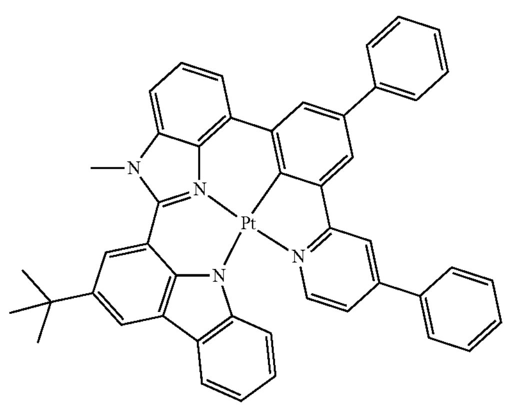

-continued
111
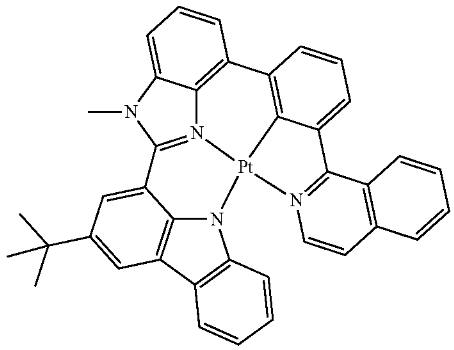
112
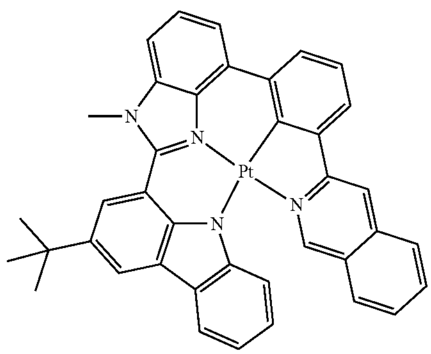
113
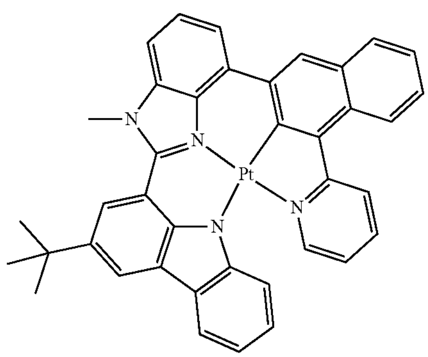
114
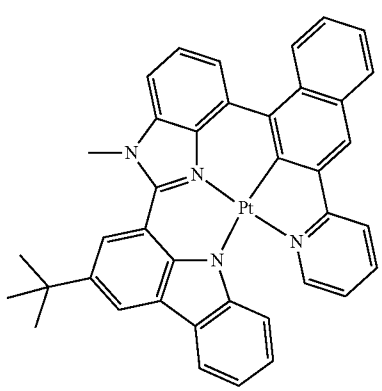
-continued
115
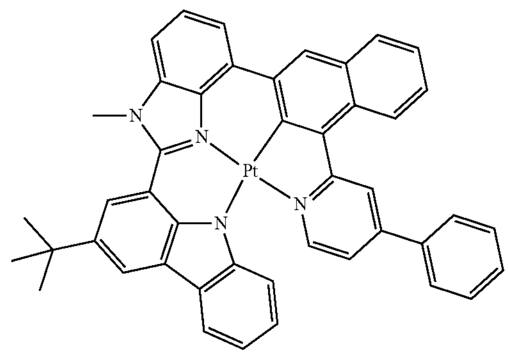
116
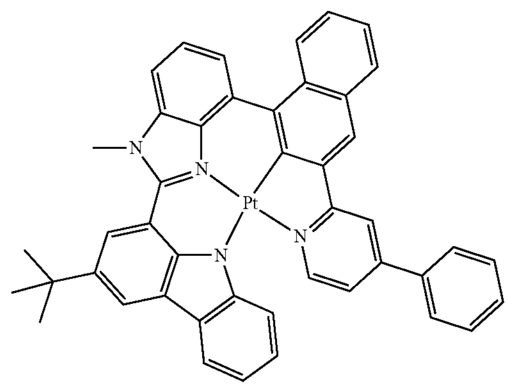
117
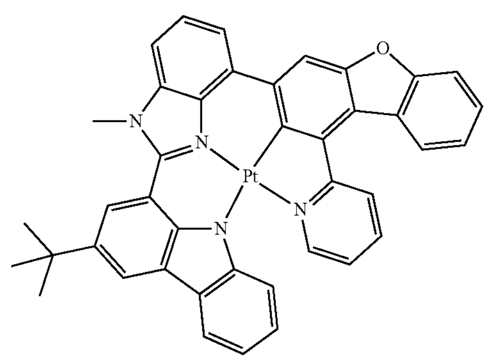
118
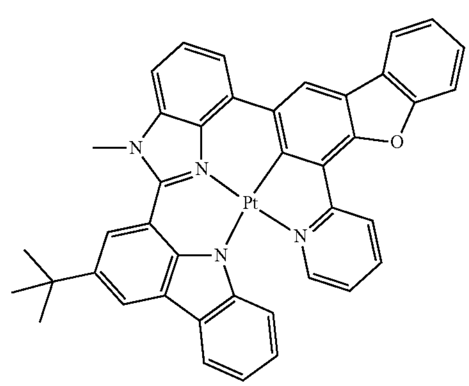

-continued
119
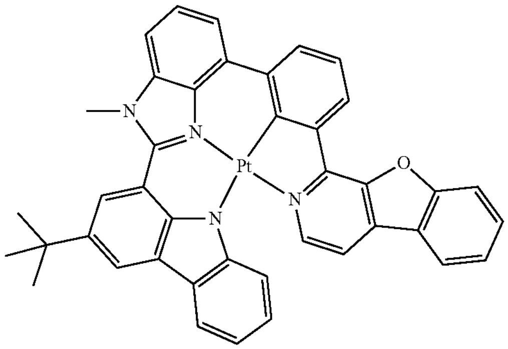
120
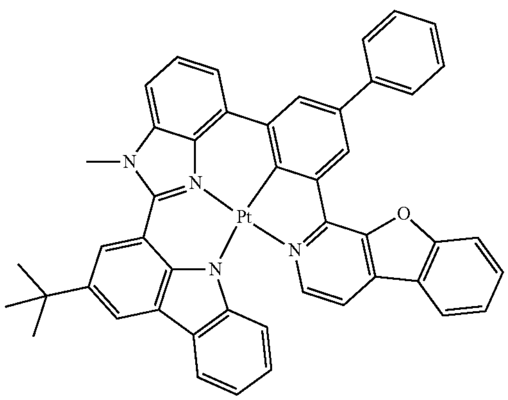
121
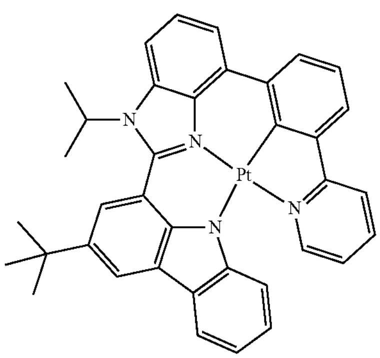
122
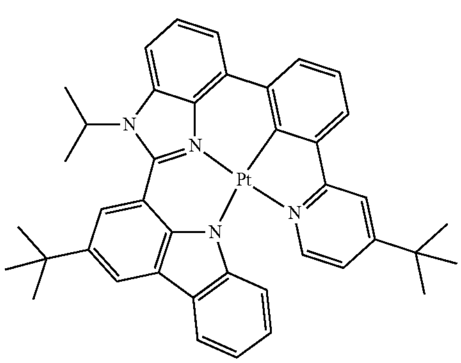
-continued
123
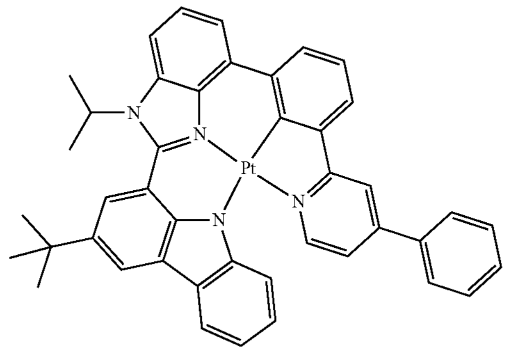
124
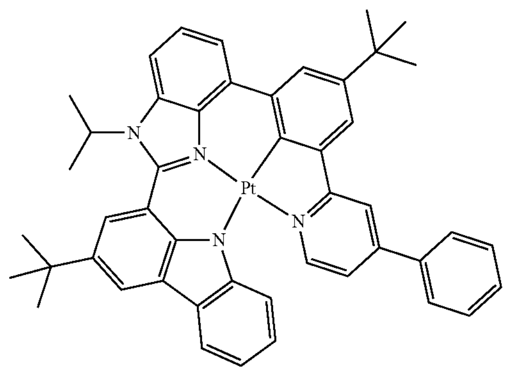
125
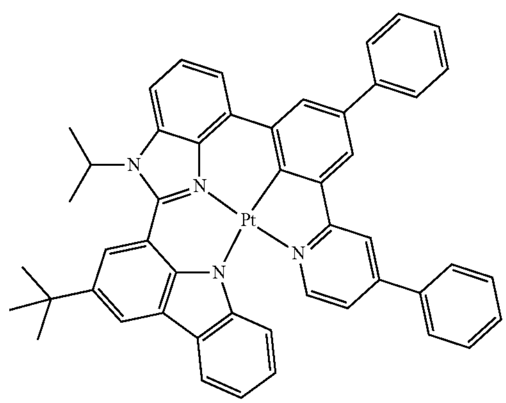
126
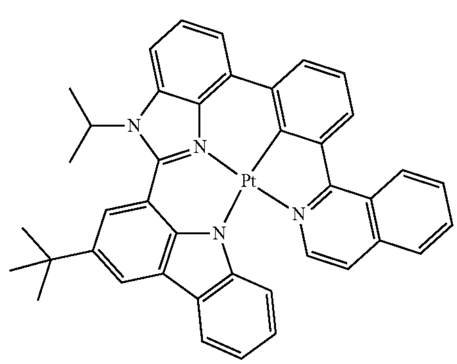

-continued
127
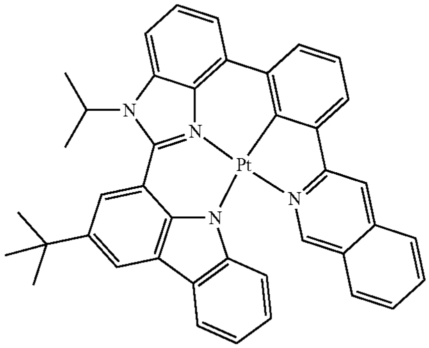
128
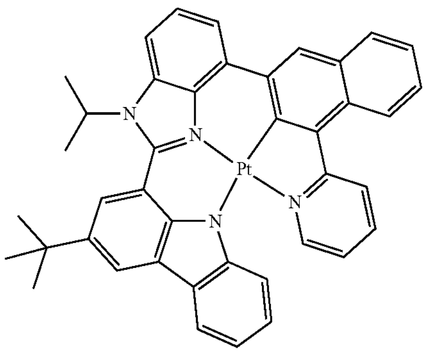
129
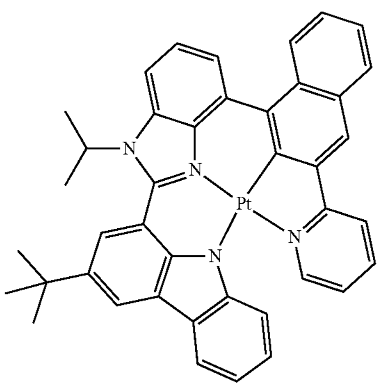
130
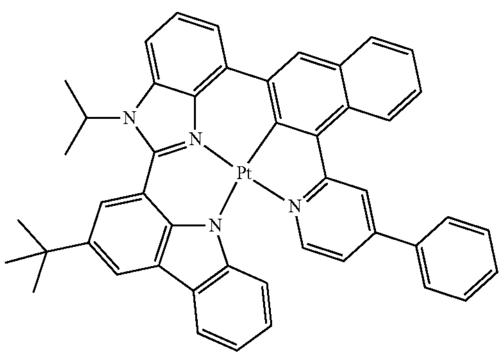
-continued
131
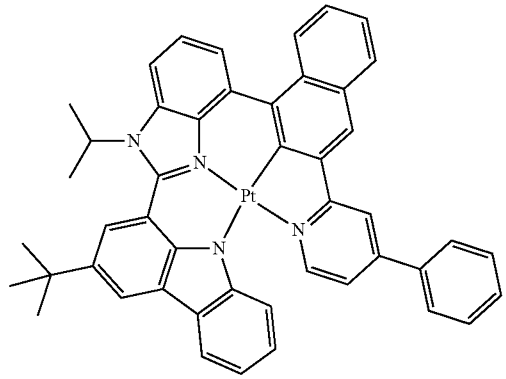
132
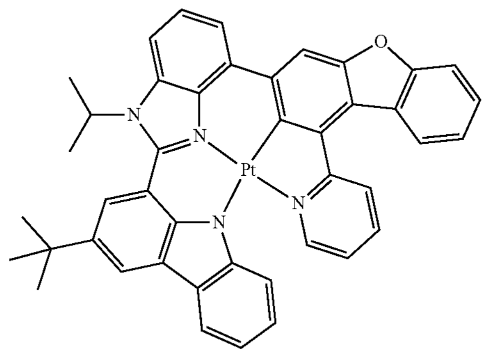
133
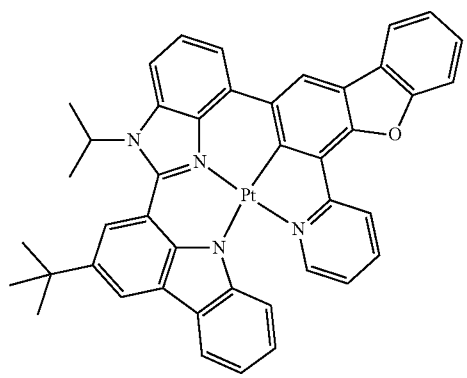
134
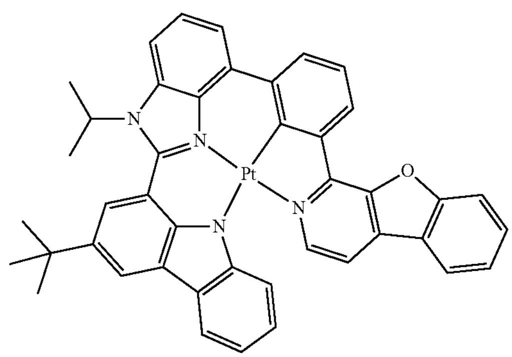

-continued
135
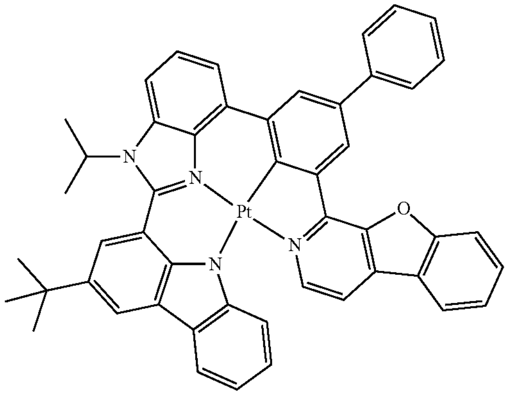
136
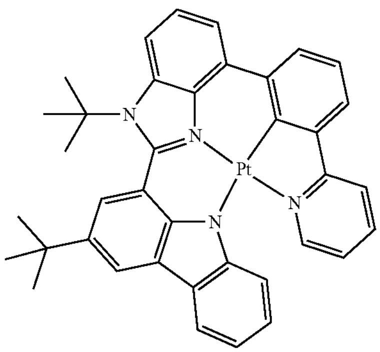
137
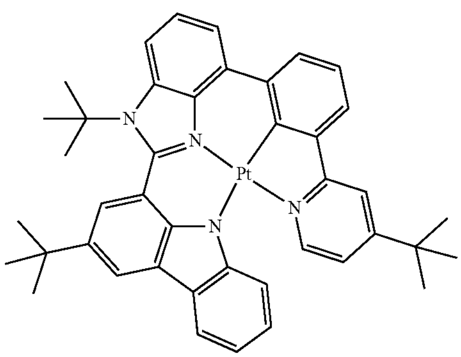
138
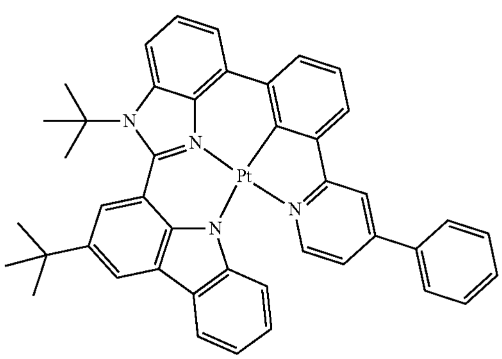
-continued
139
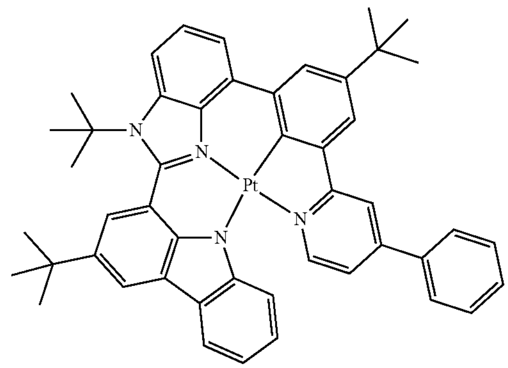
140
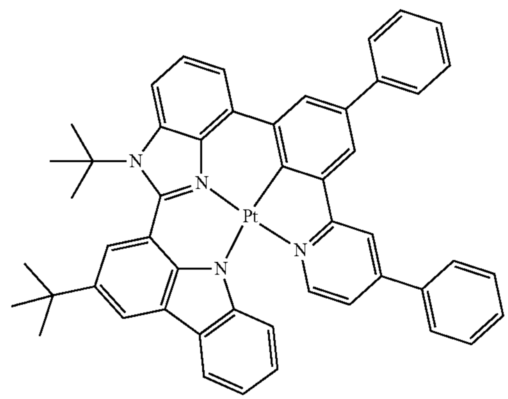
141
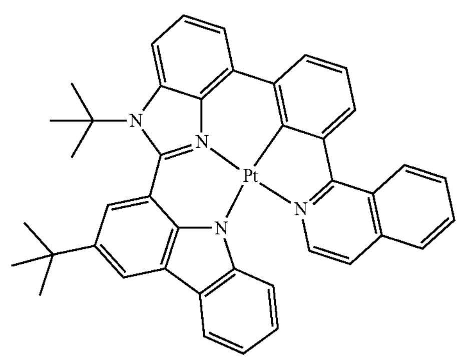
142
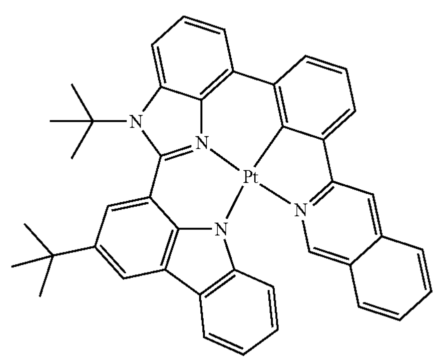

-continued
143
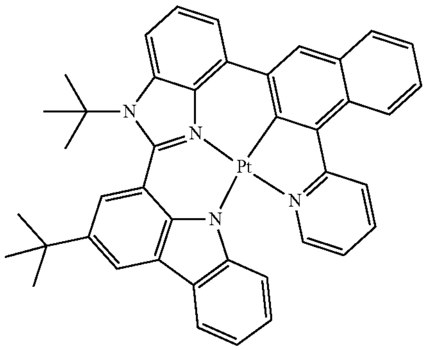
144
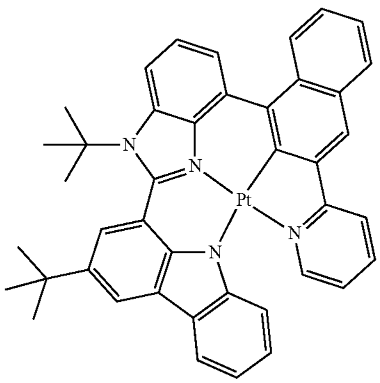
145
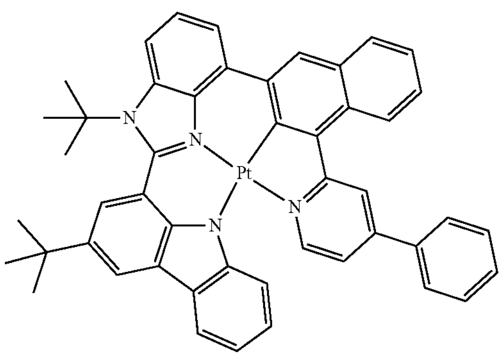
146
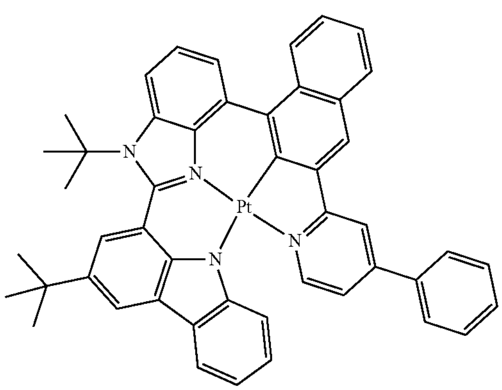
-continued
147
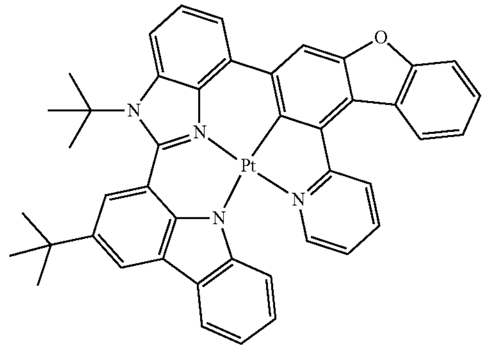
148
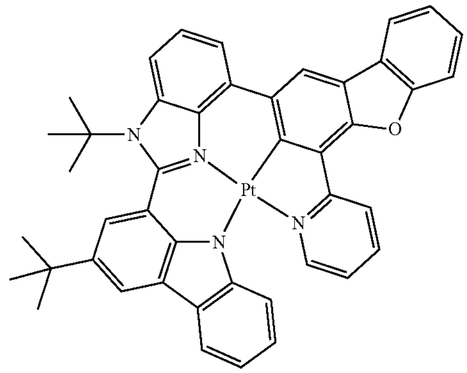
149
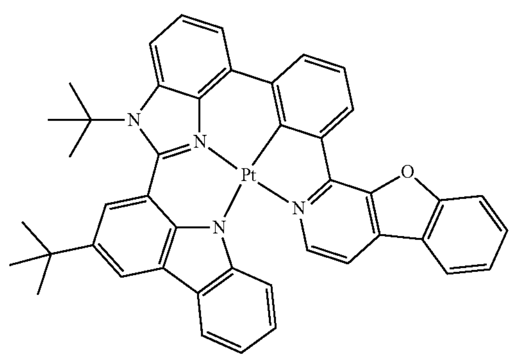
150
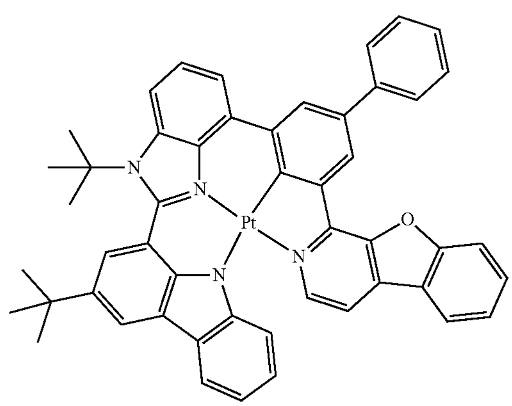

-continued
151
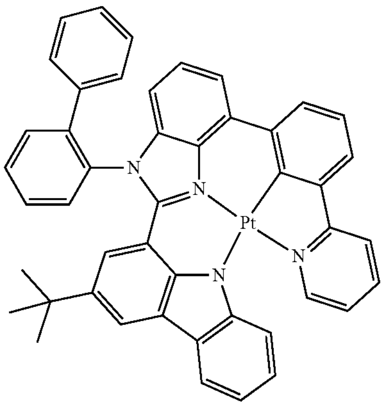
152
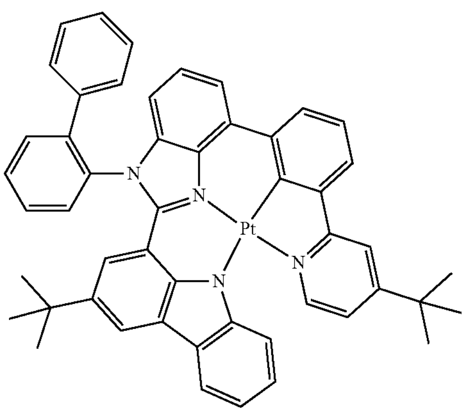
153
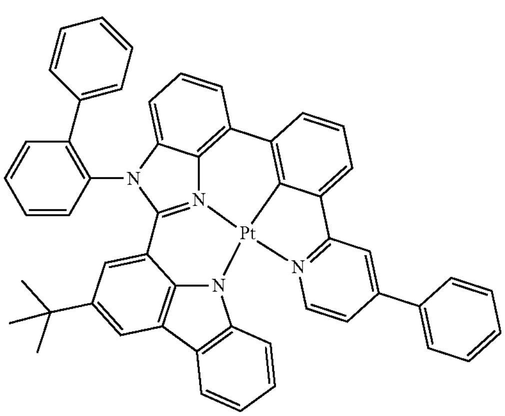
-continued
154
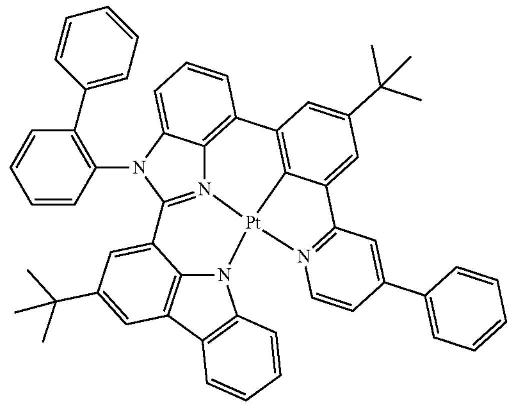
155
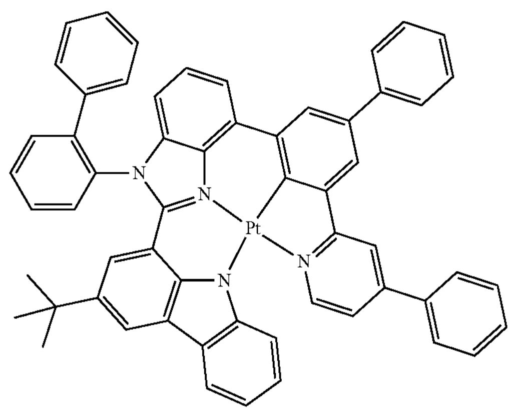
156
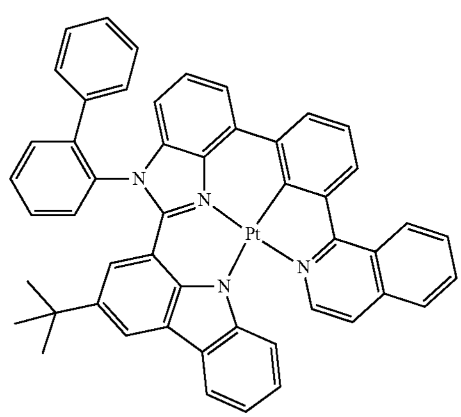

-continued
157
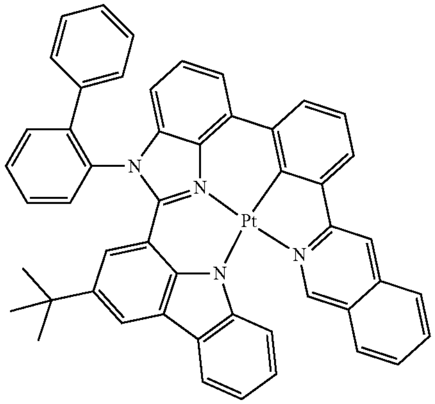
158
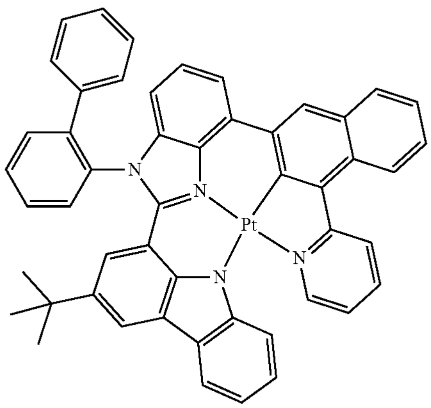
159
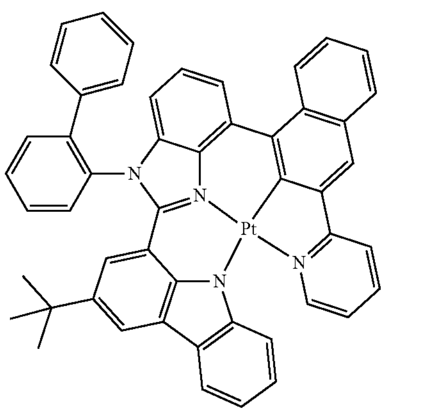
160
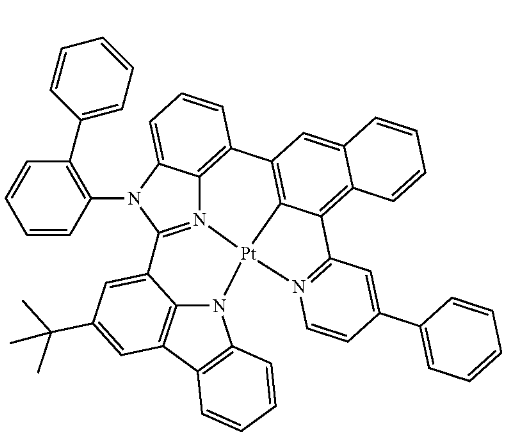
-continued
161
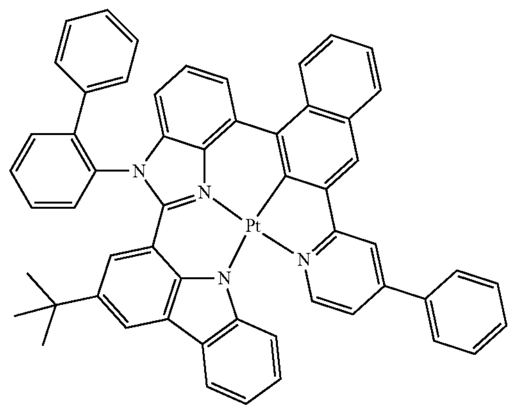
162
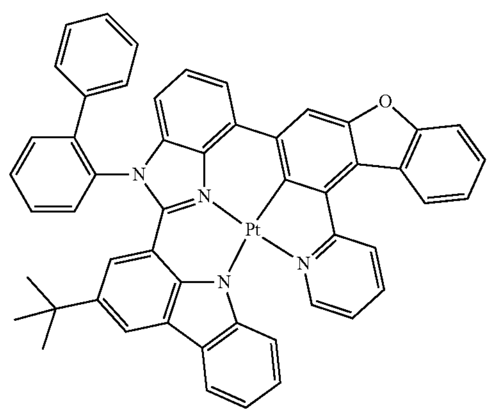
163
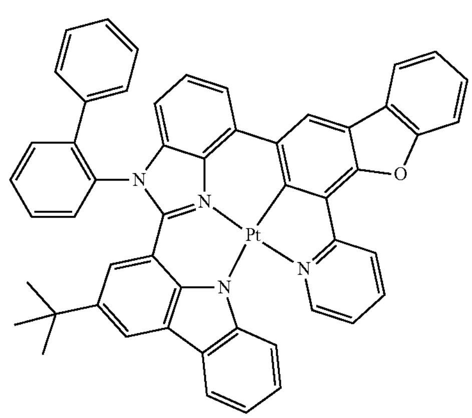

-continued
164
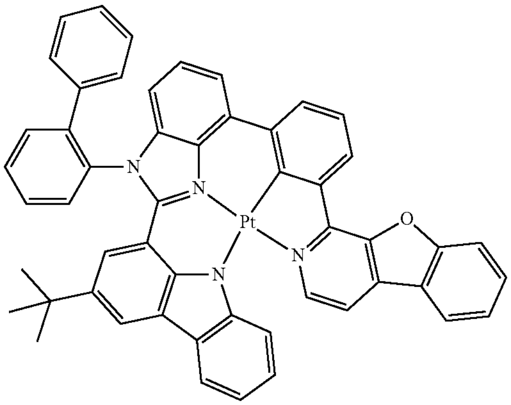
165
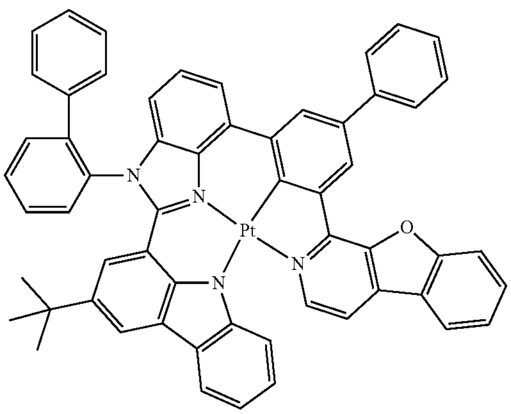
166
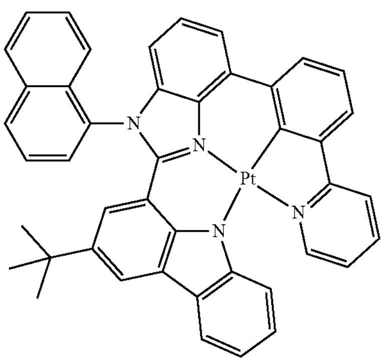
167
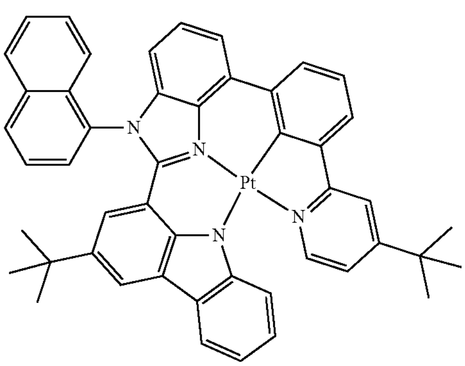
-continued
168
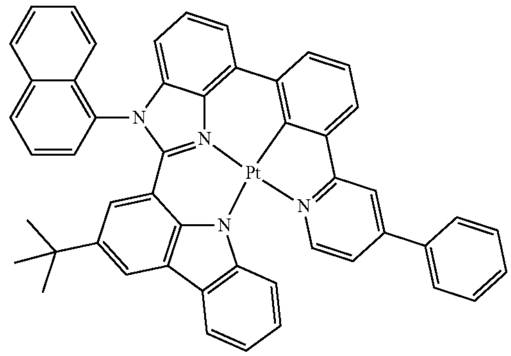
169
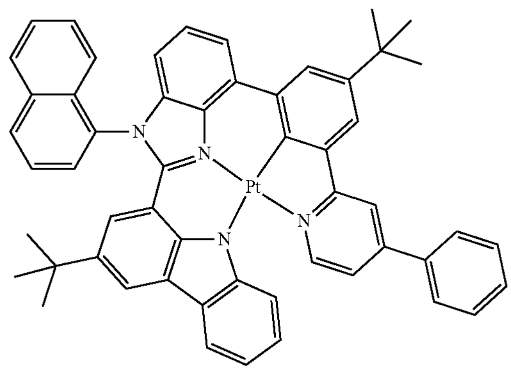
170
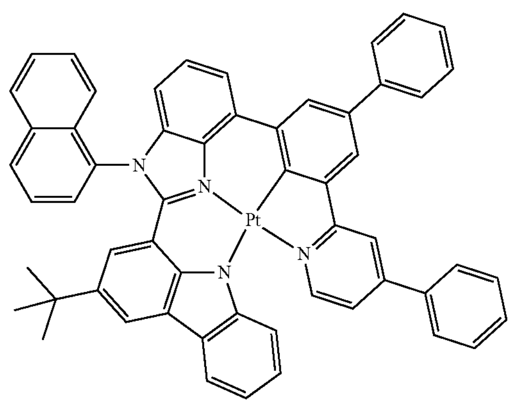
171
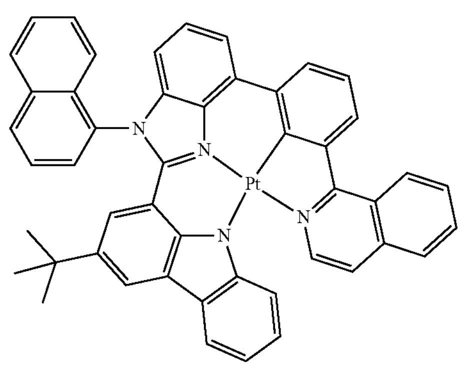

-continued
172
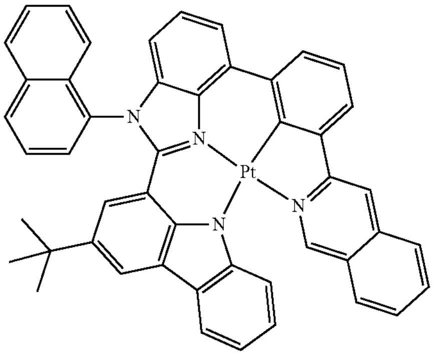
173
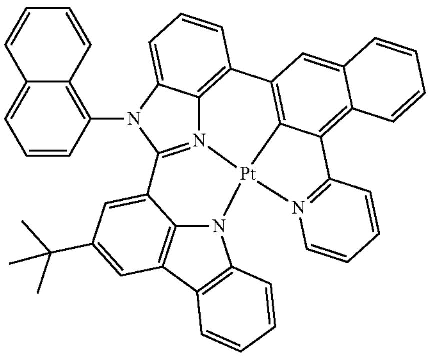
174
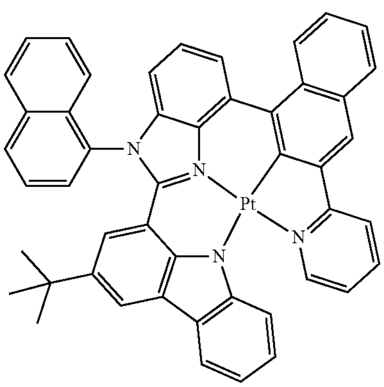
175
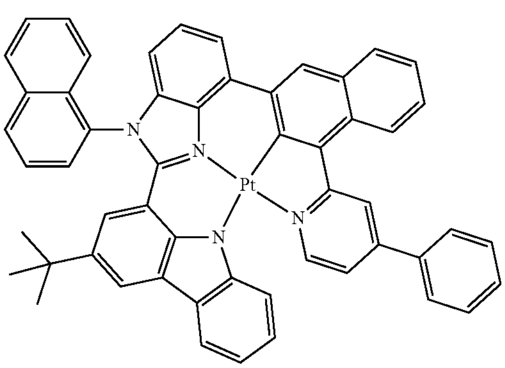
-continued
176
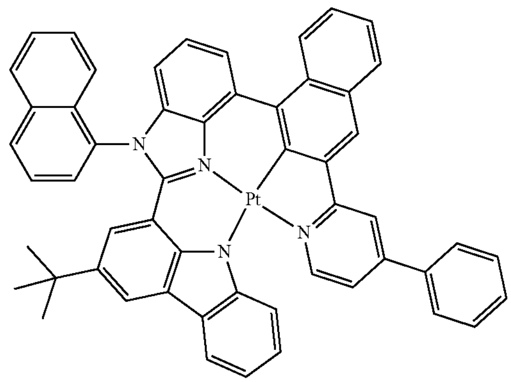
177
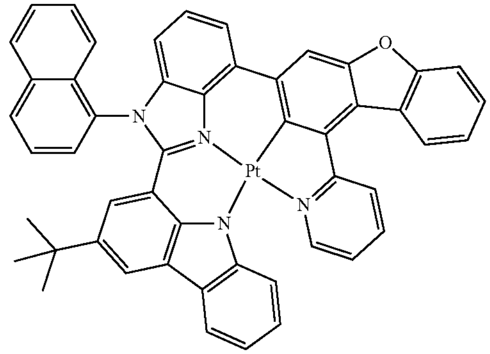
178
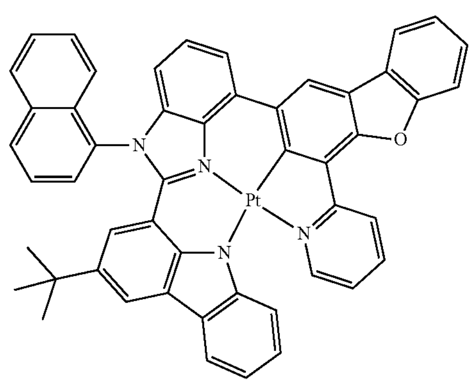
179
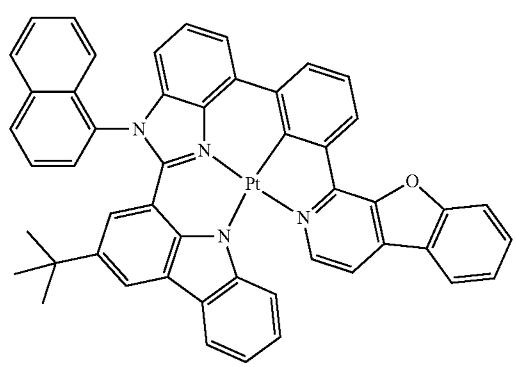

-continued
180
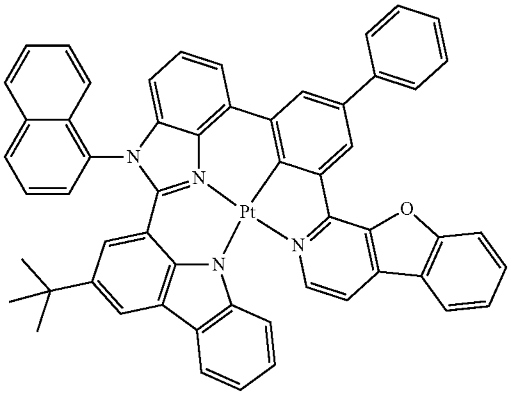
181
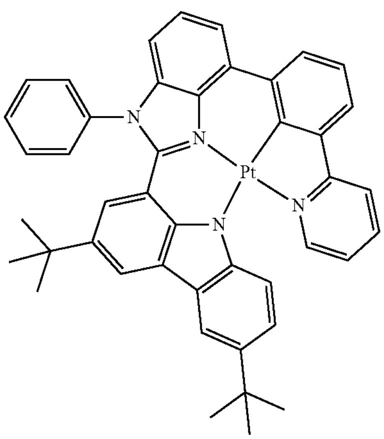
182
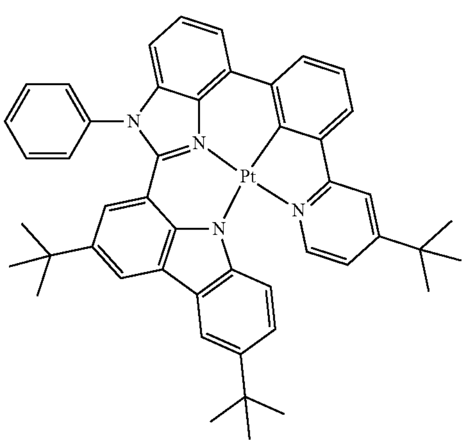
-continued
183
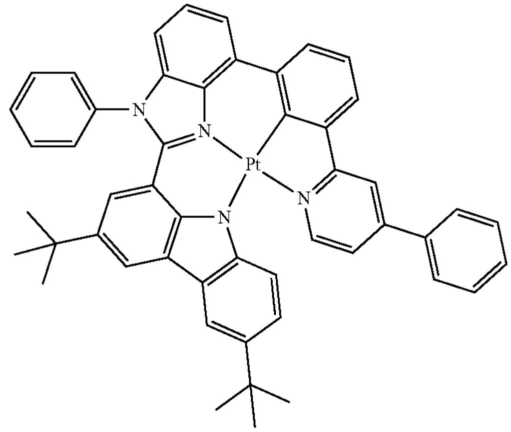
184
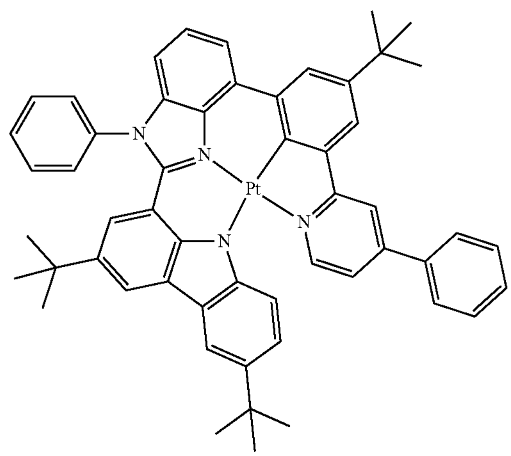
185
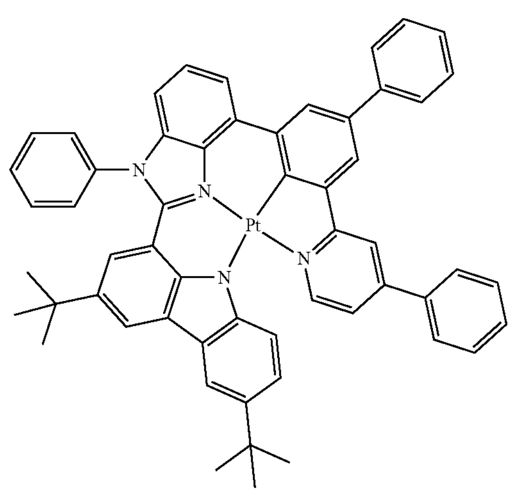

-continued
186
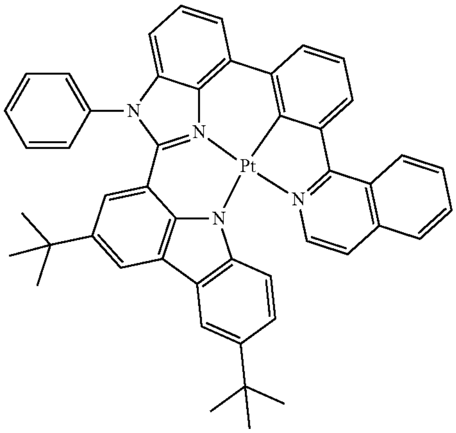
187
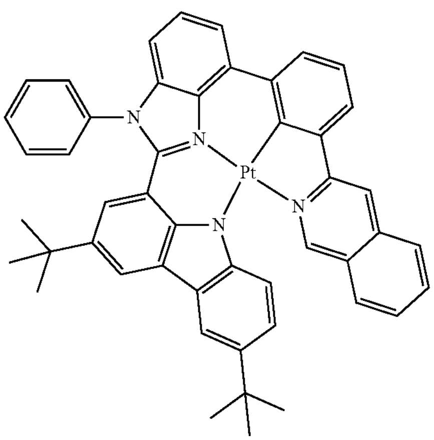
188
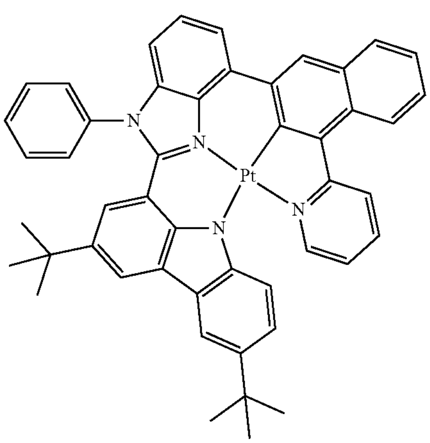
-continued
189
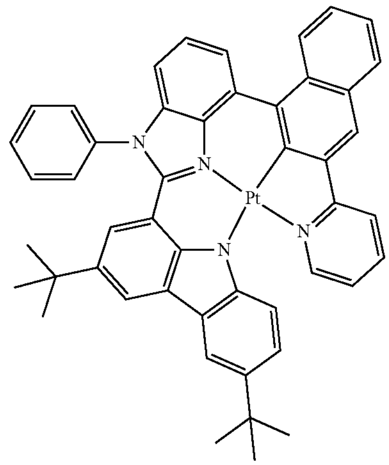
190
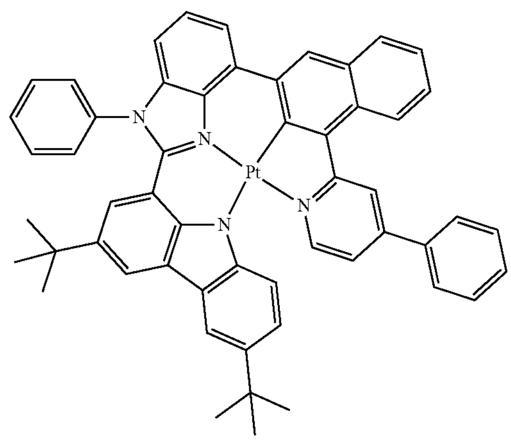
191
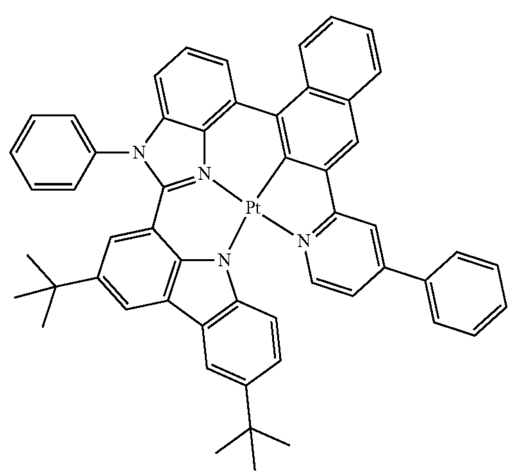

-continued
192
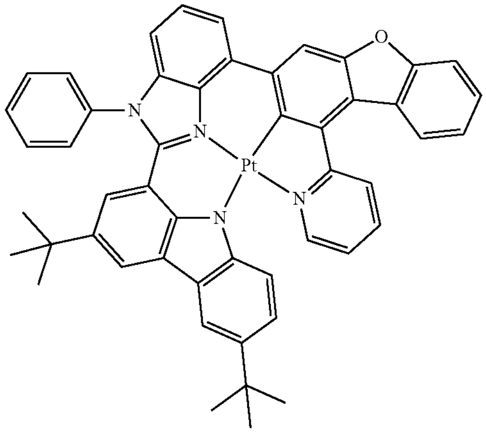
193
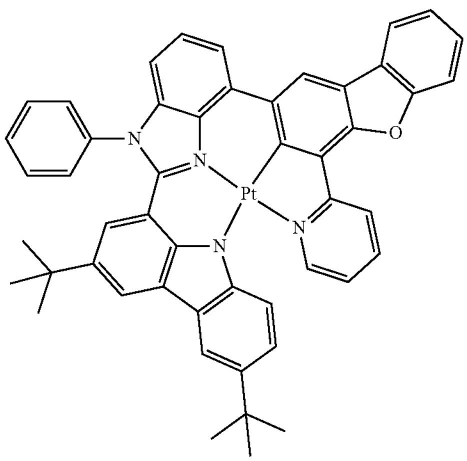
194
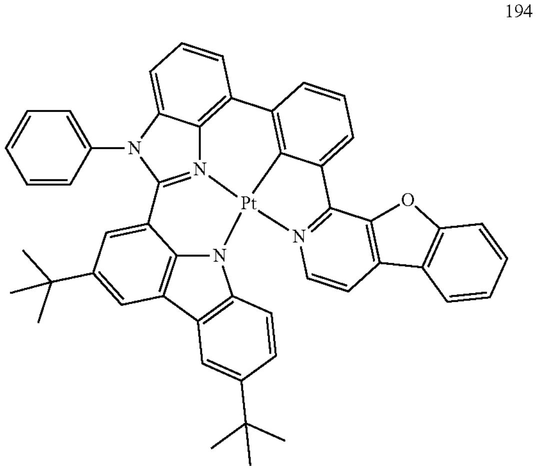
-continued
195
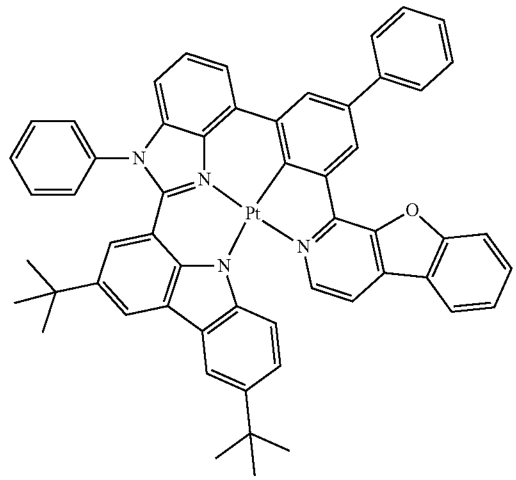
196
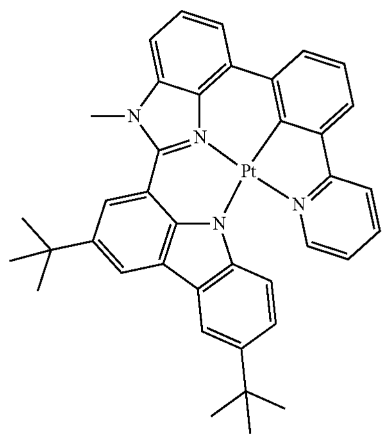
197
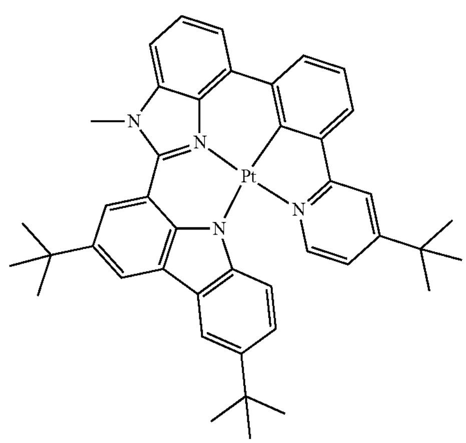

198
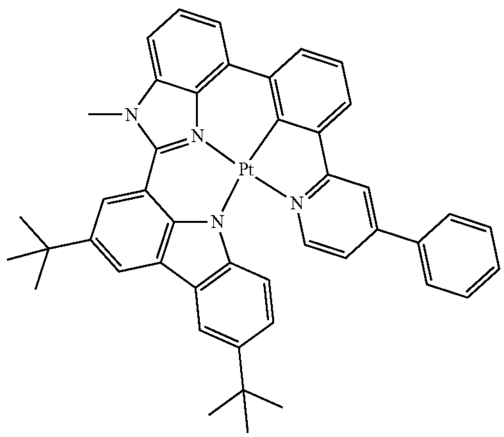
199
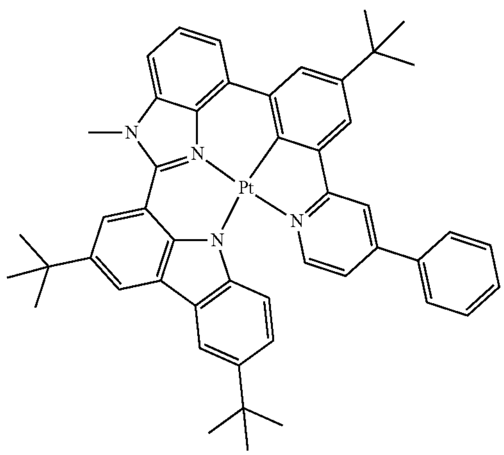
200
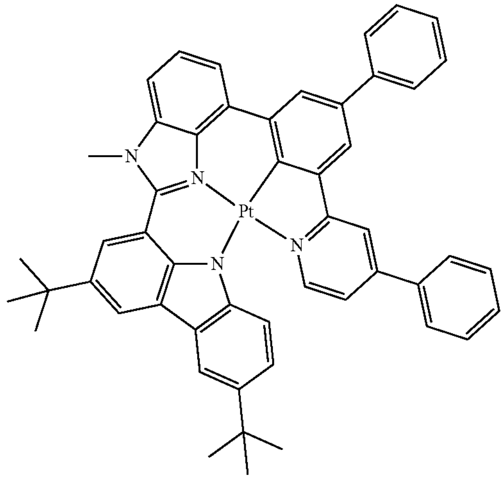
201
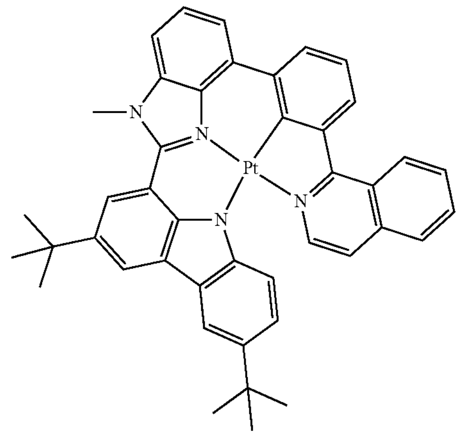
202
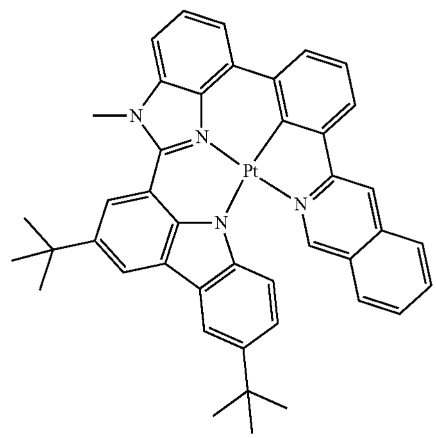
203
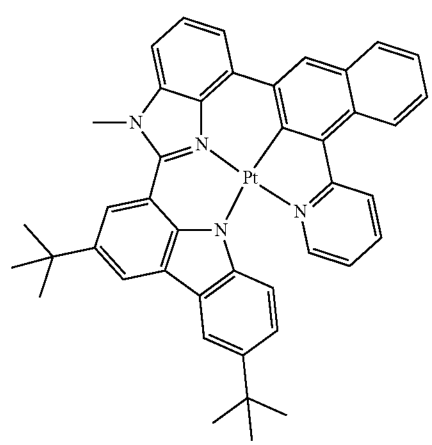

-continued
-continued
204
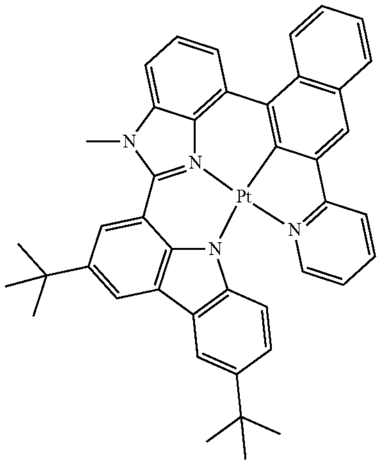
207
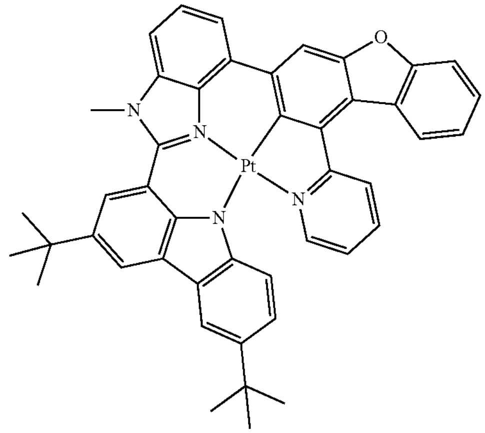
205
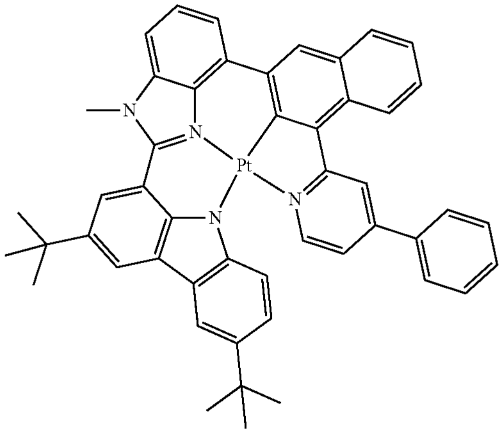
208
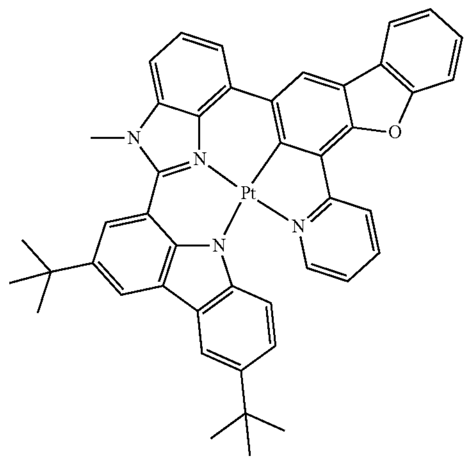
206
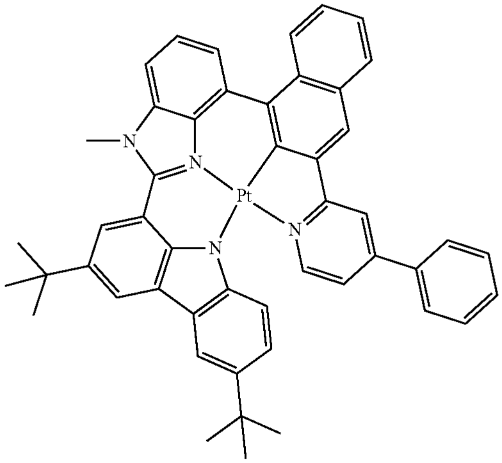
209
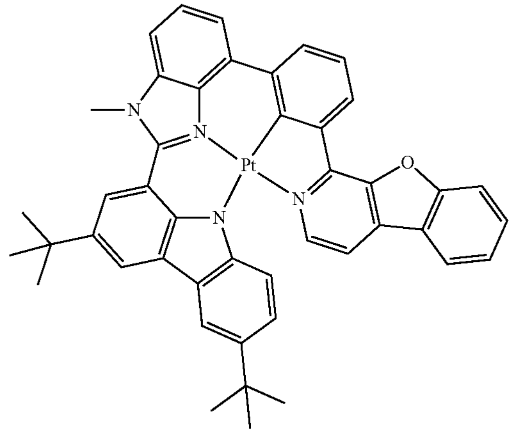

-continued
210
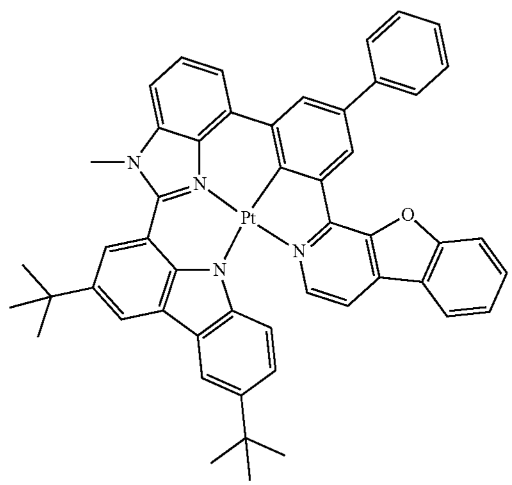
211
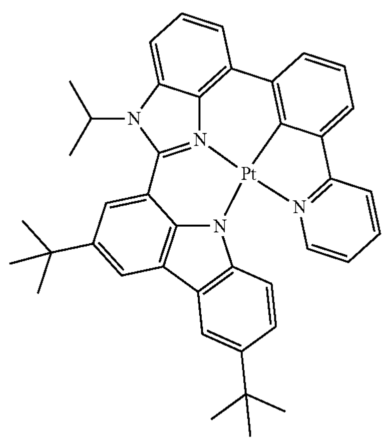
212
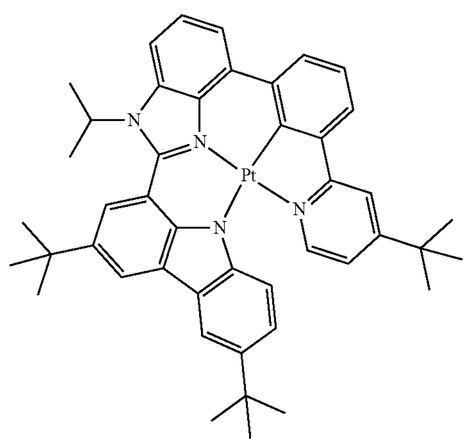
-continued
213
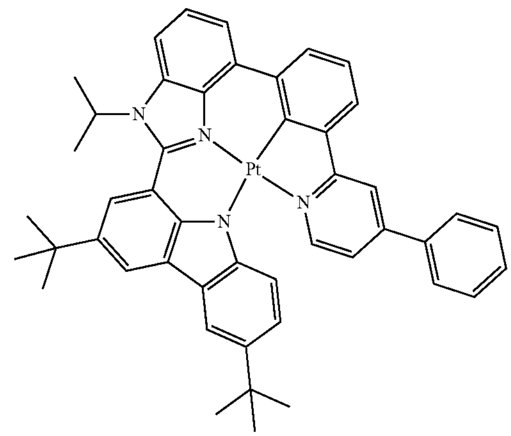
214
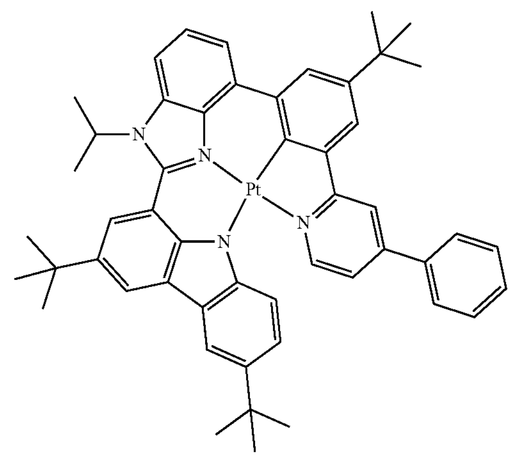
215
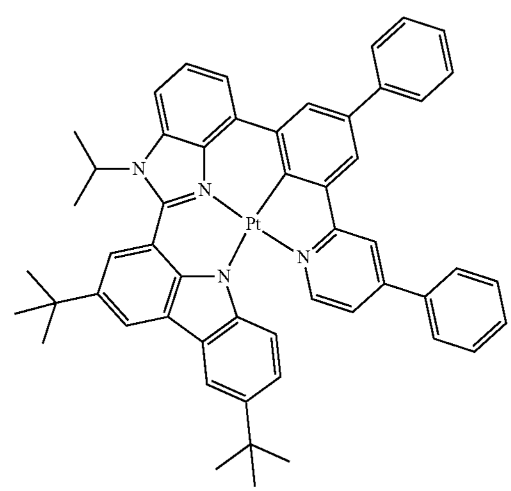

370
-continued
216
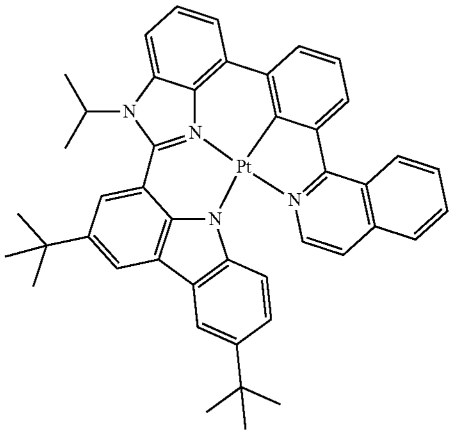
217
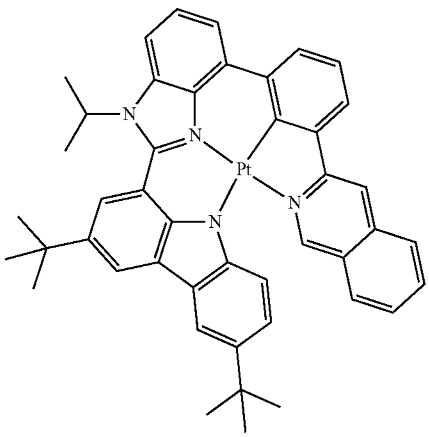
218
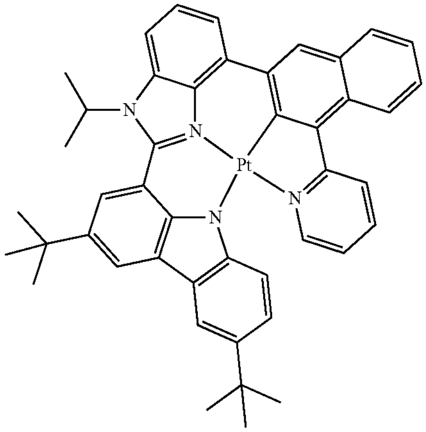
219
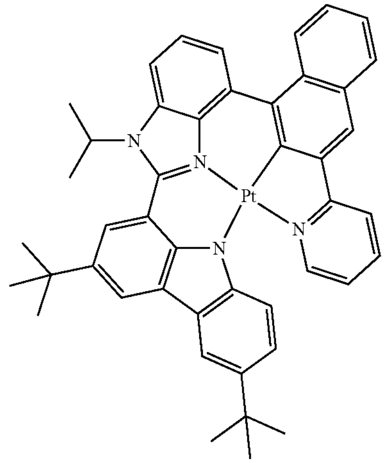
220
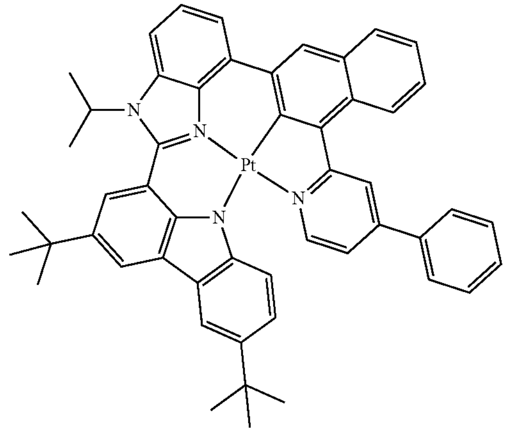
221
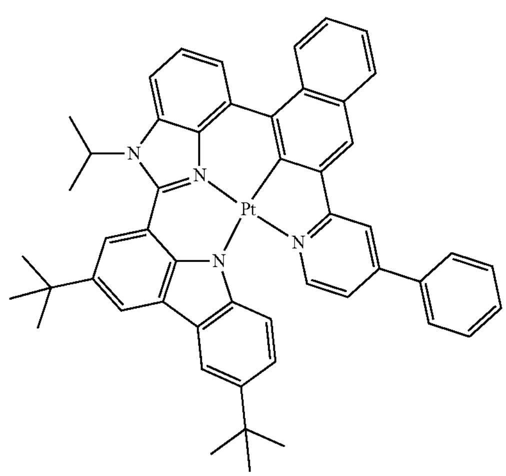

-continued
222
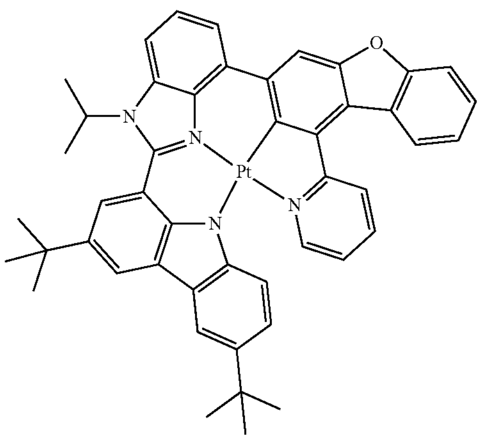
223
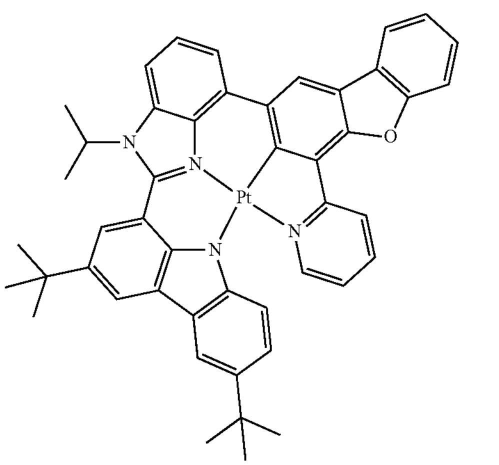
224
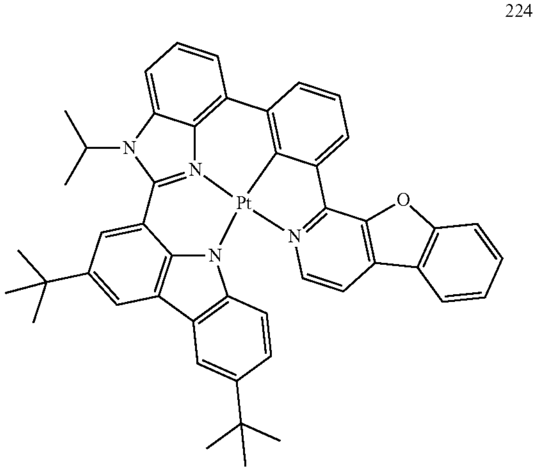
-continued
225
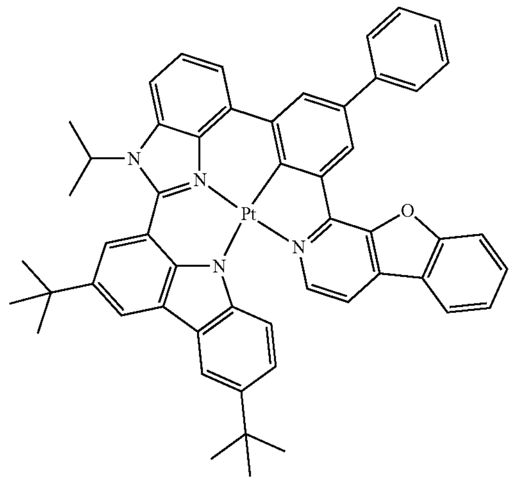
226
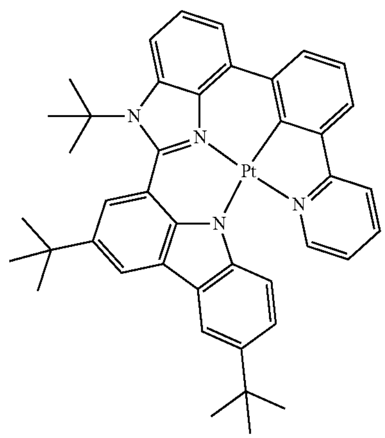
227
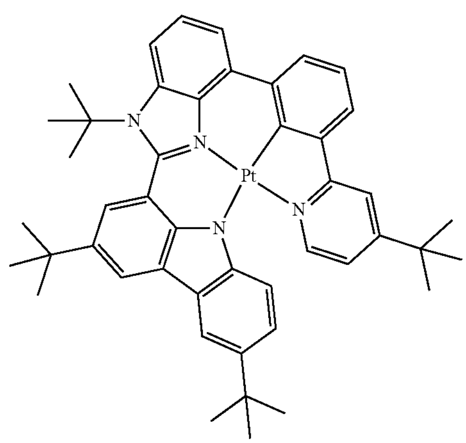

-continued
228
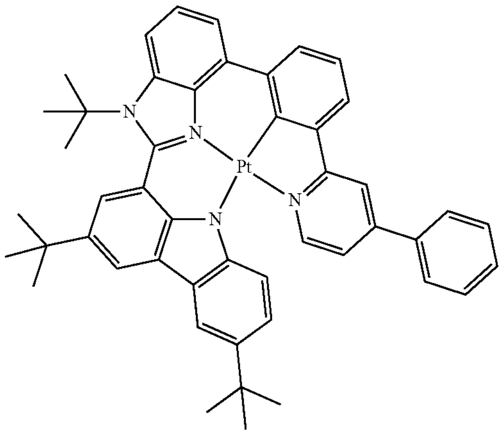
229
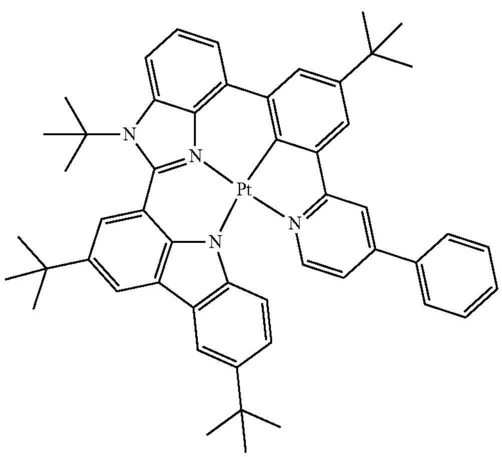
230
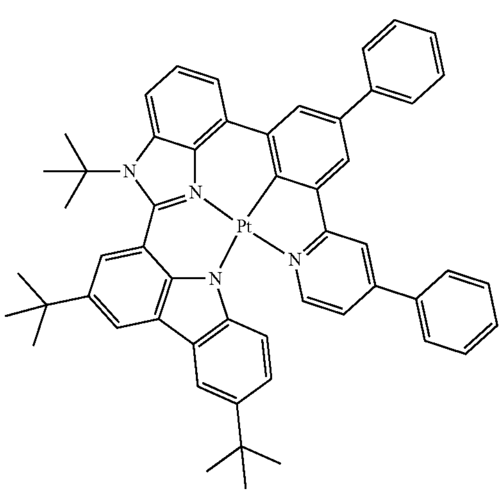
-continued
231
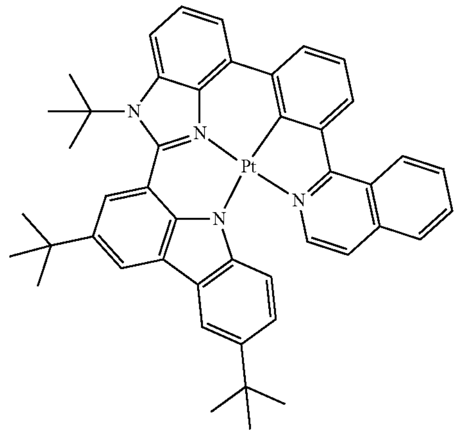
232
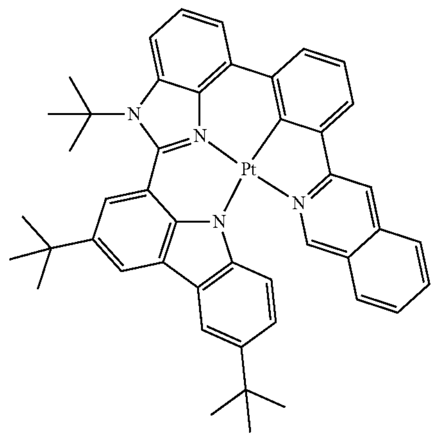
233
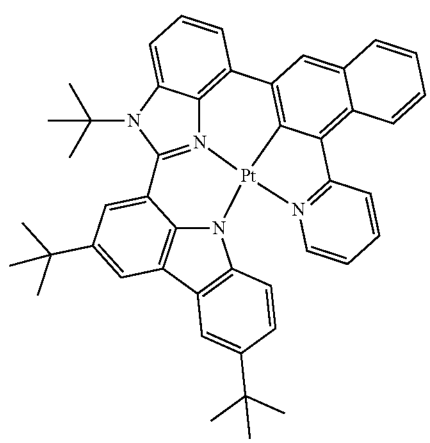

234
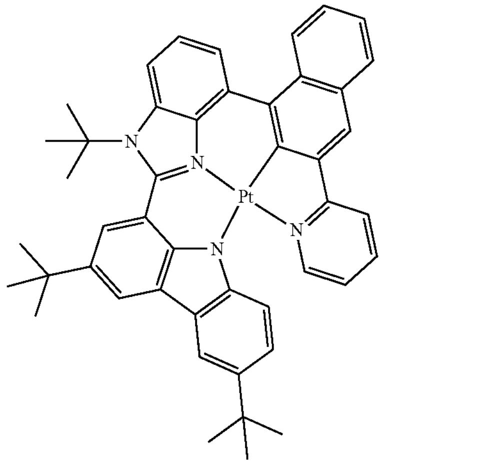
235
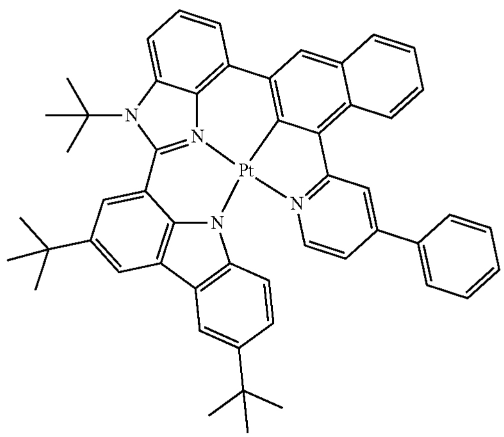
236
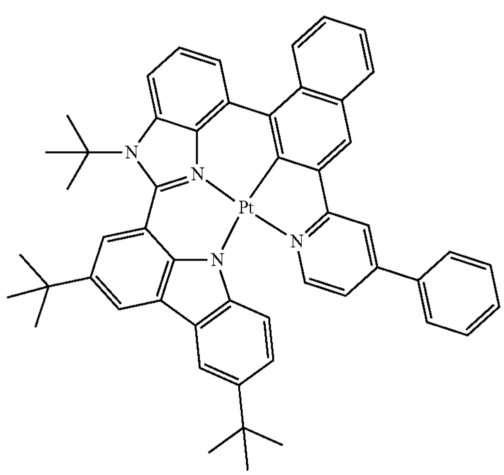
237
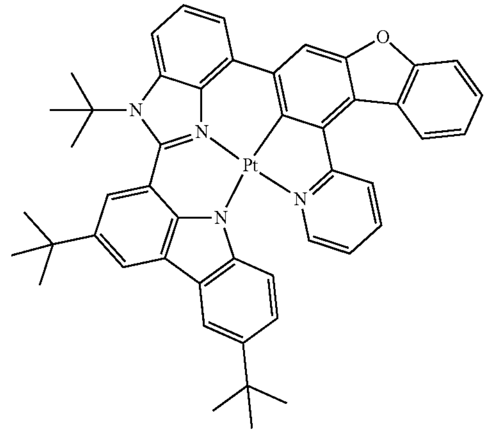
238
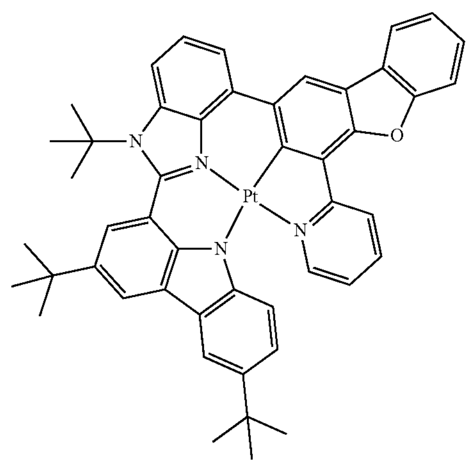
239
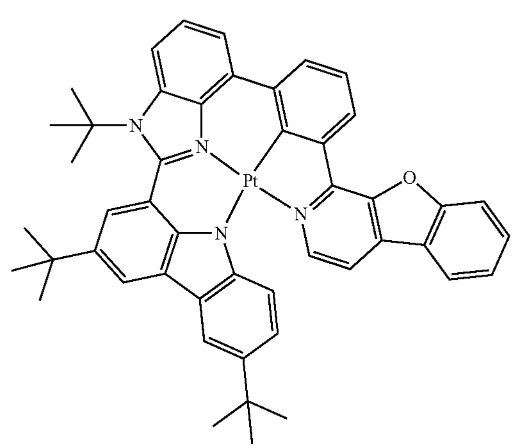

-continued
240
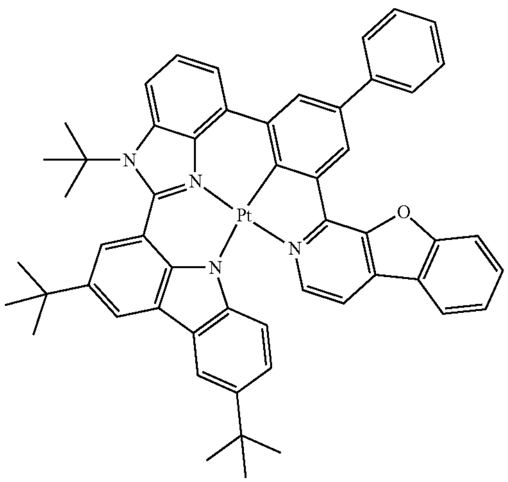
241
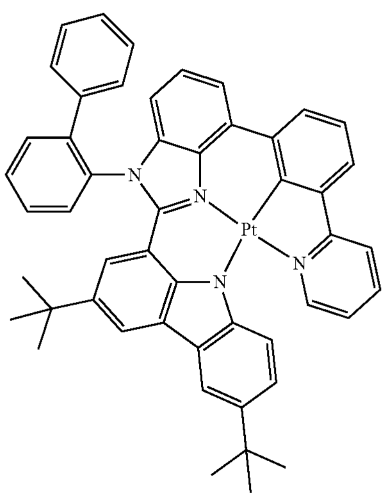
242
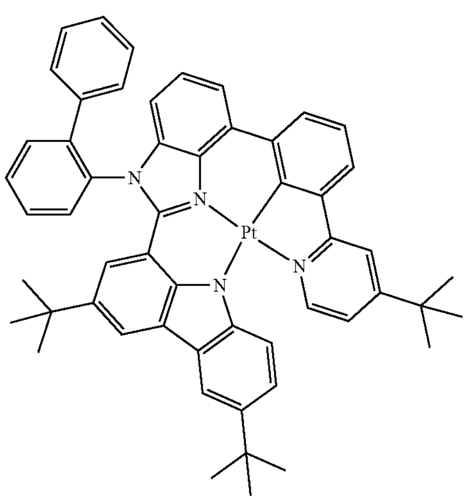
-continued
243
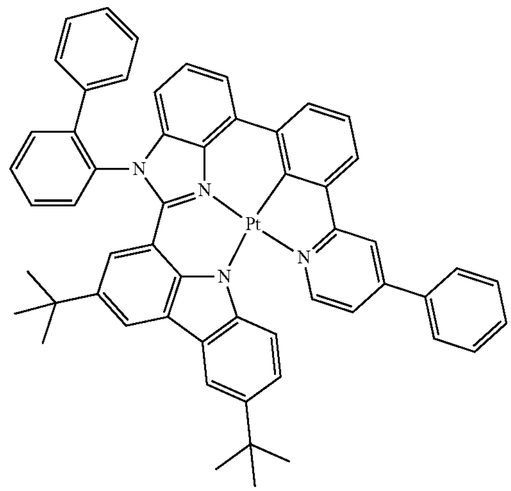
244
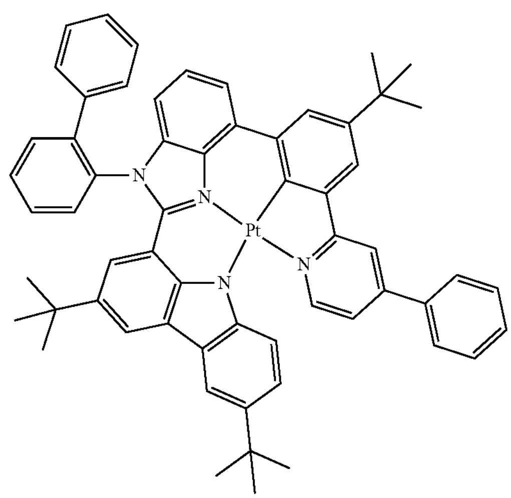
245
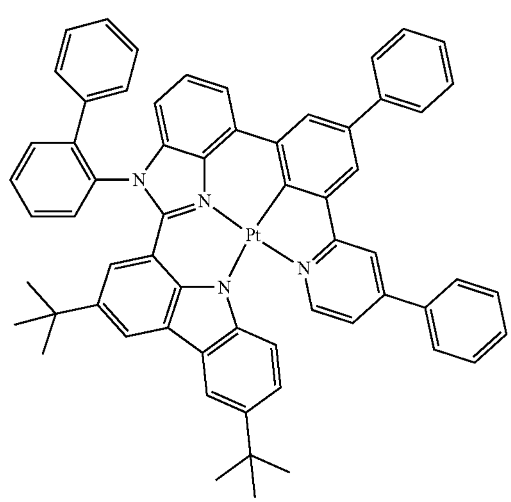

246
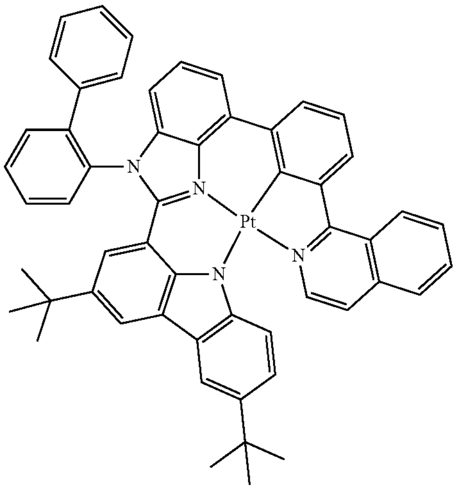
247
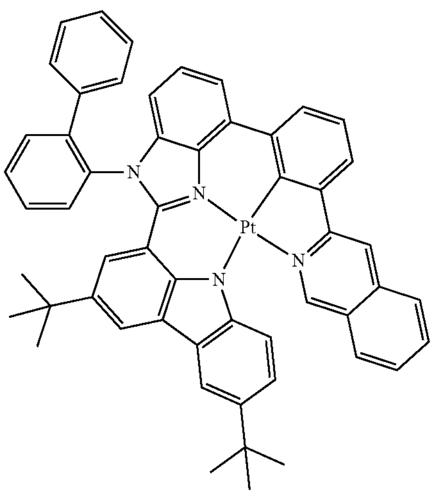
248
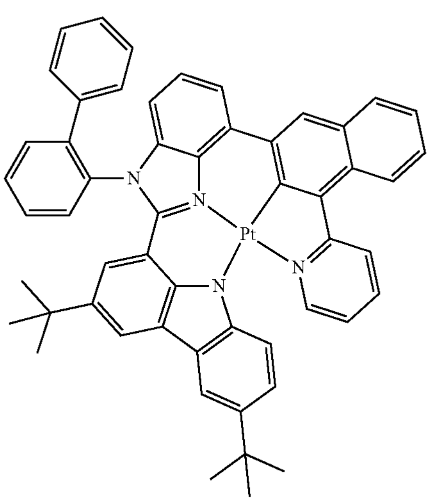
249
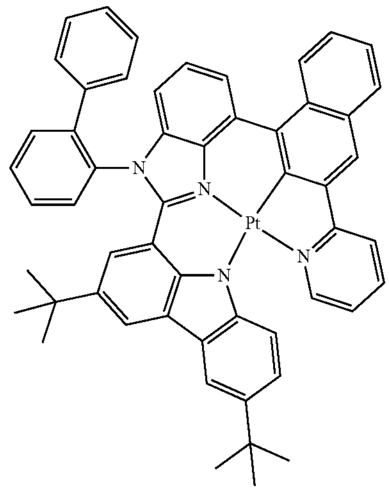
250
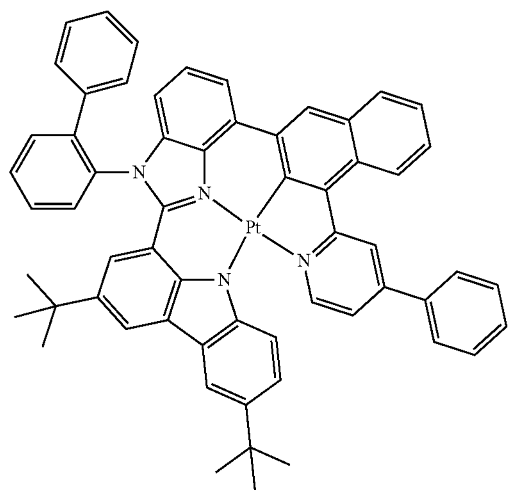
251
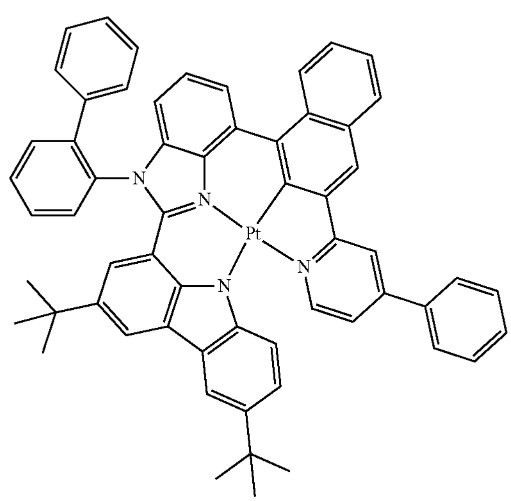

252
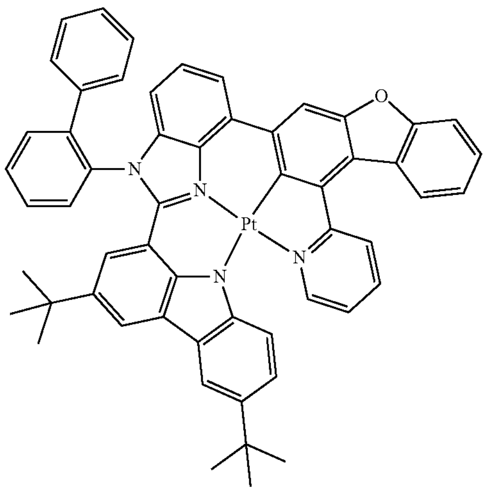
253
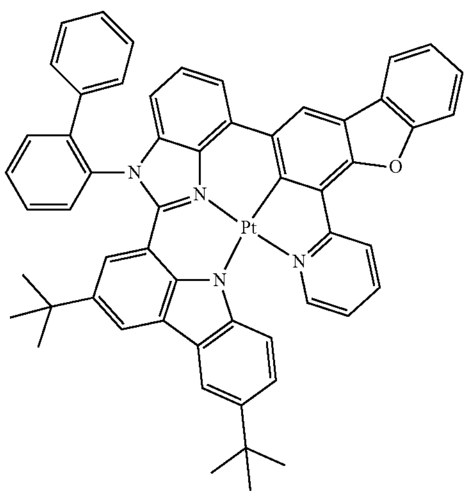
254
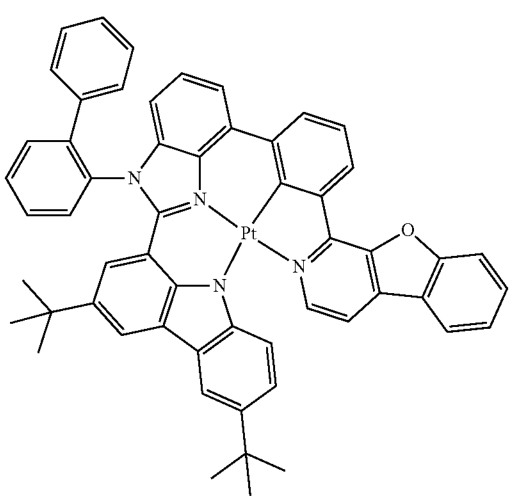
255
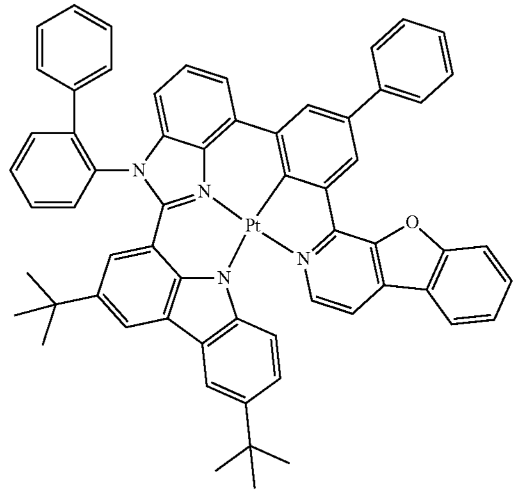
256
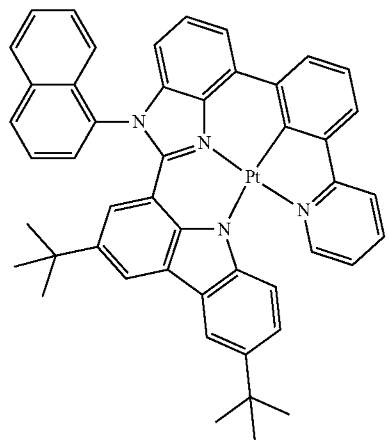
257
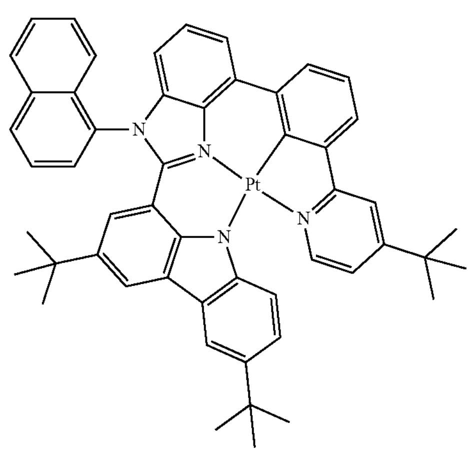

-continued
258
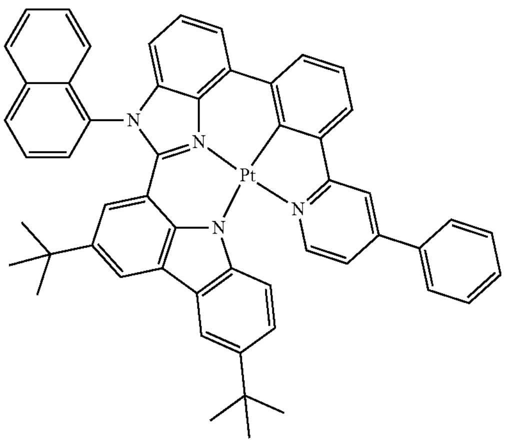
259
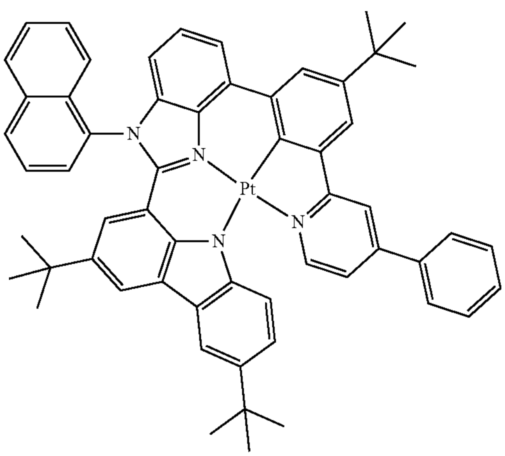
260
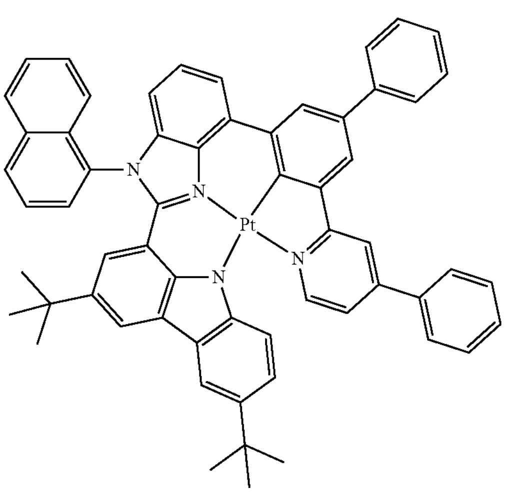
-continued
261
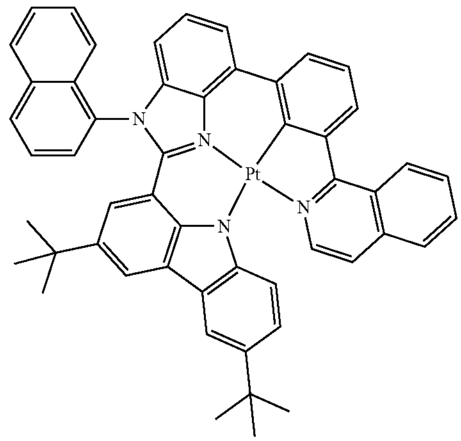
262
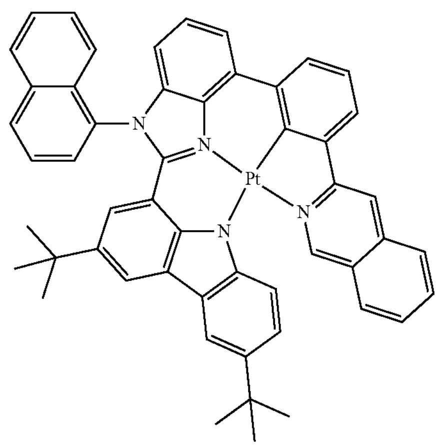
263
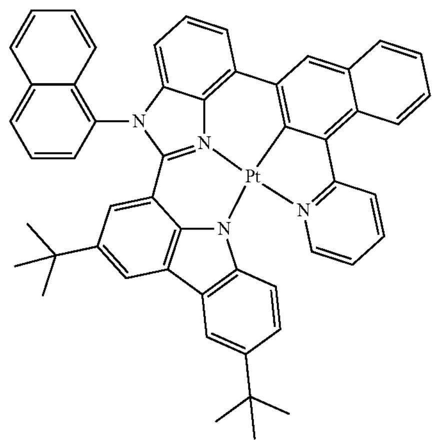

-continued
264
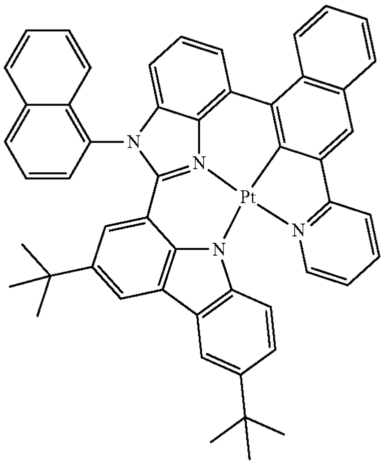
265
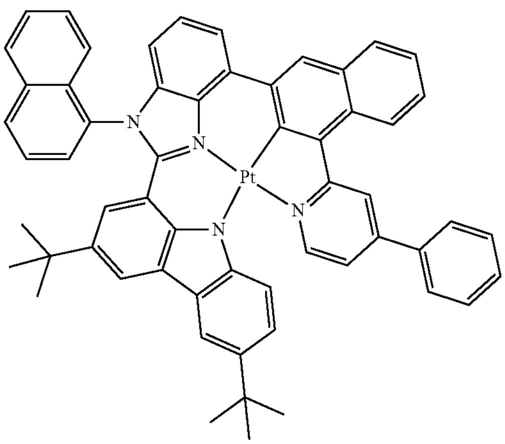
266
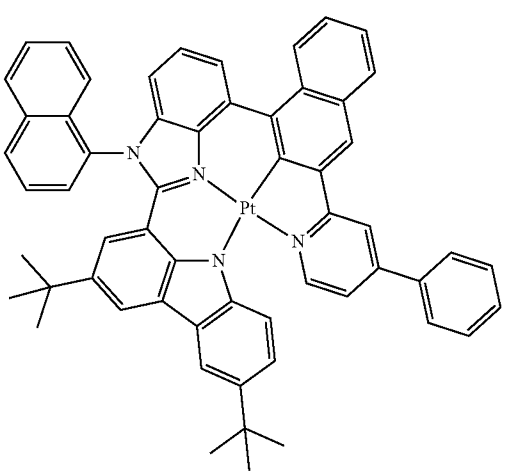
-continued
267
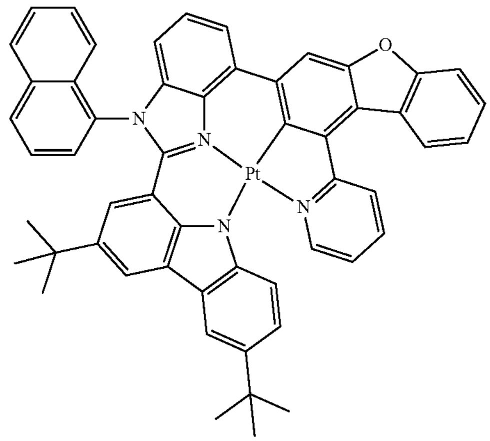
268
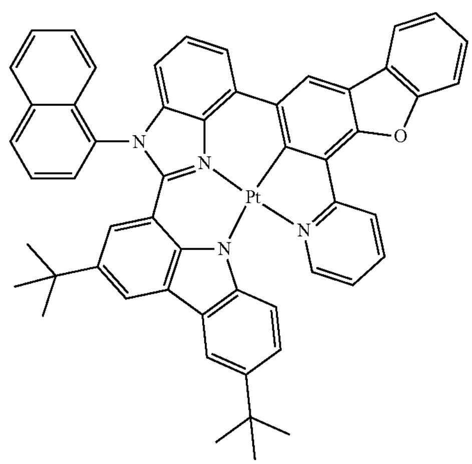
269
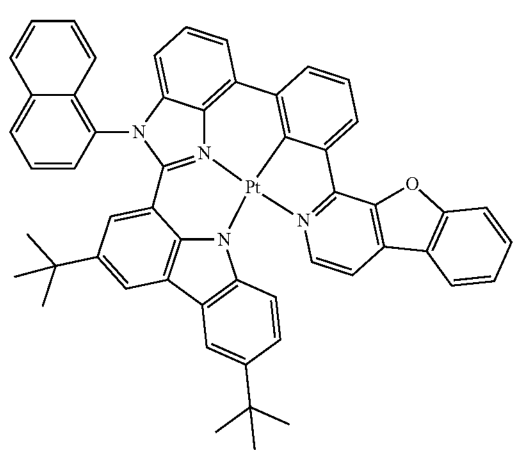

-continued

270

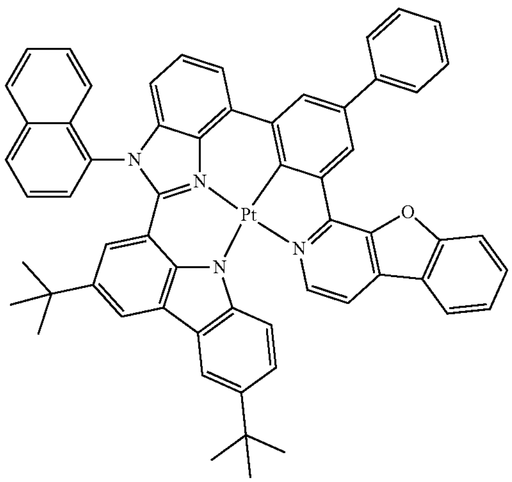

271

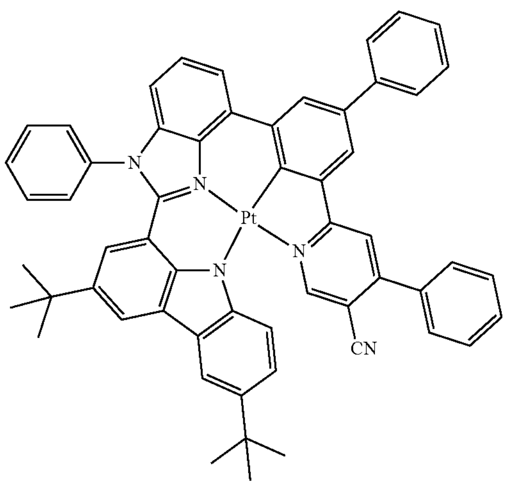

272

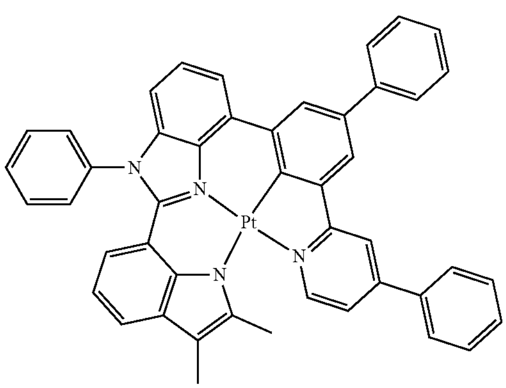

-continued

273

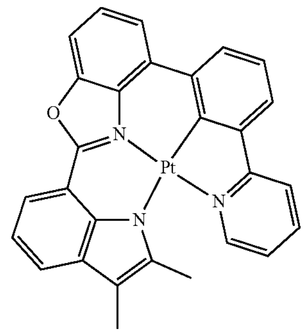

16. An organic light-emitting device comprising:

a first electrode;

a second electrode; and an organic layer disposed between the first electrode and the second electrode, wherein the organic layer comprises an emission layer and at least one organometallic compound of claim 1.

17. The organic light-emitting device of claim 16, wherein the first electrode is an anode, the second electrode is a cathode, the organic layer further comprises a hole transport region disposed between the first electrode and the emission layer and an electron transport region disposed between the emission layer and the second electrode, wherein the hole transport region comprises a hole injection layer, a hole transport layer, an electron blocking layer, or any combination thereof, and wherein the electron transport region comprises a hole blocking layer, an electron transport layer, an electron injection layer, or any combination thereof.

18. The organic light-emitting device of claim 16, wherein the emission layer comprises the organometallic compound.

19. The organic light-emitting device of claim 18, wherein the emission layer further comprises a host, and wherein an amount of the host is larger than an amount of the organometallic compound.

20. A diagnostic composition comprising at least one of the organometallic compound of claim 1.

* * * * *